United States Patent
Or-Bach et al.

(10) Patent No.: US 9,911,627 B1
(45) Date of Patent: Mar. 6, 2018

(54) METHOD OF PROCESSING A SEMICONDUCTOR DEVICE

(71) Applicant: Monolithic 3D Inc., San Jose, CA (US)

(72) Inventors: Zvi Or-Bach, San Jose, CA (US); Brian Cronquist, San Jose, CA (US); Deepak Sekar, San Jose, CA (US)

(73) Assignee: MONOLITHIC 3D INC., San Jose, CA (US)

( * ) Notice: Subject to any disclaimer, the term of this patent is extended or adjusted under 35 U.S.C. 154(b) by 963 days.

(21) Appl. No.: 13/864,244

(22) Filed: Apr. 17, 2013

Related U.S. Application Data

(63) Continuation of application No. 13/803,437, filed on Mar. 14, 2013, now Pat. No. 9,385,058, which is a continuation-in-part of application No. 13/731,108, filed on Dec. 30, 2012, which is a continuation of application No. 13/730,897, filed on Dec. 19, 2012, now abandoned.

(51) Int. Cl.
   *H01L 21/00* (2006.01)
   *H01L 21/48* (2006.01)

(52) U.S. Cl.
   CPC ............... *H01L 21/4871* (2013.01)

(58) Field of Classification Search
   USPC ........................................................ 438/122
   See application file for complete search history.

(56) References Cited

U.S. PATENT DOCUMENTS

| | | |
|---|---|---|
| 3,007,090 A | 10/1961 | Rutz |
| 3,819,959 A | 6/1974 | Chang et al. |
| 4,197,555 A | 4/1980 | Uehara et al. |
| 4,400,715 A | 8/1983 | Barbee et al. |
| 4,487,635 A | 12/1984 | Kugimiya et al. |

(Continued)

FOREIGN PATENT DOCUMENTS

| | | |
|---|---|---|
| EP | 1267594 A2 | 12/2002 |
| EP | 1909311 A2 | 4/2008 |
| WO | PCT/US2008/063483 | 5/2008 |

OTHER PUBLICATIONS

Kim, I.-K., et al., "Advanced Integration Technology for a Highly Scalable SOI DRAM with SOC (Silicon-On-Capacitors)", IEDM 1996, pp. 96-605-96-608, 22.5.4.

(Continued)

*Primary Examiner* — Dale E Page
*Assistant Examiner* — Wilner Jean Baptiste
(74) *Attorney, Agent, or Firm* — Tran & Associates

(57) ABSTRACT

A method for processing a 3D semiconductor device, the method including: processing a first layer comprising first transistors, forming a first power distribution grid to provide power to the first transistors, processing a second layer overlying the first transistors and including second transistors, where the second layer includes a through layer via with diameter of less than 150 nm, forming a second power distribution grid overlaying the second transistors, where the first power distribution grid includes first power conductors and the second power distribution grid includes second power conductors, and where the second power conductors are substantially wider or thicker than the first power conductors, and where the device includes a plurality of vias to connect the second power distribution grid to the first power distribution grid.

20 Claims, 109 Drawing Sheets

(56) References Cited

U.S. PATENT DOCUMENTS

| | | |
|---|---|---|
| 4,522,657 A | 6/1985 | Rohatgi et al. |
| 4,612,083 A | 9/1986 | Yasumoto et al. |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |
| 5,087,585 A | 2/1992 | Hayashi |
| 5,093,704 A | 3/1992 | Sato et al. |
| 5,106,775 A | 4/1992 | Kaga et al. |
| 5,152,857 A | 10/1992 | Ito et al. |
| 5,162,879 A | 11/1992 | Gill |
| 5,217,916 A | 6/1993 | Anderson et al. |
| 5,250,460 A | 10/1993 | Yamagata et al. |
| 5,258,643 A | 11/1993 | Cohen |
| 5,265,047 A | 11/1993 | Leung et al. |
| 5,266,511 A | 11/1993 | Takao |
| 5,277,748 A | 1/1994 | Sakaguchi et al. |
| 5,286,670 A | 2/1994 | Kang et al. |
| 5,294,556 A | 3/1994 | Kawamura |
| 5,308,782 A | 5/1994 | Mazure et al. |
| 5,312,771 A | 5/1994 | Yonehara |
| 5,317,236 A | 5/1994 | Zavracky et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,424,560 A | 6/1995 | Norman et al. |
| 5,475,280 A | 12/1995 | Jones et al. |
| 5,478,762 A | 12/1995 | Chao |
| 5,485,031 A | 1/1996 | Zhang et al. |
| 5,498,978 A | 3/1996 | Takahashi et al. |
| 5,527,423 A | 6/1996 | Neville et al. |
| 5,535,342 A | 7/1996 | Taylor |
| 5,554,870 A | 9/1996 | Fitch et al. |
| 5,563,084 A | 10/1996 | Ramm et al. |
| 5,583,349 A | 12/1996 | Norman et al. |
| 5,583,350 A | 12/1996 | Norman et al. |
| 5,594,563 A | 1/1997 | Larson |
| 5,604,137 A | 2/1997 | Yamazaki et al. |
| 5,617,991 A | 4/1997 | Pramanick et al. |
| 5,627,106 A | 5/1997 | Hsu |
| 5,656,548 A | 8/1997 | Zavracky et al. |
| 5,656,553 A | 8/1997 | Leas et al. |
| 5,670,411 A | 9/1997 | Yonehara |
| 5,681,756 A | 10/1997 | Norman et al. |
| 5,695,557 A | 12/1997 | Yamagata et al. |
| 5,701,027 A | 12/1997 | Gordon et al. |
| 5,707,745 A | 1/1998 | Forrest et al. |
| 5,714,395 A | 2/1998 | Bruel |
| 5,721,160 A | 2/1998 | Forrest et al. |
| 5,737,748 A | 4/1998 | Shigeeda |
| 5,739,552 A | 4/1998 | Kimura et al. |
| 5,744,979 A | 4/1998 | Goetting |
| 5,748,161 A | 5/1998 | Lebby et al. |
| 5,757,026 A | 5/1998 | Forrest et al. |
| 5,770,881 A | 6/1998 | Pelella et al. |
| 5,781,031 A | 7/1998 | Bertin et al. |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,937,312 A | 8/1999 | Iyer et al. |
| 5,943,574 A | 8/1999 | Tehrani et al. |
| 5,952,680 A | 9/1999 | Strite |
| 5,952,681 A | 9/1999 | Chen |
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,998,808 A | 12/1999 | Matsushita |
| 6,001,693 A | 12/1999 | Yeouchung et al. |
| 6,009,496 A | 12/1999 | Tsai |
| 6,020,252 A | 2/2000 | Aspar et al. |
| 6,020,263 A | 2/2000 | Shih et al. |
| 6,027,958 A | 2/2000 | Vu et al. |
| 6,030,700 A | 2/2000 | Forrest et al. |
| 6,052,498 A | 4/2000 | Paniccia |
| 6,054,370 A | 4/2000 | Doyle |
| 6,057,212 A | 5/2000 | Chan et al. |
| 6,071,795 A | 6/2000 | Cheung et al. |
| 6,075,268 A | 6/2000 | Gardner et al. |
| 6,103,597 A | 8/2000 | Aspar et al. |
| 6,111,260 A | 8/2000 | Dawson et al. |
| 6,125,217 A | 9/2000 | Paniccia et al. |
| 6,153,495 A | 11/2000 | Kub et al. |
| 6,191,007 B1 | 2/2001 | Matsui et al. |
| 6,222,203 B1 | 4/2001 | Ishibashi et al. |
| 6,229,161 B1 | 5/2001 | Nemati et al. |
| 6,242,324 B1 | 6/2001 | Kub et al. |
| 6,242,778 B1 | 6/2001 | Marmillion et al. |
| 6,259,623 B1 | 7/2001 | Takahashi |
| 6,264,805 B1 | 7/2001 | Forrest et al. |
| 6,281,102 B1 | 8/2001 | Cao et al. |
| 6,294,018 B1 | 9/2001 | Hamm et al. |
| 6,306,705 B1 | 10/2001 | Parekh et al. |
| 6,321,134 B1 | 11/2001 | Henley et al. |
| 6,322,903 B1 | 11/2001 | Siniaguine et al. |
| 6,331,468 B1 | 12/2001 | Aronowitz et al. |
| 6,331,790 B1 | 12/2001 | Or-Bach et al. |
| 6,353,492 B2 | 3/2002 | McClelland et al. |
| 6,355,501 B1 | 3/2002 | Fung et al. |
| 6,358,631 B1 | 3/2002 | Forrest et al. |
| 6,365,270 B2 | 4/2002 | Forrest et al. |
| 6,376,337 B1 | 4/2002 | Wang et al. |
| 6,380,046 B1 | 4/2002 | Yamazaki |
| 6,392,253 B1 | 5/2002 | Saxena |
| 6,417,108 B1 | 7/2002 | Akino et al. |
| 6,420,215 B1 | 7/2002 | Knall et al. |
| 6,423,614 B1 | 7/2002 | Doyle |
| 6,429,481 B1 | 8/2002 | Mo et al. |
| 6,429,484 B1 | 8/2002 | Yu |
| 6,430,734 B1 | 8/2002 | Zahar |
| 6,475,869 B1 | 11/2002 | Yu |
| 6,476,493 B2 | 11/2002 | Or-Bach et al. |
| 6,479,821 B1 | 11/2002 | Hawryluk et al. |
| 6,515,511 B2 | 2/2003 | Sugibayashi et al. |
| 6,526,559 B2 | 2/2003 | Schiefele et al. |
| 6,528,391 B1 | 3/2003 | Henley et al. |
| 6,534,352 B1 | 3/2003 | Kim |
| 6,534,382 B1 | 3/2003 | Sakaguchi et al. |
| 6,544,837 B1 | 4/2003 | Divakauni et al. |
| 6,545,314 B2 | 4/2003 | Forbes et al. |
| 6,555,901 B1 | 4/2003 | Yoshihara et al. |
| 6,563,139 B2 | 5/2003 | Hen |
| 6,580,289 B2 | 6/2003 | Cox |
| 6,600,173 B2 | 7/2003 | Tiwari |
| 6,620,659 B2 | 9/2003 | Emmma et al. |
| 6,624,046 B1 | 9/2003 | Zavracky et al. |
| 6,627,518 B1 | 9/2003 | Inoue et al. |
| 6,630,713 B2 | 10/2003 | Geusic |
| 6,635,552 B1 | 10/2003 | Gonzalez |
| 6,635,588 B1 | 10/2003 | Hawryluk et al. |
| 6,638,834 B2 | 10/2003 | Gonzalez |
| 6,642,744 B2 | 11/2003 | Or-Bach et al. |
| 6,653,209 B1 | 11/2003 | Yamagata |
| 6,661,085 B2 | 12/2003 | Kellar et al. |

(56) References Cited

U.S. PATENT DOCUMENTS

| | | |
|---|---|---|
| 6,677,204 B2 | 1/2004 | Cleeves et al. |
| 6,686,253 B2 | 2/2004 | Or-Bach |
| 6,703,328 B2 | 3/2004 | Tanaka et al. |
| 6,756,633 B2 | 6/2004 | Wang et al. |
| 6,756,811 B2 | 6/2004 | Or-Bach |
| 6,759,282 B2 | 7/2004 | Campbell et al. |
| 6,762,076 B2 | 7/2004 | Kim et al. |
| 6,774,010 B2 | 8/2004 | Chu et al. |
| 6,805,979 B2 | 10/2004 | Ogura et al. |
| 6,806,171 B1 | 10/2004 | Ulyashin et al. |
| 6,809,009 B2 | 10/2004 | Aspar et al. |
| 6,815,781 B2 | 11/2004 | Vyvoda et al. |
| 6,819,136 B2 | 11/2004 | Or-Bach |
| 6,821,826 B1 | 11/2004 | Chan et al. |
| 6,841,813 B2 | 1/2005 | Walker et al. |
| 6,844,243 B1 | 1/2005 | Gonzalez |
| 6,864,534 B2 | 3/2005 | Ipposhi et al. |
| 6,875,671 B2 | 4/2005 | Faris |
| 6,882,572 B2 | 4/2005 | Wang et al. |
| 6,888,375 B2 | 5/2005 | Feng et al. |
| 6,917,219 B2 | 7/2005 | New |
| 6,927,431 B2 | 8/2005 | Gonzalez |
| 6,930,511 B2 | 8/2005 | Or-Bach |
| 6,943,067 B2 | 9/2005 | Greenlaw |
| 6,943,407 B2 | 9/2005 | Ouyang et al. |
| 6,949,421 B1 | 9/2005 | Padmanabhan et al. |
| 6,953,956 B2 | 10/2005 | Or-Bach et al. |
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |
| 7,064,579 B2 | 6/2006 | Madurawe |
| 7,067,396 B2 | 6/2006 | Aspar et al. |
| 7,067,909 B2 | 6/2006 | Reif et al. |
| 7,068,070 B2 | 6/2006 | Or-Bach |
| 7,068,072 B2 | 6/2006 | New et al. |
| 7,078,739 B1 | 7/2006 | Nemati et al. |
| 7,094,667 B1 | 8/2006 | Bower |
| 7,098,691 B2 | 8/2006 | Or-Bach et al. |
| 7,105,390 B2 | 9/2006 | Brask et al. |
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,282,951 B2 | 10/2007 | Huppenthal et al. |
| 7,284,226 B1 | 10/2007 | Kondapalli |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,335,573 B2 | 2/2008 | Takayama et al. |
| 7,337,425 B2 | 2/2008 | Kirk |
| 7,338,884 B2 | 3/2008 | Shimoto et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,393,722 B1 | 7/2008 | Issaq et al. |
| 7,402,483 B2 | 7/2008 | Yu et al. |
| 7,419,844 B2 | 9/2008 | Lee et al. |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,525,186 B2 | 4/2009 | Kim et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,557,367 B2 | 7/2009 | Rogers et al. |
| 7,563,659 B2 | 7/2009 | Kwon et al. |
| 7,566,855 B2 | 7/2009 | Olsen et al. |
| 7,586,778 B2 | 9/2009 | Ho et al. |
| 7,589,375 B2 | 9/2009 | Jang et al. |
| 7,608,848 B2 | 10/2009 | Ho et al. |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,742,331 B2 | 6/2010 | Watanabe |
| 7,745,250 B2 | 6/2010 | Han |
| 7,749,884 B2 | 7/2010 | Mathew et al. |
| 7,750,669 B2 | 7/2010 | Spangaro |
| 7,759,043 B2 | 7/2010 | Tanabe et al. |
| 7,768,115 B2 | 8/2010 | Lee et al. |
| 7,772,096 B2 | 8/2010 | DeSouza et al. |
| 7,774,735 B1 | 8/2010 | Sood |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |

(56) References Cited

U.S. PATENT DOCUMENTS

| | | |
|---|---|---|
| 7,795,619 B2 | 9/2010 | Hara |
| 7,799,675 B2 | 9/2010 | Lee |
| 7,800,099 B2 | 9/2010 | Yamazaki et al. |
| 7,800,148 B2 | 9/2010 | Lee et al. |
| 7,800,199 B2 | 9/2010 | Oh et al. |
| 7,843,718 B2 | 11/2010 | Koh et al. |
| 7,846,814 B2 | 12/2010 | Lee |
| 7,863,095 B2 | 1/2011 | Sasaki et al. |
| 7,867,822 B2 | 1/2011 | Lee |
| 7,888,764 B2 | 2/2011 | Lee |
| 7,915,164 B2 | 3/2011 | Konevecki et al. |
| 7,968,965 B2 | 6/2011 | Kim |
| 7,969,193 B1 | 6/2011 | Wu et al. |
| 7,982,250 B2 | 7/2011 | Yamasaki et al. |
| 8,013,399 B2 | 9/2011 | Thomas et al. |
| 8,014,195 B2 | 9/2011 | Okhonin et al. |
| 8,022,493 B2 | 9/2011 | Bang |
| 8,030,780 B2 | 10/2011 | Kirby et al. |
| 8,031,544 B2 | 10/2011 | Kim et al. |
| 8,044,464 B2 | 10/2011 | Yamazaki et al. |
| 8,106,520 B2 | 1/2012 | Keeth et al. |
| 8,107,276 B2 | 1/2012 | Breitwisch et al. |
| 8,129,256 B2 | 3/2012 | Farooq et al. |
| 8,136,071 B2 | 3/2012 | Solomon |
| 8,138,502 B2 | 3/2012 | Nakamura et al. |
| 8,158,515 B2 | 4/2012 | Farooq et al. |
| 8,183,630 B2 | 5/2012 | Batude et al. |
| 8,184,463 B2 | 5/2012 | Saen et al. |
| 8,203,187 B2 | 6/2012 | Lung et al. |
| 8,208,279 B2 | 6/2012 | Lue |
| 8,264,065 B2 | 10/2012 | Su et al. |
| 8,343,851 B2 | 1/2013 | Kim et al. |
| 8,354,308 B2 | 1/2013 | Kang et al. |
| 8,470,689 B2 | 6/2013 | Desplobain et al. |
| 8,497,512 B2 | 7/2013 | Nakamura et al. |
| 8,525,342 B2 | 10/2013 | Chandrasekaran |
| 8,546,956 B2 | 10/2013 | Nguyen |
| 8,566,762 B2 | 10/2013 | Morimoto et al. |
| 2001/0000005 A1 | 3/2001 | Forrest et al. |
| 2001/0014391 A1 | 8/2001 | Forrest et al. |
| 2001/0028059 A1 | 10/2001 | Emma et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0141233 A1 | 10/2002 | Hosotani et al. |
| 2002/0153243 A1 | 10/2002 | Forrest et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei |
| 2003/0067043 A1 | 4/2003 | Zhang |
| 2003/0102079 A1 | 6/2003 | Kalvesten et al. |
| 2003/0107117 A1 | 6/2003 | Antonell et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0157748 A1 | 8/2003 | Kim et al. |
| 2003/0160888 A1 | 8/2003 | Yoshikawa |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0150068 A1 | 8/2004 | Leedy |
| 2004/0150070 A1* | 8/2004 | Okada ............ H01L 22/32 257/508 |
| 2004/0152272 A1 | 8/2004 | Fladre et al. |
| 2004/0155301 A1 | 8/2004 | Zhang |
| 2004/0156233 A1 | 8/2004 | Bhattacharyya |
| 2004/0164425 A1 | 8/2004 | Urakawa |
| 2004/0166649 A1 | 8/2004 | Bressot et al. |
| 2004/0175902 A1 | 9/2004 | Rayssac et al. |
| 2004/0178819 A1 | 9/2004 | New |
| 2004/0195572 A1 | 10/2004 | Kato et al. |
| 2004/0259312 A1 | 12/2004 | Schlosser et al. |
| 2004/0262635 A1 | 12/2004 | Lee |
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0067620 A1 | 3/2005 | Chan et al. |
| 2005/0067625 A1 | 3/2005 | Hata |
| 2005/0073060 A1 | 4/2005 | Datta et al. |
| 2005/0082526 A1 | 4/2005 | Bedell et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0043367 A1 | 2/2006 | Chang et al. |
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0170046 A1 | 8/2006 | Hara |
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |
| 2006/0195729 A1 | 8/2006 | Huppenthal et al. |
| 2006/0207087 A1 | 9/2006 | Jafri et al. |
| 2006/0249859 A1 | 11/2006 | Eiles et al. |
| 2006/0275962 A1 | 12/2006 | Lee |
| 2007/0014508 A1 | 1/2007 | Chen et al. |
| 2007/0035329 A1 | 2/2007 | Madurawe |
| 2007/0063259 A1 | 3/2007 | Derderian et al. |
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1 | 5/2007 | Kashiwabara et al. |
| 2007/0108523 A1 | 5/2007 | Ogawa et al. |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0158659 A1 | 7/2007 | Bensce |

(56) References Cited

U.S. PATENT DOCUMENTS

| | | |
|---|---|---|
| 2007/0158831 A1 | 7/2007 | Cha et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0210336 A1 | 9/2007 | Madurawe |
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252203 A1 | 11/2007 | Zhu et al. |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2008/0032463 A1 | 2/2008 | Lee |
| 2008/0038902 A1 | 2/2008 | Lee |
| 2008/0048327 A1 | 2/2008 | Lee |
| 2008/0054359 A1 | 3/2008 | Yang et al. |
| 2008/0067573 A1 | 3/2008 | Jang et al. |
| 2008/0070340 A1 | 3/2008 | Borrelli et al. |
| 2008/0072182 A1 | 3/2008 | He et al. |
| 2008/0099780 A1 | 5/2008 | Tran |
| 2008/0108171 A1 | 5/2008 | Rogers et al. |
| 2008/0124845 A1 | 5/2008 | Yu et al. |
| 2008/0128745 A1 | 6/2008 | Mastro et al. |
| 2008/0135949 A1 | 6/2008 | Lo et al. |
| 2008/0136455 A1 | 6/2008 | Diamant et al. |
| 2008/0142959 A1 | 6/2008 | DeMulder et al. |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0179678 A1 | 7/2008 | Dyer et al. |
| 2008/0191247 A1 | 8/2008 | Yin et al. |
| 2008/0191312 A1 | 8/2008 | Oh et al. |
| 2008/0194068 A1 | 8/2008 | Temmler et al. |
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0261378 A1 | 10/2008 | Yao et al. |
| 2008/0272492 A1 | 11/2008 | Tsang |
| 2008/0277778 A1 | 11/2008 | Furman et al. |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315351 A1 | 12/2008 | Kakehata |
| 2009/0001469 A1 | 1/2009 | Yoshida et al. |
| 2009/0001504 A1 | 1/2009 | Takei et al. |
| 2009/0016716 A1 | 1/2009 | Ishida |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | McIlrath |
| 2009/0057879 A1 | 3/2009 | Garrou et al. |
| 2009/0061572 A1 | 3/2009 | Hareland et al. |
| 2009/0064058 A1 | 3/2009 | McIlrath |
| 2009/0066365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0079000 A1 | 3/2009 | Yamasaki et al. |
| 2009/0081848 A1 | 3/2009 | Erokhin |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |
| 2009/0161401 A1 | 6/2009 | Bigler et al. |
| 2009/0179268 A1 | 7/2009 | Abou-Khalil et al. |
| 2009/0194152 A1 | 8/2009 | Liu et al. |
| 2009/0194768 A1 | 8/2009 | Leedy |
| 2009/0194836 A1 | 8/2009 | Kim |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |
| 2009/0224364 A1 | 9/2009 | Oh et al. |
| 2009/0234331 A1 | 9/2009 | Langereis et al. |
| 2009/0236749 A1 | 9/2009 | Otemba et al. |
| 2009/0242893 A1 | 10/2009 | Tomiyasu |
| 2009/0242935 A1 | 10/2009 | Fitzgerald |
| 2009/0250686 A1 | 10/2009 | Sato et al. |
| 2009/0262583 A1 | 10/2009 | Lue |
| 2009/0263942 A1 | 10/2009 | Ohnuma et al. |
| 2009/0267233 A1 | 10/2009 | Lee |
| 2009/0272989 A1 | 11/2009 | Shum et al. |
| 2009/0290434 A1 | 11/2009 | Kurjanowicz |
| 2009/0294822 A1 | 12/2009 | Batude et al. |
| 2009/0294861 A1 | 12/2009 | Thomas et al. |
| 2009/0302387 A1 | 12/2009 | Joshi et al. |
| 2009/0302394 A1 | 12/2009 | Fujita |
| 2009/0309152 A1 | 12/2009 | Knoefler et al. |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0025766 A1 | 2/2010 | Nuttinck et al. |
| 2010/0031217 A1 | 2/2010 | Sinha et al. |
| 2010/0038743 A1 | 2/2010 | Lee |
| 2010/0052134 A1 | 3/2010 | Werner et al. |
| 2010/0058580 A1 | 3/2010 | Yazdani |
| 2010/0059796 A1 | 3/2010 | Scheuerlein |
| 2010/0081232 A1 | 4/2010 | Furman et al. |
| 2010/0112753 A1 | 5/2010 | Lee |
| 2010/0112810 A1 | 5/2010 | Lee et al. |
| 2010/0123202 A1 | 5/2010 | Hofmann |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0157117 A1 | 6/2010 | Wang |
| 2010/0190334 A1 | 7/2010 | Lee |
| 2010/0193884 A1 | 8/2010 | Park et al. |
| 2010/0193964 A1 | 8/2010 | Farooq et al. |
| 2010/0221867 A1 | 9/2010 | Bedell et al. |
| 2010/0224915 A1 | 9/2010 | Kawashima et al. |
| 2010/0225002 A1 | 9/2010 | Law et al. |
| 2010/0276662 A1 | 11/2010 | Colinge |
| 2010/0295136 A1* | 11/2010 | Or-Bach et al. ............ 257/390 |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0050125 A1 | 3/2011 | Medendorp et al. |
| 2011/0053332 A1 | 3/2011 | Lee |
| 2011/0101537 A1 | 5/2011 | Barth et al. |
| 2011/0102014 A1 | 5/2011 | Madurawe |
| 2011/0143506 A1 | 6/2011 | Lee |
| 2011/0147791 A1 | 6/2011 | Norman et al. |
| 2011/0147849 A1 | 6/2011 | Augendre et al. |
| 2011/0221022 A1 | 9/2011 | Toda |
| 2011/0227158 A1 | 9/2011 | Zhu |

(56) References Cited

U.S. PATENT DOCUMENTS

| | | |
|---|---|---|
| 2011/0241082 A1 | 10/2011 | Bernstein et al. |
| 2011/0284992 A1 | 11/2011 | Zhu |
| 2011/0286283 A1 | 11/2011 | Lung et al. |
| 2011/0304765 A1 | 12/2011 | Yogo et al. |
| 2012/0001184 A1 | 1/2012 | Ha et al. |
| 2012/0003815 A1 | 1/2012 | Lee |
| 2012/0013013 A1* | 1/2012 | Sadaka ............ H01L 21/2007 257/773 |
| 2012/0025388 A1 | 2/2012 | Law et al. |
| 2012/0034759 A1 | 2/2012 | Sakaguchi et al. |
| 2012/0063090 A1 | 3/2012 | Hsiao et al. |
| 2012/0074466 A1 | 3/2012 | Setiadi et al. |
| 2012/0161310 A1 | 6/2012 | Brindle et al. |
| 2012/0178211 A1 | 7/2012 | Hebert |
| 2012/0181654 A1 | 7/2012 | Lue |
| 2012/0182801 A1 | 7/2012 | Lue |
| 2012/0241919 A1 | 9/2012 | Mitani |
| 2012/0319728 A1 | 12/2012 | Madurawe |
| 2013/0026663 A1 | 1/2013 | Radu et al. |
| 2013/0082235 A1 | 4/2013 | Gu et al. |
| 2013/0193550 A1 | 8/2013 | Sklenard et al. |
| 2013/0196500 A1 | 8/2013 | Batude et al. |
| 2013/0203248 A1 | 8/2013 | Ernst et al. |
| 2014/0131885 A1 | 5/2014 | Samadi et al. |
| 2014/0145347 A1 | 5/2014 | Samadi et al. |
| 2014/0146630 A1 | 5/2014 | Xie et al. |
| 2014/0149958 A1 | 5/2014 | Samadi et al. |
| 2014/0225218 A1 | 8/2014 | Du |
| 2014/0225235 A1 | 8/2014 | Du |
| 2014/0252306 A1 | 9/2014 | Du |
| 2014/0253196 A1 | 9/2014 | Du et al. |

OTHER PUBLICATIONS

Lee, B.H., et al., "A Novel CMP Method for cost-effective Bonded SOI Wafer Fabrication," Proceedings 1995 IEEE International SOI Conference, Oct. 1995, pp. 60-61.

Lee, B.H., et al., "A Novel Pattern Transfer Process for Bonded SOI Giga-bit DRAMs," Proceedings 1996 IEEE International SOI Conference, Oct. 1996, pp. 114-115.

Kuroda, T., "ThruChip Interface for Heterogeneous Chip Stacking," ElectroChemicalSociety Transactions, 50 (14) 63-68 (2012).

Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).

Kuroda, T., "Wireless Proximity Communications for 3D System Integration," Future Directions in IC and Package Design Workshop, Oct. 29, 2007.

Qiang, J-Q, "3-D Hyperintegration and Packaging Technologies for Micro-Nano Systems," Proceedings of the IEEE, 97.1 (2009) pp. 18-30.

Topol, A.W., et al., "Enabling SOI-Based Assembly Technology for Three-Dimensional (3D) Integrated Circuits (ICs)," IEDM Tech. Digest, Dec. 5, 2005, pp. 363-366.

Demeester, P., et al., "Epitaxial lift-off and its applications," Semicond. Sci. Technol., 1993, pp. 1124-1135, vol. 8.

Yoon, J., et al., "GaAs Photovoltaics and optoelectronics using releasable multilayer epitaxial assemblies", Nature, vol. 465, May 20, 2010, pp. 329-334.

Bakir and Meindl, "Integrated Interconnect Technologies for 3D Nanoelectronic Systems", Artech House, 2009, Chapter 13, pp. 389-419.

Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.

Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.

Kim, W., et al., "Multi-layered Vertical Gate NAND Flash overcoming stacking limit for terabit density storage", Symposium on VLSI Technology Digest of Technical Papers, 2009, pp. 188-189.

DiCioccio, L., et. al., "Direct bonding for wafer level 3D integration", ICICDT 2010, pp. 110-113.

Kim, W., et al., "Multi-Layered Vertical Gate NAND Flash Overcoming Stacking Limit for Terabit Density Storage," Symposium on VLSI Technology, 2009, pp. 188-189.

Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.

Hubert, A., et al., "A Stacked SONOS Technology, Up to 4 Levels and 6nm Crystalline Nanowires, with Gate-All-Around or Independent Gates (ΦFlash), Suitable for Full 3D Integration", International Electron Devices Meeting, 2009, pp. 637-640.

Celler, G.K., et al., "Frontiers of silicon-on-insulator," J. App. Phys., May 1, 2003, pp. 4955-4978, vol. 93, No. 9.

Rajendran, B., et al., "Electrical Integrity of MOS Devices in Laser Annealed 3D IC Structures", proceedings VLSI Multi Level Interconnect Conference 2004, pp. 73-74.

Rajendran, B., "Sequential 3D IC Fabrication: Challenges and Prospects", Proceedings of VLSI Multi Level Interconnect Conference 2006, pp. 57-64.

Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.

Hui, K. N., et al., "Design of vertically-stacked polychromatic light-emitting diodes," Optics Express, Jun. 8, 2009, pp. 9873-9878, vol. 17, No. 12.

Chuai, D. X., et al., "A Trichromatic Phosphor-Free White Light-Emitting Diode by Using Adhesive Bonding Scheme," Proc. SPIE, 2009, vol. 7635.

Suntharalingam, V., et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.

Coudrain, P., et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.

Flamand, G., et al., "Towards Highly Efficient 4-Terminal Mechanical Photovoltaic Stacks," III-Vs Review, Sep.-Oct. 2006, pp. 24-27, vol. 19, Issue 7.

Zahler, J.M., et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.

Sekar, D. C., et al., "A 3D-IC Technology with Integrated Microchannel Cooling", Proc. Intl. Interconnect Technology Conference, 2008, pp. 13-15.

Brunschweiler, T., et al., "Forced Convective Interlayer Cooling in Vertically Integrated Packages," Proc. Intersoc. Conference on Thermal Management (ITHERM), 2008, pp. 1114-1125.

Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.

Motoyoshi, M., "3D-IC Integration," 3rd Stanford and Tohoku University Joint Open Workshop, Dec. 4, 2009, pp. 1-52.

Wong, S., et al., "Monolithic 3D Integrated Circuits," VLSI Technology, Systems and Applications, 2007, International Symposium on VLSI-TSA 2007, pp. 1-4.

Batude, P., et al., "Advances in 3D CMOS Sequential Integration," 2009 IEEE International Electron Devices Meeting (Baltimore, Maryland), Dec. 7-9, 2009, pp. 345-348.

Tan, C.S., et al., "Wafer Level 3-D ICs Process Technology," ISBN-10: 0387765328, Springer, 1st Ed., Sep. 19, 2008, pp. v-xii, 34, 58, and 59.

Yoon, S.W. et al., "Fabrication and Packaging of Microbump Interconnections for 3D TSV," IEEE International Conference on 3D System Integration (3DIC), Sep. 28-30, 2009, pp. 1-5.

(56) References Cited

OTHER PUBLICATIONS

Franzon, P.D., et al., "Design and CAD for 3D Integrated Circuits," 45th ACM/IEEE Design, Automation Conference (DAC), Jun. 8-13, 2008, pp. 668-673.

Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.

Dong, C., et al., "Reconfigurable Circuit Design with Nanomaterials," Design, Automation & Test in Europe Conference & Exhibition, Apr. 20-24, 2009, pp. 442-447.

Razavi, S.A., et al., "A Tileable Switch Module Architecture for Homogeneous 3D FPGAs," IEEE International Conference on 3D System Integration (3DIC), Sep. 28-30, 2009, 4 pages.

Bakir M., et al., "3D Device-Stacking Technology for Memory," Chptr. 13.4, pp. 407-410, in "Integrated Interconnect Technologies for 3D Nano Electronic Systems", 2009, Artech House.

Weis, M., et al., "Stacked 3-Dimensional 6T SRAM Cell with Independent Double Gate Transistors," IC Design and Technology, May 18-20, 2009.

Doucette, P., "Integrating Photonics: Hitachi, Oki Put LEDs on Silicon," Solid State Technology, Jan. 2007, p. 22, vol. 50, No. 1.

Luo, Z.S., et al., "Enhancement of (in, Ga)N Light-emitting Diode Performance by Laser Liftoff and Transfer from Sapphire to Silicon," Photonics Technology Letters, Oct. 2002, pp. 1400-1402, vol. 14, No. 10.

Zahler, J.M. et al., "Wafer Bonding and Layer Transfer Processes for High Efficiency Solar Cells," NCPV and Solar Program Review Meeting, 2003, pp. 723-726.

Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.

Kada, M., "Development of functionally innovative 3D-integrated circuit (dream chip) technology / high-density 3D-integration technology for multifunctional devices", (2009) IEEE International Conference on 3D System Integration, 3DIC 2009.

Marchal, P., et al., "3-D technology assessment: Path-finding the technology/design sweet-spot", (2009) Proceedings of the IEEE, 97 (1), pp. 96-107.

Xie, Y., et al., "Design space exploration for 3D architectures", (2006) ACM Journal on Emerging Technologies in Computing Systems, 2 (2), Apr. 2006, pp. 65-103.

Souri, S., et al., "Multiple Si layers ICs: motivation, performance analysis, and design Implications", (2000) Proceedings—Design Automation Conference, pp. 213-220.

Vinet, M., et.al., "3D monolithic integration: Technological challenges and electrical results", Microelectronic Engineering Apr. 2011 vol. 88, Issue 4, pp. 331-335.

Bobba, S., et al., "CELONCEL: Effective Design Technique for 3-D Monolithic Integration targeting High Performance Integrated Circuits", *Asia pacific DAC* 2011, paper 4A-4.

Choudhury, D., "3D Integration Technologies for Emerging Microsystems", IEEE Proceedings of the IMS 2010, pp. 1-4.

Lee, Y.-J., et. al, "3D 65nm CMOS with 320° C. Microwave Dopant Activation", IEDM 2010, pp. 1-4.

Crnogorac, F., et al., "Semiconductor crystal islands for three-dimensional integration", J. Vac. Sci. Technol. B 28(6), Nov./Dec. 2010, pp. C6P53-C6P58.

Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.

Jung, S.-M., et al., "Highly Area Efficient and Cost Effective Double Stacked S3( Stacked Single-crystal Si) Peripheral CMOS SSTFT and SRAM Cell Technology for 512M bit density SRAM", IEDM 2003, pp. 265-268.

Joyner, J.W., "Opportunities and Limitations of Three-dimensional Integration for Interconnect Design", PhD Thesis, Georgia Institute of Technology, Jul. 2003.

Choi, S.-J., "A Novel TFT with a Laterally Engineered Bandgap for of 3D Logic and Flash Memory", 2010 Symposium of VLSI Technology Digest, pp. 111-112.

Radu, I., et al., "Recent Developments of Cu—Cu non-thermo compression bonding for wafer-to-wafer 3D stacking", IEEE 3D Systems Integration Conference (3DIC), Nov. 16-18, 2010.

Gaudin, G., et al., "Low temperature direct wafer to wafer bonding for 3D integration", 3D Systems Integration Conference (3DIC), IEEE, 2010, Munich, Nov. 16-18, 2010, pp. 1-4.

Jung, S.-M., et al., "Three Dimensionally Stacked NAND Flash Memory Technology Using Stacking Single Crystal Si Layers on ILD and TANOS Structure for Beyond 30nm Node", IEDM 2006, Dec. 11-13, 2006.

Souri, S. J., "Interconnect Performance in 3-Dimensional Integrated Circuits", PhD Thesis, Stanford, Jul. 2003.

Uemoto, Y., et al., "A High-Performance Stacked-CMOS SRAM Cell by Solid Phase Growth Technique", Symposium on VLSI Technology, 2010, pp. 21-22.

Jung, S.-M., et al., "Highly Cost Effective and High Performance 65nm S3( Stacked Single-crystal Si ) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.

Steen, S.E., et al., "Overlay as the key to drive wafer scale 3D integration", Microelectronic Engineering 84 (2007) 1412-1415.

Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.

Chan, M., et al., "3-Dimensional Integration for Interconnect Reduction in for Nano-CMOS Technologies", IEEE Tencon, Nov. 23, 2006, Hong Kong.

Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.

Naito, T., et al., "World's first monolithic 3D-FPGA with TFT SRAM over 90nm 9 layer Cu CMOS", 2010 Symposium on VLSI Technology Digest of Technical Papers, pp. 219-220.

Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.

Cong, J., et al., "Quantitative Studies of Impact of 3D IC Design on Repeater Usage", Proceedings of International VLSI/ULSI Multilevel Interconnection Conference, pp. 344-348, 2008.

Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.

Crnogorac, F., et al., "Nano-graphoepitaxy of semiconductors for 3D integration", Microelectronic Engineering 84 (2007) 891-894.

Koyanagi, M, "Different Approaches to 3D Chips", 3D IC Review, Stanford University, May 2005.

Koyanagi, M, "Three-Dimensional Integration Technology and Integrated Systems", ASPDAC 2009 presentation.

Koyanagi, M., et al., "Three-Dimensional Integration Technology and Integrated Systems", ASPDAC 2009, paper 4D-1, pp. 409-415.

Hayashi, Y., et al., "A New Three Dimensional IC Fabrication Technology Stacking Thin Film Dual-CMOS Layers", IEDM 1991, paper 25.6.1, pp. 657-660.

Clavelier, L., et al., "Engineered Substrates for Future More Moore and More Than Moore Integrated Devices", IEDM 2010, paper 2.6.1, pp. 42-45.

Kim, K., "From the Future Si Technology Perspective: Challenges and Opportunities", IEDM 2010, pp. 1.1.1-1.1.9.

(56) References Cited

OTHER PUBLICATIONS

Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.

Ramaswami, S., "3D TSV IC Processing", 3DIC Technology Forum Semicon Taiwan 2010, Sep. 9, 2010.

Davis, W.R., et al., "Demystifying 3D Ics: Pros and Cons of Going Vertical", IEEE Design and Test of Computers, Nov.-Dec. 2005, pp. 498-510.

Lin, M., et al., "Performance Benefits of Monolithically Stacked 3DFPGA", FPGA06, Feb. 22-24, 2006, Monterey, California, pp. 113-122.

Dong, C., et al., "Performance and Power Evaluation of a 3D CMOS/Nanomaterial Reconfigurable Architecture", ICCAD 2007, pp. 758-764.

Gojman, B., et al., "3D Nanowire-Based Programmable Logic", International Conference on Nano-Networks (Nanonets 2006), Sep. 14-16, 2006.

Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.

Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.

Rajendran, B., et al., "Thermal Simulation of laser Annealing for 3D Integration", Proceedings VMIC 2003.

Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.

Sadaka, M., et al., "Building Blocks for wafer level 3D integration", www.electroiq.com , Aug. 18, 2010, last accessed Aug. 18, 2010.

Madan, N., et al., "Leveraging 3D Technology for Improved Reliability," Proceedings of the 40th Annual IEEE/ACM International Symposium on Microarchitecture (MICRO 2007), IEEE Computer Society.

Hayashi, Y., et al., "Fabrication of Three Dimensional IC Using "Cumulatively Bonded IC" (CUBIC) Technology", 1990 Symposium on VLSI Technology, pp. 95-96.

Akasaka, Y., "Three Dimensional IC Trends," Proceedings of the IEEE, vol. 24, No. 12, Dec. 1986.

Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.

Kunio, T., et al., "Three Dimensional ICs, Having Four Stacked Active Device Layers," IEDM 1989, paper 34.6, pp. 837-840.

Gaillardon, P-E., et al., "Can We Go Towards True 3-D Architectures?," DAC 2011, paper 58, pp. 282-283.

Yun, J-G., et al., "Single-Crystalline Si Stacked Array (STAR) NAND Flash Memory," IEEE Transactions on Electron Devices, vol. 58, No. 4, Apr. 2011, pp. 1006-1014.

Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.

Goplen, B., et al., "Thermal Via Placement in 3DICs," Proceedings of the International Symposium on Physical Design, Apr. 3-6, 2005, San Francisco.

Bobba, S., et al., "Performance Analysis of 3-D Monolithic Integrated Circuits," 2010 IEEE International 3D Systems Integration Conference (3DIC), Nov. 2010, Munich, pp. 1-4.

Batude, P., et al., "Demonstration of low temperature 3D sequential FDSOI integration down to 50nm gate length," 2011 Symposium on VLSI Technology Digest of Technical Papers, pp. 158-159.

Batude, P., et al., "Advances, Challenges and Opportunities in 3D CMOS Sequential Integration," 2011 IEEE International Electron Devices Meeting, paper 7.3, Dec. 2011, pp. 151-154.

Yun, C. H., et al., "Transfer of patterned ion-cut silicon layers", Applied Physics Letters, vol. 73, No. 19, Nov. 1998, pp. 2772-2774.

Ishihara, R., et al., "Monolithic 3D-ICs with single grain Si thin film transistors," Solid-State Electronics 71 (2012) pp. 80-87.

Lee, S. Y., et al., "Architecture of 3D Memory Cell Array on 3D IC," IEEE International Memory Workshop, May 20, 2012, Monterey, CA.

Lee, S. Y., et al., "3D IC Architecture for High Density Memories," IEEE International Memory Workshop, p. 1-6, May 2010.

Rajendran, B., et al., "CMOS transistor processing compatible with monolithic 3-D Integration," Proceedings VMIC 2005.

Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.

Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.

Kim, J., et al., "A Stacked Memory Device on Logic 3D Technology for Ultra-high-density Data Storage," Nanotechnology, vol. 22, 254006 (2011).

Lee, K. W., et al., "Three-dimensional shared memory fabricated using wafer stacking technology," IEDM Tech. Dig., 2000, pp. 165-168.

Chen, H. Y., et al., "HfOx Based Vertical Resistive Random Access Memory for Cost Effective 3D Cross-Point Architecture without Cell Selector," Proceedings IEDM 2012, pp. 497-499.

Huet, K., et al., "Ultra Low Thermal Budget Anneals for 3D Memories: Access Device Formation," Ion Implantation Technology 2012, AIP Conf Proceedings 1496, 135-138 (2012).

Batude, P., et al., "3D Monolithic Integration," ISCAS 2011 pp. 2233-2236.

Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.

Vinet, M., et.al., "Germanium on Insulator and new 3D architectures opportunities for integration", International Journal of Nanotechnology, vol. 7, No. 4, (Aug. 2010) pp. 304-319.

Bernstein, K., et al., "Interconnects in the Third Dimension: Design Challenges for 3DICs," Design Automation Conference, 2007, DAC'07, 44th ACM/IEEE, vol., No., pp. 562-567, Jun. 4-8, 2007.

Colinge, J. P., et al., "Nanowire transistors without Junctions", Nature Nanotechnology, Feb. 21, 2010, pp. 1-5.

Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.

Kim, J.Y., et al., "The excellent scalability of the RCAT (recess-channel-array-transistor) technology for sub-70nm DRAM feature size and beyond," 2005 IEEE VLSI-TSA International Symposium, pp. 33- 34, Apr. 25-27, 2005.

Abramovici, Breuer and Friedman, Digital Systems Testing and Testable Design, Computer Science Press, 1990, pp. 432-447.

Yonehara, T., et al., "ELTRAN: SOI-Epi Wafer by Epitaxial Layer transfer from porous Silicon", the 198th Electrochemical Society Meeting, abstract No. 438 (2000).

Yonehara, T., et al., "Eltran®, Novel SOI Wafer Technology," JSAP International, Jul. 2001, pp. 10-16, No. 4.

Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.

Bangsaruntip, S., et al., "High performance and highly uniform gate-all-around silicon nanowire MOSFETs with wire size dependent scaling," Electron Devices Meeting (IEDM), 2009 IEEE International , pp. 297-300, Dec. 7-9, 2009.

Burr, G. W., et al., "Overview of candidate device technologies for storage-class memory," IBM Journal of Research and Development , vol. 52, No. 4.5, pp. 449-464, Jul. 2008.

Bez, R., et al., "Introduction to Flash memory," Proceedings IEEE, 91(4), 489-502 (2003).

(56) References Cited

OTHER PUBLICATIONS

Auth, C., et al., "45nm High-k + Metal Gate Strain-Enhanced Transistors," Symposium on VLSI Technology Digest of Technical Papers, 2008, pp. 128-129.
Jan, C. H., et al., "A 32nm Soc Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.
Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.
Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.
Sen, P. & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.
Iwai, H., et.al., "NiSi Salicide Technology for Scaled CMOS," Microelectronic Engineering, 60 (2002), pp. 157-169.
Froment, B., et al., "Nickel vs. Cobalt Silicide integration for sub-50nm CMOS", IMEC ESS Circuits, 2003. pp. 215-219.
James, D., "65 and 45-nm Devices—an Overview", Semicon West, Jul. 2008, paper No. ctr_024377.
Davis, J.A., et.al., "Interconnect Limits on Gigascale Integration(GSI) in the 21st Century", Proc. IEEE, vol. 89, No. 3, pp. 305-324, Mar. 2001.
Shino, T., et al., "Floating Body RAM Technology and its Scalability to 32nm Node and Beyond," Electron Devices Meeting, 2006, IEDM '06, International , pp. 1-4, Dec. 11-13, 2006.
Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.
Okhonin, S., et al., "New Generation of Z-RAM", Electron Devices Meeting, 2007. IEDM 2007. IEEE International, pp. 925-928, Dec. 10-12, 2007.
Henttinen, K. et al., "Mechanically Induced Si Layer Transfer in Hydrogen-Implanted Si Wafers," Applied Physics Letters, Apr. 24, 2000, p. 2370-2372, vol. 76, No. 17.
Lee, C.-W., et al., "Junctionless multigate field-effect transistor," Applied Physics Letters, vol. 94, pp. 053511-1 to 053511-2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.
Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.
Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.

Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).
Vengurlekar, A., et al., "Mechanism of Dopant Activation Enhancement in Shallow Junctions by Hydrogen", Proceedings of the Materials Research Society, vol. 864, Spring 2005, E9.28.1-6.
Yamada, M., et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X., et al., "Cascade single-chip phosphor-free white light emitting diodes," Applied Physics Letters, 2008, pp. 013507-1-013507-3, vol. 92.
Takafuji, Y., et al., "Integration of Single Crystal Si TFTs and Circuits on a Large Glass Substrate," IEEE International Electron Devices Meeting (IEDM), Dec. 7-9, 2009, pp. 1-4.
Wierer, J.J., et al., "High-power AlGaInN flip-chip light-emitting diodes, " Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al.,"Autonomous Refresh of Floating Body Cell (FBC)", International Electron Device Meeting, 2008, pp. 801-804.
Chen, P., et al., "Effects of Hydrogen Implantation Damage on the Performance of InP/InGaAs/InP p-i-n. Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Feng, J., et al., "Integration of Germanium-on-Insulator and Silicon MOSFETs on a Silicon Substrate, " IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Brebner, G., "Tooling up for Reconfigurable System Design," IEE Colloquium on Reconfigurable Systems, 1999, Ref. No. 1999/061, pp. 2/1-2/4.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P., et al., "Silicon Substrate Removal of GaN DHFETs for enhanced (>1100V) Breakdown Voltage," Aug. 2010, IEEE Electron Device Letters, vol. 31, No. 8, pp. 851-852.
Gosele, U., et al., "Semiconductor Wafer Bonding," Annual Review of Materials Science, Aug. 1998, pp. 215-241, vol. 28.
Spangler, L.J., et al., "A Technology for High Performance Single-Crystal Silicon-on-Insulator Transistors," IEEE Electron Device Letters, Apr. 1987, pp. 137-139, vol. 8, No. 4.

(56) References Cited

OTHER PUBLICATIONS

Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions on Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.
Hsu, Y.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.
Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings DATE, pp. 1338-1343.

McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IEEE Design and Test of Computers, 24 (5), pp. 486-493.
Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.
Sellathamby, C.V., et al., "Non-contact wafer probe using wireless probe cards", (2005) Proceedings—International Test Conference, 2005, pp. 447-452.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.
Brillouet, M., "Emerging Technologies on Silicon", IEDM 2004, pp. 17-24.
Meindl, J. D., "Beyond Moore's Law: The Interconnect Era", IEEE Computing in Science & Engineering, Jan./Feb. 2003, pp. 20-24.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS MANTECH Conference, May 14-17, 2007 Austin, Texas, pp. 33-36.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.

(56) References Cited

OTHER PUBLICATIONS

Borland, J.O., "Low Temperature Activation of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, vol. 25, issue 4, pp. 322-332.
Borkar, S., "Designing Reliable Systems from Unreliable Components: The Challenges of Transistor Variability and Degradation", IEEE Micro, IEEE Computer Society, Nov.-Dec. 2005, pp. 10-16.
Zhu, S., et al., "N-Type Schottky Barrier Source/Drain MOSFET Using Ytterbium Silicide", IEEE Electron Device Letters, vol. 25, No. 8, Aug. 2004, pp. 565-567.
Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.

Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Azevedo, I. L., et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Tong, Q.-Y., et al., "Low Temperature Si Layer Splitting", Proceedings 1997 IEEE International SOI Conference, Oct. 1997, pp. 126-127.
Nguyen, P., et al., "Systematic study of the splitting kinetic of H/He co-implanted substrate", SOI Conference, 2003, pp. 132-134.
Ma, X., et al., "A high-quality SOI structure fabricated by low-temperature technology with B+/H+ co-implantation and plasma bonding", Semiconductor Science and Technology, vol. 21, 2006, pp. 959-963.
Yu, C.Y., et al., "Low-temperature fabrication and characterization of Ge-on-insulator structures", Applied Physics Letters, vol. 89, 101913-1 to 101913-2 (2006).
Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.
Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Agarwal, A., et al., "Efficient production of silicon-on-insulator films by co-implantation of He+ with H+" Applied Physics Letters, vol. 72, No. 9, Mar. 1998, pp. 1086-1088.
Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IEEE Transactions on Image Processing, vol. 4, No. 12, Dec. 1995, pp. 1613-1628.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Miller, D.A.B., "Optical interconnects to electronic chips," Applied Optics, vol. 49, No. 25, Sep. 1, 2010, pp. F59-F70.
En, W. G., et al., "The Genesis Process: A New SOI wafer fabrication method", Proceedings 1998 IEEE International SOI Conference, Oct. 1998, pp. 163-164.
Uchikoga, S., et al., "Low temperature poly-Si TFT-LCD by excimer laser anneal," Thin Solid Films, vol. 383 (2001), pp. 19-24.
He, M., et al., "Large Polycrystalline Silicon Grains Prepared by Excimer Laser Crystallization of Sputtered Amorphous Silicon Film with Process Temperature at 100 C.," Japanese Journal of Applied Physics, vol. 46, No. 3B, 2007, pp. 1245-1249.

(56) References Cited

OTHER PUBLICATIONS

Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.

Ahn, J., et al., "High-quality MOSFET's with ultrathin LPCVD gate SiO2," IEEE Electron Device Lett., vol. 13, No. 4, pp. 186-188, Apr. 1992.

Yang, M., et al., "High Performance CMOS Fabricated on Hybrid Substrate with Different Crystal Orientation," Proceedings IEDM 2003.

Yin, H., et al., "Scalable 3-D finlike poly-Si TFT and its nonvolatile memory application," IEEE Trans. Electron Devices, vol. 55, No. 2, pp. 578-584, Feb. 2008.

Faynot, O. et al., "Planar Fully depleted SOI technology: A Powerful architecture for the 20nm node and beyond," Electron Devices Meeting (IEDM), 2010 IEEE International, vol., No., pp. 3.2.1, 3.2.4, Dec. 6-8, 2010.

Khakifirooz, A., "ETSOI Technology for 20nm and Beyond", SOI Consortium Workshop: Fully Depleted SOI, Apr. 28, 2011, Hsinchu Taiwan.

Wu, B., et al., "Extreme ultraviolet lithography and three dimensional circuits," Applied Phyisics Reviews, 1, 011104 (2014).

\* cited by examiner

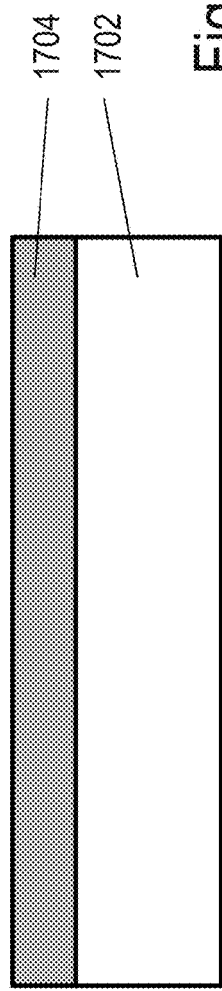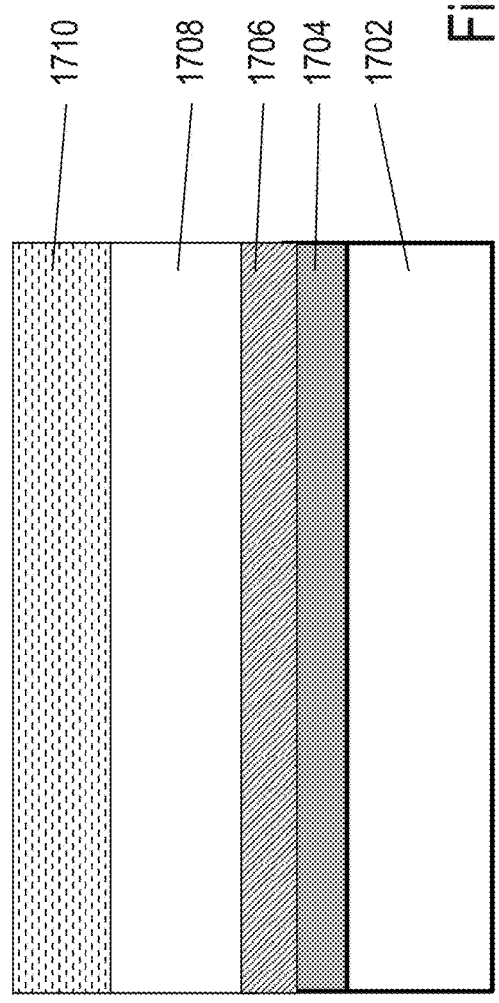

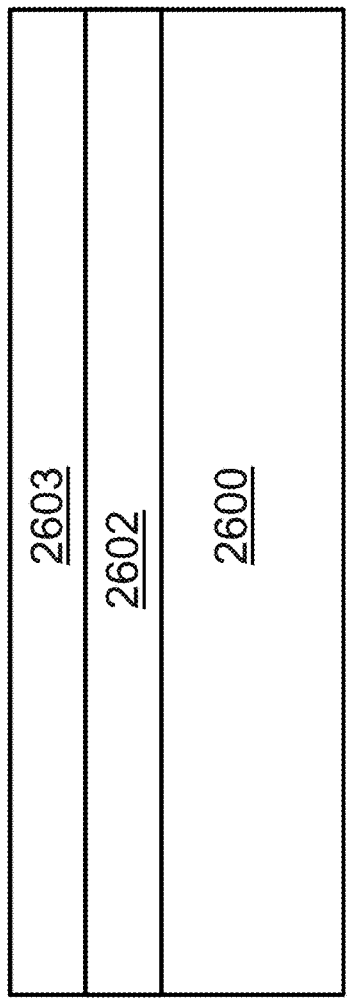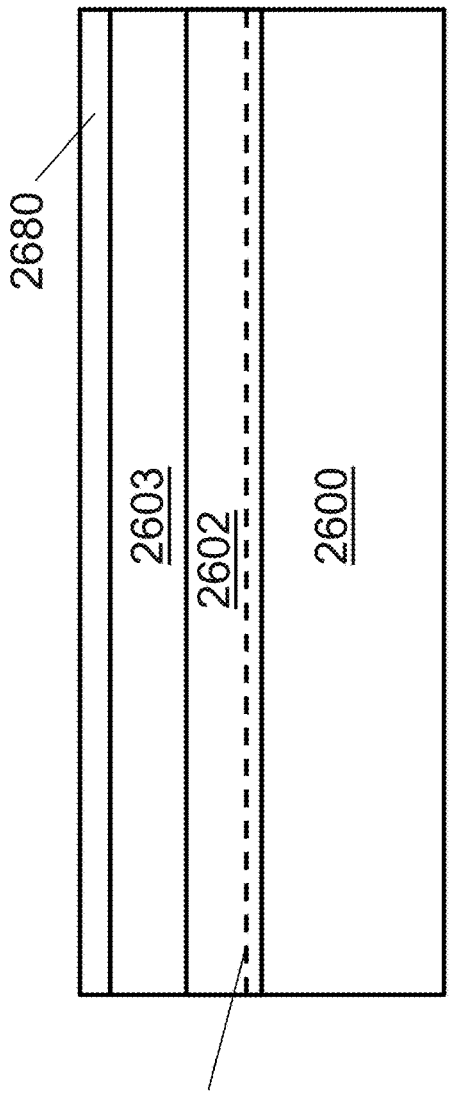

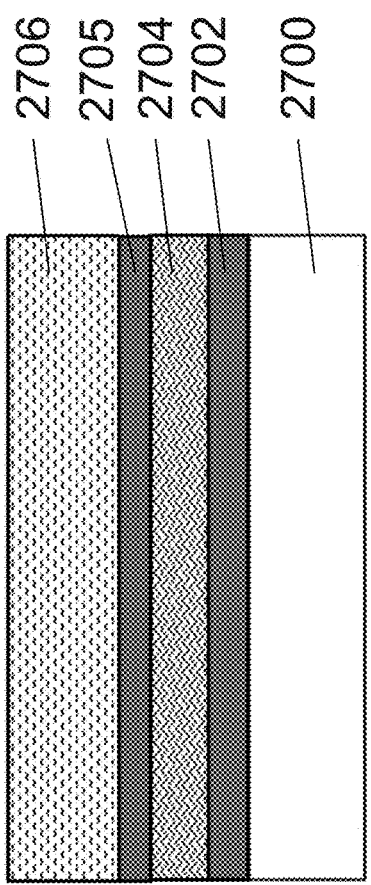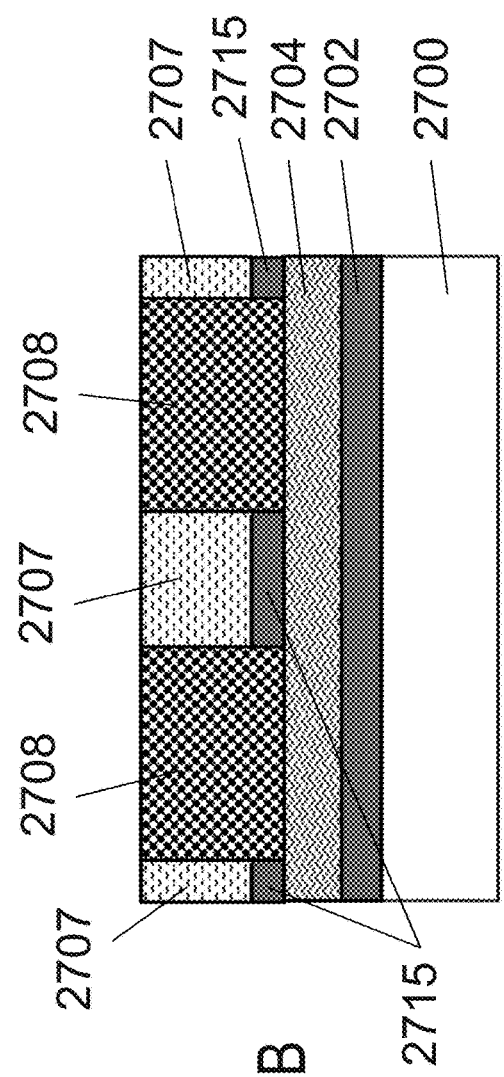
Fig. 27A
Fig. 27B

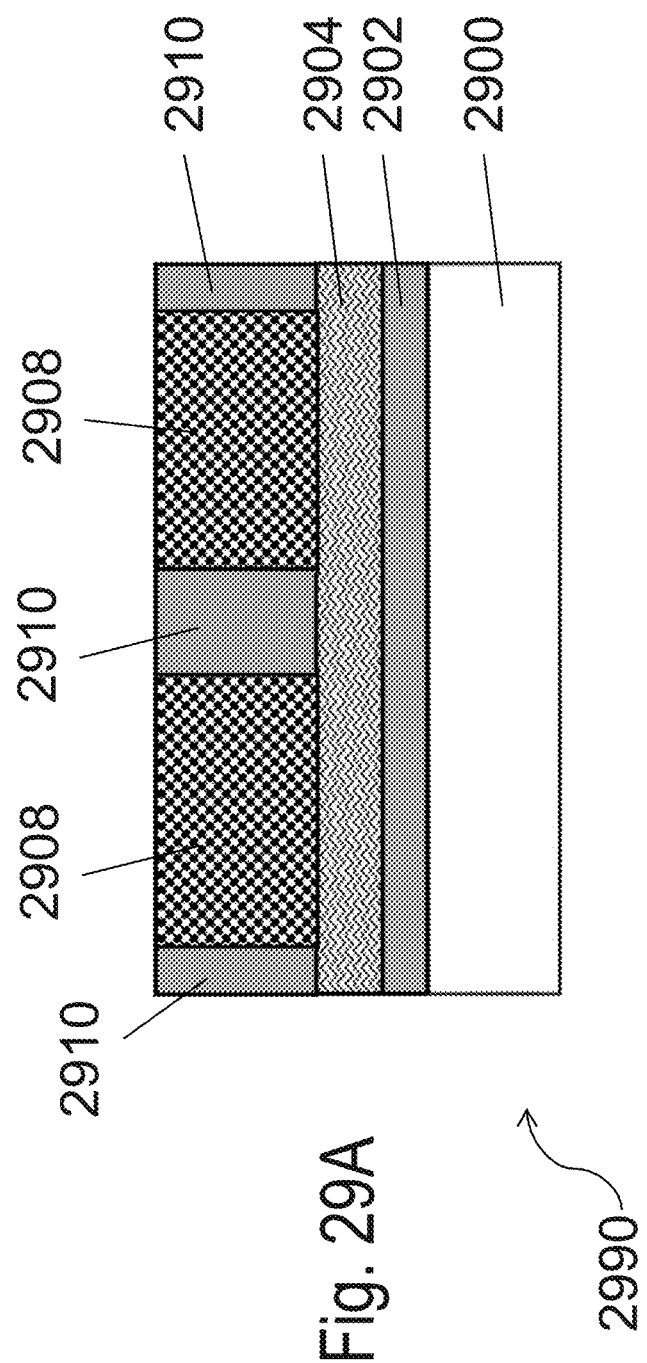

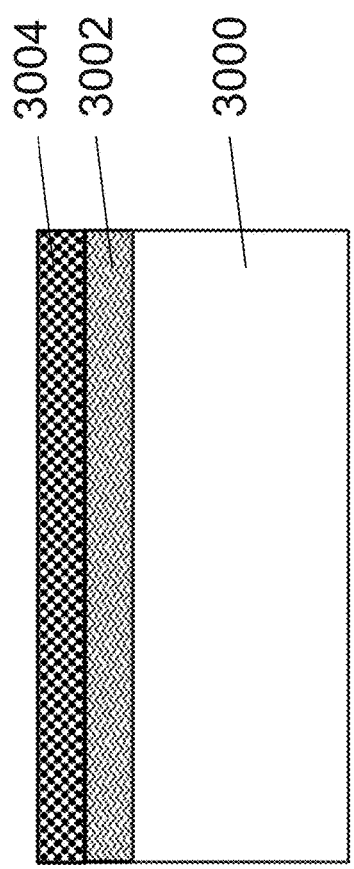
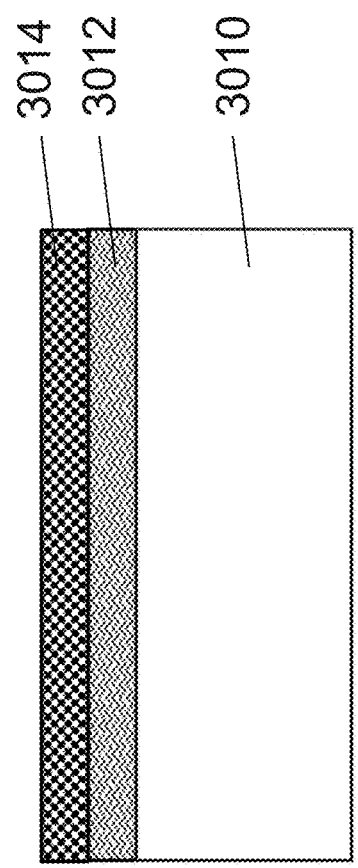
Fig. 30A
Fig. 30B

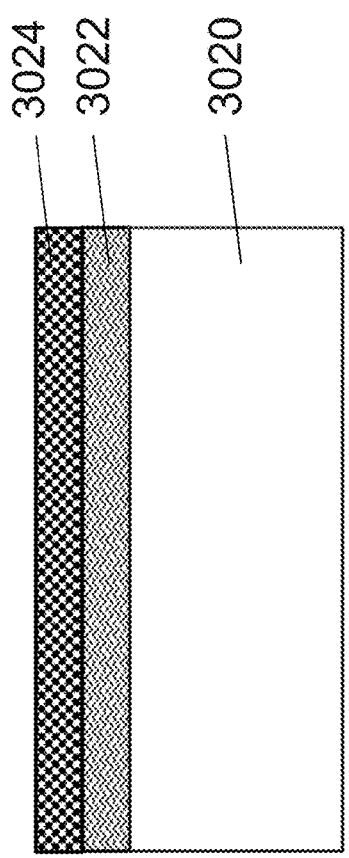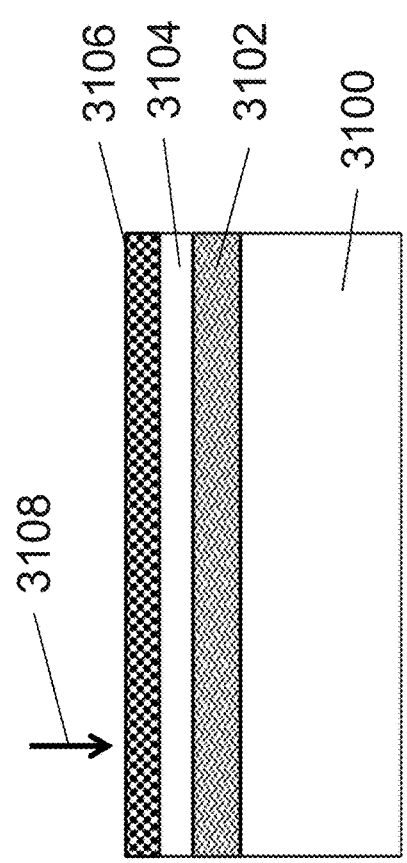

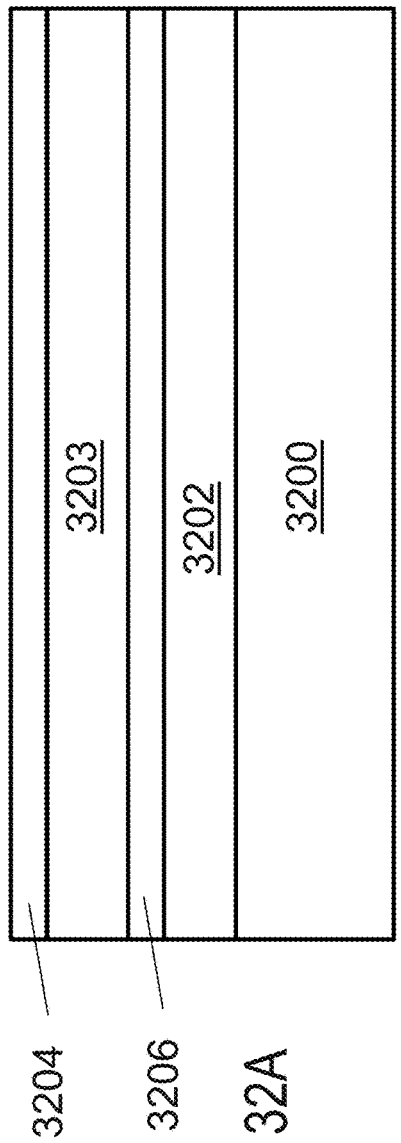
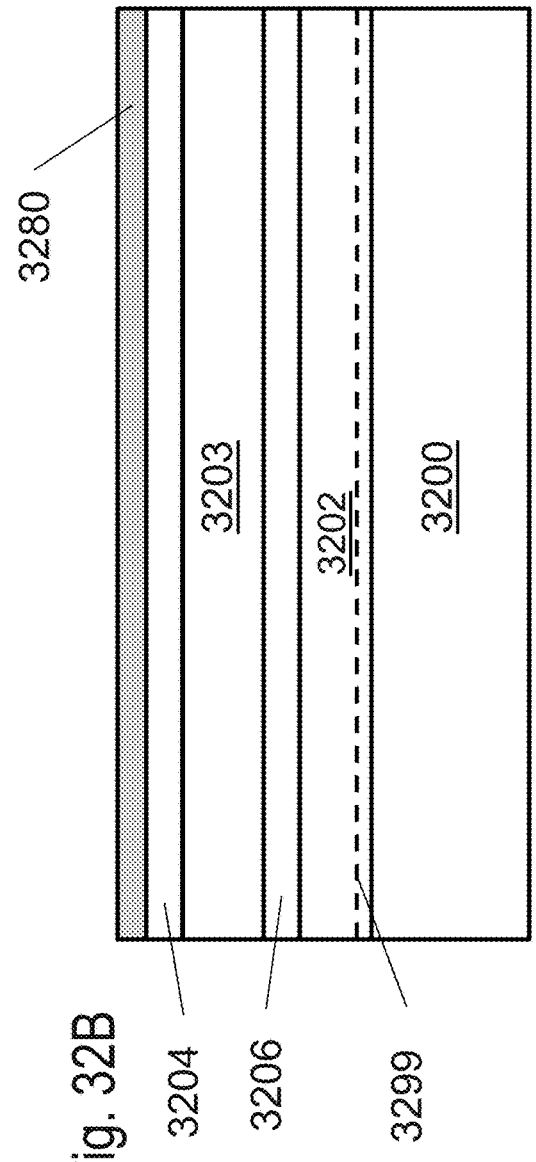

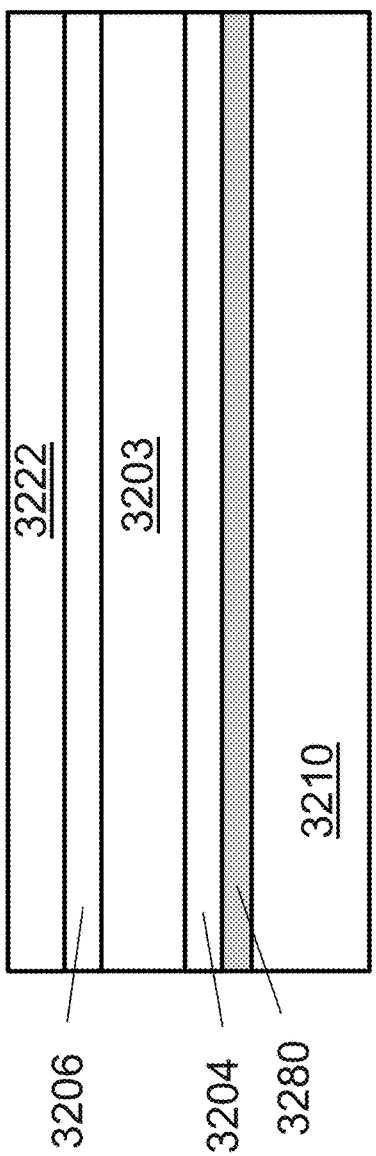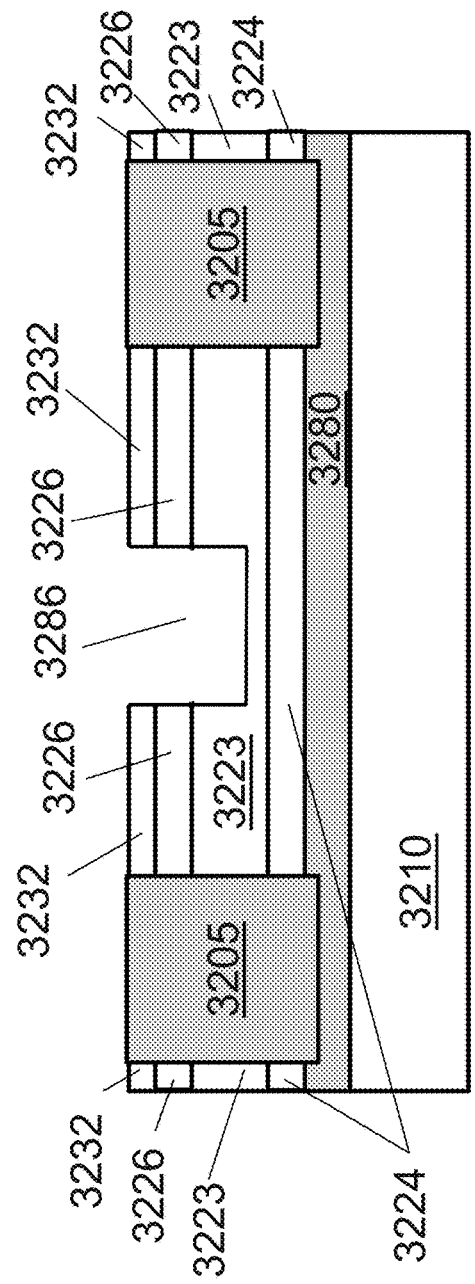

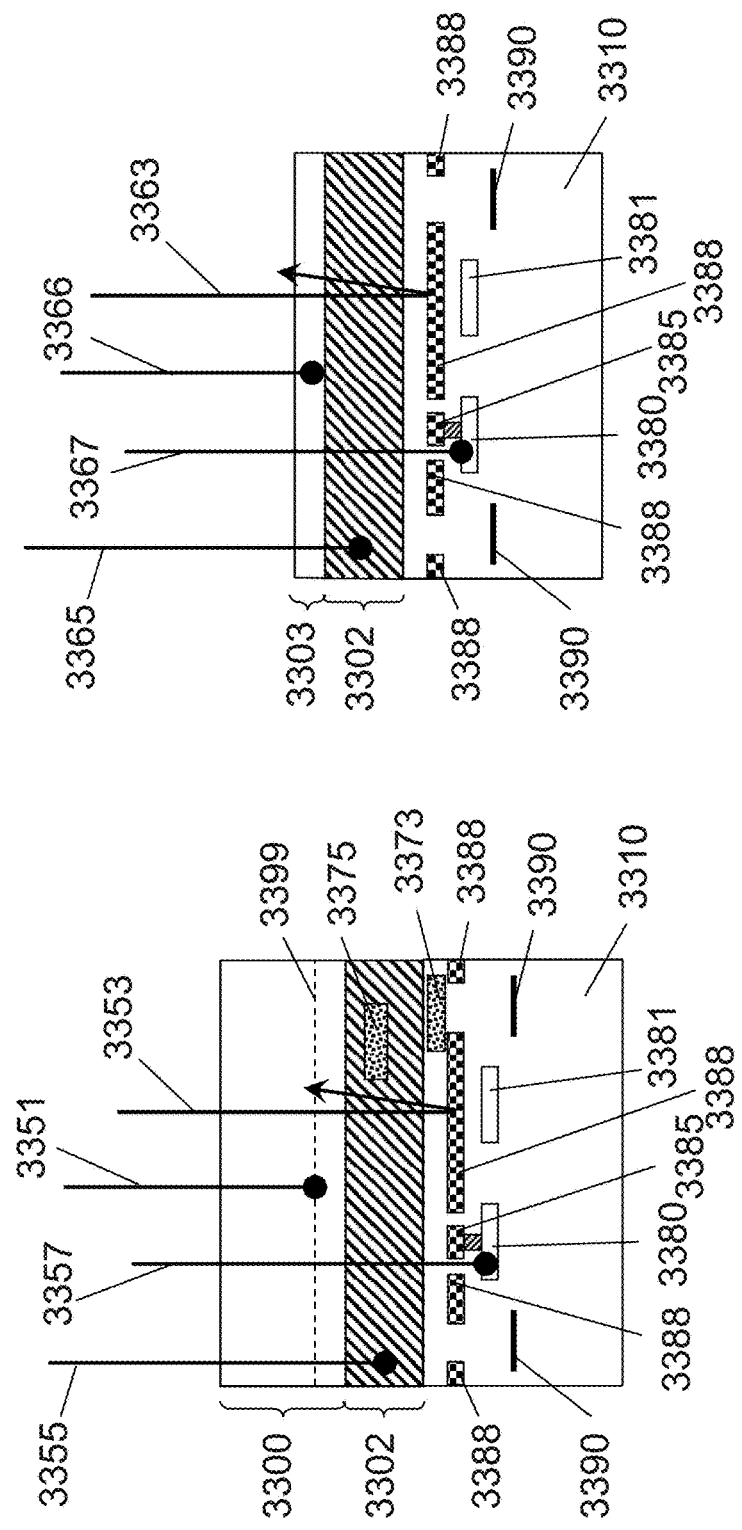

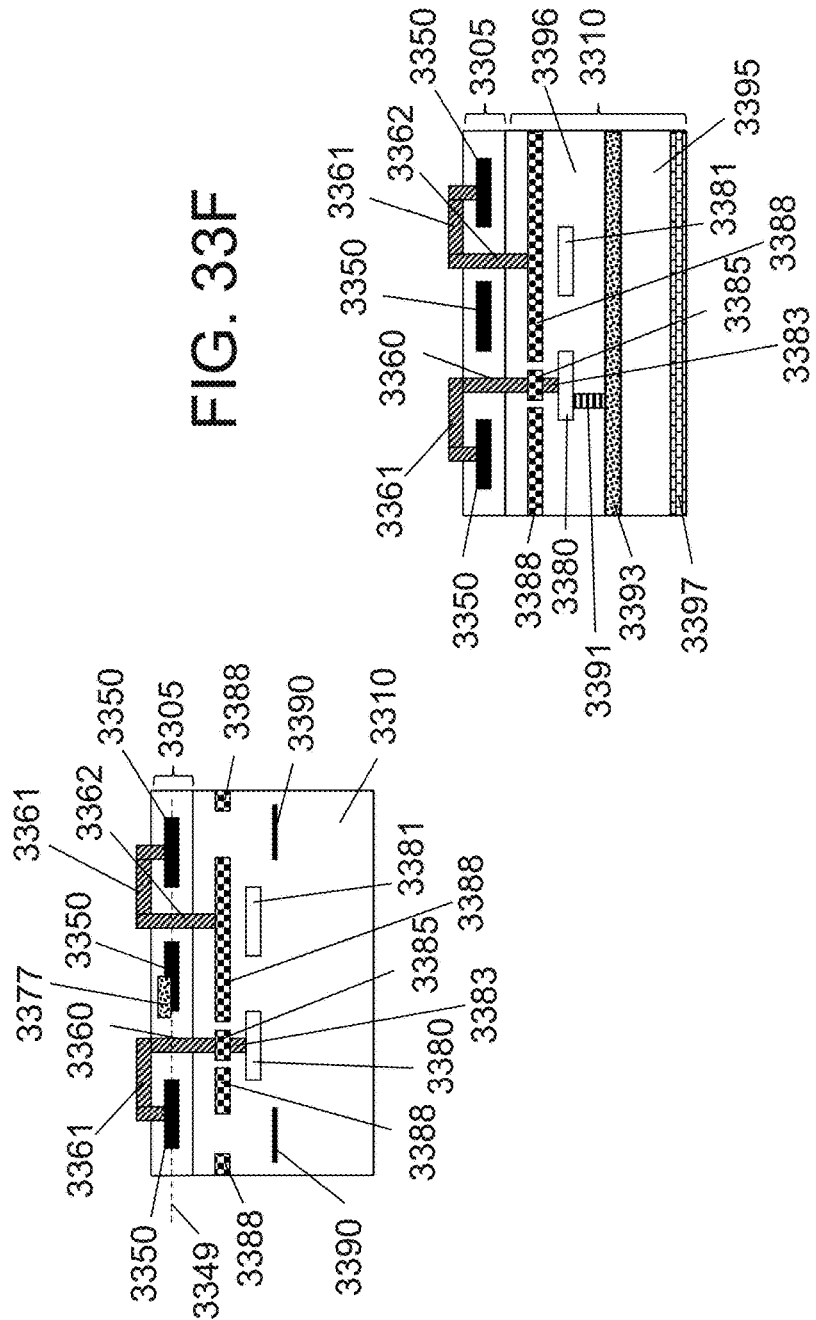

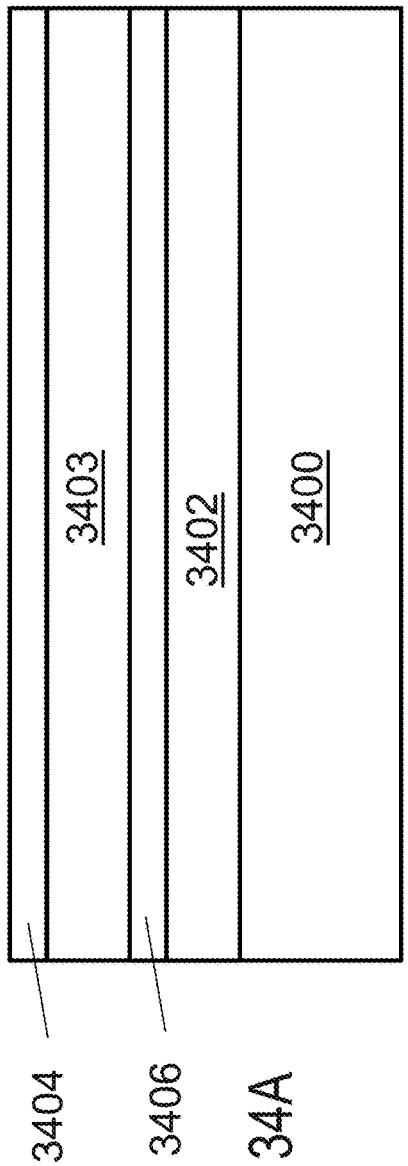
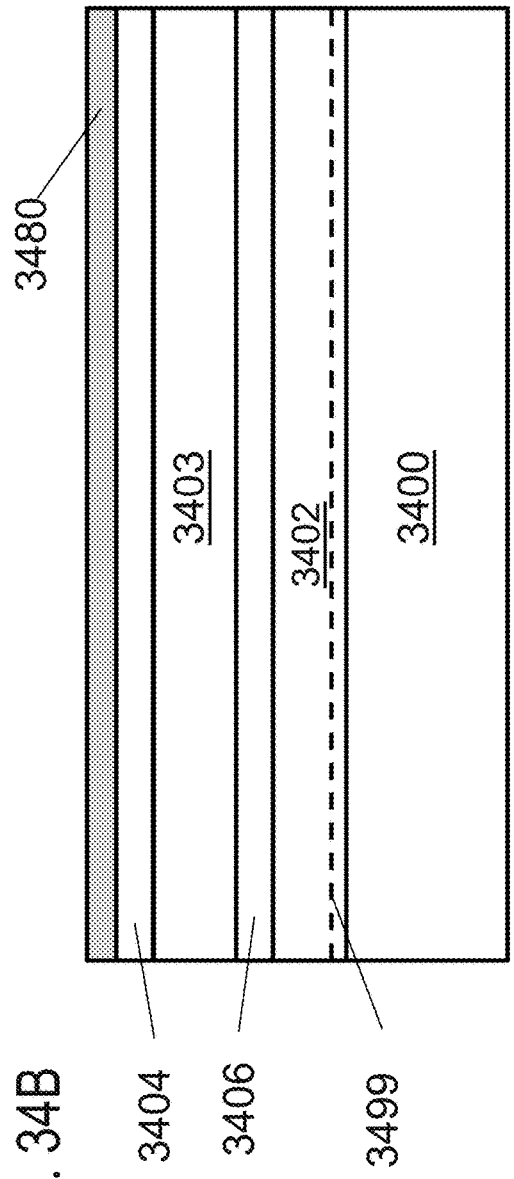

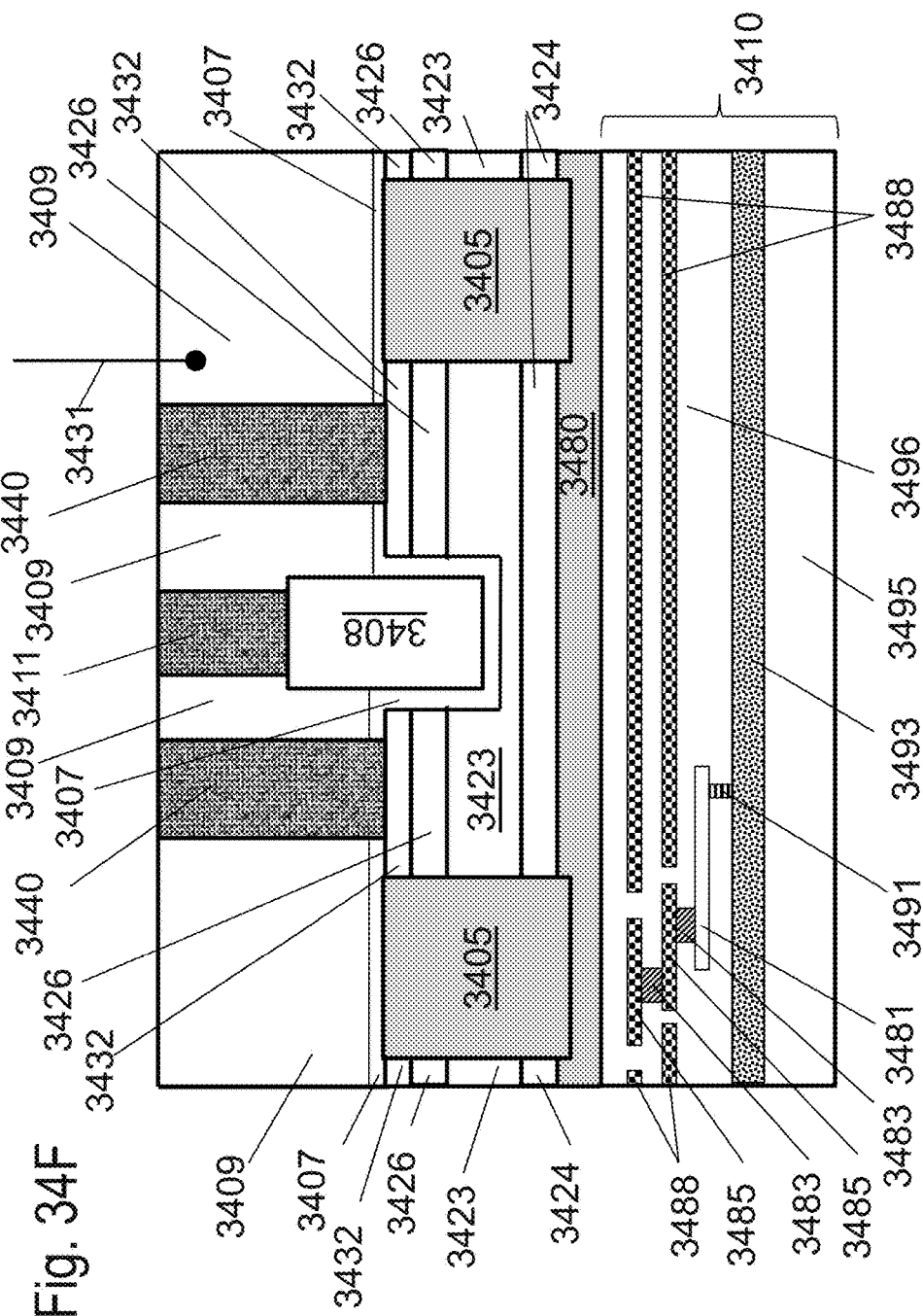

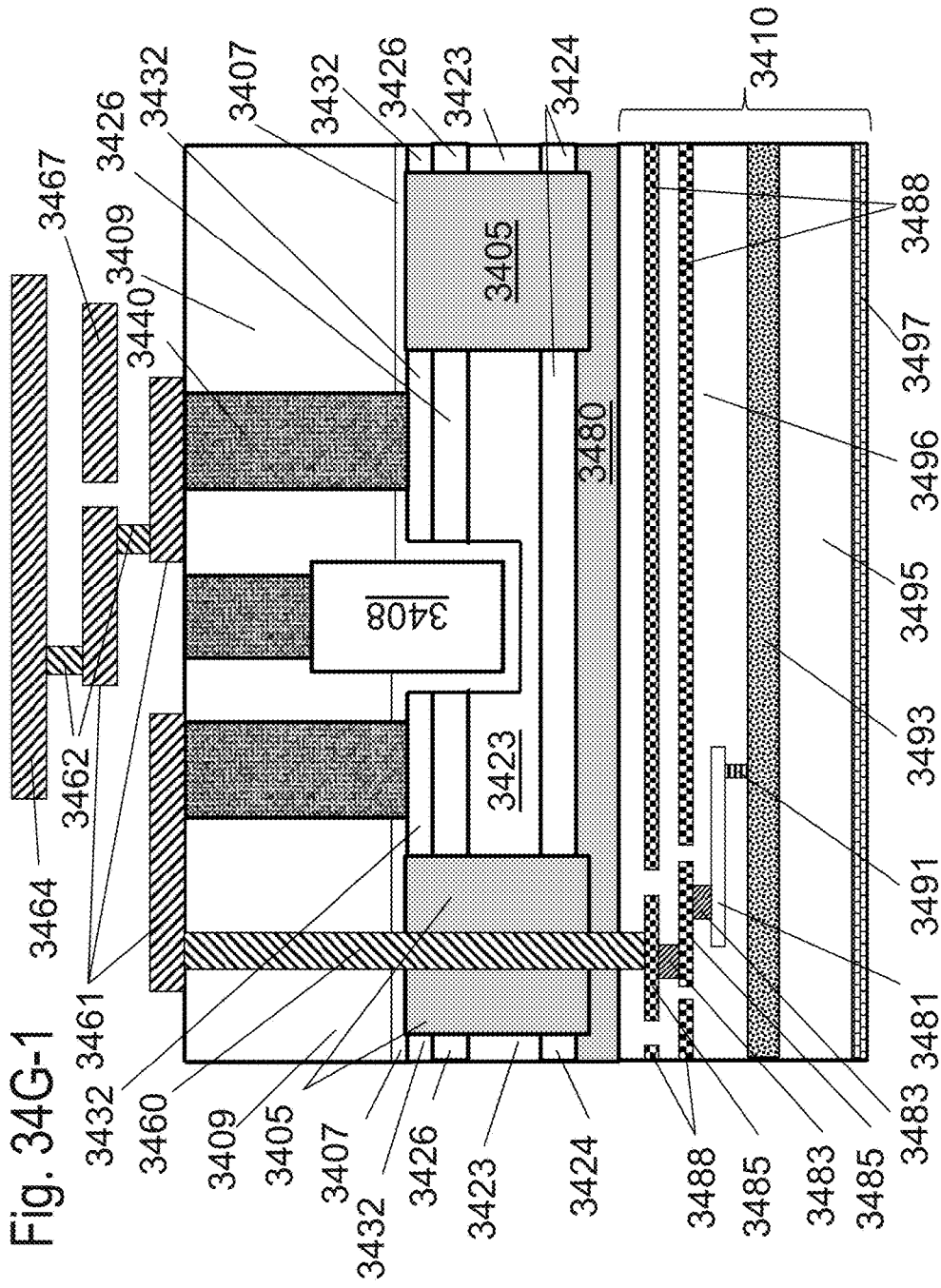

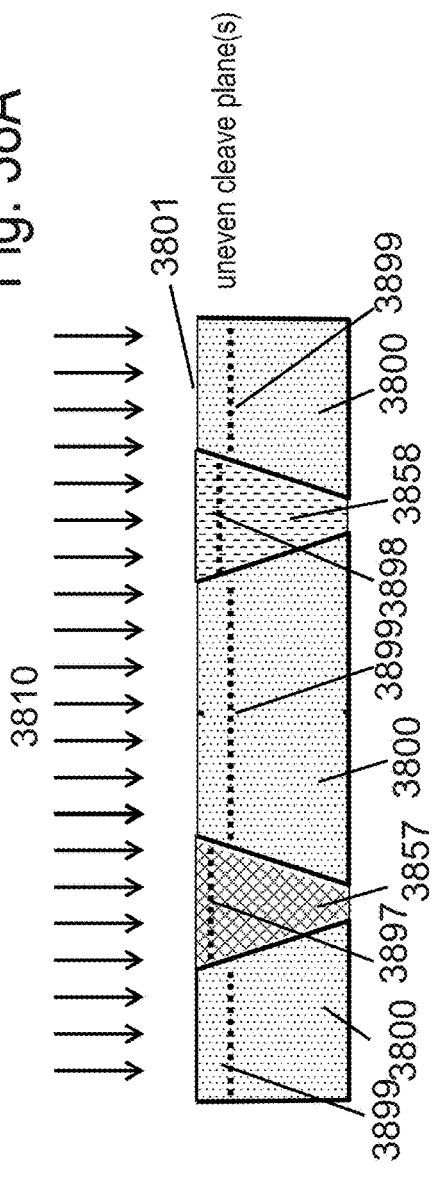
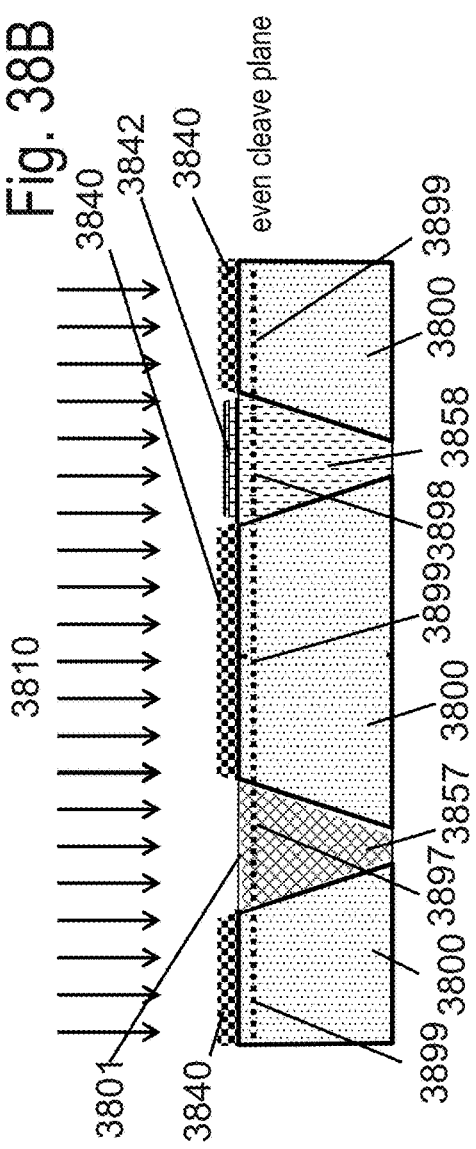

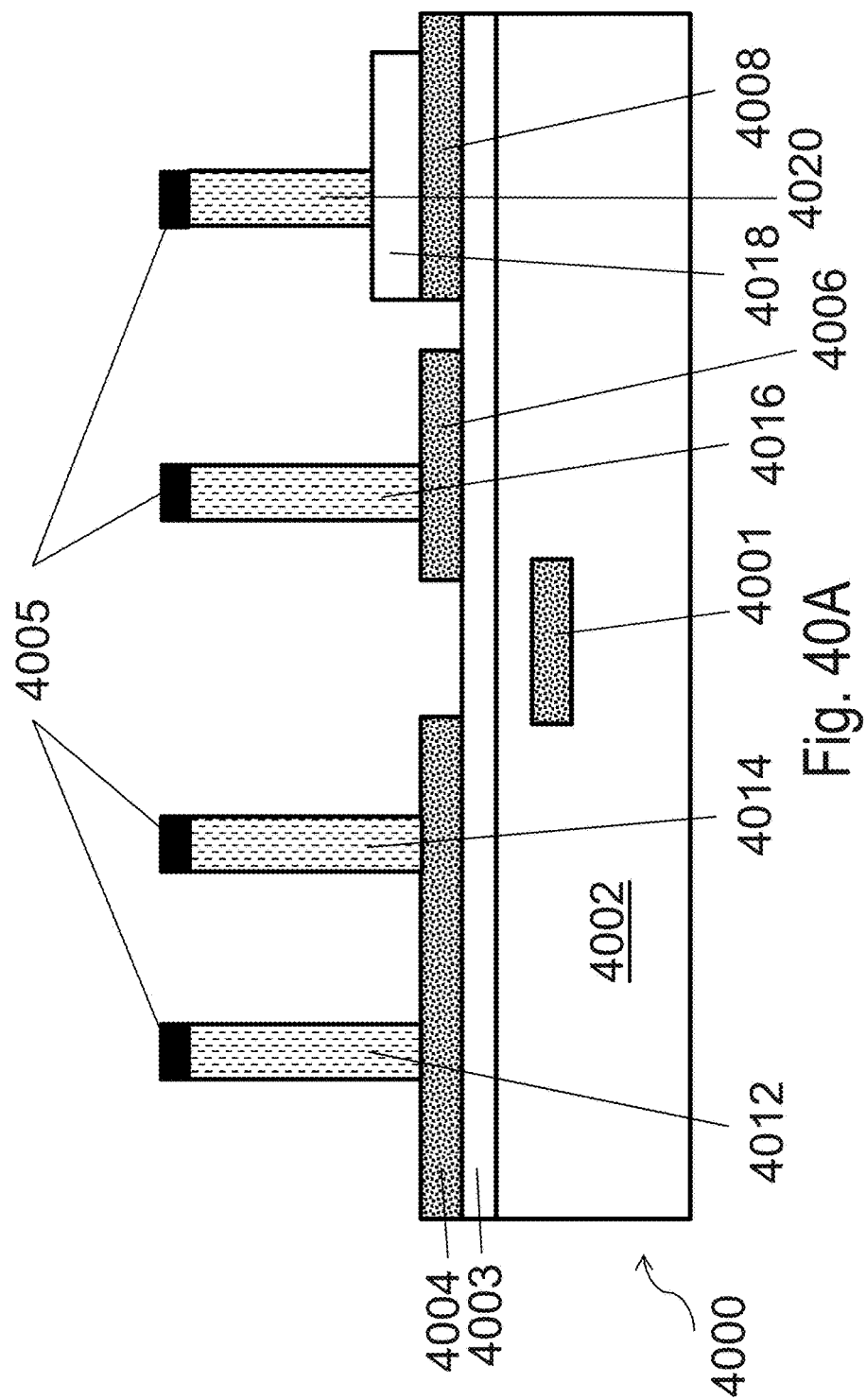

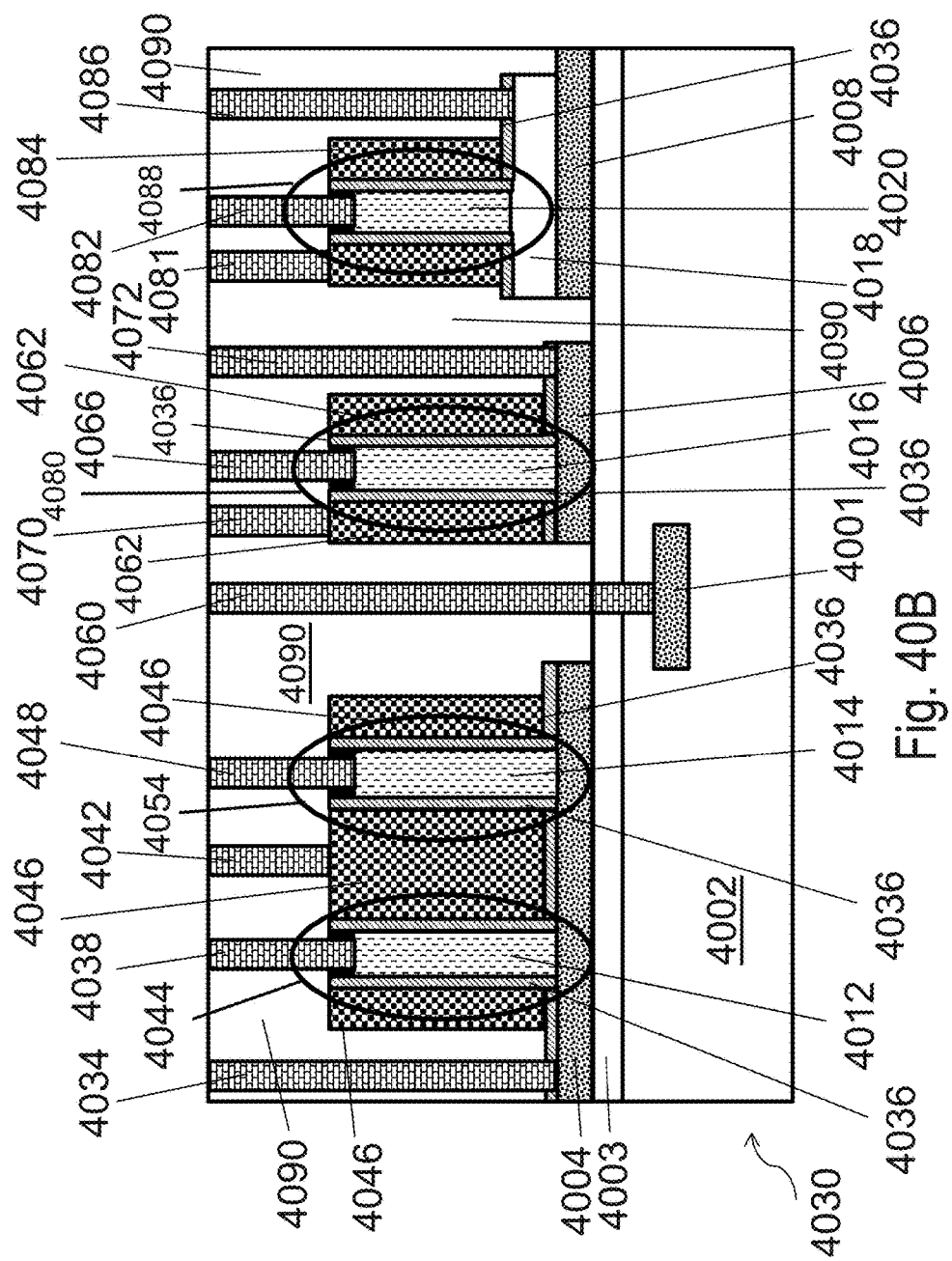

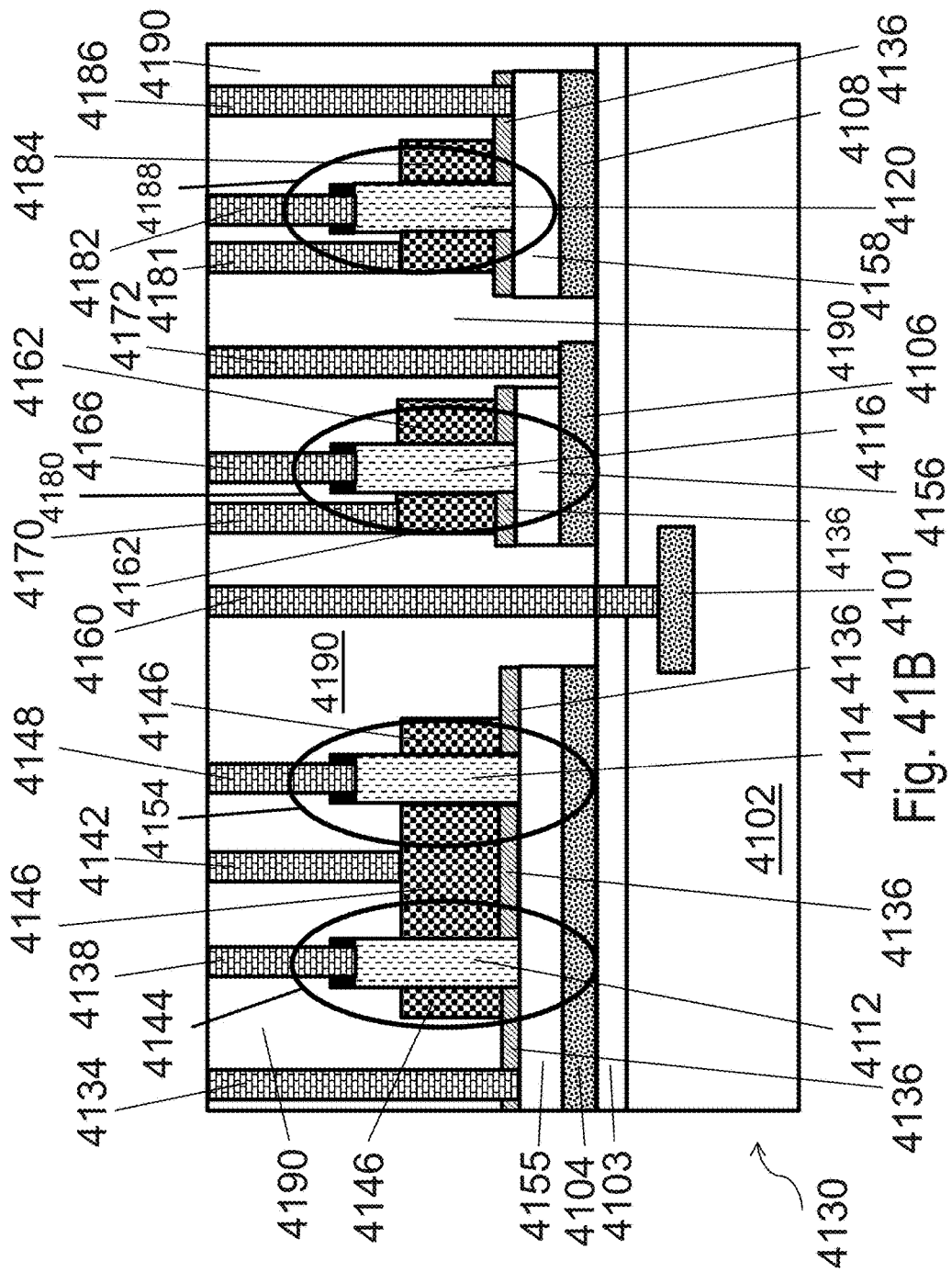

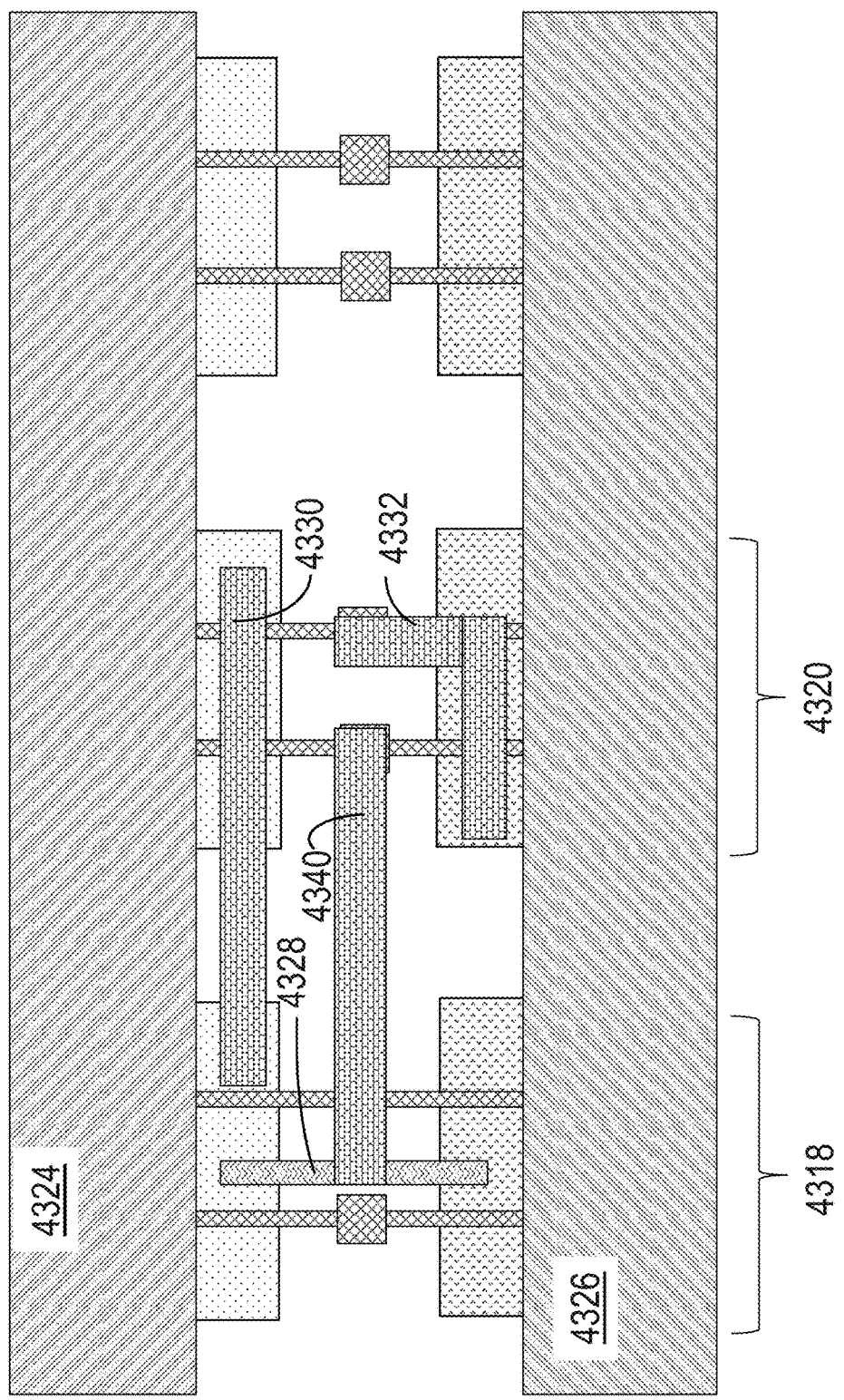

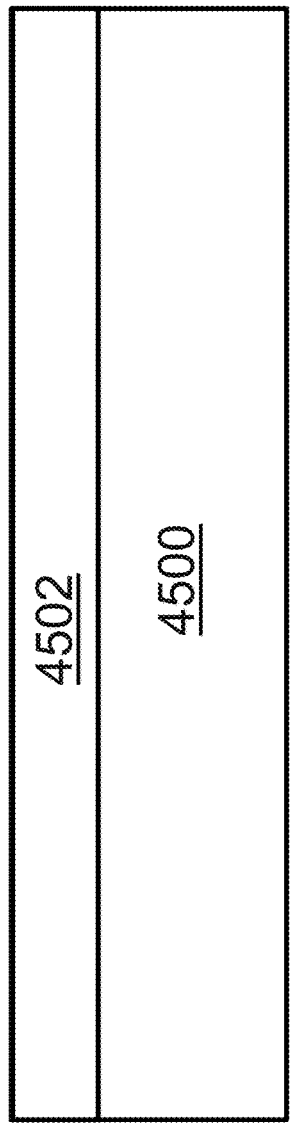
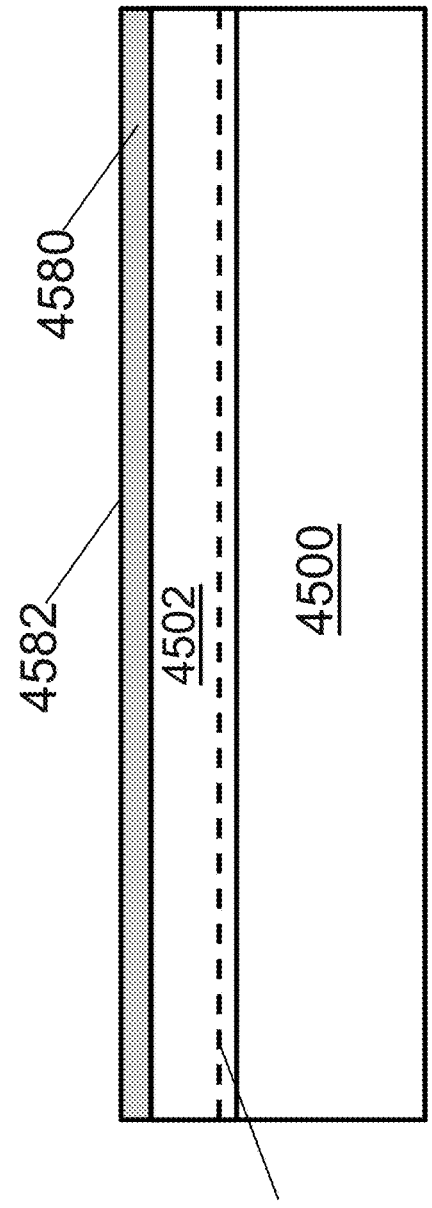
Fig. 45A
Fig. 45B

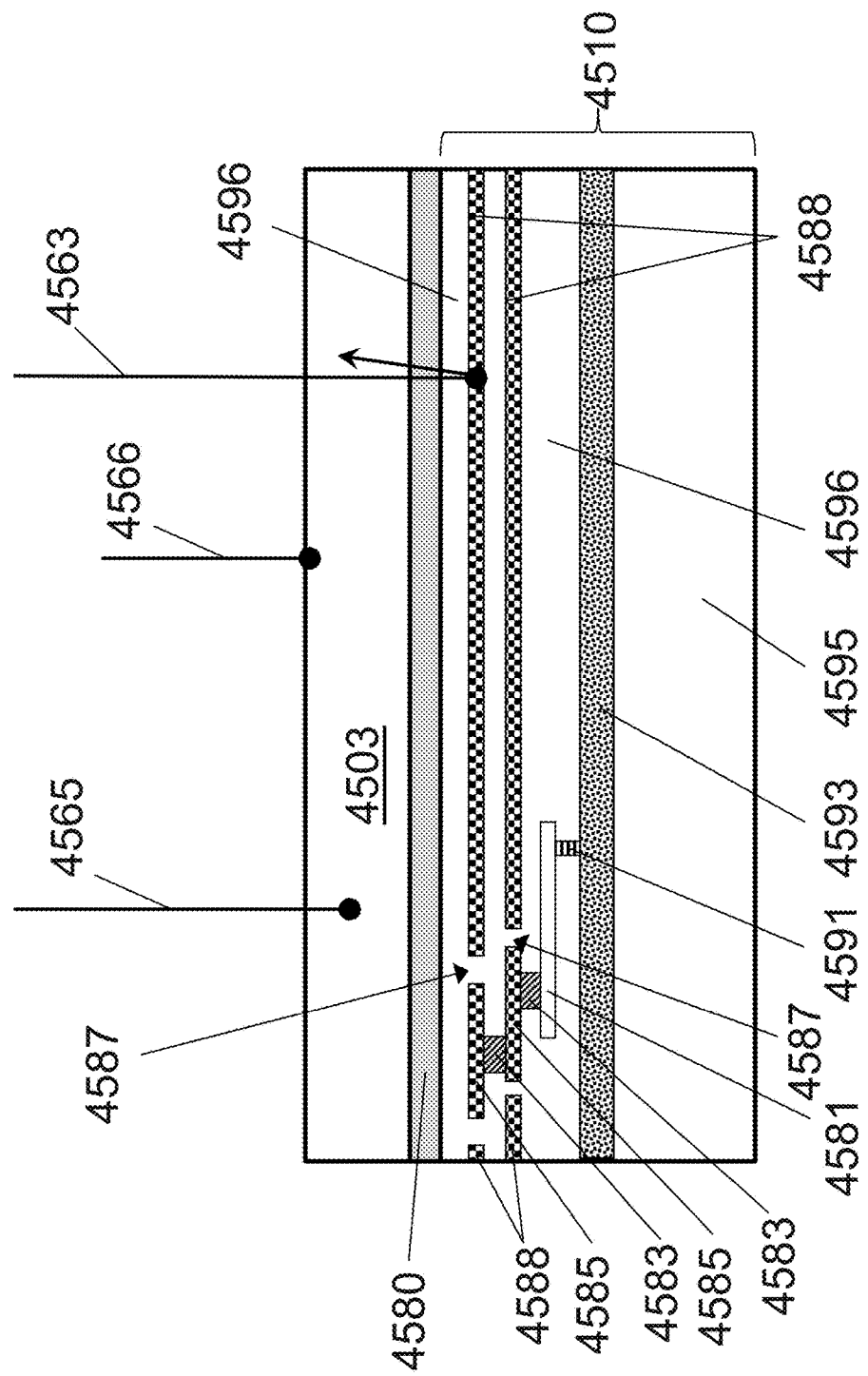

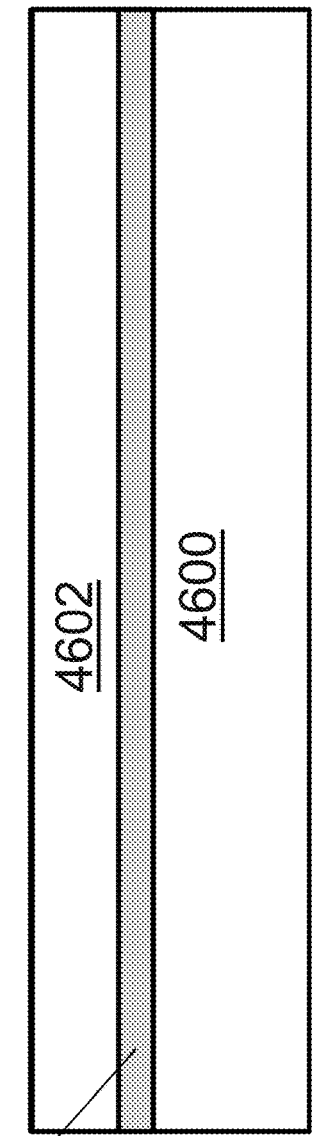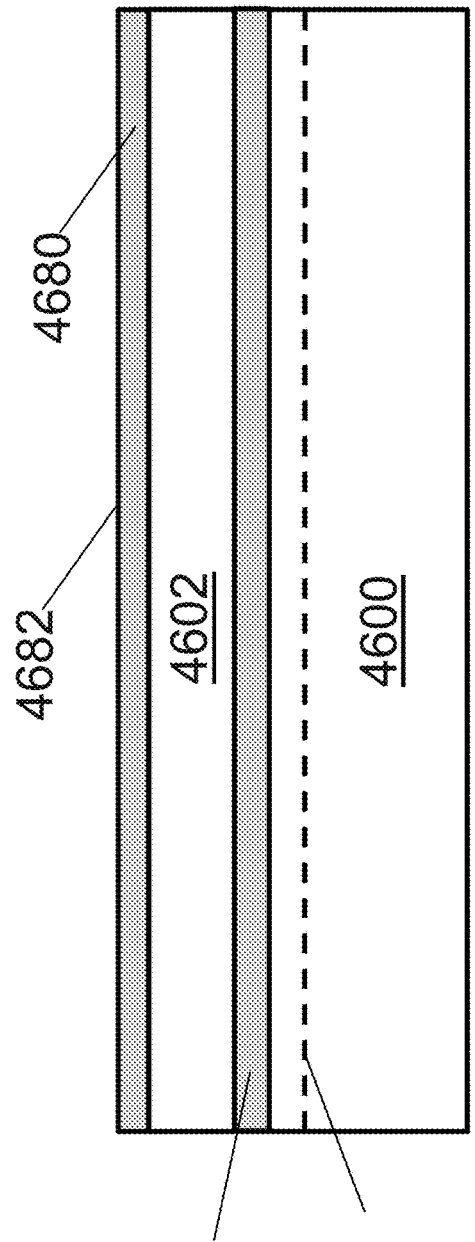

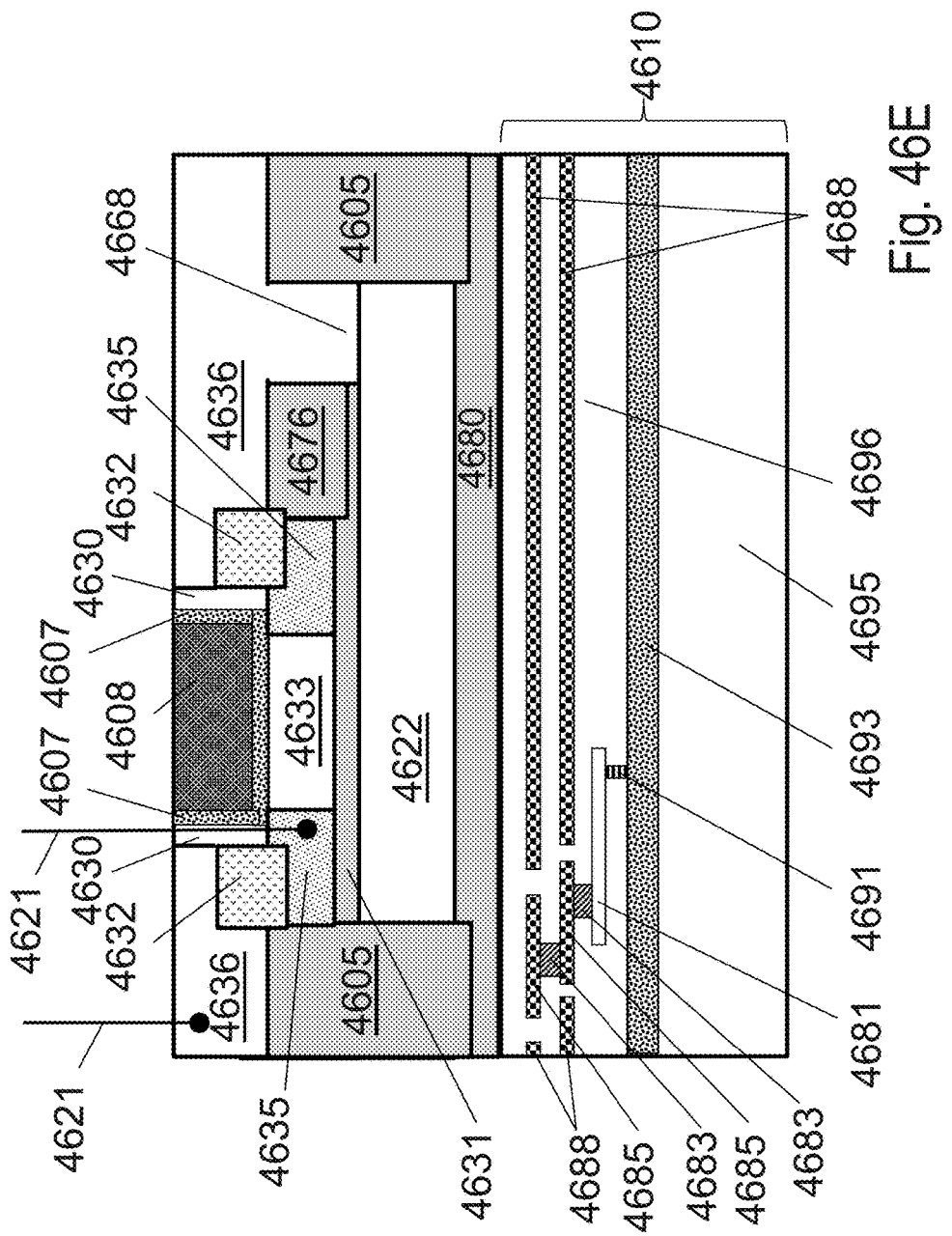

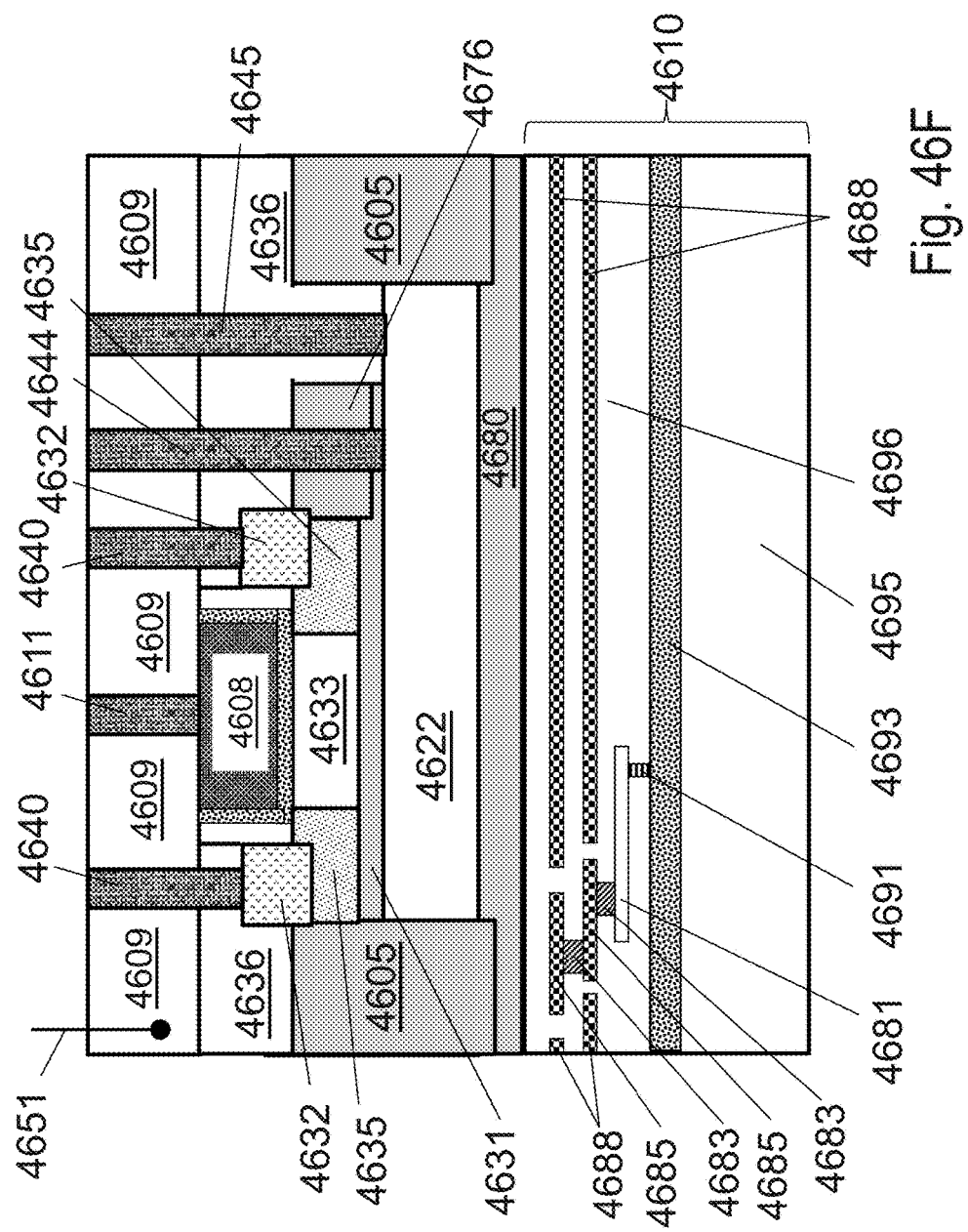

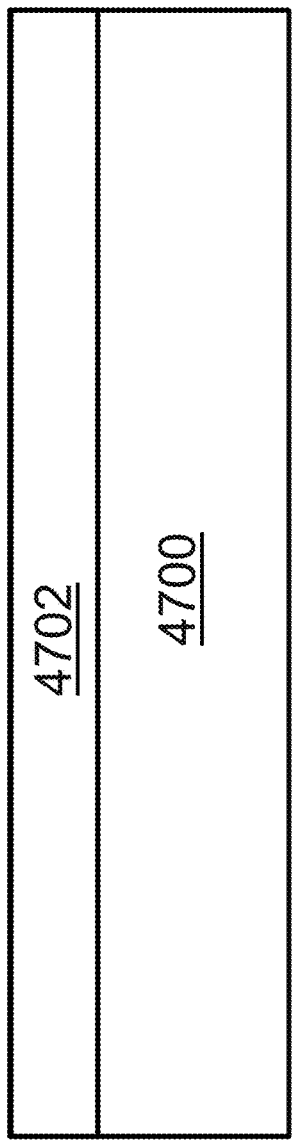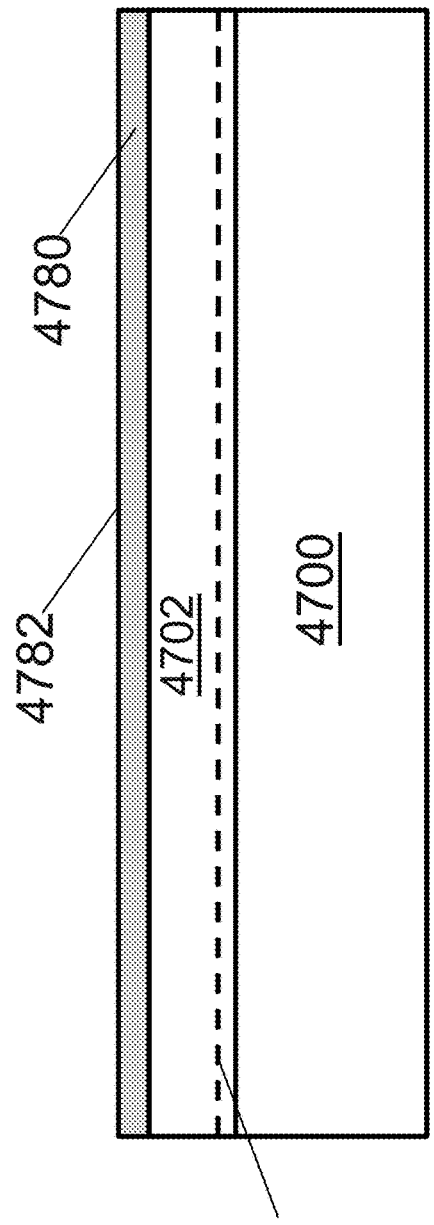

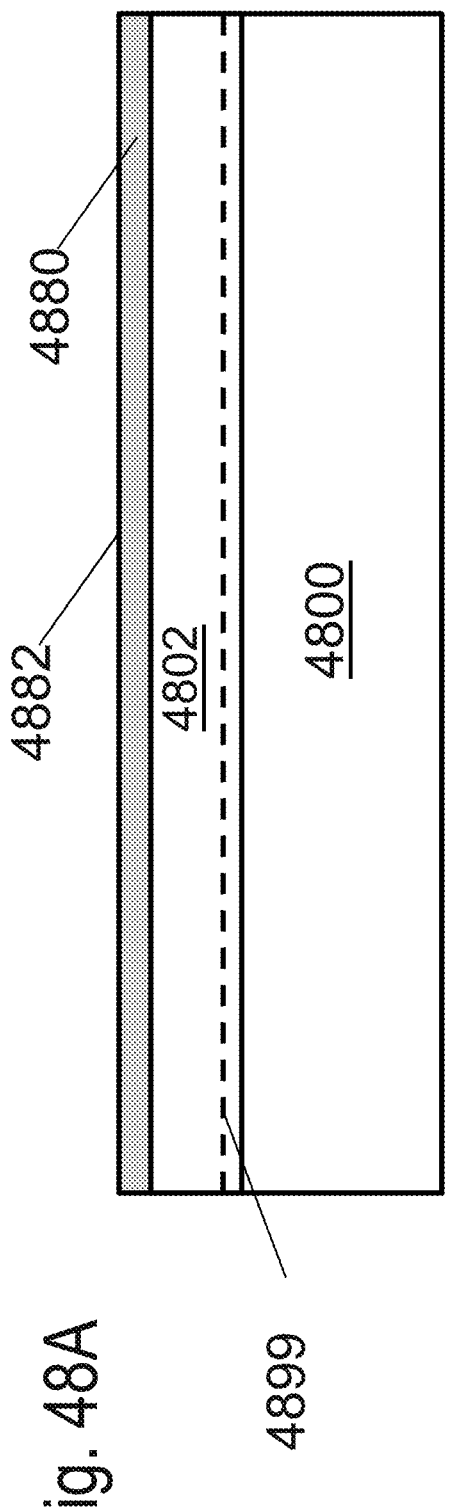

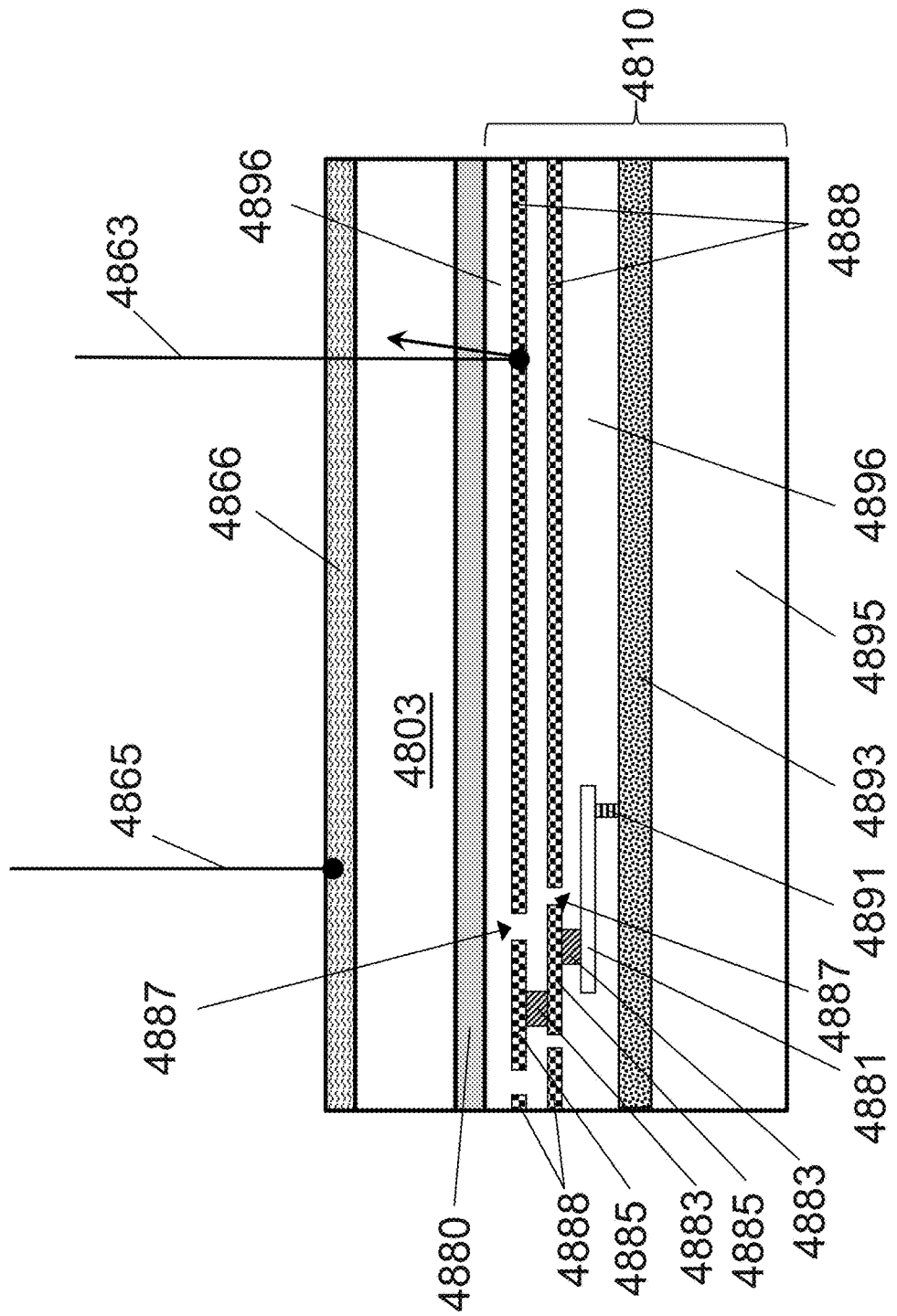

Exposure

The key to uniform intra-device process result is our optical system providing top-hat homogeneity over the whole exposed area. A portfolio of optical solutions is available to respond to the specific needs of each application:

- *Standard Exposure:* full_wafer exposure enabling the highest productivity, especially adapted to power devices applications
- With *Full Device Exposure (FDE),* Excico offers the only solution where the annealed area can be matched and aligned to the device geometry, enabling an overlap-free process critical for products such as Back Side Illuminated CMOS Imaging Sensors (BSI-CIS) or Memory Devices.

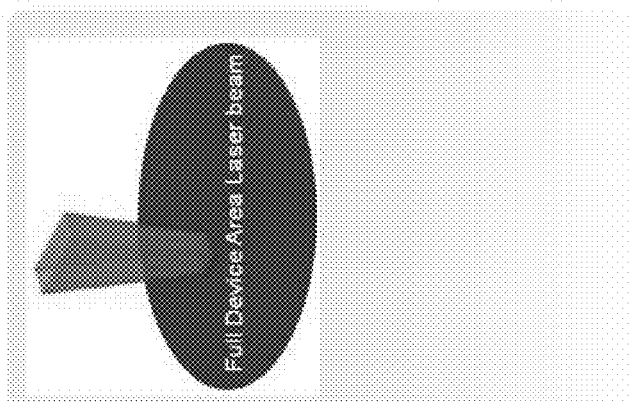

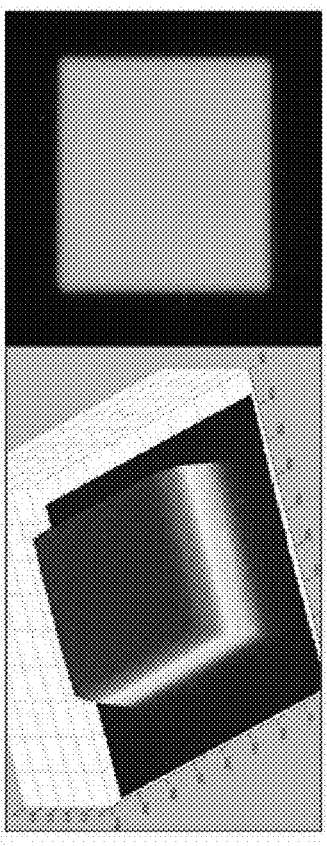

Fig. 49

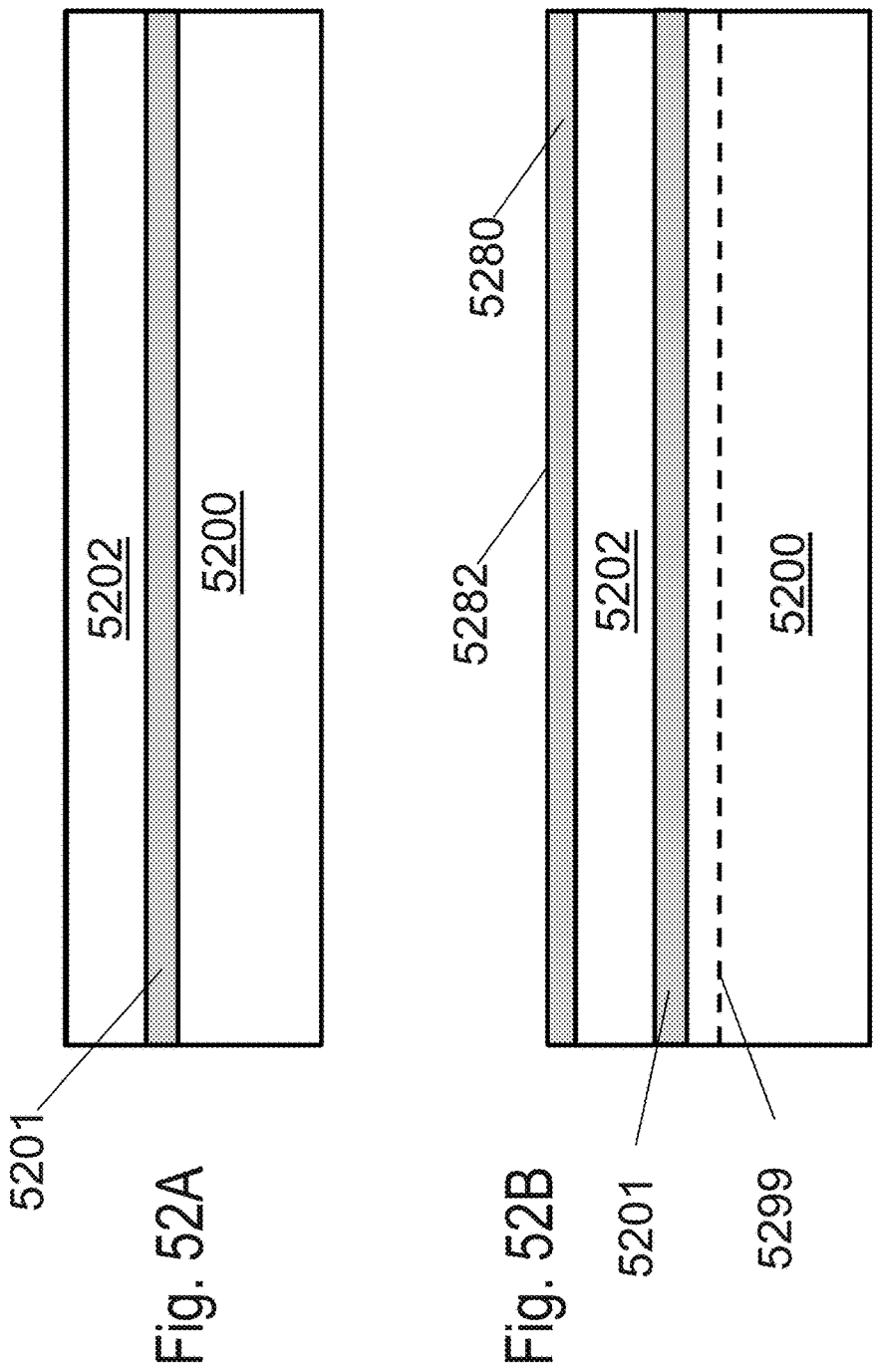

METHOD OF PROCESSING A SEMICONDUCTOR DEVICE

BACKGROUND OF THE INVENTION

1. Field of the Invention

This application relates to the general field of Integrated Circuit (IC) devices and fabrication methods, and more particularly to multilayer or Three Dimensional Integrated Circuit (3D-IC) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D approaches are described in U.S. Pat. No. 8,273,610, US patent publications 2012/0091587 and 2013/0020707, and pending U.S. patent application Ser. No. 13/441,923. The contents of the foregoing applications are incorporated herein by reference.

An early work on monolithic 3D was presented in U.S. Pat. No. 7,052,941 and follow-on work in related patents includes U.S. Pat. No. 7,470,598. A technique which has been used over the last 20 years to build SOI wafers, called "Smart-Cut" or "Ion-Cut", was presented in U.S. Pat. No. 7,470,598 as one of the options to perform layer transfer for the formation of a monolithic 3D device. Yet in a related patent disclosure, by the same inventor of U.S. Pat. No. 7,470,598, U.S. application Ser. No. 12/618,542 it states: "In one embodiment of the previous art, exfoliating implant method in which ion-implanting Hydrogen into the wafer surface is known. But this exfoliating implant method can destroy lattice structure of the doped layer 400 by heavy ion-implanting. In this case, to recover the destroyed lattice structure, a long time thermal treatment in very high temperature is required. This long time/high temperature thermal treatment can severely deform the cell devices of the lower region." Moreover, in U.S. application Ser. No. 12/635,496 by the same inventor is stated: [0034] Among the technologies to form the detaching layer, one of the well known technologies is Hydrogen Exfoliating Implant. This method has a critical disadvantage which can destroy lattice structures of the substrate because it uses high amount of ion implantation. In order to recover the destroyed lattice structures, the substrate should be cured by heat treatment in very high temperature long time. This kind of high temperature heat treatment can damage cell devices in the lower regions." Furthermore, in U.S. application Ser. No. 13/175,652 it is stated: "Among the technologies to form the detaching layer 207, one technology is called as exfoliating implant in which gas phase ions such as hydrogen is implanted to form the detaching layer, but in this technology, the crystal lattice structure of the multiple doped layers 201, 203, 205 can be damaged. In order to recover the crystal lattice damage, a thermal treatment under very high temperature and long time should be performed, and this can strongly damage the cell devices underneath." In fact the Inventor had posted a video infomercial on his corporate website, and was up-loaded on YouTube on Jun. 1, 2011, clearly stating in reference to the Smart Cut process: "The wafer bonding and detaching method is well-known SOI or Semiconductor-On-Insulator technology. Compared to conventional bulk semiconductor substrates, SOI has been introduced to increase transistor performance. However, it is not designed for 3D IC either. Let me explain the reasons . . . . The dose of hydrogen is too high and, therefore, semiconductor crystalline lattices are demolished by the hydrogen ion bombardment during the hydrogen ion implantation. Therefore, typically annealing at more than 1,100 Celsius is required for curing the lattice damage after wafer detaching. Such high temperature processing certainly destroys underlying devices and interconnect layers. Without high temperature annealing, the transferred layer should be the same as a highly defective amorphous layer. It seems that there is no way to cure the lattice damage at low temperatures. BeSang has disruptive 3D layer formation technology and it enables formation of defect-free single crystalline semiconductor layer at low temperatures . . . ."

In at least one embodiment presented herein, an innovative method to repair the crystal lattice damage caused by the hydrogen implant is described.

Regardless of the technique used to construct 3D stacked integrated circuits or chips, heat removal is a serious issue for this technology. For example, when a layer of circuits with power density P is stacked atop another layer with power density P, the net power density is 2P. Removing the heat produced due to this power density is a significant challenge. In addition, many heat producing regions in 3D stacked integrated circuits or chips have a high thermal resistance to the heat sink, and this makes heat removal even more difficult.

Several solutions have been proposed to tackle this issue of heat removal in 3D stacked integrated circuits and chips. These are described in the following paragraphs.

Publications have suggested passing liquid coolant through multiple device layers of a 3D-IC to remove heat. This is described in "Microchannel Cooled 3D Integrated Systems", Proc. Intl. Interconnect Technology Conference, 2008 by D. C. Sekar, et al., and "Forced Convective Interlayer Cooling in Vertically Integrated Packages," Proc. Intersoc. Conference on Thermal Management (ITHERM), 2008 by T. Brunschweiler, et al.

Thermal vias have been suggested as techniques to transfer heat from stacked device layers to the heat sink. Use of power and ground vias for thermal conduction in 3D-ICs has also been suggested. These techniques are described in "Allocating Power Ground Vias in 3D ICs for Simultaneous Power and Thermal Integrity" ACM Transactions on Design Automation of Electronic Systems (TODAES), May 2009 by Hao Yu, Joanna Ho and Lei He.

Other techniques to remove heat from 3D Integrated Circuits and Chips will be beneficial.

Additionally the 3D technology according to some embodiments of the invention may enable some very innovative IC alternatives with reduced development costs, increased yield, and other illustrative benefits.

SUMMARY

The invention may be directed to multilayer or Three Dimensional Integrated Circuit (3D IC) devices and fabrication methods.

In one aspect, an Integrated Circuit device, comprising: a base wafer comprising first electronic circuits, said first electronic circuits comprising a plurality of first single crystal transistors; at least one metal layer providing interconnection between said plurality of first single crystal transistors; and a second layer on a plane comprising second electronic circuits, said second electronic circuits comprising a plurality of second single crystal transistors, said second layer overlying said at least one metal layer; wherein said second single crystal transistors are aligned to said first single crystal transistors; wherein a portion of said first electronic circuits is circumscribed by a first dice lane of at least 10 microns width, and there are no conductive connections to said portion of said first electronic circuits that cross said first dice lane; wherein a portion of said second electronic circuits is circumscribed by a second dice lane of at least 10 microns width, and there are no conductive connections to said portion of said second electronic circuits that cross said second dice lane, and wherein said second dice lane is overlaying and aligned to said first dice lane.

In another aspect, an Integrated Circuit device, comprising: a base wafer comprising a plurality of first single crystal transistors; at least one metal layer providing interconnection between said plurality of first single crystal transistors; at least one shielding layer overlying said at least one metal layer; and a second layer of less than 2 micron thickness, said second layer on a plane and comprising a plurality of second single crystal transistors, said second layer overlying said at least one shielding layer; wherein said at least one shielding layer is constructed to provide at least 2 times higher heat conduction in the horizontal direction than in the vertical direction.

In another aspect, an Integrated Circuit device comprising: a base wafer comprising a plurality of first single crystal transistors, wherein said base wafer comprises a bulk body; at least one metal layer providing interconnection between said plurality of first single crystal transistors; at least one shielding layer overlying said at least one metal layer; a second layer of less than 2 micron thickness, said second layer on a plane and comprising a plurality of second single crystal transistors, said second layer overlying said at least one shielding layer; and at least one heat conduction path from said at least one shielding layer to said bulk body.

In another aspect, a method for processing a 3D semiconductor device, the method comprising: processing a first layer comprising first transistors, forming a first power distribution grid to provide power to said first transistors, processing a second layer overlying said first transistors and comprising second transistors, wherein said second transistors are aligned to said first transistors, forming a second power distribution grid overlaying said second transistors, wherein said first power distribution grid comprises first power conductors and said second power distribution grid comprises second power conductors, and wherein said second power conductors are substantially wider or thicker than said first power conductors, and wherein said device comprises a plurality of vias to connect said second power distribution grid to said first power distribution grid.

In another aspect, a method for processing a 3D semiconductor device: processing a first layer comprising first transistors, processing a second layer overlying said first transistors and comprising second transistors, wherein said second transistors are aligned to said first transistors, depositing amorphous silicon over said second transistors, and annealing said amorphous silicon using optical annealing to crystallize at least a portion of said amorphous silicon.

In another aspect, a method for processing a 3D semiconductor device: processing a first layer comprising first transistors, processing a second layer overlying said first transistors and comprising second transistors, wherein said second transistors are aligned to said first transistors, depositing an oxide isolation layer over said second layer, and annealing said oxide using optical annealing to improve the properties of said oxide.

BRIEF DESCRIPTION OF THE DRAWINGS

Various embodiments of the invention will be understood and appreciated more fully from the following detailed description, taken in conjunction with the drawings in which:

FIG. 17A-17D is an exemplary process flow for constructing recessed channel transistors with thermal contacts;

FIG. 26A-26F are exemplary drawing illustrations of a process flow for manufacturing junction-less recessed channel array transistors;

FIG. 27A-27C are exemplary drawing illustrations of Silicon or Oxide-Compound Semiconductor hetero donor or acceptor substrates which may be formed by utilizing an engineered substrate;

FIGS. 29A-29G, 29G-1, 29H are exemplary drawing illustrations of a process flow to form a closely coupled but independently optimized silicon and compound semiconductor device stack;

FIGS. 30A-30C are exemplary drawing illustrations of a partitioning of a circuit design into three layers of a 3D-IC;

FIG. 31 is an exemplary drawing illustration of a carrier substrate with an integrated heat sink/spreader and/or optically reflective layer;

FIGS. 32A-32F are exemplary drawing illustrations of a process flow for manufacturing fully depleted Recessed Channel Array Transistors (FD-RCAT);

FIGS. 33A-33B, 33B-1, 33C-33F are exemplary drawing illustrations of the integration of a shield/heat sink layer in a 3D-IC;

FIGS. 34A-34G, 34G-1 are exemplary drawing illustrations of a process flow for manufacturing fully depleted Recessed Channel Array Transistors (FD-RCAT) with an integrated shield/heat sink layer;

FIGS. 38A-38B are exemplary drawing illustrations of techniques to successfully ion-cut a silicon/compound-semiconductor hybrid substrate;

FIGS. 40A-40B are exemplary drawing illustrations of the formation of a vertically oriented JFET;

FIGS. 41A-41B are exemplary drawing illustrations of the formation of a vertically oriented junction-less transistor (JLT);

FIGS. 43A-43B are exemplary drawing illustrations of at least one layer of connections under a transistor layer and over a transistor layer, and macro-cell formation;

FIGS. 45A-45G, 45G-1 are exemplary drawing illustrations of a process flow for manufacturing fully depleted MOSFET (FD-MOSFET) with an integrated shield/heat sink layer;

FIGS. 46A-46G are exemplary drawing illustrations of another process flow for manufacturing fully depleted MOSFET (FD-MOSFET) with an integrated shield/heat sink layer;

FIGS. 47A-47E, 47E-1, 47F, 47G are exemplary drawing illustrations of a process flow for manufacturing horizontally oriented JFET or JLT with an integrated shield/heat sink layer;

FIGS. 48A-48B are exemplary drawing illustrations of a process flow for manufacturing a crystallized layer suitable for forming transistors;

FIG. 49 is an exemplary illustration of a laser annealing machine's output that may form a large rectangular window of uniform laser energy;

FIGS. 52A-52F are exemplary drawing illustrations of an additional process flow for manufacturing fully depleted MOSFET (FD-MOSFET) with an integrated shield/heat sink layer.

DETAILED DESCRIPTION

Figure 1:
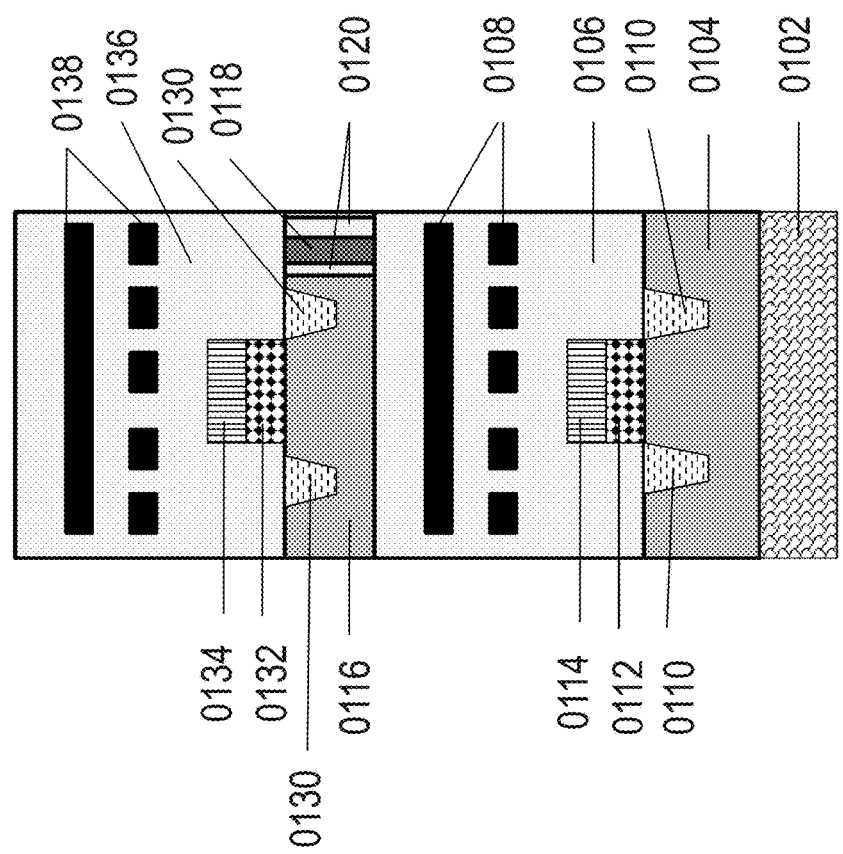
FIG. 1 is an exemplary drawing illustration of a 3D integrated circuit.

An embodiment of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

FIG. 1 illustrates a 3D integrated circuit. Two crystalline layers, 0104 and 0116, which may include semiconductor materials such as, for example, mono-crystalline silicon, germanium, GaAs, InP, and graphene, are shown. For this illustration, mono-crystalline (single crystal) silicon may be used. Silicon layer 0116 could be thinned down from its original thickness, and its final thickness could be in the range of about 0.01 um to about 50 um, for example, 10 nm, 100 nm, 200 nm, 0.4 um, 1 um, 2 um or 5 um. Silicon layer 0104 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0104 may also be of thicknesses greater than 100 um, depending on, for example, the strength of bonding to heat removal apparatus 0102. Silicon layer 0104 may include transistors such as, for example, MOSFETS, FinFets, BJTs, HEMTs, HBTs, which may include gate electrode region 0114, gate dielectric region 0112, source and drain junction regions (not shown), and shallow trench isolation (STI) regions 0110. Silicon layer 0116 may include transistors such as, for example, MOSFETS, FinFets, BJTs, HEMTs, HBTs, which may include gate electrode region 0134, gate dielectric region 0132, source and drain junction regions (not shown), and shallow trench isolation (STI) regions 0130. A through-silicon via (TSV) 0118 could be present and may have an associated surrounding dielectric region 0120. Wiring layers 0108 for silicon layer 0104 and wiring dielectric regions 0106 may be present and may form an associated interconnect layer or layers. Wiring layers 0138 for silicon layer 0116 and wiring dielectric 0136 may be present and may form an associated interconnect layer or layers. Through-silicon via (TSV) 0118 may connect to wiring layers 0108 and wiring layers 0138 (not shown). The heat removal apparatus 0102 may include a heat spreader and/or a heat sink. The heat removal problem for the 3D integrated circuit shown in FIG. 1 is immediately apparent. The silicon layer 0116 is far away from the heat removal apparatus 0102, and it may be difficult to transfer heat among silicon layer 0116 and heat removal apparatus 0102. Furthermore, wiring dielectric regions 0106 may not conduct heat well, and this increases the thermal resistance among silicon layer 0116 and heat removal apparatus 0102. Silicon layer 0104 and silicon layer 0116 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0102 may include an external surface from which heat transfer may take place by methods such as air cooling, liquid cooling, or attachment to another heat sink or heat spreader structure.

It should be noted that while in general a heat sink may be an extra heat conducting element bonded with good heat conductivity (or made to be in contact with) to the back side of the base layer or substrate, such as for example, mono-crystalline bulk silicon or the bulk substrate of an SOI wafer, in many cases the base layer itself could be an effective heat sink. For example, many silicon wafers are many hundreds of microns thick before extra thinning or back-grinding, and has a relatively high heat capacity in comparison to the transistor layer, which may be less than one micron thick. Accordingly the heat sink structure for some devices discussed herein might be the bulk substrate or base layer itself. In addition, when the term 'bulk body' is used herein, it may refer to the base layer or substrate such as a mono-crystalline bulk silicon substrate or the bulk substrate of an SOI wafer, such that the bulk body has a greater heat capacity than the 3D layer/region structure to which it is thermally connected. Of course, the bulk body may additionally be connected to a heat sink.

Figure 2:
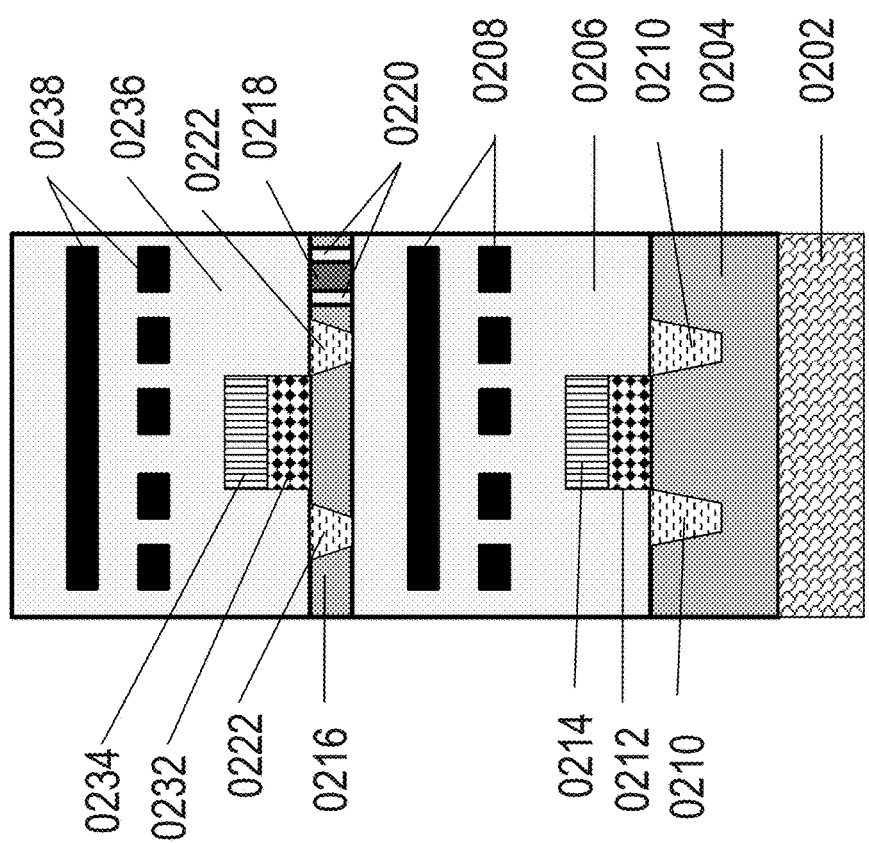
FIG. 2 is an exemplary drawing illustration of another 3D integrated circuit.

FIG. 2 illustrates an exemplary 3D integrated circuit that could be constructed, for example, using techniques described in U.S. Pat. No. 8,273,610, US patent publications 2012/0091587 and 2013/0020707, and pending U.S. patent application Ser. Nos. 13/441,923 and 13/099,010. The contents of the foregoing patent and applications are incorporated herein by reference. Two crystalline layers, 0204 and 0216, which may include semiconductor materials such as, for example, mono-crystalline silicon, germanium, GaAs, InP, and graphene, are shown. For this illustration, mono-crystalline (single crystal) silicon may be used. Silicon layer 0216 could be thinned down from its original thickness, and its final thickness could be in the range of about 0.01 um to about 50 um, for example, 10 nm, 100 nm, 200 nm, 0.4 um, 1 um, 2 um or 5 um. Silicon layer 0204 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0204 may also be of thicknesses greater than 100 um, depending on, for example, the strength of bonding to heat removal apparatus 0202. Silicon layer 0204 may include transistors such as, for example, MOSFETS, FinFets, BJTs, HEMTs, HBTs, which may include gate electrode region 0214, gate dielectric region 0212, source and drain junction regions (not shown for clarity) and shallow trench isolation (STI) regions 0210. Silicon layer 0216 may include transistors such as, for example, MOSFETS, FinFets, BJTs, HEMTs, HBTs, which may include gate electrode region 0234, gate dielectric region 0232, source and drain junction regions (not shown for clarity), and shallow trench isolation (STI) regions 0222. It can be observed that the STI regions 0222 can go right through to the bottom of silicon layer 0216 and provide good electrical isolation. This, however, may cause challenges for heat removal from the STI surrounded transistors since STI regions 0222 are typically composed of insulators that do not conduct heat well. Therefore, the heat spreading capabilities of silicon layer 0216 with STI regions 0222 are low. A through-layer via (TLV) 0218 may be present and may include an associated surrounding dielectric region 0220. Wiring layers 0208 for silicon layer 0204 and wiring dielectric regions 0206 may be present and may form an associated interconnect layer or layers. Wiring layers 0238 for silicon layer 0216 and wiring dielectric 0236 may be present and may form an associated interconnect layer or layers. Through-layer via (TLV) 0218 may connect to wiring layers 0208 and wiring layers 0238 (not shown). The heat removal apparatus 0202 may include a heat spreader and/or a heat sink. The heat removal problem for the 3D integrated circuit shown in FIG. 2 is immediately apparent. The silicon layer 0216 may be far away from the heat removal apparatus 0202, and it may be difficult to transfer heat among silicon layer 0216 and heat removal apparatus 0202. Furthermore, wiring dielectric regions 0206 may not conduct heat well, and this increases the thermal resistance among silicon layer 0216 and heat removal apparatus 0202. The heat removal challenge is further exacerbated by the poor heat spreading properties of silicon layer 0216 with STI regions 0222. Silicon layer 0204 and silicon layer 0216 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0202 may include an external surface from which heat transfer may take place by methods such as air cooling, liquid cooling, or attachment to another heat sink or heat spreader structure.

Figure 3:
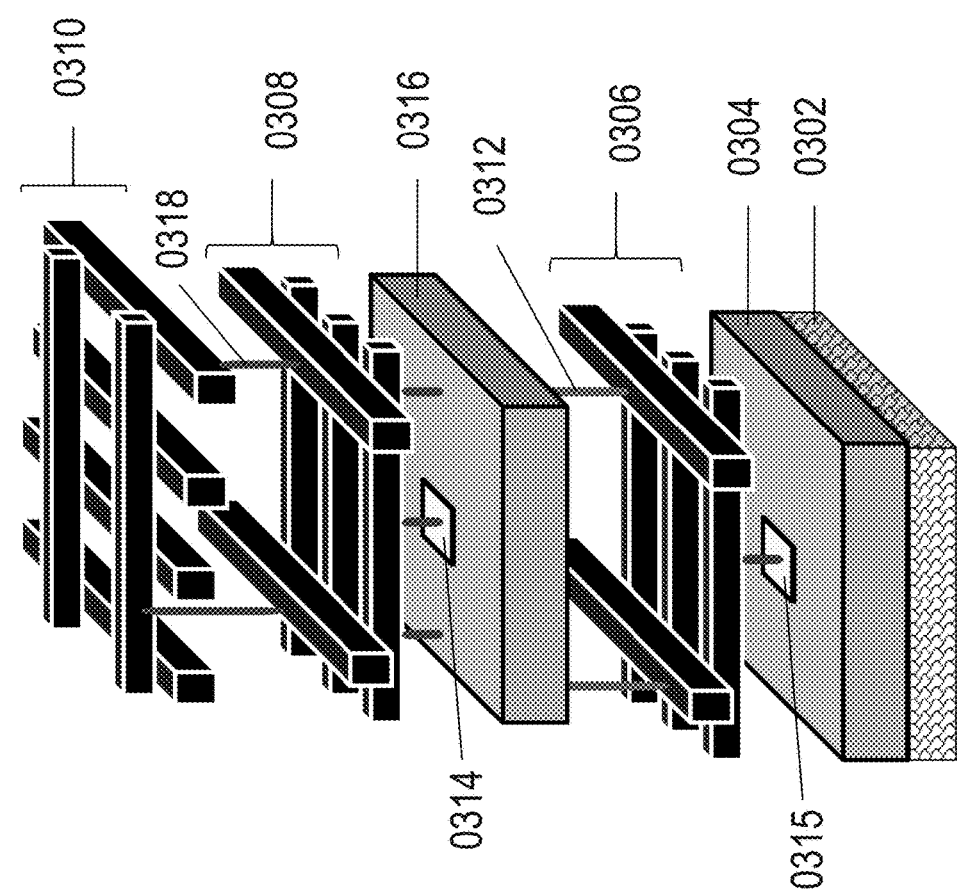
FIG. 3 is an exemplary drawing illustration of the power distribution network of a 3D integrated circuit.
Figure 4:
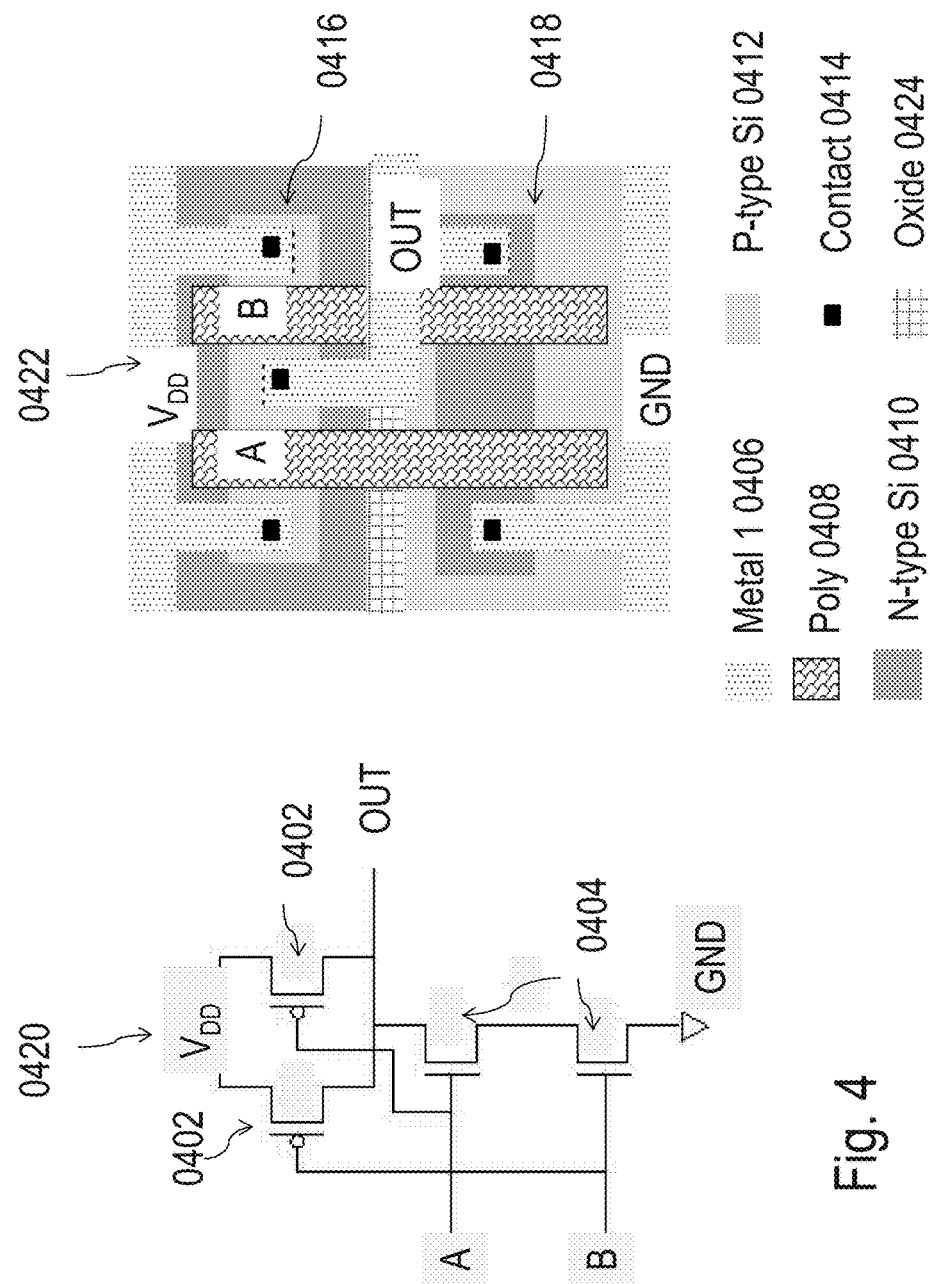
FIG. 4 is an exemplary drawing illustration of a NAND gate.

FIG. 3 and FIG. 4 illustrate how the power or ground distribution network of a 3D integrated circuit could assist heat removal. FIG. 3 illustrates an exemplary power distribution network or structure of the 3D integrated circuit. As shown in FIGS. 1 and 2, a 3D integrated circuit, could, for example, be constructed with two silicon layers, first silicon layer 0304 and second silicon layer 0316. The heat removal apparatus 0302 could include, for example, a heat spreader and/or a heat sink. The power distribution network or structure could consist of a global power grid 0310 that takes the supply voltage (denoted as $V_{DD}$) from the chip/circuit power pads and transfers $V_{DD}$ to second local power grid 0308 and first local power grid 0306, which transfers the supply voltage to logic/memory cells, transistors, and/or gates such as second transistor 0314 and first transistor 0315. Second layer vias 0318 and first layer vias 0312, such as the previously described TSV or TLV, could be used to transfer the supply voltage from the global power grid 0310 to second local power grid 0308 and first local power grid 0306. The global power grid 0310 may also be present among first silicon layer 0304 and second silicon layer 0316. The 3D integrated circuit could have a similarly designed and laid-out distribution networks, such as for ground and other supply voltages, as well. The power grid may be designed and constructed such that each layer or strata of transistors and devices may be supplied with a different value Vdd. For example, first silicon layer 0304 may be supplied by its power grid to have a Vdd value of 1.0 volts and second silicon layer 0316 a Vdd value of 0.8 volts. Furthermore, the global power grid 0310 wires may be constructed with substantially higher current conduction, for example 30% higher, 50% higher, 2× higher, than local power grids, for example, such as first local power grid 0306 wires and second local power grid 0308 wires. The thickness, linewidth, and material composition for the global power grid 0310 wires may provide for the higher current conduction, for example, the thickness of the global power grid 0310 wires may be twice that of the local power grid wires and/or the linewidth of the global power grid 0310 wires may be 2× that of the local power grid wires. Moreover, the global power grid 0310 may be optimally located in the top strata or layer of transistors and devices. Noise on the power grids, such as the Vss and/or Vdd supply grids, may be mitigated by attaching/connecting decoupling capacitors onto the power conducting lines of the grid(s), such as global power grid 0310, first local power grid 0306 wires and second local power grid 0308 wires. The decoupling caps may include, for example, trench capacitors such as described by Pei, C., et al., "A novel, low-cost deep trench decoupling capacitor for high-performance, low-power bulk CMOS applications," ICSICT (9th International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal).

Typically, many contacts may be made among the supply and ground distribution networks and first silicon layer 0304. Due to this, there could exist a low thermal resistance among the power/ground distribution network and the heat removal apparatus 0302. Since power/ground distribution networks may be typically constructed of conductive metals and could have low effective electrical resistance, the power/ground distribution networks could have a low thermal resistance as well. Each logic/memory cell or gate on the 3D integrated circuit (such as, for example, second transistor 0314) is typically connected to $V_{DD}$ and ground, and therefore could have contacts to the power and ground distribution network. The contacts could help transfer heat efficiently (for example, with low thermal resistance) from each logic/memory cell or gate on the 3D integrated circuit (such as, for example, second transistor 0314) to the heat removal apparatus 0302 through the power/ground distribution network and the silicon layer 0304. Silicon layer 0304 and silicon layer 0316 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0302 may include an external surface from which heat transfer may take place by methods such as air cooling, liquid cooling, or attachment to another heat sink or heat spreader structure.

FIG. 4 illustrates an exemplary NAND logic cell or NAND gate 0420 and how substantially all portions of this logic cell or gate could be designed and laid-out with low thermal resistance to the $V_{DD}$ or ground (GND) contacts. The NAND gate 0420 could include two pMOS transistors 0402 and two nMOS transistors 0404. The layout of the NAND gate 0420 is indicated in exemplary layout 0422. Various regions of the layout may include metal regions 0406, poly regions 0408, n type silicon regions 0410, p type silicon regions 0412, contact regions 0414, and oxide regions 0424. pMOS transistors 0416 and nMOS transistors 0418 may be present in the layout. It can be observed that substantially all parts of the exemplary NAND gate 0420 could have low thermal resistance to $V_{DD}$ or GND contacts since they may be physically very close to them, within a few design rule lambdas, wherein lamda is the basic minimum layout rule distance for a given set of circuit layout design rules. Thus, substantially all transistors in the NAND gate 0420 can be maintained at desirable temperatures, such as, for example, less than 25 or 50 or 70 degrees Centigrade, if the $V_{DD}$ or ground contacts are maintained at desirable temperatures.

While the previous paragraph described how an existing power distribution network or structure can transfer heat efficiently from logic/memory cells or gates in 3D-ICs to their heat sink, many techniques to enhance this heat transfer capability will be described herein. Many embodiments of the invention can provide several benefits, including lower thermal resistance and the ability to cool higher power 3D-ICs. As well, thermal contacts may provide mechanical stability and structural strength to low-k Back End Of Line (BEOL) structures, which may need to accommodate shear forces, such as from CMP and/or cleaving processes. The heat transfer capability enhancement techniques may be useful and applied to different methodologies and implementations of 3D-ICs, including monolithic 3D-ICs and TSV-based 3D-ICs. The heat removal apparatus employed, which may include heat sinks and heat spreaders, may include an external surface from which heat transfer may take place by methods such as air cooling, liquid cooling, or attachment to another heat sink or heat spreader structure.

Figure 5:
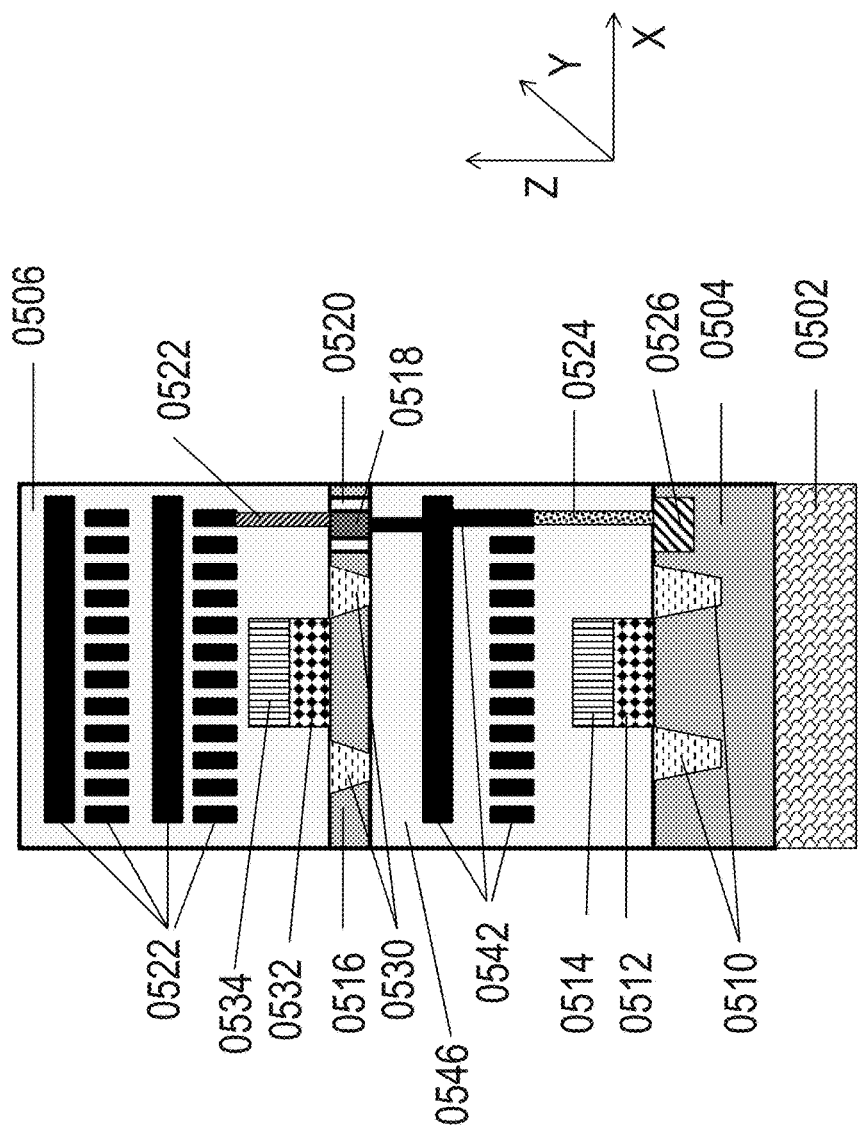
FIG. 5 is an exemplary drawing illustration of a thermal contact concept.

FIG. 5 illustrates an embodiment of the invention, wherein thermal contacts in a 3D-IC is described. The 3D-IC and associated power and ground distribution network may be formed as described in FIGS. 1, 2, 3, and 4 herein. For example, two crystalline layers, 0504 and 0516, which may include semiconductor materials such as, for example, mono-crystalline silicon, germanium, GaAs, InP, and graphene, may have transistors. For this illustration, mono-crystalline (single crystal) silicon may be used. Silicon layer 0516 could be thinned down from its original thickness, and its final thickness could be in the range of about 0.01 um to about 50 um, for example, 10 nm, 100 nm, 200 nm, 0.4 um, 1 um, 2 um or 5 um. Silicon layer 0504 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0504 may also be of thicknesses greater than 100 um, depending on, for example, the strength of bonding to heat removal apparatus 0202. Silicon layer 0504 may include transistors such as, for example, MOSFETS, FinFets, BJTs, HEMTs, HBTs, which may include STI regions 0510, gate dielectric regions 0512, gate electrode regions 0514 and several other regions that may be necessary for transistors such as source and drain junction regions (not shown for clarity). Silicon layer 0516 may include transistors such as, for example, MOSFETS, FinFets, BJTs, HEMTs, HBTs, which may include STI regions 0530, gate dielectric regions 0532, gate electrode regions 0534 and several other regions that may be necessary for transistors such as source and drain junction regions (not shown for clarity). Heat removal apparatus 0502 may include, for example, heat spreaders and/or heat sinks. In the example shown in FIG. 5, silicon layer 0504 is closer to the heat removal apparatus 0502 than other silicon layers such as silicon layer 0516. Wiring layers 0542 for silicon layer 0504 and wiring dielectric 0546 may be present and may form an associated interconnect layer or layers. Wiring layers 0522 for silicon layer 0516 and wiring dielectric 0506 may be present and may form an associated interconnect layer or layers. Through-layer vias (TLVs) 0518 for power delivery and interconnect and their associated dielectric regions 0520 are shown. Dielectric regions 0520 may include STI regions, such as STI regions 0530. A thermal contact 0524 may connect the local power distribution network or structure to the silicon layer 0504. The local power distribution network or structure may include wiring layers 0542 used for transistors in the silicon layer 0504. Thermal junction region 0526 can be, for example, a doped or undoped region of silicon, and further details of thermal junction region 0526 will be given in FIG. 6. The thermal contact 0524 can be suitably placed close to the corresponding through-layer via 0518; this helps transfer heat efficiently as a thermal conduction path from the through-layer via 0518 to thermal junction region 0526 and silicon layer 0504 and ultimately to the heat removal apparatus 0502. For example, the thermal contact 0524 could be located within approximately 2 um distance of the through-layer via 0518 in the X-Y plane (the through-layer via 0518 vertical length direction is considered the Z plane in FIG. 5). While the thermal contact 0524 is described above as being between the power distribution network or structure and the silicon layer closest to the heat removal apparatus, it could also be between the ground distribution network and the silicon layer closest to the heat sink. Furthermore, more than one thermal contact 0524 can be placed close to the through-layer via 0518. The thermal contacts can improve heat transfer from transistors located in higher layers of silicon such as silicon layer 0516 to the heat removal apparatus 0502. While mono-crystalline silicon has been mentioned as the transistor material in this document, other options are possible including, for example, poly-crystalline silicon, mono-crystalline germanium, mono-crystalline III-V semiconductors, graphene, and various other semiconductor materials with which devices, such as transistors, may be constructed within. Moreover, thermal contacts and vias may not be stacked in a vertical line through multiple stacks, layers, strata of circuits. Thermal contacts and vias may include materials such as sp2 carbon as conducting and sp3 carbon as non-conducting of electrical current. Thermal contacts and vias may include materials such as carbon nano-tubes. Thermal contacts and vias may include materials such as, for example, copper, aluminum, tungsten, titanium, tantalum, cobalt metals and/or silicides of the metals. Silicon layer 0504 and silicon layer 0516 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0502 may include an external surface from which heat transfer may take place by methods such as air cooling, liquid cooling, or attachment to another heat sink or heat spreader structure.

Figure 6:
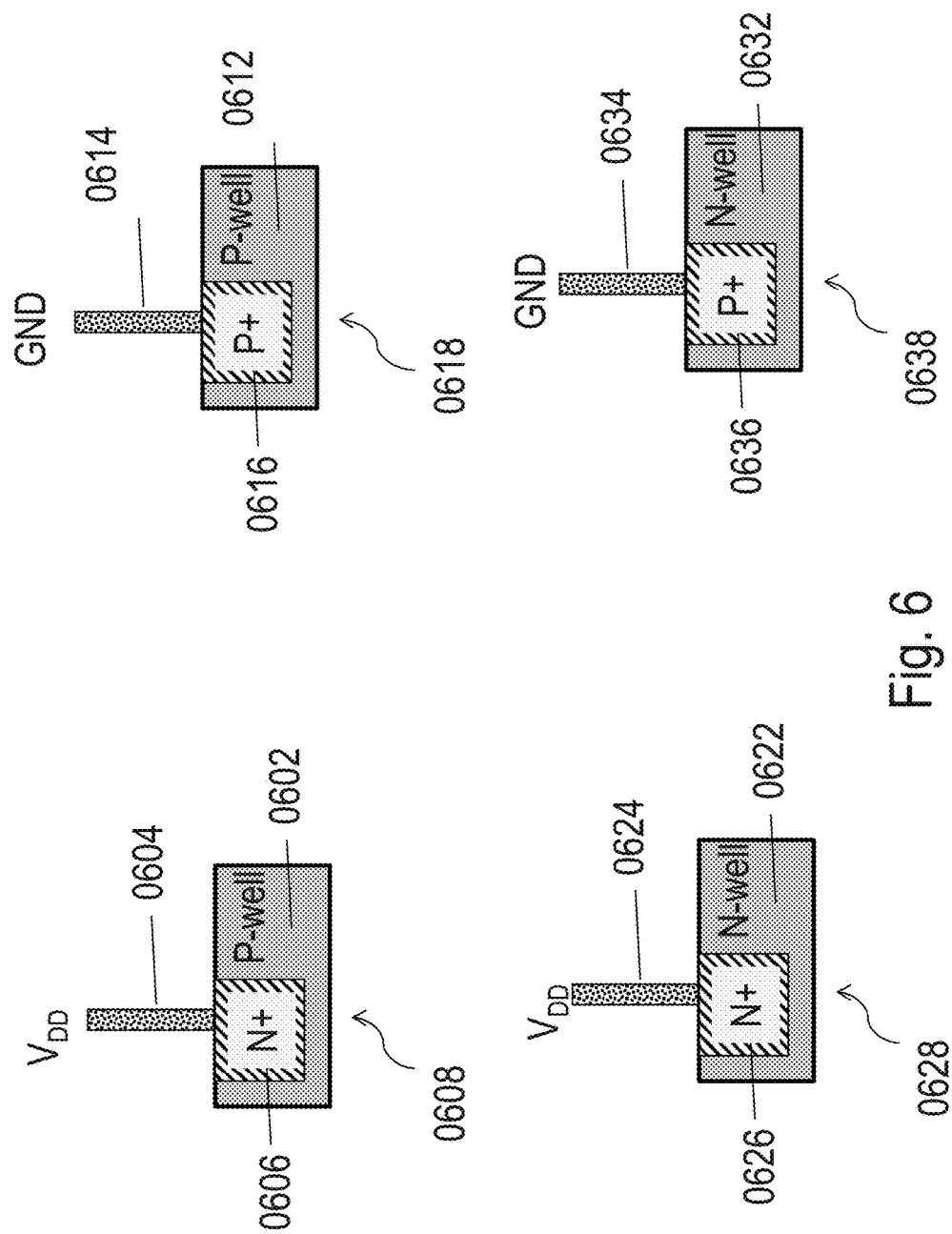
FIG. 6 is an exemplary drawing illustration of various types of thermal contacts.

FIG. 6 describes an embodiment of the invention, wherein various implementations of thermal junctions and associated thermal contacts are illustrated. P-wells in CMOS integrated circuits may be typically biased to ground and N-wells may be typically biased to the supply voltage $V_{DD}$. A thermal contact 0604 between the power ($V_{DD}$) distribution network and a P-well 0602 can be implemented as shown in N+ in P-well thermal junction and contact example 0608, where an n+ doped region thermal junction 0606 may be formed in the P-well region at the base of the thermal contact 0604. The n+ doped region thermal junction 0606 ensures a reverse biased p-n junction can be formed in N+ in P-well thermal junction and contact example 0608 and makes the thermal contact viable (for example, not highly conductive) from an electrical perspective. The thermal contact 0604 could be formed of a conductive material such as copper, aluminum or some other material with a thermal conductivity of at least 100 W/m-K. A thermal contact 0614 between the ground (GND) distribution network and a P-well 0612 can be implemented as shown in P+ in P-well thermal junction and contact example 0618, where a p+ doped region thermal junction 0616 may be formed in the P-well region at the base of the thermal contact 0614. The p+ doped region thermal junction 0616 makes the thermal contact viable (for example, not highly conductive) from an electrical perspective. The p+ doped region thermal junction 0616 and the P-well 0612 may typically be biased at ground potential. The thermal contact 0614 could be formed of a conductive material such as copper, aluminum or some other material with a thermal conductivity of at least 100 W/m-K. A thermal contact 0624 between the power ($V_{DD}$) distribution network and an N-well 0622 can be implemented as shown in N+ in N-well thermal junction and contact example 0628, wherein an n+ doped region thermal junction 0626 may be formed in the N-well region at the base of the thermal contact 0624. The n+ doped region thermal junction 0626 makes the thermal contact viable (for example, not highly conductive) from an electrical perspective. The n+ doped region thermal junction 0626 and the N-well 0622 may typically be biased at $V_{DD}$ potential. The thermal contact 0624 could be formed of a conductive material such as copper, aluminum or some other material with a thermal conductivity of at least 100 W/m-K. A thermal contact 0634 between the ground (GND) distribution network and an N-well 0632 can be implemented as shown in P+ in N-well thermal junction and contact example

0638, where a p+ doped region thermal junction 0636 may be formed in the N-well region at the base of the thermal contact 0634. The p+ doped region thermal junction 0636 makes the thermal contact viable (for example, not highly conductive) from an electrical perspective due to the reverse biased p-n junction formed in P+ in N-well thermal junction and contact example 0638. The thermal contact 0634 could be formed of a conductive material such as copper, aluminum or some other material with a thermal conductivity of at least 100 W/m-K. Note that the thermal contacts are designed to conduct negligible electricity, and the current flowing through them is several orders of magnitude lower than the current flowing through a transistor when it is switching. Therefore, the thermal contacts can be considered to be designed to conduct heat and conduct negligible (or no) electricity.

Figure 7:
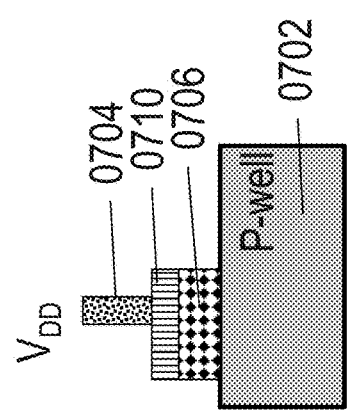
FIG. 7 is an exemplary drawing illustration of another type of thermal contact.

FIG. 7 describes an embodiment of the invention, wherein an additional type of thermal contact structure is illustrated. The embodiment shown in FIG. 7 could also function as a decoupling capacitor to mitigate power supply noise. It could consist of a thermal contact 0704, an electrode 0710, a dielectric 0706 and P-well 0702. The dielectric 0706 may be electrically insulating, and could be optimized to have high thermal conductivity. Dielectric 0706 could be formed of materials, such as, for example, hafnium oxide, silicon dioxide, other high k dielectrics, carbon, carbon based material, or various other dielectric materials with electrical conductivity below 1 nano-amp per square micron.

A thermal connection may be defined as the combination of a thermal contact and a thermal junction. The thermal connections illustrated in FIG. 6, FIG. 7 and other figures in this document are designed into a chip to remove heat, and are designed to not conduct electricity. Essentially, a semiconductor device including power distribution wires is described wherein some of said wires have a thermal connection designed to conduct heat to the semiconductor layer and the wires do not substantially conduct electricity through the thermal connection to the semiconductor layer.

Thermal contacts similar to those illustrated in FIG. 6 and FIG. 7 can be used in the white spaces of a design, for example, locations of a design where logic gates or other useful functionality may not be present. The thermal contacts may connect white-space silicon regions to power and/or ground distribution networks. Thermal resistance to the heat removal apparatus can be reduced with this approach. Connections among silicon regions and power/ground distribution networks can be used for various device layers in the 3D stack, and may not be restricted to the device layer closest to the heat removal apparatus. A Schottky contact or diode may also be utilized for a thermal contact and thermal junction. Moreover, thermal contacts and vias may not have to be stacked in a vertical line through multiple stacks, layers, strata of circuits.

Figure 8:
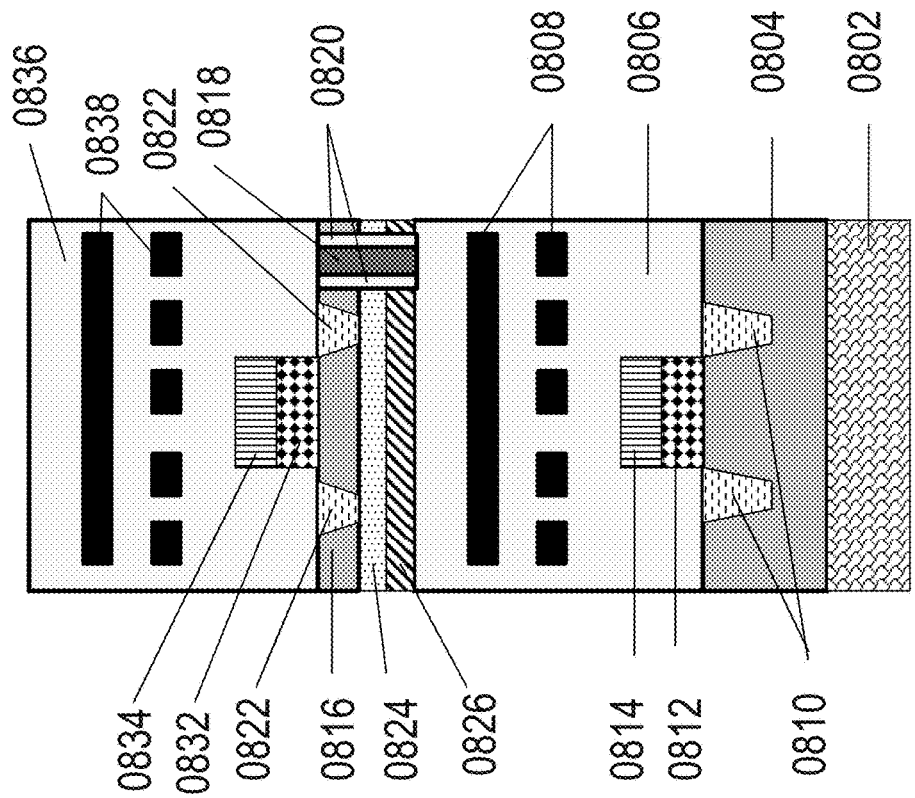
FIG. 8 is an exemplary drawing illustration of the use of heat spreaders in 3D stacked device layers.

FIG. 8 illustrates an embodiment of the invention, which can provide enhanced heat removal from 3D-ICs by integrating heat spreader regions in stacked device layers. The 3D-IC and associated power and ground distribution network may be formed as described in FIGS. 1, 2, 3, 4, and 5 herein. For example, two crystalline layers, 0804 and 0816, which may include semiconductor materials such as, for example, mono-crystalline silicon, germanium, GaAs, InP, and graphene, are shown. For this illustration, mono-crystalline (single crystal) silicon may be used. Silicon layer 0816 could be thinned from its original thickness, and its final thickness could be in the range of about 0.01 um to about 50 um, for example, 10 nm, 100 nm, 200 nm, 0.4 um, 1 um, 2 um or 5 um. Silicon layer 0804 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0804 may also be of thicknesses greater than 100 um, depending on, for example, the strength of bonding to heat removal apparatus 0802. Silicon layer 0804 may include transistors such as, for example, MOSFETS, FinFets, BJTs, HEMTs, HBTs, which may include gate electrode region 0814, gate dielectric region 0812, shallow trench isolation (STI) regions 0810 and several other regions that may be necessary for transistors such as source and drain junction regions (not shown for clarity). Silicon layer 0816 may include transistors such as, for example, MOSFETS, FinFets, BJTs, HEMTs, HBTs, which may include gate electrode region 0834, gate dielectric region 0832, shallow trench isolation (STI) regions 0822 and several other regions that may be necessary for transistors such as source and drain junction regions (not shown for clarity). A through-layer via (TLV) 0818 may be present and may include an associated surrounding dielectric region 0820. Wiring layers 0808 for silicon layer 0804 and wiring dielectric 0806 may be present and may form an associated interconnect layer or layers. Wiring layers 0838 for silicon layer 0816 and wiring dielectric 0836 may be present and may form an associated interconnect layer or layers. Through-layer via (TLV) 0818 may connect to wiring layers 0808 and wiring layers 0838 (not shown). The heat removal apparatus 0802 may include, for example, a heat spreader and/or a heat sink. It can be observed that the STI regions 0822 can go right through to the bottom of silicon layer 0816 and provide good electrical isolation. This, however, may cause challenges for heat removal from the STI surrounded transistors since STI regions 0822 are typically composed of insulators that do not conduct heat well. The buried oxide layer 0824 typically does not conduct heat well. To tackle heat removal issues with the structure shown in FIG. 8, a heat spreader 0826 may be integrated into the 3D stack. The heat spreader 0826 material may include, for example, copper, aluminum, graphene, diamond, carbon or any other material with a high thermal conductivity (defined as greater than 10 W/m-K). While the heat spreader concept for 3D-ICs is described with an architecture similar to FIG. 2, similar heat spreader concepts could be used for architectures similar to FIG. 1, and also for other 3D IC architectures. Silicon layer 0804 and silicon layer 0816 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0802 may include an external surface from which heat transfer may take place by methods such as air cooling, liquid cooling, or attachment to another heat sink or heat spreader structure.

Figure 9:
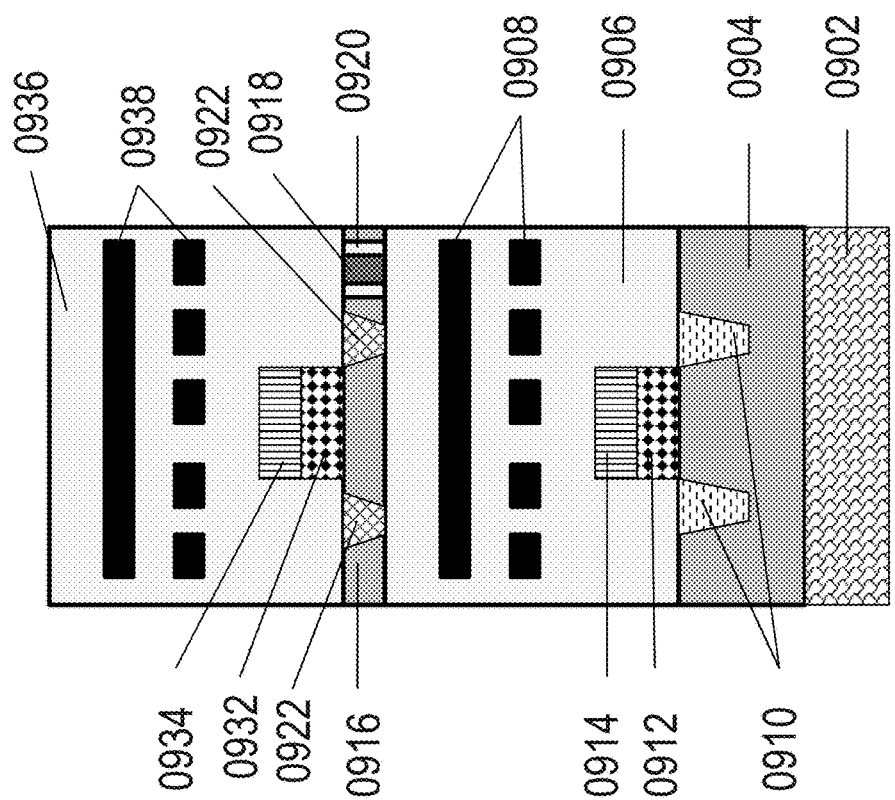
FIG. 9 is an exemplary drawing illustration of the use of thermally conductive shallow trench isolation (STI) in 3D stacked device layers.

FIG. 9 illustrates an embodiment of the invention, which can provide enhanced heat removal from 3D-ICs by using thermally conductive shallow trench isolation (STI) regions in stacked device layers. The 3D-IC and associated power and ground distribution network may be formed as described in FIGS. 1, 2, 3, 4, 5 and 8 herein. For example, two crystalline layers, 0904 and 0916, which may include semiconductor materials such as, for example, mono-crystalline silicon, germanium, GaAs, InP, and graphene, are shown. For this illustration, mono-crystalline (single crystal) silicon may be used. Silicon layer 0916 could be thinned from its original thickness, and its final thickness could be in the range of about 0.01 um to about 50 um, for example, 10 nm, 100 nm, 200 nm, 0.4 um, 1 um, 2 um or 5 um. Silicon layer 0904 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0904 may also be of thicknesses greater than 100 um, depending on, for example, the strength of bonding to heat removal apparatus 0802. Silicon layer 0904 may include transistors such as, for example, MOSFETS, FinFets, BJTs, HEMTs, HBTs, which may include gate electrode region 0914, gate dielectric region 0912, shallow trench isolation (STI) regions 0910 and several other regions that may be necessary for transistors such as source and drain junction regions (not shown for clarity). Silicon layer 0916 may include transistors such as, for example, MOSFETS, FinFets, BJTs, HEMTs, HBTs, which may include gate electrode region 0934, gate dielectric region 0932, shallow trench isolation (STI) regions 0922 and several other regions that may be necessary for transistors such as source and drain junction regions (not shown for clarity). A through-layer via (TLV) 0918 may be present and may include an associated surrounding dielectric region 0920. Dielectric region 0920 may include a shallow trench isolation region. Wiring layers 0908 for silicon layer 0904 and wiring dielectric 0906 may be present and may form an associated interconnect layer or layers. Wiring layers 0938 for silicon layer 0916 and wiring dielectric 0936 may be present and may form an associated interconnect layer or layers. Through-layer via (TLV) 0918 may connect to wiring layers 0908 and wiring layers 0938 (not shown). The heat removal apparatus 0902 may include a heat spreader and/or a heat sink. It can be observed that the STI regions 0922 can go right through to the bottom of silicon layer 0916 and provide good electrical isolation. This, however, may cause challenges for heat removal from the STI surrounded transistors since STI regions 0922 are typically composed of insulators such as silicon dioxide that do not conduct heat well. To tackle possible heat removal issues with the structure shown in FIG. 9, the STI regions 0922 in stacked silicon layers such as silicon layer 0916 could be formed substantially of thermally conductive dielectrics including, for example, diamond, carbon, or other dielectrics that have a thermal conductivity higher than silicon dioxide and/or have a thermal conductivity higher than 0.6 W/m-K. This structure can provide enhanced heat spreading in stacked device layers. Thermally conductive STI dielectric regions could be used in the vicinity of the transistors in stacked 3D device layers and may also be utilized as the dielectric that surrounds TLV 0918, such as dielectric region 0920. While the thermally conductive shallow trench isolation (STI) regions concept for 3D-ICs is described with an architecture similar to FIG. 2, similar thermally conductive shallow trench isolation (STI) regions concepts could be used for architectures similar to FIG. 1, and also for other 3D IC architectures and 2D IC as well. Silicon layer 0904 and silicon layer 0916 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0902 may include an external surface from which heat transfer may take place by methods such as air cooling, liquid cooling, or attachment to another heat sink or heat spreader structure.

Figure 10:
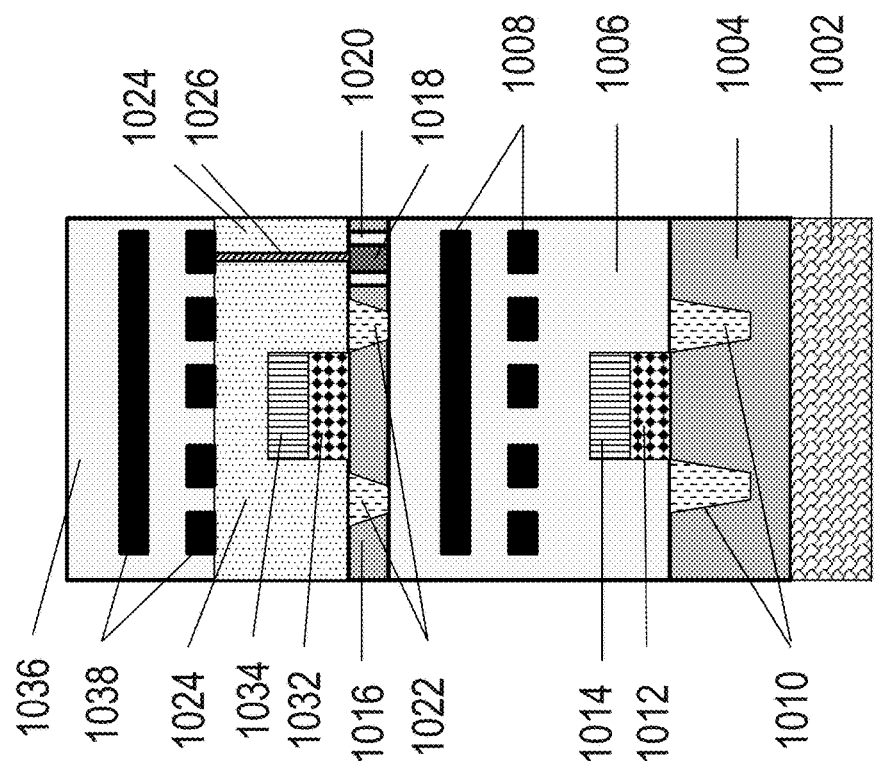
FIG. 10 is an exemplary drawing illustration of the use of thermally conductive pre-metal dielectric regions in 3D stacked device layers.

FIG. 10 illustrates an embodiment of the invention, which can provide enhanced heat removal from 3D-ICs using thermally conductive pre-metal dielectric regions in stacked device layers. The 3D-IC and associated power and ground distribution network may be formed as described in FIGS. 1, 2, 3, 4, 5, 8 and 9 herein. For example, two crystalline layers, 1004 and 1016, which may include semiconductor materials such as, for example, mono-crystalline silicon, germanium, GaAs, InP, and graphene, are shown. For this illustration, mono-crystalline (single crystal) silicon may be used. Silicon layer 1016 could be thinned from its original thickness, and its final thickness could be in the range of about 0.01 um to about 50 um, for example, 10 nm, 100 nm, 200 nm, 0.4 um, 1 um, 2 um or 5 um. Silicon layer 1004 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 1004 may also be of thicknesses greater than 100 um, depending on, for example, the strength of bonding to heat removal apparatus 1002. Silicon layer 1004 may include transistors such as, for example, MOSFETS, FinFets, BJTs, HEMTs, HBTs, which may include gate electrode region 1014, gate dielectric region 1012, shallow trench isolation (STI) regions 1010 and several other regions that may be necessary for transistors such as source and drain junction regions (not shown for clarity). Silicon layer 1016 may include transistors such as, for example, MOSFETS, FinFets, BJTs, HEMTs, HBTs, which may include gate electrode region 1034, gate dielectric region 1032, shallow trench isolation (STI) regions 1022 and several other regions that may be necessary for transistors such as source and drain junction regions (not shown for clarity). A through-layer via (TLV) 1018 may be present and may include an associated surrounding dielectric region 1020, which may include an STI region. Wiring layers 1008 for silicon layer 1004 and wiring dielectric 1006 may be present and may form an associated interconnect layer or layers. Wiring layers 1038 for silicon layer 1016 and wiring dielectric 1036 may be present and may form an associated interconnect layer or layers. Through-layer via (TLV) 1018 may connect to wiring layers 1008 (not shown). The heat removal apparatus 1002 may include, for example, a heat spreader and/or a heat sink. It can be observed that the STI regions 1022 can go right through to the bottom of silicon layer 1016 and provide good electrical isolation. This, however, can cause challenges for heat removal from the STI surrounded transistors since STI regions 1022 are typically filled with insulators such as silicon dioxide that do not conduct heat well. To tackle this issue, the inter-layer dielectrics (ILD) 1024 for contact region 1026 could be constructed substantially with a thermally conductive material, such as, for example, insulating carbon, diamond, diamond like carbon (DLC), and various other materials that provide better thermal conductivity than silicon dioxide or have a thermal conductivity higher than 0.6 W/m-K. Thermally conductive pre-metal dielectric regions could be used around some of the transistors in stacked 3D device layers. While the thermally conductive pre-metal dielectric regions concept for 3D-ICs is described with an architecture similar to FIG. 2, similar thermally conductive pre-metal dielectric region concepts could be used for architectures similar to FIG. 1, and also for other 3D IC architectures and 2D IC as well. Silicon layer 1004 and silicon layer 1016 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 1002 may include an external surface from which heat transfer may take place by methods such as air cooling, liquid cooling, or attachment to another heat sink or heat spreader structure.

Figure 11:
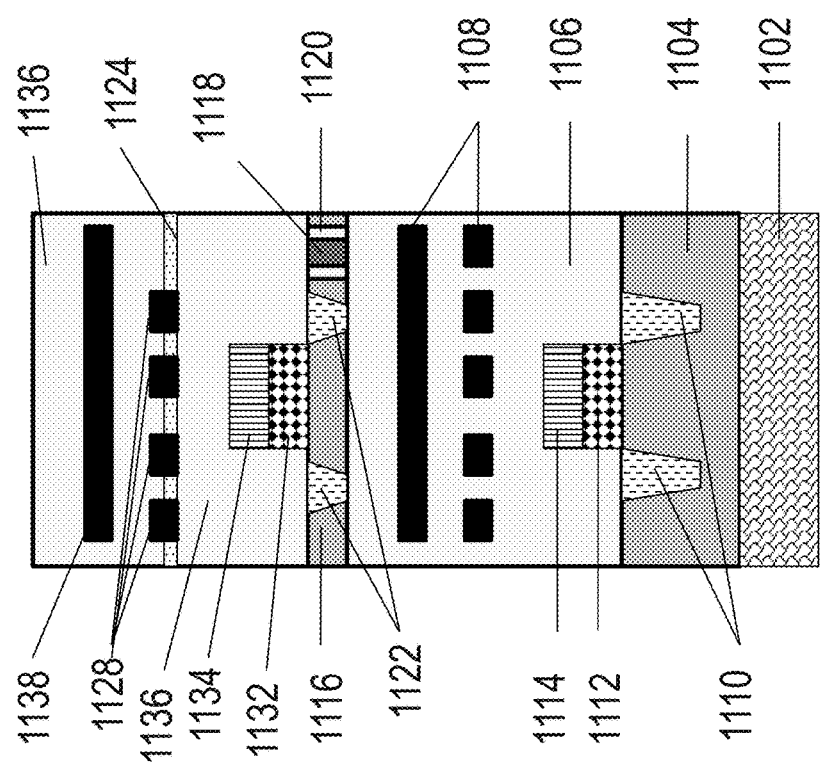
FIG. 11 is an exemplary drawing illustration of the use of thermally conductive etch stop layers for the first metal layer of 3D stacked device layers.

FIG. 11 describes an embodiment of the invention, which can provide enhanced heat removal from 3D-ICs using thermally conductive etch stop layers or regions for the first metal level of stacked device layers. The 3D-IC and associated power and ground distribution network may be formed as described in FIGS. 1, 2, 3, 4, 5, 8, 9 and 10 herein. For example, two crystalline layers, 1104 and 1116, which may include semiconductor materials such as, for example, mono-crystalline silicon, germanium, GaAs, InP, and graphene, are shown. For this illustration, mono-crystalline (single crystal) silicon may be used. Silicon layer 1116 could be thinned from its original thickness, and its final thickness could be in the range of about 0.01 um to about 50 um, for example, 10 nm, 100 nm, 200 nm, 0.4 um, 1 um, 2 um or 5 um. Silicon layer 1104 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 1104 may also be of thicknesses greater than 100 um, depending on, for example, the strength of bonding to heat removal apparatus 1102. Silicon layer 1104 may include transistors such as, for example, MOSFETS, FinFets, BJTs, HEMTs, HBTs, which may include gate electrode region 1114, gate dielectric region 1112, shallow trench isolation (STI) regions 1110 and several other regions that may be necessary for transistors such as source and drain junction regions (not shown for clarity). Silicon layer 1116 may include transistors such as, for example, MOSFETS, FinFets, BJTs, HEMTs, HBTs, which may include gate electrode region 1134, gate dielectric region 1132, shallow trench isolation (STI) regions 1122 and several other regions that may be necessary for transistors such as source and drain junction regions (not shown for clarity). A through-layer via (TLV) 1118 may be present and may include an associated surrounding dielectric region 1120. Wiring layers 1108 for silicon layer 1104 and wiring dielectric 1106 may be present and may form an associated interconnect layer or layers. Wiring layers for silicon layer 1116 may include first metal layer 1128 and other metal layers 1138 and wiring dielectric 1136 and may form an associated interconnect layer or layers. The heat removal apparatus 1102 may include, for example, a heat spreader and/or a heat sink. It can be observed that the STI regions 1122 can go right through to the bottom of silicon layer 1116 and provide good electrical isolation. This, however, can cause challenges for heat removal from the STI surrounded transistors since STI regions 1122 are typically filled with insulators such as silicon dioxide that do not conduct heat well. To tackle this issue, etch stop layer 1124 as part of the process of constructing the first metal layer 1128 of silicon layer 1116 can be substantially constructed out of a thermally conductive but electrically isolative material. Examples of such thermally conductive materials could include insulating carbon, diamond, diamond like carbon (DLC), and various other materials that provide better thermal conductivity than silicon dioxide and silicon nitride, and/or have thermal conductivity higher than 0.6 W/m-K. Thermally conductive etch-stop layer dielectric regions could be used for the first metal layer above transistors in stacked 3D device layers. While the thermally conductive etch stop layers or regions concept for 3D-ICs is described with an architecture similar to FIG. 2, similar thermally conductive etch stop layers or regions concepts could be used for architectures similar to FIG. 1, and also for other 3D IC architectures and 2D IC as well. Silicon layer 1104 and silicon layer 1116 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 1102 may include an external surface from which heat transfer may take place by methods such as air cooling, liquid cooling, or attachment to another heat sink or heat spreader structure.

Figure 12A:
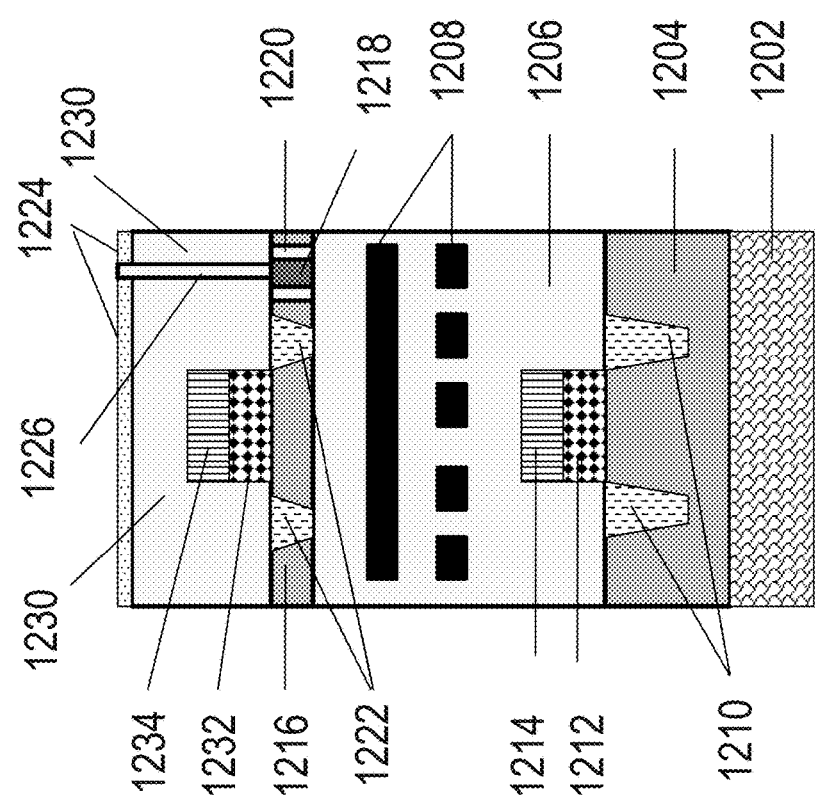
FIG. 12A-12B are exemplary drawing illustrations of the use and retention of thermally conductive hard mask layers for patterning contact layers of 3D stacked device layers.
Figure 12B:
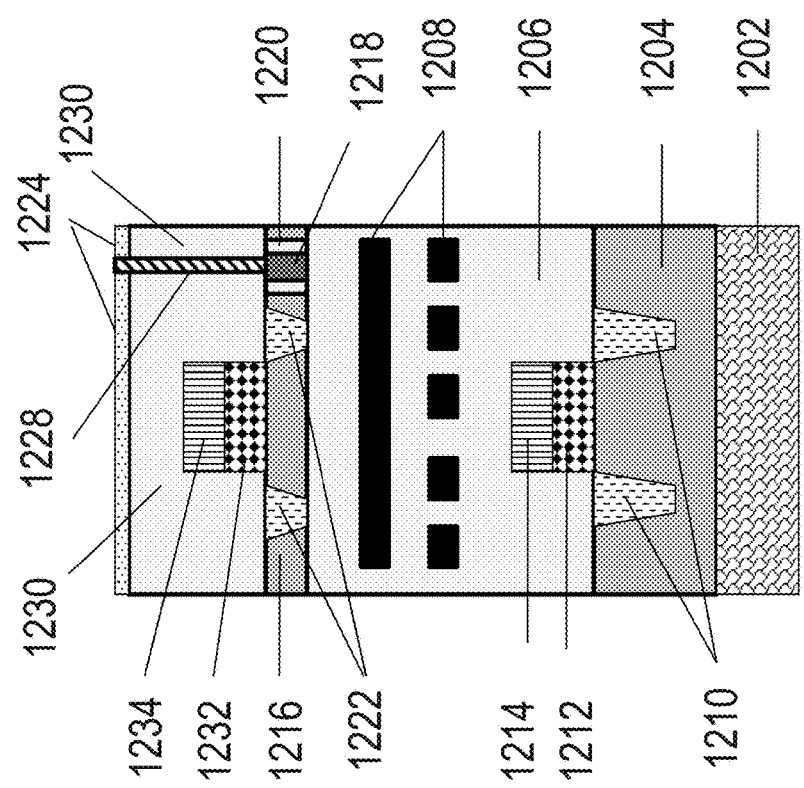

FIG. 12A-B describes an embodiment of the invention, which can provide enhanced heat removal from 3D-ICs using thermally conductive layers or regions as part of pre-metal dielectrics for stacked device layers. The 3D-IC and associated power and ground distribution network may be formed as described in FIGS. 1, 2, 3, 4, 5, 8, 9, 10 and 11 herein. For example, two crystalline layers, 1204 and 1216, are shown and may have transistors. For this illustration, mono-crystalline (single crystal) silicon may be used. Silicon layer 1216 could be thinned from its original thickness, and its final thickness could be in the range of about 0.01 um to about 50 um, for example, 10 nm, 100 nm, 200 nm, 0.4 um, 1 um, 2 um or 5 um. Silicon layer 1204 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 1204 may also be of thicknesses greater than 100 um, depending on, for example, the strength of bonding to heat removal apparatus 1202. Silicon layer 1204 may include transistors such as, for example, MOSFETS, FinFets, BJTs, HEMTs, HBTs, which may include gate electrode region 1214, gate dielectric region 1212, shallow trench isolation (STI) regions 1210 and several other regions that may be necessary for transistors such as source and drain junction regions (not shown for clarity). Silicon layer 1216 may include transistors such as, for example, MOSFETS, FinFets, BJTs, HEMTs, HBTs, which may include gate electrode region 1234, gate dielectric region 1232, shallow trench isolation (STI) regions 1222 and several other regions that may be necessary for transistors such as source and drain junction regions (not shown for clarity). A through-layer via (TLV) 1218 may be present and may include an associated surrounding dielectric region 1220. Wiring layers 1208 for silicon layer 1204 and wiring dielectric 1206 may be present and may form an associated interconnect layer or layers. Through-layer via (TLV) 1218 may connect to wiring layers 1208 and future wiring layers such as those for interconnection of silicon layer 1216 transistors (not shown). The heat removal apparatus 1202 may include a heat spreader and/or a heat sink. It can be observed that the STI regions 1222 can go right through to the bottom of silicon layer 1216 and provide good electrical isolation. This, however, can cause challenges for heat removal from the STI surrounded transistors since STI regions 1222 are typically filled with insulators such as silicon dioxide that do not conduct heat well. To tackle this issue, a technique is described in FIG. 12A-B. FIG. 12A illustrates the formation of openings for making contacts to the transistors of silicon layer 1216. A hard mask layer 1224 or region is typically used during the lithography step for contact formation and hard mask layer 1224 or region may be utilized to define contact opening regions 1226 of the pre-metal dielectric 1230 that is etched away. FIG. 12B illustrates the contact 1228 formed after metal is filled into the contact opening regions 1226 shown in FIG. 12A, and after a chemical mechanical polish (CMP) process. The hard mask layer 1224 or region used for the process shown in FIG. 12A-B may include a thermally conductive but electrically isolative material. Examples of such thermally conductive materials could include insulating carbon, diamond, diamond like carbon (DLC), and various other materials that provide better thermal conductivity than silicon dioxide and silicon nitride, and/or have thermal conductivity higher than 0.6 W/m-K and can be left behind after the process step shown in FIG. 12B (hence, electrically non-conductive). Further steps for forming the 3D-IC (such as forming additional metal layers) may be performed (not shown). While the thermally conductive materials for hard mask concept for 3D-ICs is described with an architecture similar to FIG. 2, similar thermally conductive materials for hard mask concepts could be used for architectures similar to FIG. 1, and also for other 3D IC architectures and 2D IC as well. Silicon layer 1204 and silicon layer 1216 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 1202 may include an external surface from which heat transfer may take place by methods such as air cooling, liquid cooling, or attachment to another heat sink or heat spreader structure.

Figure 13:
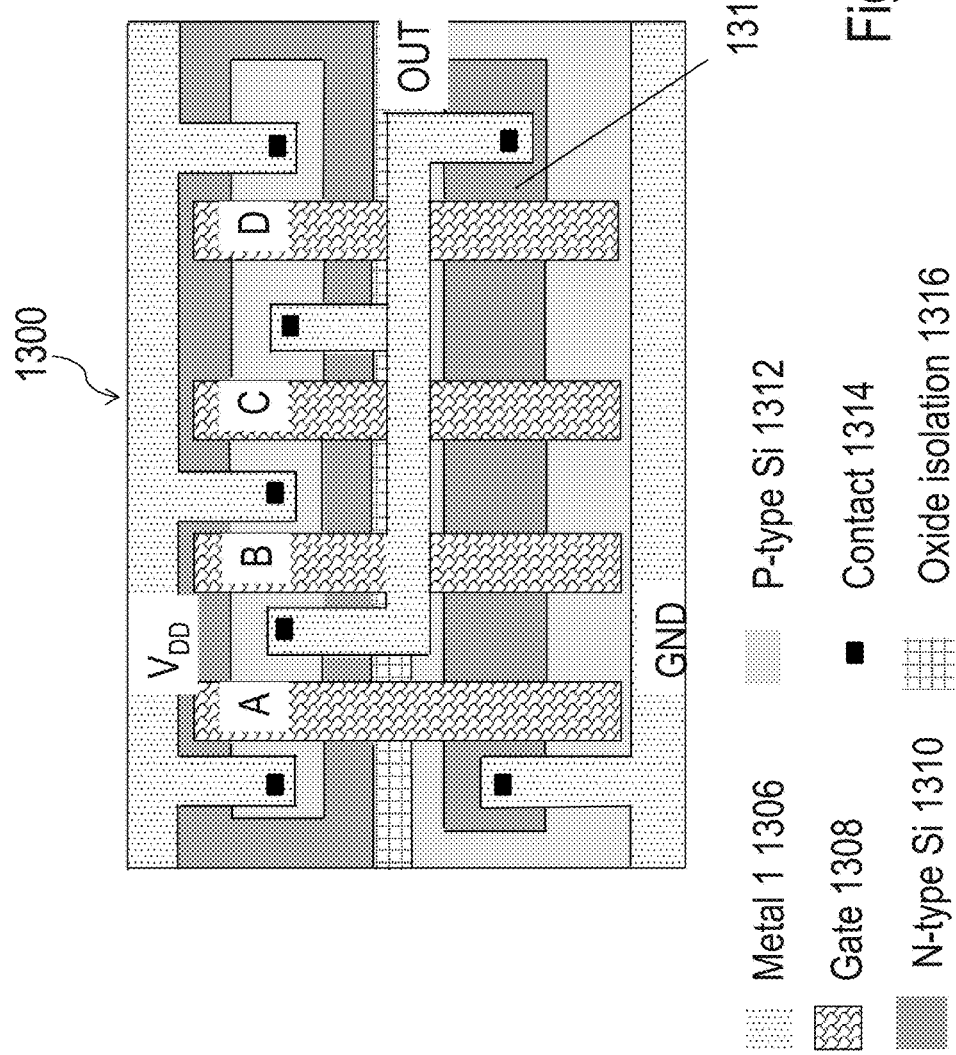
FIG. 13 is an exemplary drawing illustration of a 4 input NAND gate.

FIG. 13 illustrates the layout of an exemplary 4-input NAND gate 1300, where the output OUT is a function of inputs A, B, C and D. 4-input NAND gate 1300 may include metal 1 regions 1306, gate regions 1308, N-type silicon regions 1310, P-type silicon regions 1312, contact regions 1314, and oxide isolation regions 1316. If the 4-input NAND gate 1300 is used in 3D IC stacked device layers, some regions of the NAND gate (such as, for example, sub-region 1318 of N-type silicon regions 1310) are far away from $V_{DD}$ and GND contacts of 4-input NAND gate 1300. The regions, such as sub-region 1318, could have a high thermal resistance to $V_{DD}$ and GND contacts, and could heat up to undesired temperatures. This is because the regions of the NAND gate far away from $V_{DD}$ and GND contacts cannot effectively use the low-thermal resistance power delivery network to transfer heat to the heat removal apparatus.

Figure 14:
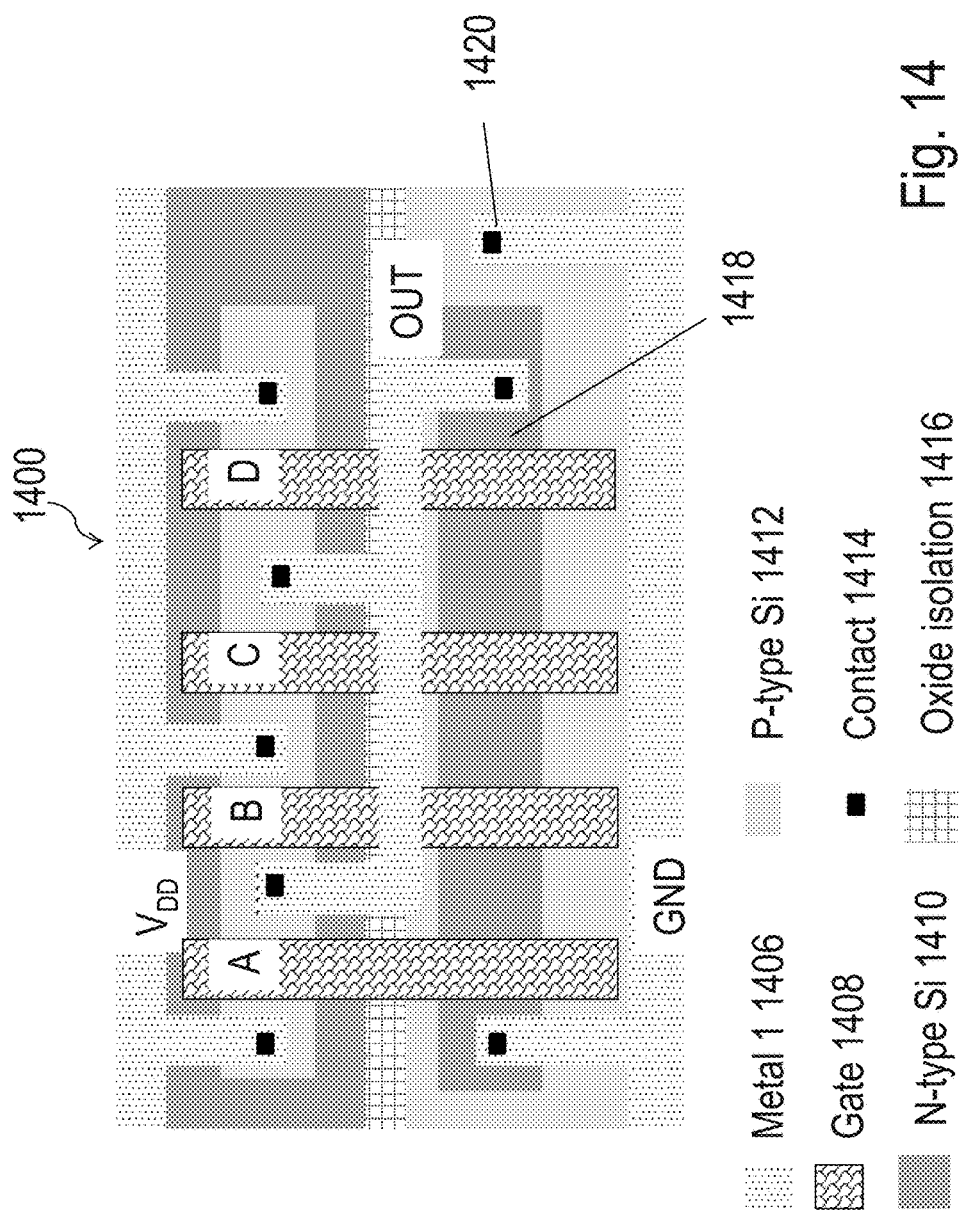
FIG. 14 is an exemplary drawing illustration of a 4 input NAND gate where substantially all parts of the logic cell can be within desirable temperature limits.

FIG. 14 illustrates an embodiment of the invention wherein the layout of exemplary 3D stackable 4-input NAND gate 1400 can be modified so that substantially all parts of the gate are at desirable temperatures during chip operation. Desirable temperatures during chip operation may depend on the type of transistors, circuits, and product application & use, and may be, for example, sub-150° C., sub-100° C., sub-75° C., sub-50° C. or sub-25° C. Inputs to the 3D stackable 4-input NAND gate 1400 are denoted as A, B, C and D, and the output is denoted as OUT. The 4-input NAND gate 1400 may include metal 1 regions 1406, gate regions 1408, N-type silicon regions 1410, P-type silicon regions 1412, contact regions 1414, and oxide isolation regions 1416. As discussed above, sub-region 1418 could have a high thermal resistance to $V_{DD}$ and GND contacts and could heat up to undesired temperatures. Thermal contact 1420 (whose implementation can be similar to those described in FIG. 6 and FIG. 7) may be added to the layout, for example as shown in FIG. 13, to keep the temperature of sub-region 1418 within desirable limits by reducing the thermal resistance from sub-region 1418 to the GND distribution network. Several other implementations of adding and placement of thermal contacts that would be appreciated by persons of ordinary skill in the art can be used to make the exemplary layout shown in FIG. 14 more desirable from a thermal perspective.

Figure 15:
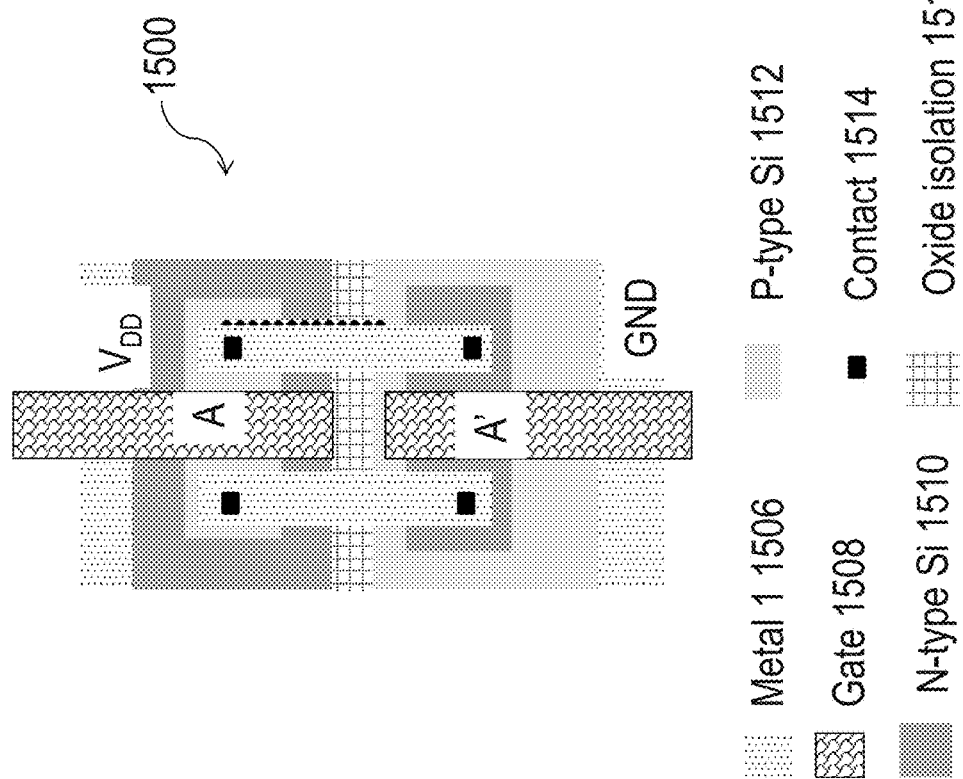
FIG. 15 is an exemplary drawing illustration of a transmission gate.

FIG. 15 illustrates the layout of an exemplary transmission gate 1500 with control inputs A and A' (A' typically the inversion of A). Transmission gate 1500 may include metal 1 regions 1506, gate regions 1508, N-type silicon regions 1510, P-type silicon regions 1512, contact regions 1514, and oxide isolation regions 1516. If transmission gate 1500 is used in 3D IC stacked device layers, some regions of the transmission gate could heat up to undesired temperatures since there are no $V_{DD}$ and GND contacts. There could be a high thermal resistance to $V_{DD}$ and GND distribution networks. Thus, the transmission gate cannot effectively use the low-thermal resistance power delivery network to transfer heat to the heat removal apparatus. Transmission gate is one example of transistor function that might not include any connection to the power grid and accordingly there may not be a good thermal path to remove the built-up heat. Sometimes in a 3D structure the transistor isolation may be achieved by etching around the transistor or transistor function substantially all of the silicon and filling it with an electrically isolative material, such as, for example, silicon oxides, which might have a poor thermal conduction. As such, the transistor or transistor function may not have an effective thermal path to remove heat build-up. There are other functions, such as, for example, SRAM select transistors and Look-Up-Table select transistors, which may use transistors with no power grid (Vdd, Vss) connections (may only have signal connections) which may be subject to the same heat removal problem.

Figure 16:
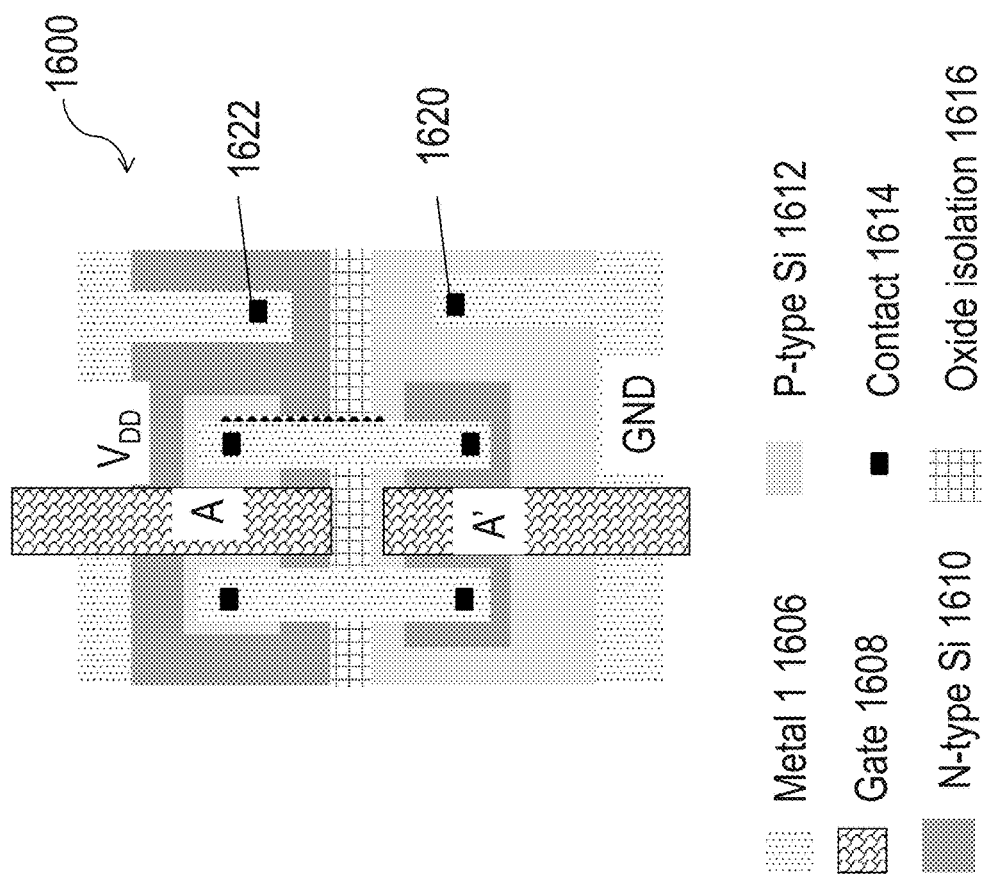
FIG. 16 is an exemplary drawing illustration of a transmission gate where substantially all parts of the logic cell can be within desirable temperature limits.

FIG. 16 illustrates an embodiment of the invention wherein the layout of exemplary 3D stackable transmission gate 1600 can be modified so that substantially all parts of the gate, channel, and transistor body are at desirable temperatures during chip operation. Desirable temperatures during chip operation may depend on the type of transistors, circuits, and product application & use, and may be, for example, sub-150° C., sub-100° C., sub-75° C., sub-50° C. or sub-25° C. Control signals to the 3D stackable transmission gate 1600 are denoted as A and A' (A' typically the inversion of A). 3D stackable transmission gate 1600 may include metal 1 regions 1606, gate regions 1608, N-type silicon regions 1610, P-type silicon regions 1612, contact regions 1614, and oxide isolation regions 1616. Thermal contacts, such as, for example thermal contact 1620 and second thermal contact 1622 (whose implementation can be similar to those described in FIG. 6 and FIG. 7) may be added to the layout shown in FIG. 15 to keep the temperature of 3D stackable transmission gate 1600 within desirable limits (by reducing the thermal resistance to the $V_{DD}$ and GND distribution networks). The thermal paths may use a reverse bias diode in at least one portion so that the thermal path may conduct heat but does not conduct current or an electric signal, and accordingly does not interfere with the proper operation of the transistor function. Several other implementations of adding and placement of thermal contacts that would be appreciated by persons of ordinary skill in the art can be used to make the exemplary layout, such as shown in FIG. 16, more desirable from a thermal perspective.

The techniques illustrated with FIG. 14 and FIG. 16 are not restricted to cells such as transmission gates and NAND gates, and can be applied to a number of cells such as, for example, SRAMs, CAMs, multiplexers and many others. Furthermore, the techniques illustrated with at least FIG. 14 and FIG. 16 can be applied and adapted to various techniques of constructing 3D integrated circuits and chips, including those described in U.S. Pat. No. 8,273,610, US patent publications 2012/0091587 and 2013/0020707, and pending U.S. patent application Ser. Nos. 13/441,923 and 13/099,010. The contents of the foregoing applications are incorporated herein by reference. Furthermore, techniques illustrated with FIG. 14 and FIG. 16 (and other similar techniques) need not be applied to substantially all such gates on the chip, but could be applied to a portion of gates of that type, such as, for example, gates with higher activity factor, lower threshold voltage or higher drive current. Moreover, thermal contacts and vias may not have to be stacked in a vertical line through multiple stacks, layers, strata of circuits.

When a chip is typically designed a cell library consisting of various logic cells such as NAND gates, NOR gates and other gates is created, and the chip design flow proceeds using this cell library. It will be clear to one skilled in the art that a cell library may be created wherein each cell's layout can be optimized from a thermal perspective and based on heat removal criteria such as maximum allowable transistor channel temperature (for example, where each cell's layout can be optimized such that substantially all portions of the cell have low thermal resistance to the $V_{DD}$ and GND contacts, and therefore, to the power bus and the ground bus).

Figure 24:
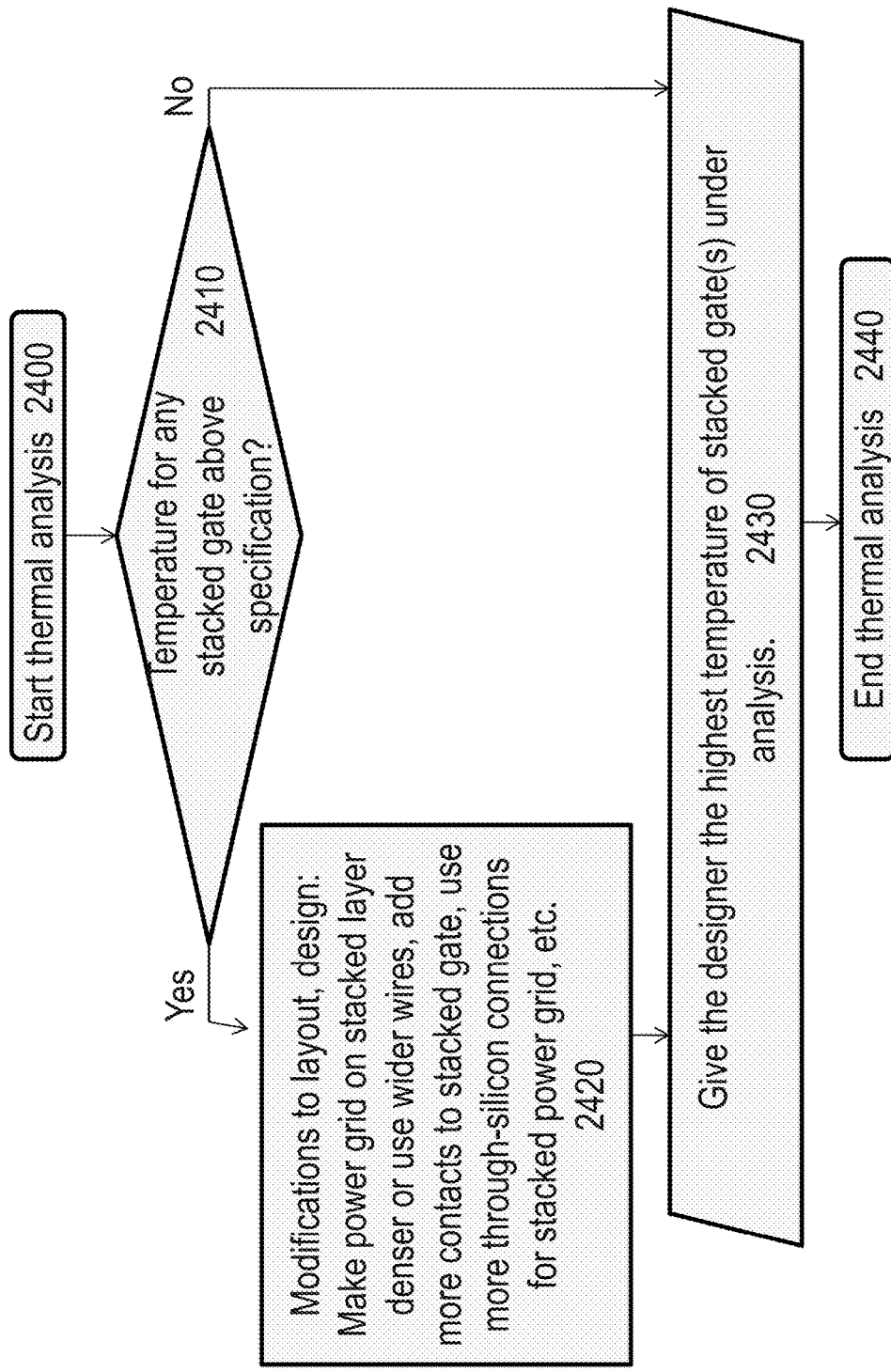
FIG. 24 is an exemplary procedure for a chip designer to ensure a good thermal profile for a design.

FIG. 24 illustrates a procedure for a chip designer to ensure a good thermal profile for his or her design. After a first pass or a portion of the first pass of the desired chip layout process is complete, a thermal analysis may be conducted to determine temperature profiles for active or passive elements, such as gates, on the 3D chip. The thermal analysis may be started (2400). The temperature of any stacked gate, or region of gates, may be calculated, for example, by simulation such as a multi-physics solver, and compared to a desired specification value (2410). If the gate, or region of gates, temperature is higher than the specification, which may, for example, be in the range of 65° C.-150° C., modifications (2420) may be made to the layout or design, such as, for example, power grids for stacked layers may be made denser or wider, additional contacts to the gate may be added, more through-silicon (TLV and/or TSV) connections may be made for connecting the power grid in stacked layers to the layer closest to the heat sink, or any other method to reduce stacked layer temperature that may be described herein or in referenced documents, which may be used alone or in combination. The output (2430) may give the designer the temperature of the modified stacked gate ('Yes' tree), or region of gates, or an unmodified one ('No' tree), and may include the original un-modified gate temperature that was above the desired specification. The thermal analysis may end (2440) or may be iterated. Alternatively, the power grid may be designed (based on heat removal criteria) simultaneously with the logic gates and layout of the design, or for various regions of any layer of the 3D integrated circuit stack. The density of TLVs may be greater than $10^4$ per $cm^2$, and may be 10×, 100×, 1000×, denser than TSVs.

Figure 22:
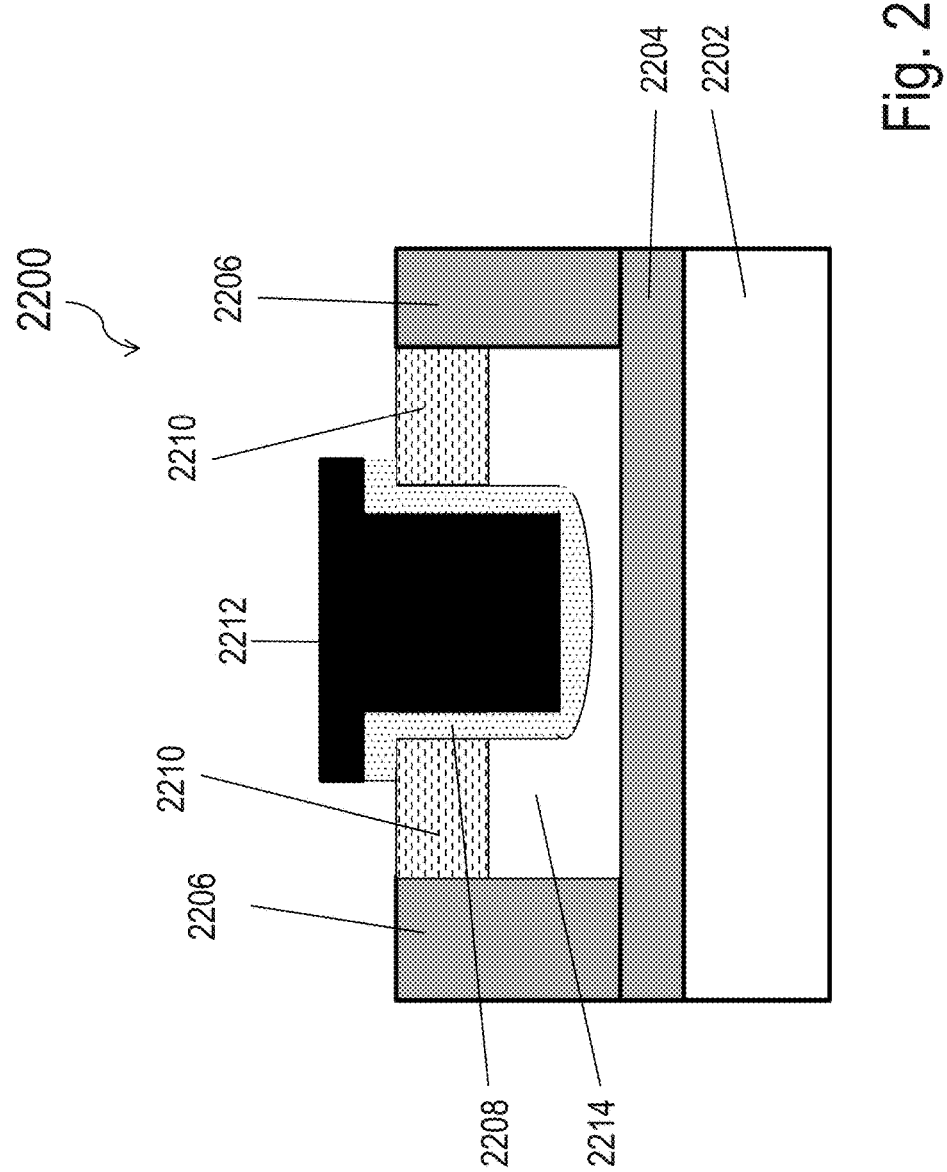
FIG. 22 is an exemplary drawing illustration of a recessed channel transistor (RCAT)

Recessed channel transistors form a transistor family that can be stacked in 3D. FIG. 22 illustrates an exemplary Recessed Channel Transistor 2200 which may be constructed in a 3D stacked layer using procedures outlined in U.S. Pat. No. 8,273,610, US patent publications 2012/0091587 and 2013/0020707, and pending U.S. patent application Ser. Nos. 13/441,923 and 13/099,010. The contents of the foregoing patent and applications are incorporated herein by reference. Recessed Channel Transistor 2200 may include 2202 a bottom layer of transistors and wires 2202, oxide layer 2204, oxide regions 2206, gate dielectric 2208, n+ silicon regions 2210, gate electrode 2212 and region of p− silicon region 2214. The recessed channel transistor is surrounded on substantially all sides by thermally insulating oxide layers oxide layer 2204 and oxide regions 2206, and heat removal may be a serious issue. Furthermore, to contact the p− silicon region 2214, a p+ region may be needed to obtain low contact resistance, which may not be easy to construct at temperatures lower than approximately 400° C.

Figure 17C:
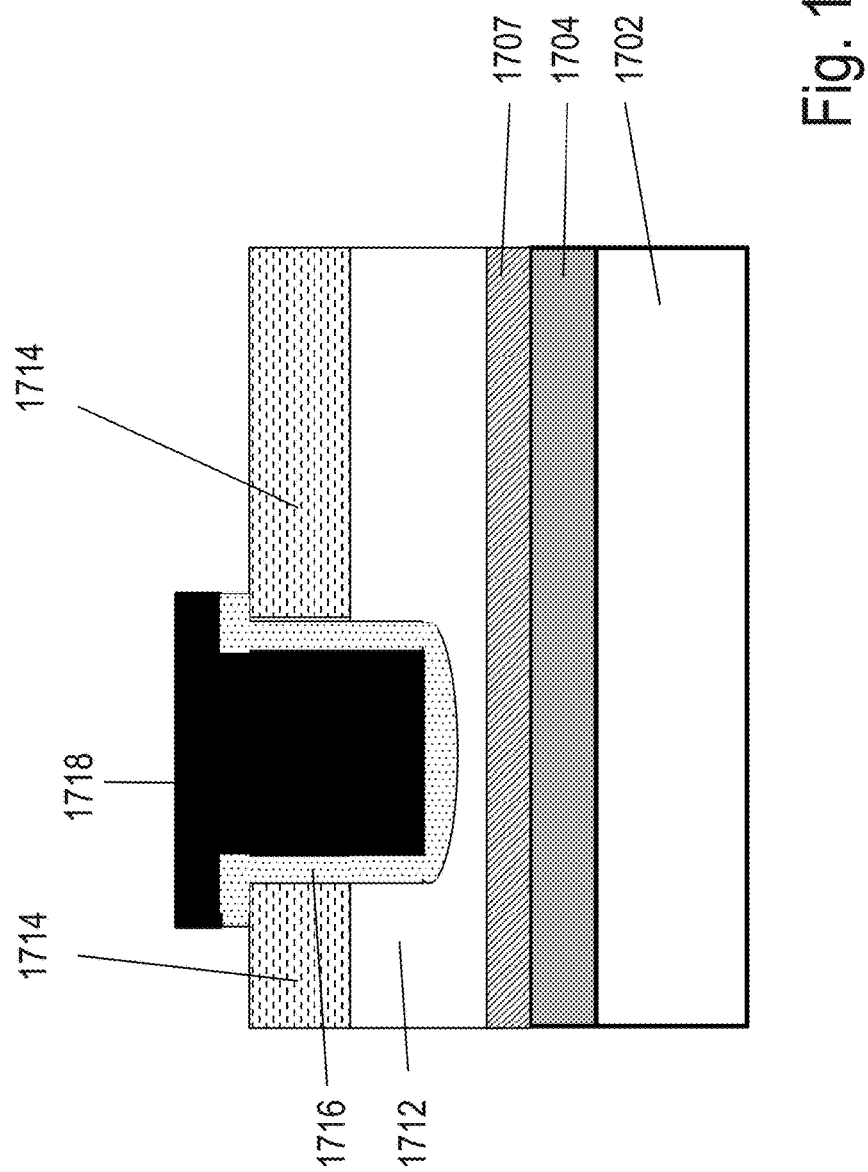
Figure 17D:
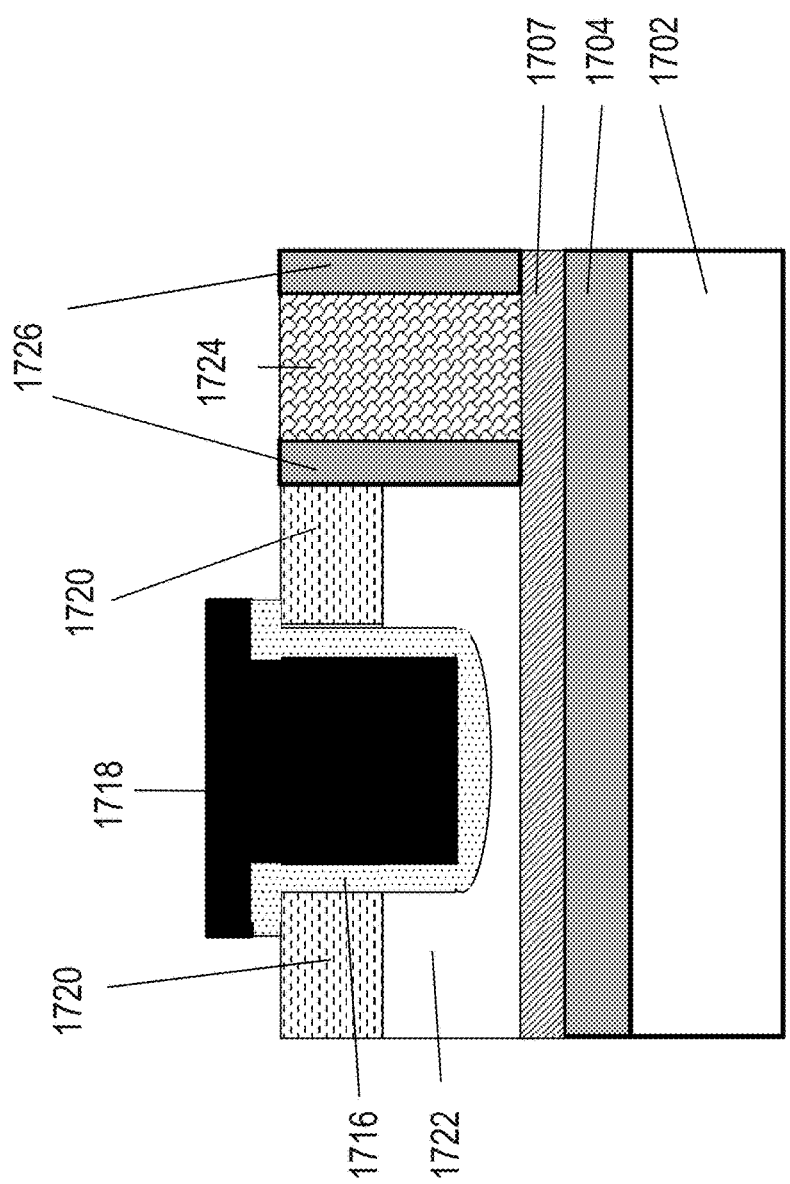

FIG. 17A-D illustrates an embodiment of the invention wherein thermal contacts can be constructed to a recessed channel transistor. Note that numbers used in FIG. 17A-D are inter-related. For example, if a certain number is used in FIG. 17A, it has the same meaning if present in FIG. 17B. The process flow may begin as illustrated in FIG. 17A with a bottom layer or layers of transistors and copper interconnects 1702 being constructed with a silicon dioxide layer 1704 atop it. Layer transfer approaches similar to those described in U.S. Pat. No. 8,273,610, US patent publications 2012/0091587 and 2013/0020707, and pending U.S. patent application Ser. Nos. 13/441,923 and 13/099,010 may be utilized. The contents of the foregoing patent and applications are incorporated herein by reference. An activated layer of p+ silicon 1706, an activated layer of p− silicon 1708 and an activated layer of n+ silicon 1710 can be transferred atop the structure illustrated in FIG. 17A to form the structure illustrated in FIG. 17B. FIG. 17C illustrates a next step in the process flow. After forming isolation regions such as, for example, STI-Shallow Trench Isolation (not shown in FIG. 17C for simplicity) and thus forming p+ regions 1707, gate dielectric regions 1716 and gate electrode regions 1718 could be formed, for example, by etch and deposition processes, using procedures similar to those described in U.S. Pat. No. 8,273,610, US patent publications 2012/0091587 and 2013/0020707, and pending U.S. patent application Ser. Nos. 13/441,923 and 13/099,010. Thus, p− silicon region 1712 and n+ silicon regions 1714 may be formed. FIG. 17C thus illustrates an RCAT (recessed channel transistor) formed with a p+ silicon region atop copper interconnect regions where the copper interconnect regions are not exposed to temperatures higher than approximately 400° C. FIG. 17D illustrates a next step of the process where thermal contacts could be made to the p+ silicon region 1707. FIG. 17D may include final p− silicon region 1722 and final n+ silicon regions 1720. Via 1724 may be etched and constructed, for example, of metals (such as Cu, Al, W, degenerately doped Si), metal silicides ($WSi_2$) or a combination of the two, and may include oxide isolation regions 1726. Via 1724 can connect p+ region 1707 to the ground (GND) distribution network. Via 1724 could alternatively be connected to a body bias distribution network. Via 1724 and final n+ silicon regions 1720 may be electrically coupled, such as by removal of a portion of an oxide isolation regions 1726, if desired for circuit reasons (not shown). The nRCAT could have its body region connected to GND potential (or body bias circuit) and operate correctly or as desired, and the heat produced in the device layer can be removed through the low-thermal resistance GND distribution network to the heat removal apparatus (not shown for clarity).

Figure 18:
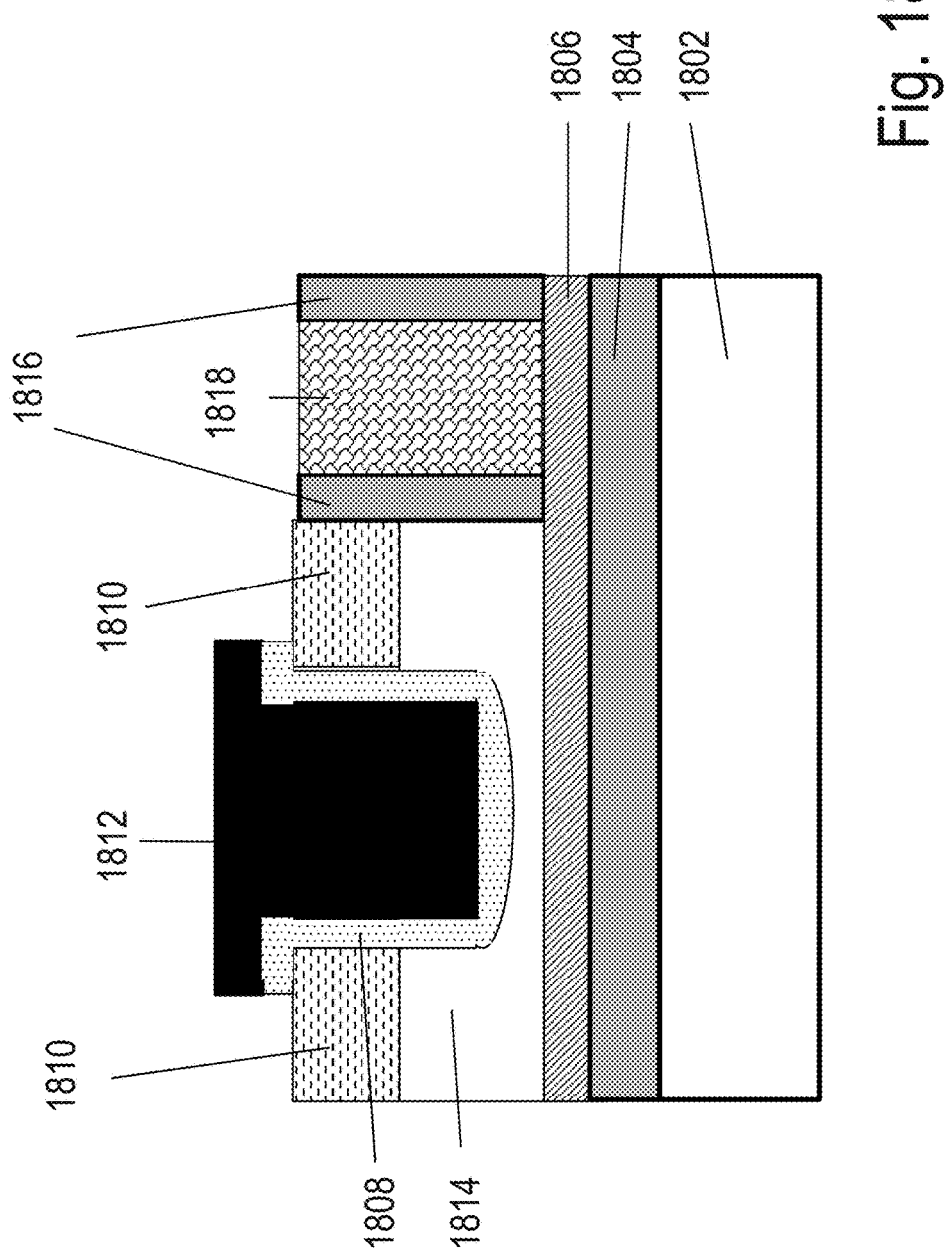
FIG. 18 is an exemplary drawing illustration of a pMOS recessed channel transistor with thermal contacts.

FIG. 18 illustrates an embodiment the invention, which illustrates the application of thermal contacts to remove heat from a pRCAT device layer that is stacked above a bottom layer of transistors and wires 1802. The p-RCAT layer may include 1804 buried oxide region 1804, n+ silicon region 1806, n− silicon region 1814, p+ silicon region 1810, gate dielectric 1808 and gate electrode 1812. The structure shown in FIG. 18 can be constructed using methods similar to those described in respect to FIG. 17A-D above. The thermal contact 1818 could be constructed of, for example, metals (such as Cu, Al, W, degenerately doped Si), metal silicides (WSi$_2$) or a combination of two or more types of materials, and may include oxide isolation regions 1816. Thermal contact 1818 may connect n+ region 1806 to the power (V$_{DD}$) distribution network. The pRCAT could have its body region connected to the supply voltage (V$_{DD}$) potential (or body bias circuit) and operate correctly or as desired, and the heat produced in the device layer can be removed through the low-thermal resistance V$_{DD}$ distribution network to the heat removal apparatus. Thermal contact 1818 could alternatively be connected to a body bias distribution network (not shown for clarity). Thermal contact 1818 and p+ silicon region 1810 may be electrically coupled, such as by removal of a portion of an oxide isolation regions 1816, if desired for circuit reasons (not shown).

Figure 19:
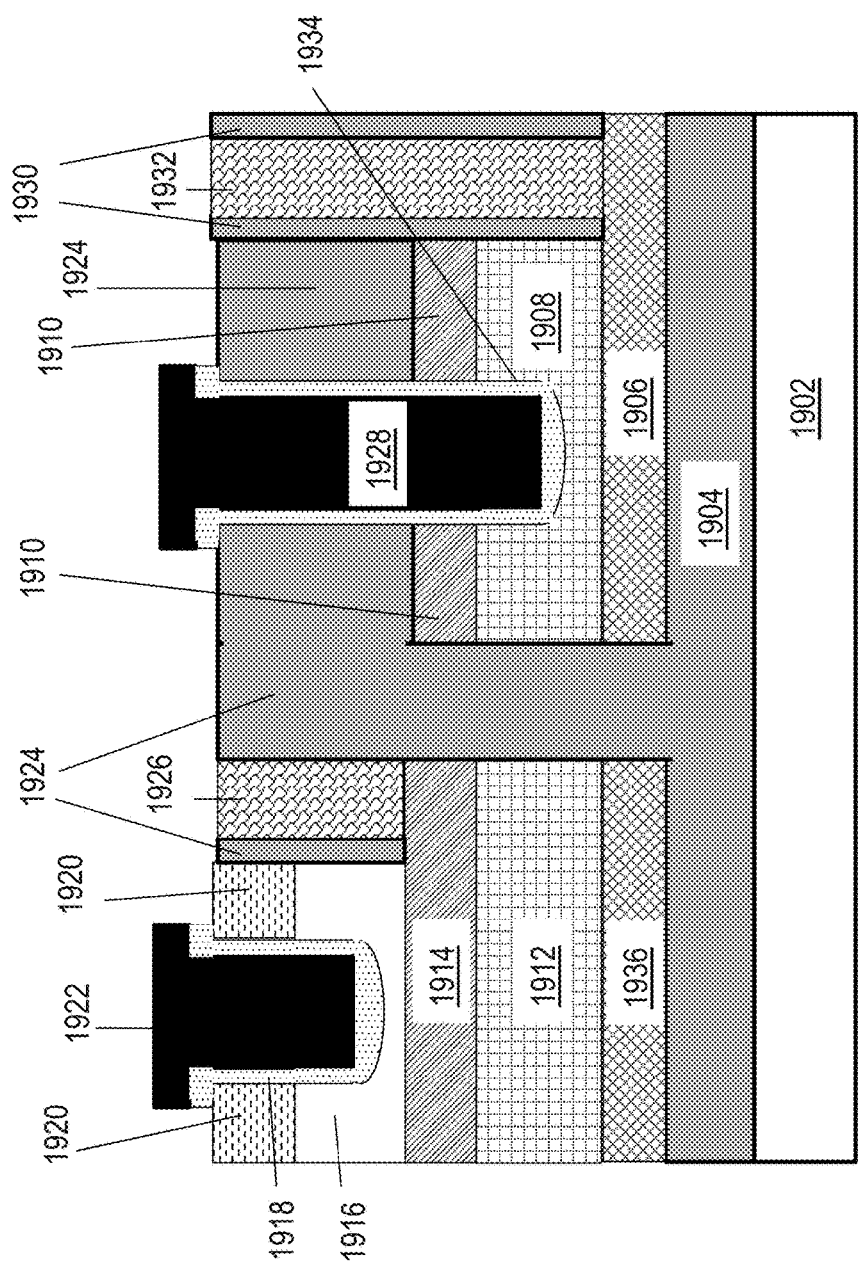
FIG. 19 is an exemplary drawing illustration of a CMOS circuit with recessed channel transistors and thermal contacts.

FIG. 19 illustrates an embodiment of the invention that describes the application of thermal contacts to remove heat from a CMOS device layer that could be stacked atop a bottom layer of transistors and wires 1902. The CMOS device layer may include insulator regions 1904, sidewall insulator regions 1924, thermal via insulator regions 1930, such as silicon dioxide. The CMOS device layer may include nMOS p+ silicon region 1906, pMOS p+ silicon region 1936, nMOS p– silicon region 1908, pMOS buried p– silicon region 1912, nMOS n+ silicon regions 1910, pMOS n+ silicon 1914, pMOS n-silicon region 1916, p+ silicon regions 1920, pMOS gate dielectric region 1918, pMOS gate electrode region 1922, nMOS gate dielectric region 1934 and nMOS gate electrode region. A nMOS transistor could therefore be formed of regions 1934, 1928, 1910, 1908 and 1906. A pMOS transistor could therefore be formed of regions 1914, 1916, 1918, 1920 and 1922. This stacked CMOS device layer could be formed with procedures similar to those described in U.S. Pat. No. 8,273,610, US patent publications 2012/0091587 and 2013/0020707, and pending U.S. patent application Ser. Nos. 13/441,923 and 13/099,010 and at least FIG. 17A-D herein. The thermal contact 1926 may be connected between n+ silicon region 1914 and the power (V$_{DD}$) distribution network and helps remove heat from the pMOS transistor. This is because the pMOSFET could have its body region connected to the supply voltage (V$_{DD}$) potential or body bias distribution network and operate correctly or as desired, and the heat produced in the device layer can be removed through the low-thermal resistance V$_{DD}$ distribution network to the heat removal apparatus as previously described. The thermal contact 1932 may be connected between p+ silicon region 1906 and the ground (GND) distribution network and helps remove heat from the nMOS transistor. This is because the nMOSFET could have its body region connected to GND potential or body bias distribution network and operate correctly or as desired, and the heat produced in the device layer can be removed through the low-thermal resistance GND distribution network to the heat removal apparatus as previously described.

Figure 20:
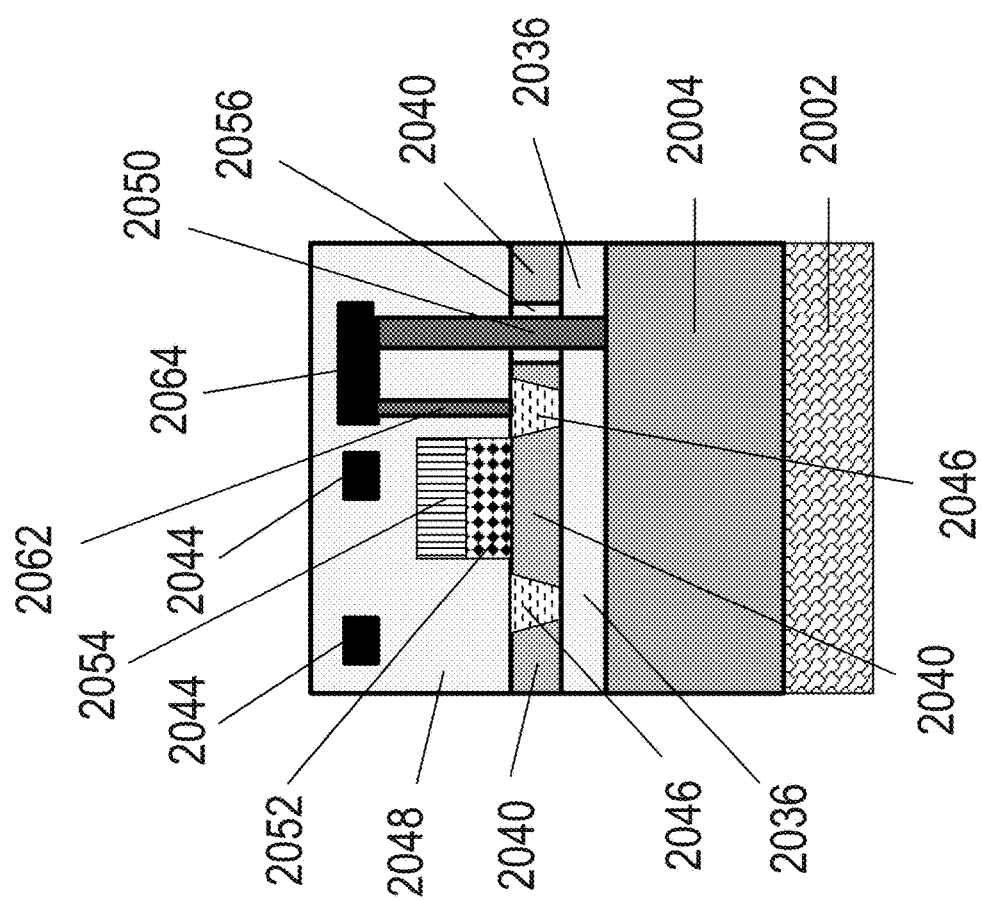
FIG. 20 is an exemplary drawing illustration of a technique to remove heat more effectively from silicon-on-insulator (SOI) circuits.

FIG. 20 illustrates an embodiment of the invention that describes a technique that could reduce heat-up of transistors fabricated on silicon-on-insulator (SOI) substrates. SOI substrates have a buried oxide (BOX) or other insulator between the silicon transistor regions and the heat sink. This BOX region may have a high thermal resistance, and makes heat transfer from the transistor regions to the heat sink difficult. The nMOS transistor in SOI may include buried oxide regions 2036, BEOL metal insulator regions 2048, and STI insulator regions 2056, such as silicon dioxide. The nMOS transistor in SOI may include n+ silicon regions 2046, p– silicon regions 2040, gate dielectric region 2052, gate electrode region 2054, interconnect wiring regions 2044, and highly doped silicon substrate 2004. Use of silicon-on-insulator (SOI) substrates may lead to low heat transfer from the transistor regions to the heat removal apparatus 2002 through the buried oxide regions 2036 (generally a layer) that may have low thermal conductivity. The ground contact 2062 of the nMOS transistor shown in FIG. 20 can be connected to the ground distribution network wiring 2064 which in turn can be connected with a low thermal resistance connection 2050 to highly doped silicon substrate 2004. This enables low thermal conductivity, a thermal conduction path, between the transistor shown in FIG. 20 and the heat removal apparatus 2002. While FIG. 20 described how heat could be transferred among an nMOS transistor and the heat removal apparatus, similar approaches can also be used for pMOS transistors, and many other transistors, for example, FinFets, BJTs, HEMTs, and HBTs. Many of the aforementioned transistors may be constructed as fully depleted channel devices. The heat removal apparatus 2002 may include an external surface from which heat transfer may take place by methods such as air cooling, liquid cooling, or attachment to another heat sink or heat spreader structure.

Figure 21:
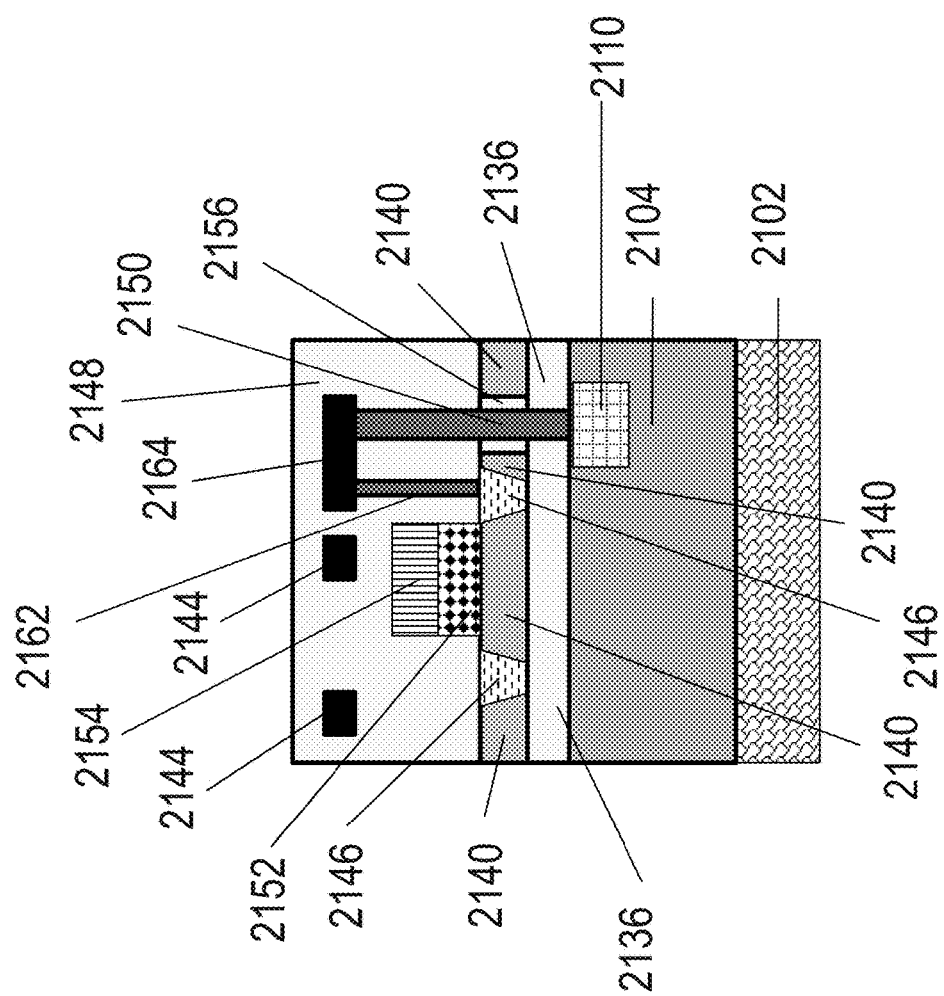
FIG. 21 is an exemplary drawing illustration of an alternative technique to remove heat more effectively from silicon-on-insulator (SOI) circuits.

FIG. 21 illustrates an embodiment of the invention which describes a technique that could reduce heat-up of transistors fabricated on silicon-on-insulator (SOI) substrates. The nMOS transistor in SOI may include buried oxide regions 2136, BEOL metal insulator regions 2148, and STI insulator regions 2156, such as silicon dioxide. The nMOS transistor in SOI may include n+ silicon regions 2146, p– silicon regions 2140, gate dielectric region 2152, gate electrode region 2154, interconnect wiring regions 2144, and highly doped silicon substrate 2104. Use of silicon-on-insulator (SOI) substrates may lead to low heat transfer from the transistor regions to the heat removal apparatus 2102 through the buried oxide regions 2136 (generally a layer) that may have low thermal conductivity. The ground contact 2162 of the nMOS transistor shown in FIG. 21 can be connected to the ground distribution network 2164 which in turn can be connected with a low thermal resistance connection 2150 to highly doped silicon substrate 2104 through an implanted and activated region 2110. The implanted and activated region 2110 could be such that thermal contacts similar to those in FIG. 6 can be formed. This may enable low thermal conductivity, a thermal conduction path, between the transistor shown in FIG. 21 and the heat removal apparatus 2102. This thermal conduction path, whilst thermally conductive, may not be electrically conductive (due to the reverse biased junctions that could be constructed in the path), and thus, not disturb the circuit operation. While FIG. 21 described how heat could be transferred among the nMOS transistor and the heat removal apparatus, similar approaches can also be used for pMOS transistors, and other transistors, for example, FinFets, BJTs, HEMTs, and HBTs.

Figure 23:
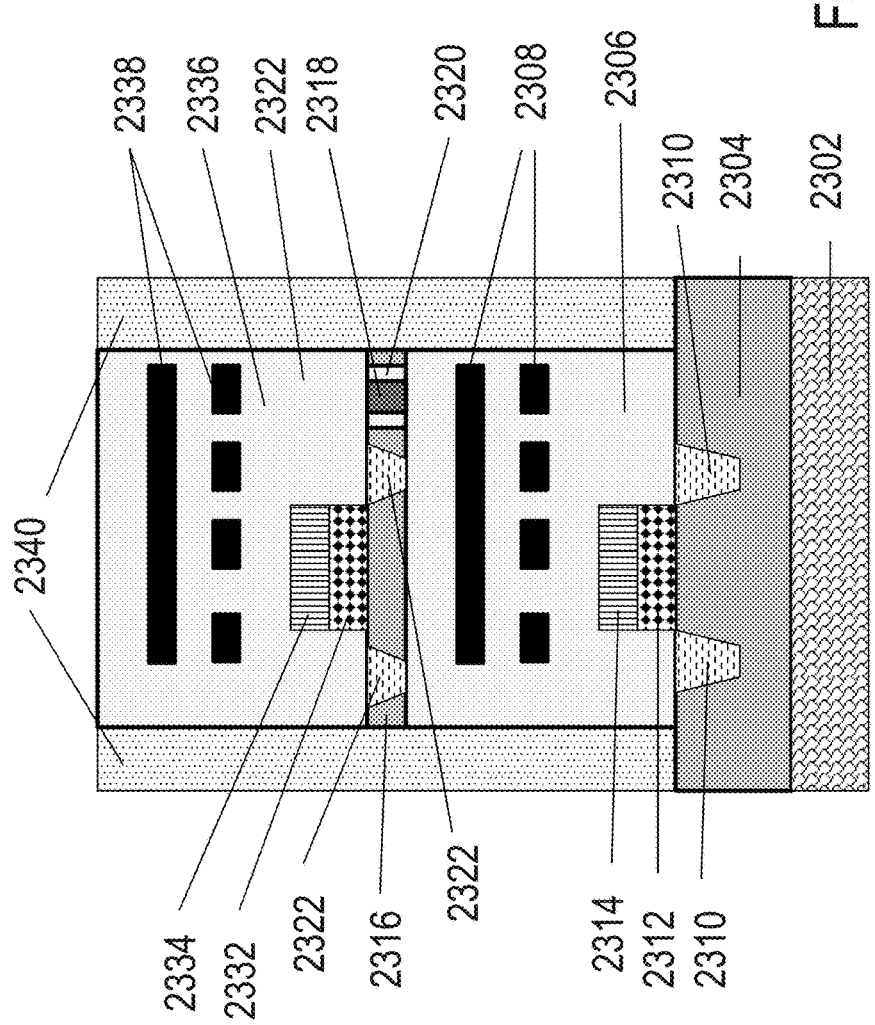
FIG. 23 is an exemplary drawing illustration of a 3D-IC with thermally conductive material on the sides.

FIG. 23 illustrates an embodiment of the invention wherein heat spreading regions may be located on the sides of 3D-ICs. The 3D integrated circuit shown in FIG. 23 could be potentially constructed using techniques described in U.S. Pat. No. 8,273,610, US patent publications 2012/0091587 and 2013/0020707, and pending U.S. patent application Ser. Nos. 13/441,923 and 13/099,010. For example, two crystalline layers, 2304 and 2316, which may include semiconductor materials such as, for example, mono-crystalline silicon, germanium, GaAs, InP, and graphene, are shown. For this illustration, mono-crystalline (single crystal) silicon may be used. Silicon layer 2316 could be thinned from its original thickness, and its final thickness could be in the range of about 0.01 um to about 50 um, for example, 10 nm, 100 nm, 200 nm, 0.4 um, 1 um, 2 um or 5 um. Silicon layer 2304 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 2304 may also be of thicknesses greater than 100 um, depending on, for example, the strength of bonding to heat removal apparatus 2302. Silicon layer 2304 may include transistors such as, for example, MOSFETS, FinFets, BJTs, HEMTs, HBTs, which may include gate electrode region 2314, gate dielectric region 2312, and shallow trench isolation (STI) regions 2310 and several other regions that may be necessary for transistors such as source and drain junction regions (not shown for clarity). Silicon layer 2316 may include transistors such as, for example, MOSFETS, FinFets, BJTs, HEMTs, HBTs, which may include gate electrode region 2334, gate dielectric region 2332, and shallow trench isolation (STI) regions 2322 and several other regions that may be necessary for transistors such as source and drain junction regions (not shown for clarity). It can be observed that the STI regions 2322 can go right through to the bottom of silicon layer 2316 and provide good electrical isolation. A through-layer via (TLV) 2318 may be present and may include an associated surrounding dielectric region 2320. Dielectric region 2320 may include a shallow trench isolation region. Wiring layers 2308 for silicon layer 2304 and wiring dielectric 2306 may be present and may form an associated interconnect layer or layers. Wiring layers 2338 for silicon layer 2316 and wiring dielectric 2336 may be present and may form an associated interconnect layer or layers. Through-layer via (TLV) 2318 may connect to wiring layers 2308 and wiring layers 2338 (not shown). The heat removal apparatus 2302 may include a heat spreader and/or a heat sink. Thermally conductive material regions 2340 could be present at the sides of the 3D-IC shown in FIG. 23. Thermally conductive material regions 2340 may be formed by sequential layer by layer etch and fill, or by an end of process etch and fill. Thus, a thermally conductive heat spreading region could be located on the sidewalls of a 3D-IC. The thermally conductive material regions 2340 could include dielectrics such as, for example, insulating carbon, diamond, diamond like carbon (DLC), and other dielectrics that have a thermal conductivity higher than silicon dioxide and/or have a thermal conductivity higher than 0.6 W/m-K. Another method that could be used for forming thermally conductive material regions 2340 could involve depositing and planarizing the thermally conductive material at locations on or close to the dicing regions, such as potential dicing scribe lines (described in U.S. Patent Application Publication 2012/0129301) of a 3D-IC after an etch process. The wafer could be diced. Those of ordinary skill in the art will appreciate that one could combine the concept of having thermally conductive material regions on the sidewalls of 3D-ICs with concepts shown in other figures of this patent application, such as, for example, the concept of having lateral heat spreaders shown in FIG. 8. Silicon layer 2304 and silicon layer 2316 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 2302 may include an external surface from which heat transfer may take place by methods such as air cooling, liquid cooling, or attachment to another heat sink or heat spreader structure.

Figure 25:
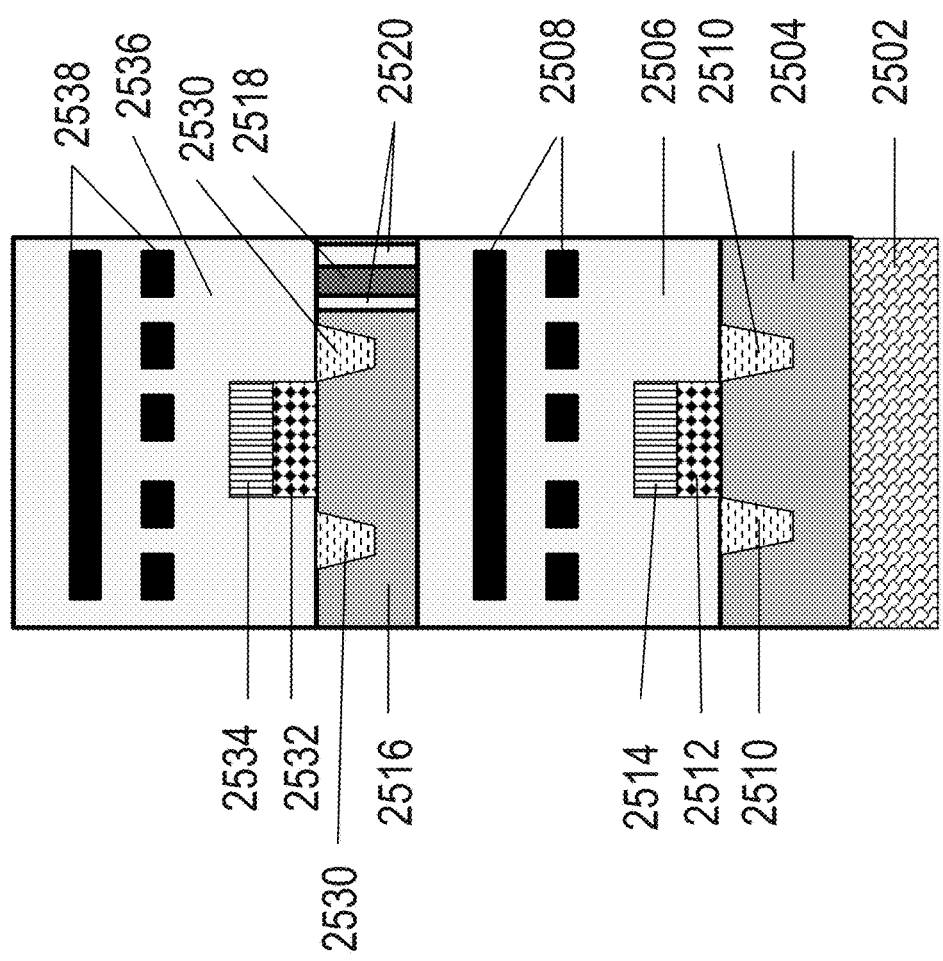
FIG. 25 is an exemplary drawing illustration of a monolithic 3D-IC structure with CTE adjusted through layer connections.

FIG. 25 illustrates an exemplary monolithic 3D integrated circuit. The 3D integrated circuit shown in FIG. 25 could be potentially constructed using techniques described in U.S. Pat. No. 8,273,610, US patent publications 2012/0091587 and 2013/0020707, and pending U.S. patent application Ser. Nos. 13/441,923 and 13/099,010. For example, two crystalline layers, 2504 and 2516, which may include semiconductor materials such as, for example, mono-crystalline silicon, germanium, GaAs, InP, and graphene, are shown. For this illustration, mono-crystalline (single crystal) silicon may be used. Silicon layer 2516 could be thinned from its original thickness, and its final thickness could be in the range of about 0.01 um to about 50 um, for example, 10 nm, 100 nm, 200 nm, 0.4 um, 1 um, 2 um or 5 um. Silicon layer 2504 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 2504 may also be of thicknesses greater than 100 um, depending on, for example, the strength of bonding to heat removal apparatus 2502. Silicon layer 2504, or silicon substrate, may include transistors such as, for example, MOSFETS, FinFets, BJTs, HEMTs, HBTs, which may include gate electrode region 2514, gate dielectric region 2512, transistor junction regions 2510 and several other regions that may be necessary for transistors such as source and drain junction regions (not shown for clarity). Silicon layer 2516 may include transistors such as, for example, MOSFETS, FinFets, BJTs, HEMTs, HBTs, which may include gate electrode region 2534, gate dielectric region 2532, transistor junction regions 2530 and several other regions that may be necessary for transistors such as source and drain junction regions (not shown for clarity). A through-silicon connection 2518, or TLV (through-silicon via) could be present and may have a surrounding dielectric region 2520. Surrounding dielectric region 2520 may include a shallow trench isolation (STI) region, such as one of the shallow trench isolation (STI) regions typically in a 3D integrated circuit stack (not shown). Silicon layer 2504 may have wiring layers 2508 and wiring dielectric 2506. Wiring layers 2508 and wiring dielectric 2506 may form an associated interconnect layer or layers. Silicon layer 2516 may have wiring layers 2538 and wiring dielectric 2536. Wiring layers 2538 and wiring dielectric 2536 may form an associated interconnect layer or layers. Wiring layers 2538 and wiring layers 2508 may be constructed of copper, aluminum or other materials with bulk resistivity lower than 2.8 uohm-cm. The choice of materials for through-silicon connection 2518 may be challenging. If copper is chosen as the material for through-silicon connection 2518, the co-efficient of thermal expansion (CTE) mismatch between copper and the surrounding mono-crystalline silicon layer 2516 may become an issue. Copper has a CTE of approximately 16.7 ppm/K while silicon has a CTE of approximately 3.2 ppm/K. This large CTE mismatch may cause reliability issues and the need for large keep-out zones around the through-silicon connection 2518 wherein transistors cannot be placed. If transistors are placed within the keep-out zone of the through-silicon connection 2518, their current-voltage characteristics may be different from those placed in other areas of the chip. Similarly, if Aluminum (CTE=23 ppm/K) is used as the material for through-silicon connection 2518, its CTE mismatch with the surrounding mono-crystalline silicon layer 2516 could cause large keep-out zones and reliability issues. Silicon layer 2504 and silicon layer 2516 may be may be substantially absent of semiconductor dopants to form an undoped silicon region or layer, or doped, such as, for example, with elemental or compound species that form a p+, or p, or p−, or n+, or n, or n− silicon layer or region.

An embodiment of the invention utilizes a material for the through-silicon connection 2518 (TSV or TLV) that may have a CTE closer to silicon than, for example, copper or aluminum. The through-silicon connection 2518 may include materials such as, for example, tungsten (CTE approximately 4.5 ppm/K), highly doped polysilicon or amorphous silicon or single crystal silicon (CTE approximately 3 ppm/K), conductive carbon, or some other material with CTE less than 15 ppm/K. Wiring layers 2538 and wiring layers 2508 may have materials with CTE greater than 15 ppm/K, such as, for example, copper or aluminum.

Persons of ordinary skill in the art will appreciate that the illustrations in FIG. 25 are exemplary only and are not drawn to scale. Such skilled persons will further appreciate that many variations are possible such as, for example, the through-silicon connection 2518 may include materials in addition to those (such as Tungsten, conductive carbon) described above, for example, liners and barrier metals such as TiN, TaN, and other materials known in the art for via, contact, and through silicon via formation. Moreover, the transistors in silicon layer 2504 may be formed in a manner similar to silicon layer 2516. Furthermore, through-silicon connection 2518 may be physically and electrically connected (not shown) to wiring layers 2508 and wiring layers 2538 by the same material as the wiring layers 2508/2538, or by the same materials as the through-silicon connection 2518 composition, or by other electrically and/or thermally conductive materials not found in the wiring layers 2508/2538 or the through-silicon connection 2518. Many other modifications within the scope of the invention will suggest themselves to such skilled persons after reading this specification. Thus the invention is to be limited only by the appended claims.

A planar n-channel Junction-Less Recessed Channel Array Transistor (JL-RCAT) suitable for a monolithic 3D IC may be constructed as follows. The JL-RCAT may provide an improved source and drain contact resistance, thereby allowing for lower channel doping, and the recessed channel may provide for more flexibility in the engineering of channel lengths and transistor characteristics, and increased immunity from process variations. FIG. 26A-F illustrates an exemplary n-channel JL-RCAT which may be constructed in a 3D stacked layer using procedures outlined below and in U.S. Pat. No. 8,273,610, US patent publications 2012/0091587 and 2013/0020707, and pending U.S. patent application Ser. Nos. 13/441,923 and 13/099,010. The contents of the foregoing applications are incorporated herein by reference.

As illustrated in FIG. 26A, a N− substrate donor wafer 2600 may be processed to include wafer sized layers of N+ doping 2602, and N− doping 2603 across the wafer. The N+ doped layer 2602 may be formed by ion implantation and thermal anneal. N− doped layer 2603 may have additional ion implantation and anneal processing to provide a different dopant level than N− substrate donor wafer 2600. N− doped layer 2603 may have graded or various layers of N− doping to mitigate transistor performance issues, such as, for example, short channel effects, after the JL-RCAT is formed. The layer stack may alternatively be formed by successive epitaxially deposited doped silicon layers of N+ 2602 and N− 2603, or by a combination of epitaxy and implantation. Annealing of implants and doping may include, for example, conductive/inductive thermal, optical annealing techniques (such as short wavelength laser annealing) or types of Rapid Thermal Anneal (RTA or spike). The N+ doped layer 2602 may have a doping concentration that may be more than 10× the doping concentration of N− doped layer 2603. N− doped layer 2603 may have a thickness and/or doping that may allow fully-depleted channel operation when the JL-RCAT transistor is substantially completely formed, such as, for example, less than 5 nm, less than 10 nm, or less than 20 nm.

As illustrated in FIG. 26B, the top surface of N− substrate donor wafer 2600 may be prepared for oxide wafer bonding with a deposition of an oxide or by thermal oxidation of N− doped layer 2603 to form oxide layer 2680. A layer transfer demarcation plane (shown as dashed line) 2699 may be formed by hydrogen implantation or other methods as described in the incorporated references. The N− substrate donor wafer 2600 and acceptor wafer 2610 may be prepared for wafer bonding as previously described and low temperature (less than approximately 400° C.) bonded. Acceptor wafer 2610, as described in the incorporated references, may include, for example, transistors, circuitry, and metal, such as, for example, aluminum or copper, interconnect wiring, and thru layer via metal interconnect strips or pads. The portion of the N+ doped layer 2602 and the N-substrate donor wafer 2600 that may be above the layer transfer demarcation plane 2699 may be removed by cleaving or other low temperature processes as described in the incorporated references, such as, for example, ion-cut or other layer transfer methods.

Figure 26C:
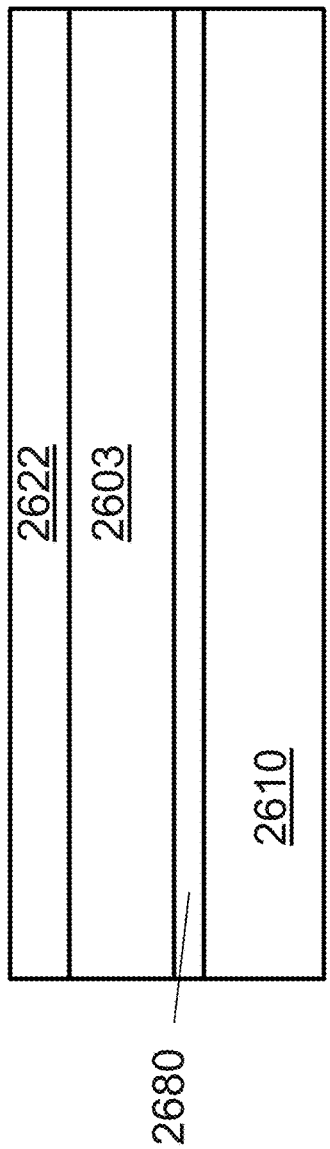

As illustrated in FIG. 26C, oxide layer 2680, N− doped layer 2603, and remaining N+ layer 2622 have been layer transferred to acceptor wafer 2610. The top surface of N+ layer 2622 may be chemically or mechanically polished. Now transistors may be formed with low effective temperature (less than approximately 400° C. exposure to the acceptor wafer 4510 sensitive layers, such as interconnect and device layers) processing and aligned to the acceptor wafer alignment marks (not shown) as described in the incorporated references.

Alignment is a basic step in semiconductor processing. In most cases it is part of the flow that every successive layer is patterned and aligned to a previous or underneath layer. This alignment of each layer could all be done to one common alignment mark, such as for example the zero mark utilized by some ASML equipment, or to some other alignment mark or marks that are embedded in a layer underneath the masking layer being aligned. In today's equipment such alignment would be precise to below 40 nanometers, or 10 nanometers or a few nanometers. In general such alignment could be observed outside the manufacturing fabrication facility by comparing two devices processed using the same mask set. If two layers in one device maintain their relative positions the same—to few nanometers—as the other device, it is a clear indication that these layers are one aligned to the other. This could be achieve by either aligning to the same alignment mark or one is using alignment mark embedded in the other or using different alignment marks of layers that are aligned to each other. Within the manufacturing fabrication facility alignment may be observed and measured by scanning the post develop, and sometime post etch, alignment structures such as for example fiducial marks, or box in box, crosses, etc. as understood by those skilled in the art.

Figure 26D:
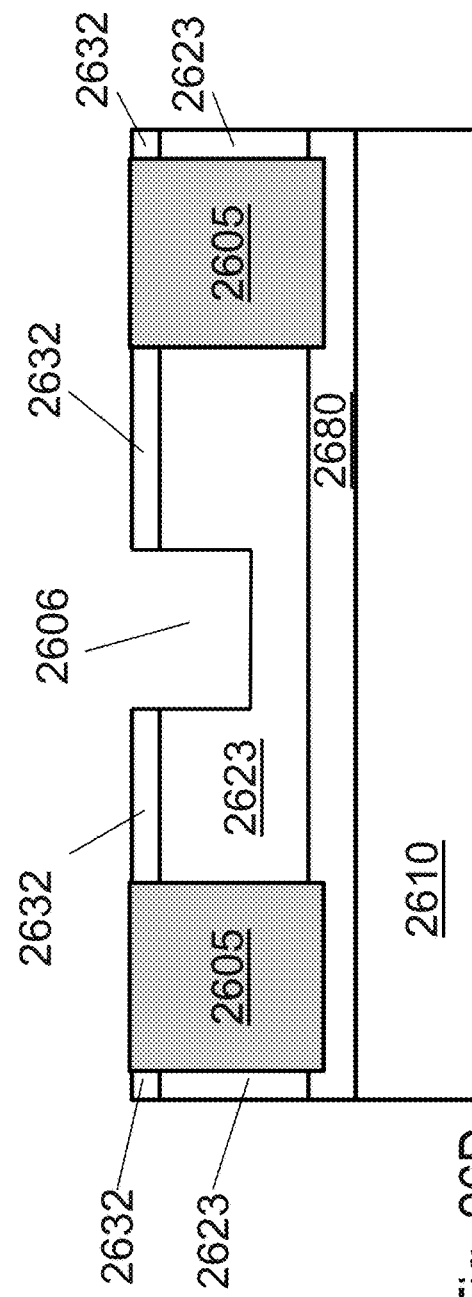

As illustrated in FIG. 26D, the transistor isolation regions 2605 may be formed by mask defining and plasma/RIE etching N+ layer 2622 and N− doped layer 2603 substantially to the top of oxide layer 2680 (not shown), substantially into oxide layer 2680, or into a portion of the upper oxide layer of acceptor wafer 2610 (not shown). A low-temperature gap fill oxide may be deposited and chemically mechanically polished, the oxide remaining in isolation regions 2605. The recessed channel 2606 may be mask defined and etched thru N+ doped layer 2622 and partially into N− doped layer 2603. The recessed channel surfaces and edges may be smoothed by processes, such as, for example, wet chemical, plasma/RIE etching, low temperature hydrogen plasma, or low temperature oxidation and strip techniques, to mitigate high field effects. The low temperature smoothing process may employ, for example, a plasma produced in a TEL (Tokyo Electron Labs) SPA (Slot Plane Antenna) machine. Thus N+ source and drain regions 2632 and N− channel region 2623 may be formed, which may substantially form the transistor body. The doping concentration of N+ source and drain regions 2632 may be more than 10× the concentration of N− channel region 2623. The doping concentration of the N− channel region 2623 may include gradients of concentration or layers of differing doping concentrations. The etch formation of recessed channel 2606 may define the transistor channel length. The shape of the recessed etch may be rectangular as shown, or may be spherical (generally from wet etching, sometimes called an S-RCAT: spherical RCAT), or a variety of other shapes due to etching methods and shaping from smoothing processes, and may help control for the channel electric field uniformity. The thickness of N− channel region 2623 in the region below recessed channel 2606 may be of a thickness and/or doping that allows fully-depleted channel operation. The thickness of N− channel region 2623 in the region below N+ source and drain regions 2632 may be of a thickness that allows fully-depleted transistor operation.

Figure 26E:
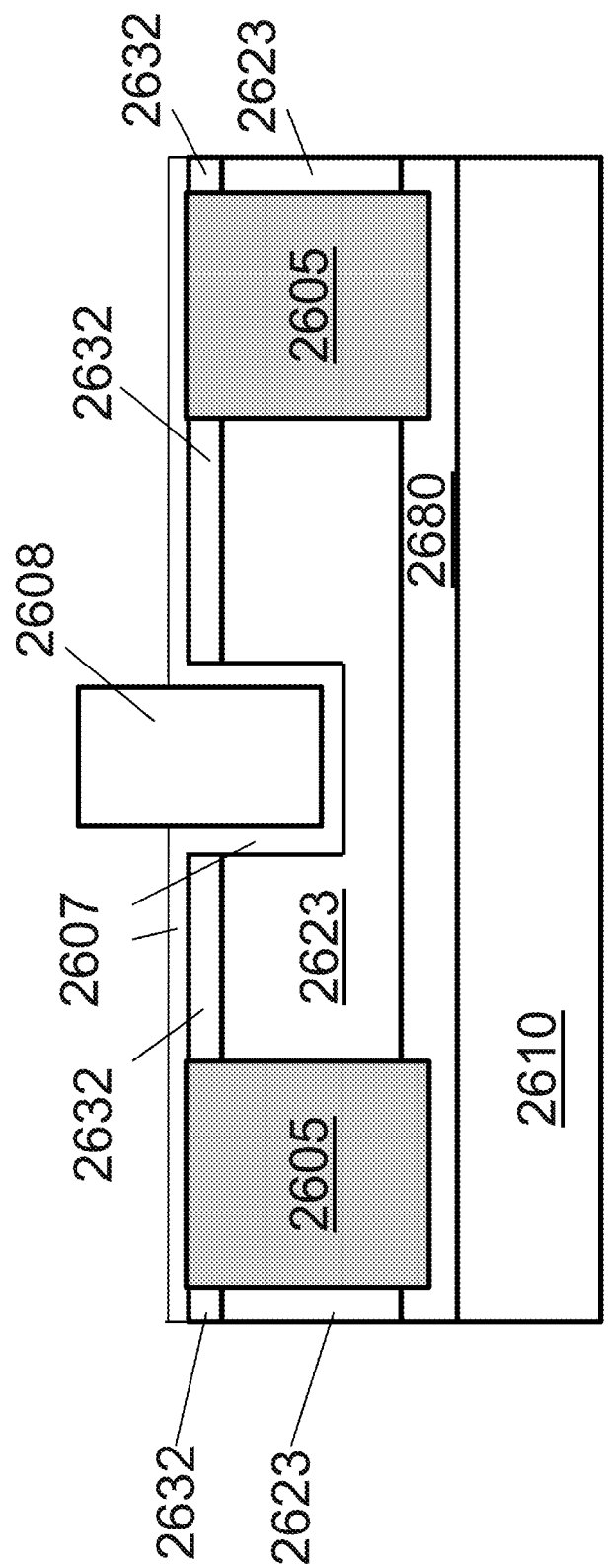

As illustrated in FIG. 26E, a gate dielectric 2607 may be formed and a gate metal material may be deposited. The gate dielectric 2607 may be an atomic layer deposited (ALD) gate dielectric that may be paired with a work function specific gate metal in the industry standard high k metal gate process schemes described in the incorporated references. Alternatively, the gate dielectric 2607 may be formed with a low temperature processes including, for example, LPCVD $SiO_2$ oxide deposition or low temperature microwave plasma oxidation of the silicon surfaces and a gate material with proper work function and less than approximately 400° C. deposition temperature such as, for example, tungsten or aluminum may be deposited. The gate material may be chemically mechanically polished, and the gate area defined by masking and etching, thus forming the gate electrode 2608.

Figure 26F:
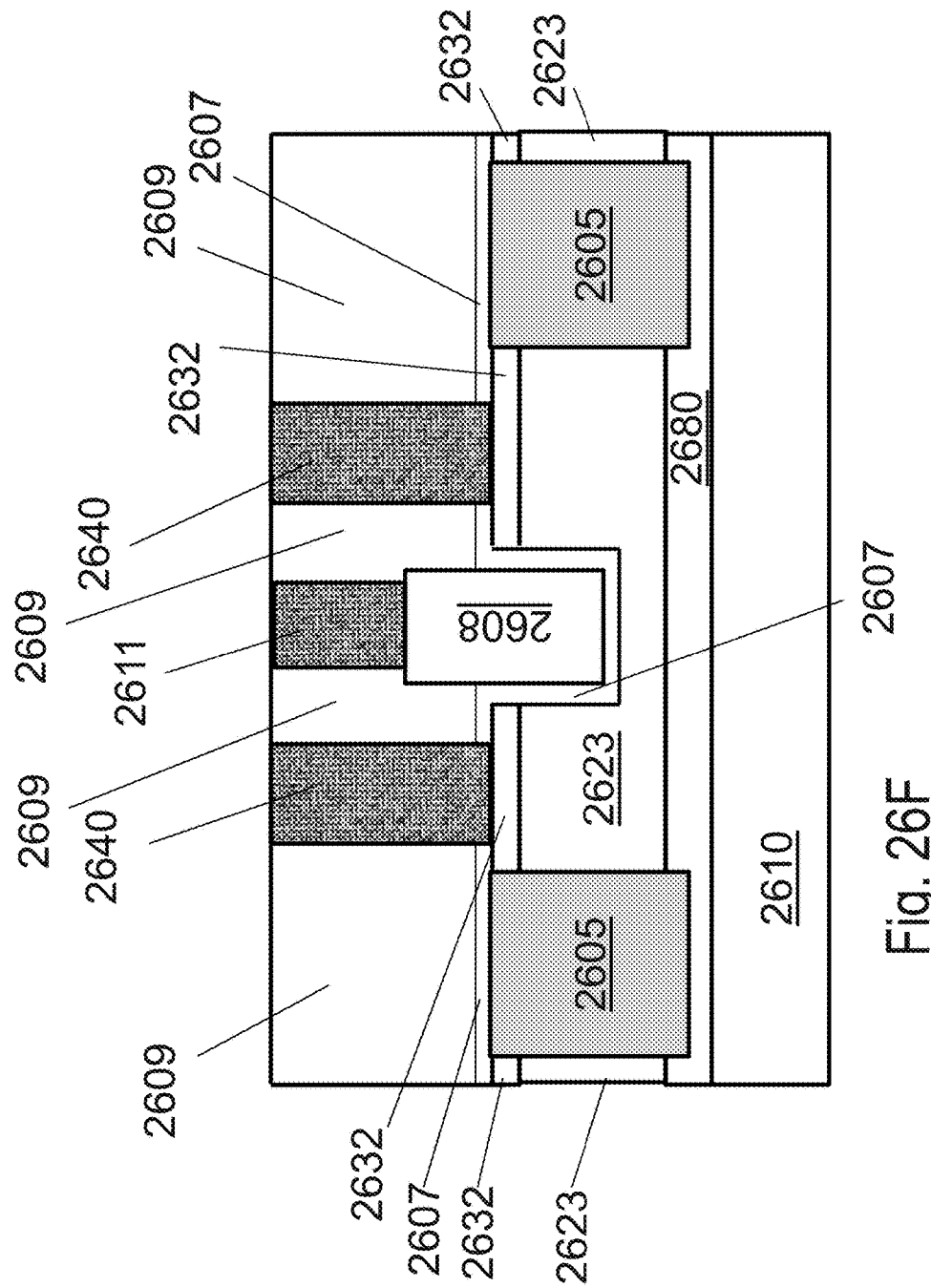

As illustrated in FIG. 26F, a low temperature thick oxide 2609 may be deposited and planarized, and source, gate, and drain contacts, and thru layer via (not shown) openings may be masked and etched preparing the transistors to be connected via metallization. Thus gate contact 2611 connects to gate electrode 2608, and source & drain contacts 2640 connect to N+ source and drain regions 2632. The thru layer via (not shown) provides electrical coupling among the donor wafer transistors and the acceptor wafer metal connect pads or strips (not shown) as described in the incorporated references.

The formation procedures of and use of the N+ source and drain regions 2632 that may have more than 10× the concentration of N− channel region 2623 may enable low contact resistance in a FinFet type transistor, wherein the thickness of the transistor channel is greater than the width of the channel, the transistor channel width being perpendicular to a line formed between the source and drain.

Persons of ordinary skill in the art will appreciate that the illustrations in FIGS. 26A through 26F are exemplary only and are not drawn to scale. Such skilled persons will further appreciate that many variations are possible such as, for example, a p-channel JL-RCAT may be formed with changing the types of dopings appropriately. Moreover, the N− substrate donor wafer 2600 may be p type. Further, N− doped layer 2603 may include multiple layers of different doping concentrations and gradients to fine tune the eventual JL-RCAT channel for electrical performance and reliability characteristics, such as, for example, off-state leakage current and on-state current. Furthermore, isolation regions 2605 may be formed by a hard mask defined process flow, wherein a hard mask stack, such as, for example, silicon oxide and silicon nitride layers, or silicon oxide and amorphous carbon layers, may be utilized. Moreover, CMOS JL-RCATs may be constructed with n-JLRCATs in a first mono-crystalline silicon layer and p-JLRCATs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Furthermore, a back-gate or double gate structure may be formed for the JL-RCAT and may utilize techniques described in the incorporated references. Further, efficient heat removal and transistor body biasing may be accomplished on a JL-RCAT by adding an appropriately doped buried layer (P− in the case of a n-JL-RCAT), forming a buried layer region underneath the N− channel region 2623 for junction isolation, and connecting that buried region to a thermal and electrical contact, similar to what is described for layer 1606 and region 1646 in FIGS. 16A-G in the incorporated reference pending U.S. patent application Ser. No. 13/441,923 and U.S. Patent Publication 2012/0091587. Many other modifications within the scope of the invention will suggest themselves to such skilled persons after reading this specification. Thus the invention is to be limited only by the appended claims.

When formation of a 3D-IC is discussed herein, crystalline layers, for example, two crystalline layers, 2504 and 2516, are utilized to form the monolithic 3D-IC, generally utilizing layer transfer techniques. Similarly, donor layers and acceptor layers of crystalline materials which are referred to and utilized in the referenced US patent documents including U.S. Pat. No. 8,273,610, US patent publications 2012/0091587 and 2013/0020707, and pending U.S. patent application Ser. Nos. 13/441,923 and 13/099,010 may be utilized to form a monolithic 3D-IC, generally utilizing layer transfer techniques. The crystalline layers, whether donor or acceptor layer, may include regions of compound semiconductors, such as, for example, InP, GaAs, and/or GaN, and regions of mono-crystalline silicon and/or silicon dioxide. Heterogeneous integration with short interconnects between the compound semiconductor transistors and the silicon based transistors (such as CMOS) could be enabled by placing or constructing Si—CS hetero-layers into a monolithic 3D-IC structure.

As illustrated in FIG. 27, an exemplary Si—CS hetero donor or acceptor substrate may be formed by utilizing an engineered substrate, for example, SOLES as manufactured and offered for sale by SOITEC S.A. As illustrated in FIG. 27A, engineered substrate may include silicon substrate 2700, buried oxide layer 2702, compound semiconductor template layer 2704, for example, Germanium, oxide layer 2705, and silicon layer 2706, for example, mono-crystalline silicon.

As illustrated in FIG. 27B, regions of silicon layer 2706 may be mask defined and etched away, exposing regions of the top surface of compound semiconductor template layer 2704 and thus forming silicon regions 2707 and oxide regions 2715. High quality compound semiconductor regions 2708 may be epitaxially grown in the exposed regions of compound semiconductor template layer 2704. An example of compound semiconductor growth on an engineered substrate may be found in "Liu, W. K., et al., "Monolithic integration of InP-based transistors on Si substrates using MBE," J. Crystal Growth 311 (2009), pp. 1979-1983." Alternatively, an engineered substrate as described in FIG. 27A but without silicon layer 2706 may be utilized to eliminate the silicon layer removal etch.

Figure 27C:
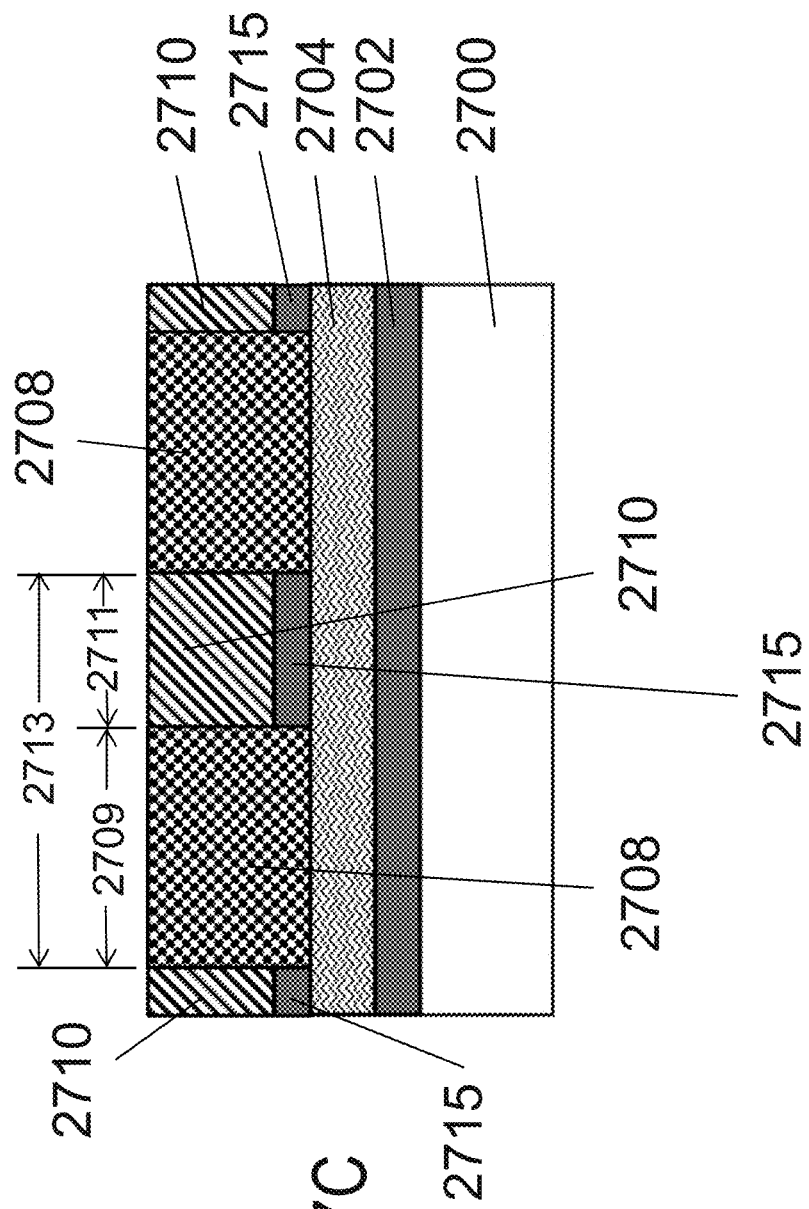

As illustrated in FIG. 27C, silicon regions 2707 may be mask defined and etched partially or fully away and oxide isolation regions 2710 may be formed by, for example, deposition, densification and etchback/planarization of an SACVD oxide such as in a typical STI (Shallow Trench Isolation) process. Alternatively, compound semiconductor template layer 2704 regions that may be below silicon regions 2707 may also be etched away and the oxide fill may proceed. With reference to the repetitive preformed transistor structures such as illustrated in at least FIGS. 32, 33, 73-80 and related specification sections in U.S. Pat. No. 8,273,610, compound semiconductor regions 2708 may be processed to have a repeat width (in x and/or y) of CS repeat 2709, and oxide isolation regions 2710 may be processed to have a repeat width (in x and/or y) of oxide repeat 2711, and the exemplary Si—CS hetero donor or acceptor substrate may be processed to have repeat pitch 2713. For example, repeat pitch 2713 may be on the order of microns, for example, CS repeat 2709 may be 5 um in x and/or y, and oxide repeat 2711 may be 1 um in x and/or y. Repeat pitch 2713 may be on the order of nanometers, for example, CS repeat 2709 may be 50 nm in x and/or y, and oxide repeat 2711 may be 50 nm in x and/or y. Repeat pitch 2713 may include a combination of micron and nanometer components; for example, CS repeat 2709 may be 5 um in x and/or y, and oxide repeat 2711 may be 50 nm in x and/or y. At current CS and CMOS technology levels, the process flow of FIG. 29 may utilize a repeat pitch 2713 of a combination of micron (for CS devices) and nanometer (for isolation and vertical connects) components.

Figure 28A:
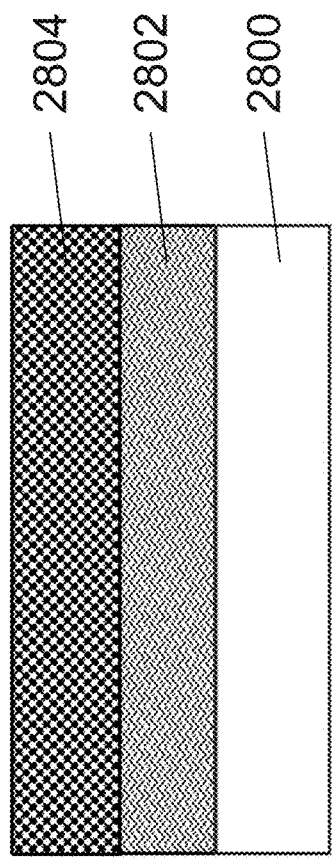
FIG. 28A-28B are exemplary drawing illustrations of Silicon or Oxide-Compound Semiconductor hetero donor or acceptor substrates which may be formed by epitaxial growth directly on a silicon or SOI substrate.

As illustrated in FIG. 28, alternatively, an exemplary Si—CS hetero donor or acceptor substrate may be formed by epitaxial growth directly on a silicon or SOI substrate. As illustrated in FIG. 28A, buffer layers 2802 may be formed on mono-crystalline silicon substrate 2800 and high quality compound semiconductor layers 2804 may be epitaxially grown on top of the surface of buffer layers 2802. Buffer layers 2802 may include, for example, MBE grown materials and layers that help match the lattice between the mono-crystalline silicon substrate 2800 and compound semiconductor layers 2804. For an InP HEMT, buffer layers 2802 may include an AlAs initiation layer, GaAs lattice matching layers, and a graded $In_xAl_{1-x}As$ buffer, $0<x<0.6$. Compound semiconductor layers 2804 may include, for example, barrier, channel, and cap layers. An example of compound semiconductor growth directly on a mono-crystalline silicon substrate may be found in "Hoke, W. E., et al., "AlGaN/GaN high electron mobility transistors on 100 mm silicon substrates by plasma molecular beam epitaxy," Journal of Vacuum Science & Technology B: Microelectronics and Nanometer Structures, (29) 3, May 2011, pp. 03C107-03C107-5."

Figure 28B:
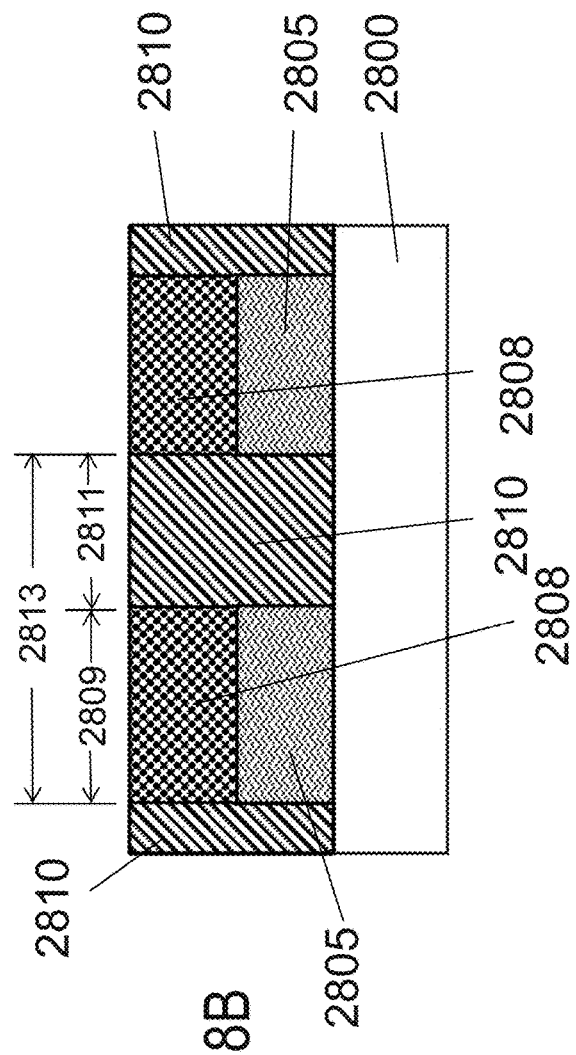

As illustrated in FIG. 28B, compound semiconductor layers 2804 and buffer layers 2802 may be mask defined and etched substantially away and oxide isolation regions 2810 may be formed by, for example, deposition, densification and etchback/planarization of an SACVD oxide such as in a typical STI (Shallow Trench Isolation) process. Thus, compound semiconductor regions 2808 and buffer regions 2805 may be formed. With reference to the repetitive preformed transistor structures such as illustrated in at least FIGS. 32, 33, 73-80 and related specification sections in U.S. Pat. No. 8,273,610, compound semiconductor regions 2808 may be processed to have a repeat width (in x and/or y) of CS repeat 2809, and oxide isolation regions 2810 may be processed to have a repeat width (in x and/or y) of oxide repeat 2811, and the exemplary Si—CS hetero donor or acceptor substrate may be processed to have repeat pitch 2813. For example, repeat pitch 2813 may be on the order of microns, for example, CS repeat 2809 may be 5 um in x and/or y, and oxide repeat 2811 may be 1 um in x and/or y. Repeat pitch 2813 may be on the order of nanometers, for example, CS repeat 2809 may be 50 nm in x and/or y, and oxide repeat 2811 may be 50 nm in x and/or y. Repeat pitch 2813 may include a combination of micron and nanometer components; for example, CS repeat 2809 may be 5 um in x and/or y, and oxide repeat 2811 may be 50 nm in x and/or y. At current CS and CMOS technology levels, the process flow of FIG. 29 may utilize a repeat pitch 2813 of a combination of micron (for CS devices) and nanometer (for isolation and vertical connects) components.

The substrates formed and described in FIGS. 27 and 28 may be utilized in forming 3D-ICs, for example, as donor layers and/or acceptor layers of crystalline materials, as described in the referenced US patent documents including U.S. Pat. No. 8,273,610, US patent publications 2012/0091587 and 2013/0020707, and pending U.S. patent application Ser. Nos. 13/441,923 and 13/099,010 generally by layer transfer techniques, such as, for example, ion-cut. For example, repetitive preformed transistor structures such as illustrated in at least FIGS. 32, 33, 73-80 and related specification sections in U.S. Pat. No. 8,273,610 may be utilized on Si—CS substrates such as FIGS. 27B, 27C, and/or 28B to form stacked 3D-ICs wherein at least one layer may have compound semiconductor transistors. For example, non-repetitive transistor structures such as illustrated in at least FIGS. 57, 58, 65-68, 151, 152, 157, 158 and 160-161 and related specification sections in U.S. Pat. No. 8,273,610 may be utilized on Si—CS substrates such as FIGS. 27A and/or 28A to form stacked 3D-ICs wherein at least one layer may have compound semiconductor transistors. Defect anneal techniques, such as those illustrated in at least FIGS. 184-189 and related specification sections in U.S. Pat. No. 8,273,610, incorporated herein by reference, may be utilized to anneal and repair defects in the layer transferred, generally ion-cut, substrates in at least FIGS. 27 and 28 herein this document.

FIGS. 29A-H illustrate via cross section drawings the use of the Oxide-CS substrate of FIG. 27C to form a closely coupled but independently optimized silicon and compound semiconductor device stack by using layer transfer techniques. The oxide-CS substrate of FIG. 28B may also be utilized.

As illustrated in FIG. 29A, Oxide-CS engineered substrate 2990 may include silicon substrate 2900, buried oxide layer 2902, compound semiconductor template layer 2904, for example, Germanium, compound semiconductor regions 2908, and oxide isolation regions 2910. Oxide regions 2715 such as shown in FIG. 27C are omitted for clarity. Oxide-CS engineered substrate 2990 may include alignment marks (not shown).

Figure 29B:
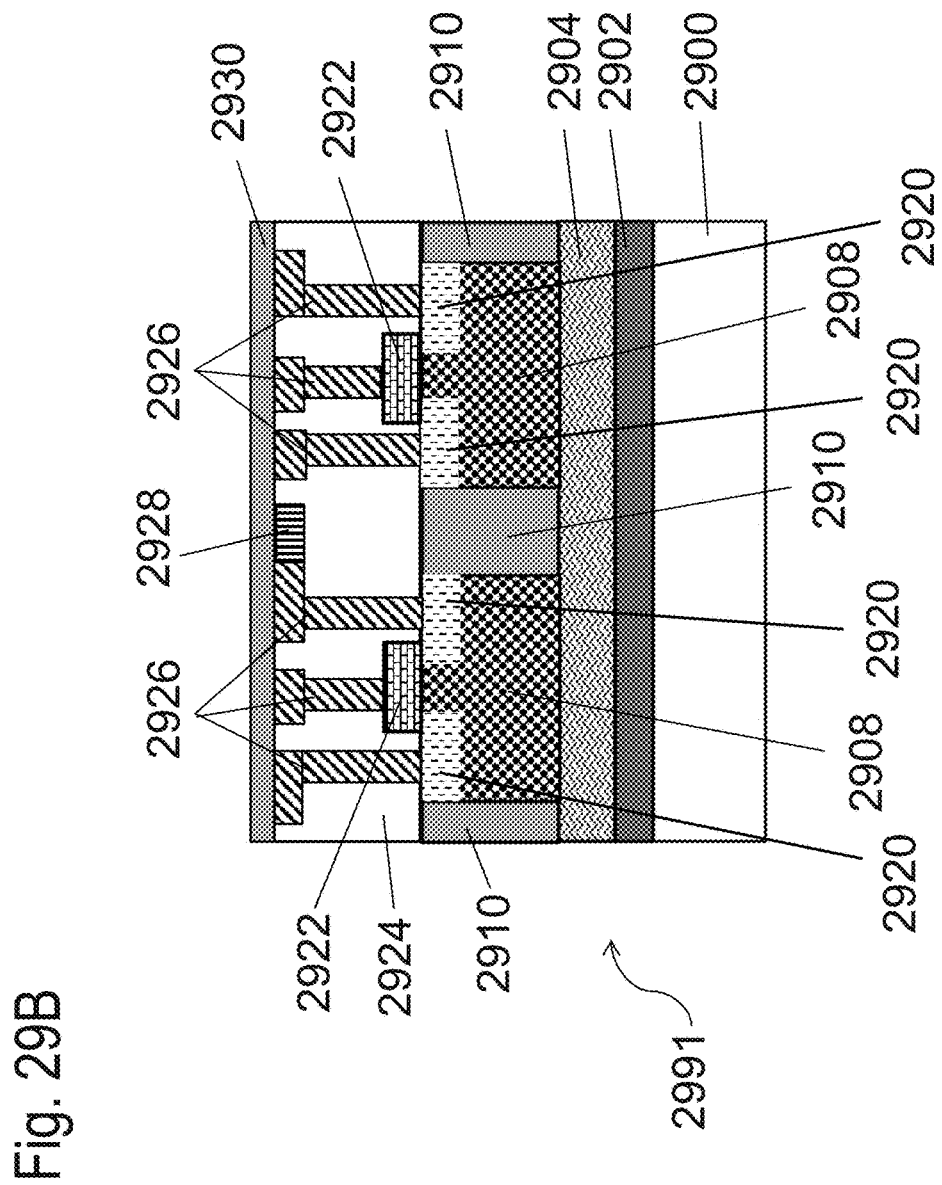

As illustrated in FIG. 29B, Oxide-CS engineered substrate 2990 may be processed to form compound semiconductor transistor, such as, for example, InP, GaAs, SiGe, GaN HEMTs and HBTs, and a metal interconnect layer or layers wherein the top metal interconnect layer may include a CS donor wafer orthogonal connect strip 2928. The details of the orthogonal connect strip methodology may be found as illustrated in at least FIGS. 30-33, 73-80, and 94 and related specification sections of U.S. Pat. No. 8,273,610. The length of CS donor wafer orthogonal connect strip 2928 may be drawn/layed-out over and parallel to the oxide isolation regions 2910. CS donor wafer bonding oxide 2930 may be deposited in preparation for oxide-oxide bonding. Thus, CS donor substrate 2991 may include silicon substrate 2900, buried oxide layer 2902, compound semiconductor template layer 2904, compound semiconductor regions 2908, oxide isolation regions 2910, compound semiconductor transistor source and drain regions 2920, compound semiconductor transistor gate regions 2922, CS donor substrate metallization isolation dielectric regions 2924, CS donor substrate metal interconnect wire and vias 2926, CS donor wafer orthogonal connect strip 2928, and CS donor wafer bonding oxide 2930.

Figure 29C:
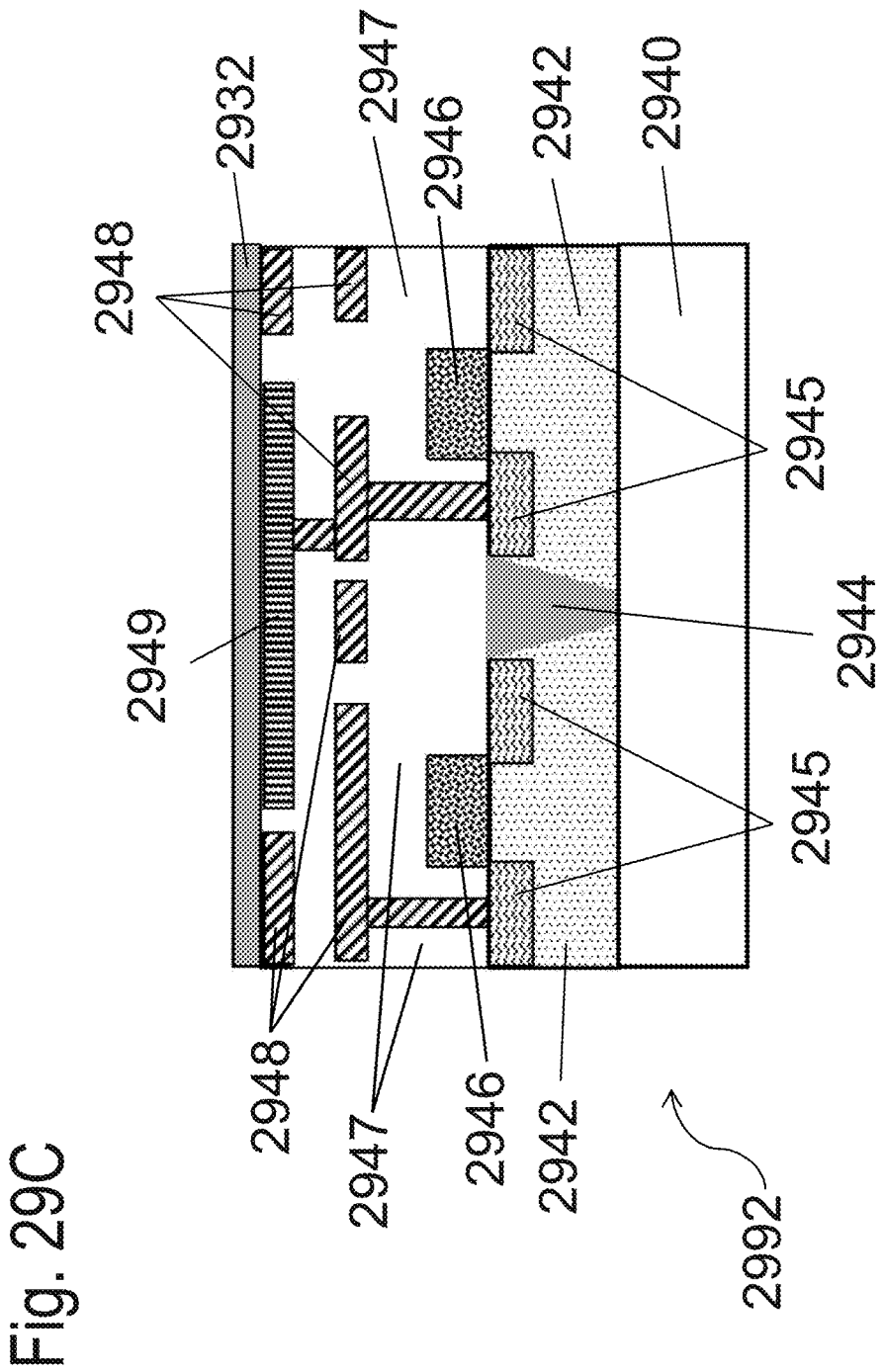

As illustrated in FIG. 29C, crystalline substrate 2940 may be processed to form transistors, such as, for example, mono-crystalline silicon PMOSFETs and NMOSFETs, and a metal interconnect layer or layers wherein the top metal interconnect layer may include a base substrate orthogonal connect strip 2949. The details of the orthogonal connect strip methodology may be found as illustrated in at least FIGS. 30-33, 73-80, and 94 and related specification sections of U.S. Pat. No. 8,273,610. Crystalline substrate 2940 may include semiconductor materials such as mono-crystalline silicon. The base substrate orthogonal connect strip 2949 may be drawn/laid-out in an orthogonal and mid-point intersect crossing manner with respect to the CS donor wafer orthogonal connect strip 2928. Acceptor wafer bonding oxide 2932 may be deposited in preparation for oxide-oxide bonding. Thus, acceptor base substrate 2992 may include crystalline substrate 2940, well regions 2942, Shallow Trench Isolation (STI) regions 2944, transistor source and drain regions 2945, transistor gate stack regions 2946, base substrate metallization isolation dielectric regions 2947, base substrate metal interconnect wires and vias 2948, base substrate orthogonal connect strip 2949, and acceptor wafer bonding oxide 2932. Acceptor base substrate 2992 may include alignment marks (not shown).

Figure 29D:
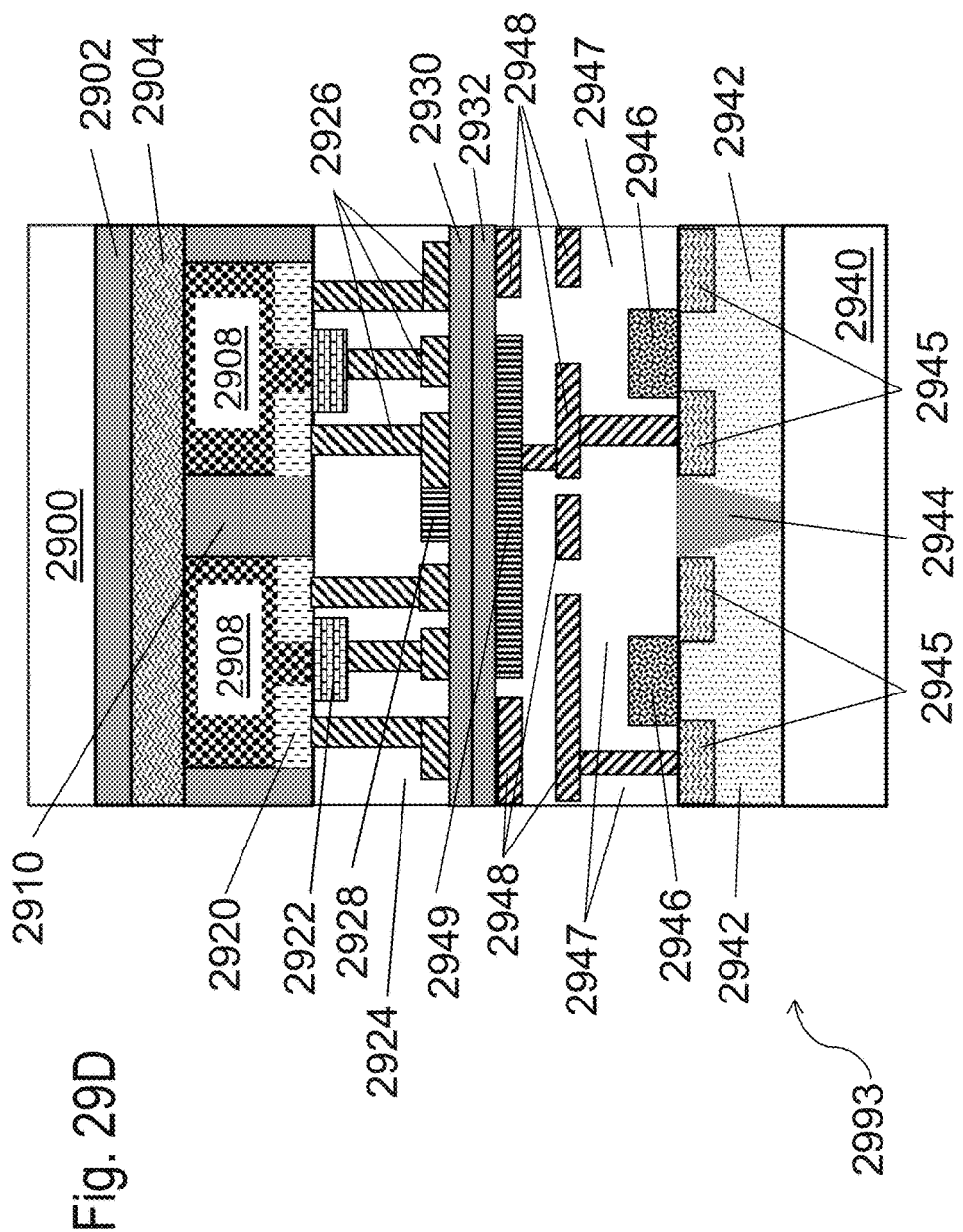

As illustrated in FIG. 29D, CS donor substrate 2991 may be flipped over, aligned (using information from alignment marks in CS donor substrate 2991 and acceptor base substrate 2992), and oxide to oxide bonded to acceptor base substrate 2992. The bonding may take place between the large area surfaces of acceptor wafer bonding oxide 2932 and CS donor wafer bonding oxide 2930. The bond may be made at low temperatures, such as less than about 400° C., so to protect the base substrate metallization and isolation structures. Thus, CS-base bonded substrate structure 2993 may be formed. The lengths of base substrate orthogonal connect strip 2949 and CS donor wafer orthogonal connect strip 2928 may be designed to compensate for misalignment of the wafer to wafer bonding process and other errors, as described in the referenced related specification cited previously. Pre-bond plasma pre-treatments and thermal anneals, such as a 250° C. anneal, may be utilized to strengthen the low temperature oxide-oxide bond.

Figure 29E:
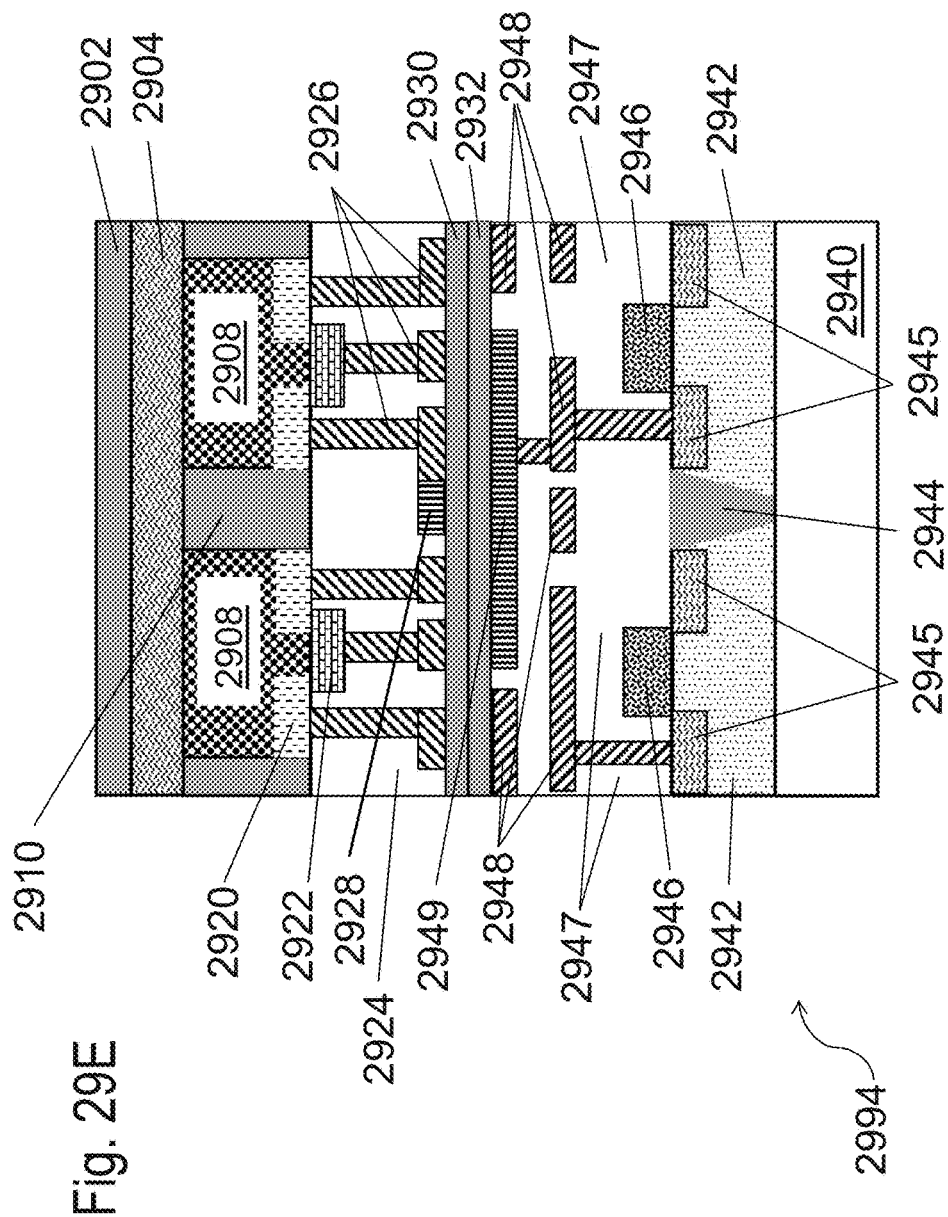

As illustrated in FIG. 29E, crystalline substrate 2940 of CS-base bonded substrate structure 2993 may be removed by processes such as wet etching crystalline substrate 2940 with warm KOH after protecting the sidewalls and backside of CS-base bonded substrate structure 2993 with, for example, resist and/or wax. Plasma, RIE, and/or CMP processes may also be employed. Thus CS-base bonded structure 2994 may be formed.

Figure 29F:
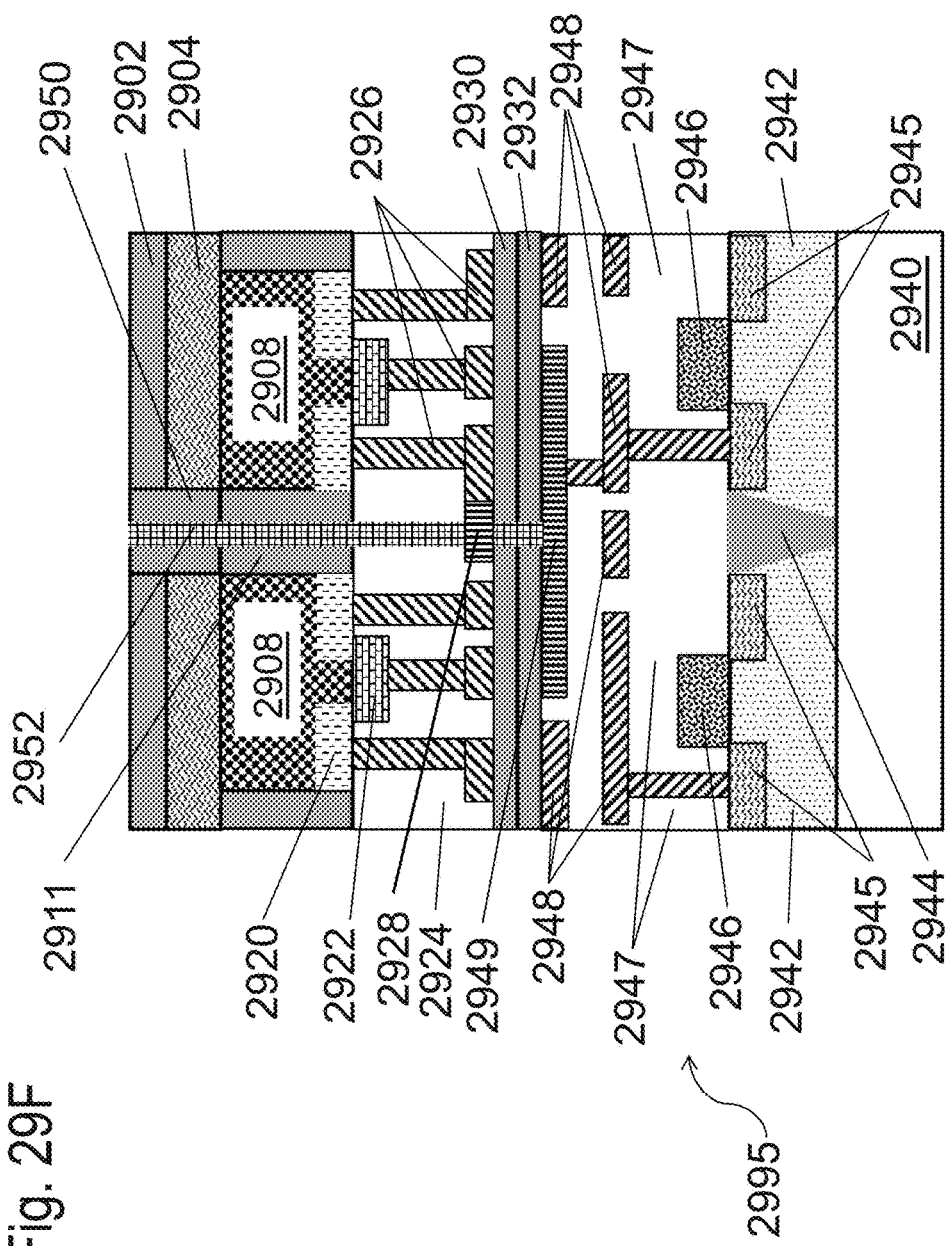
Figure 29G:
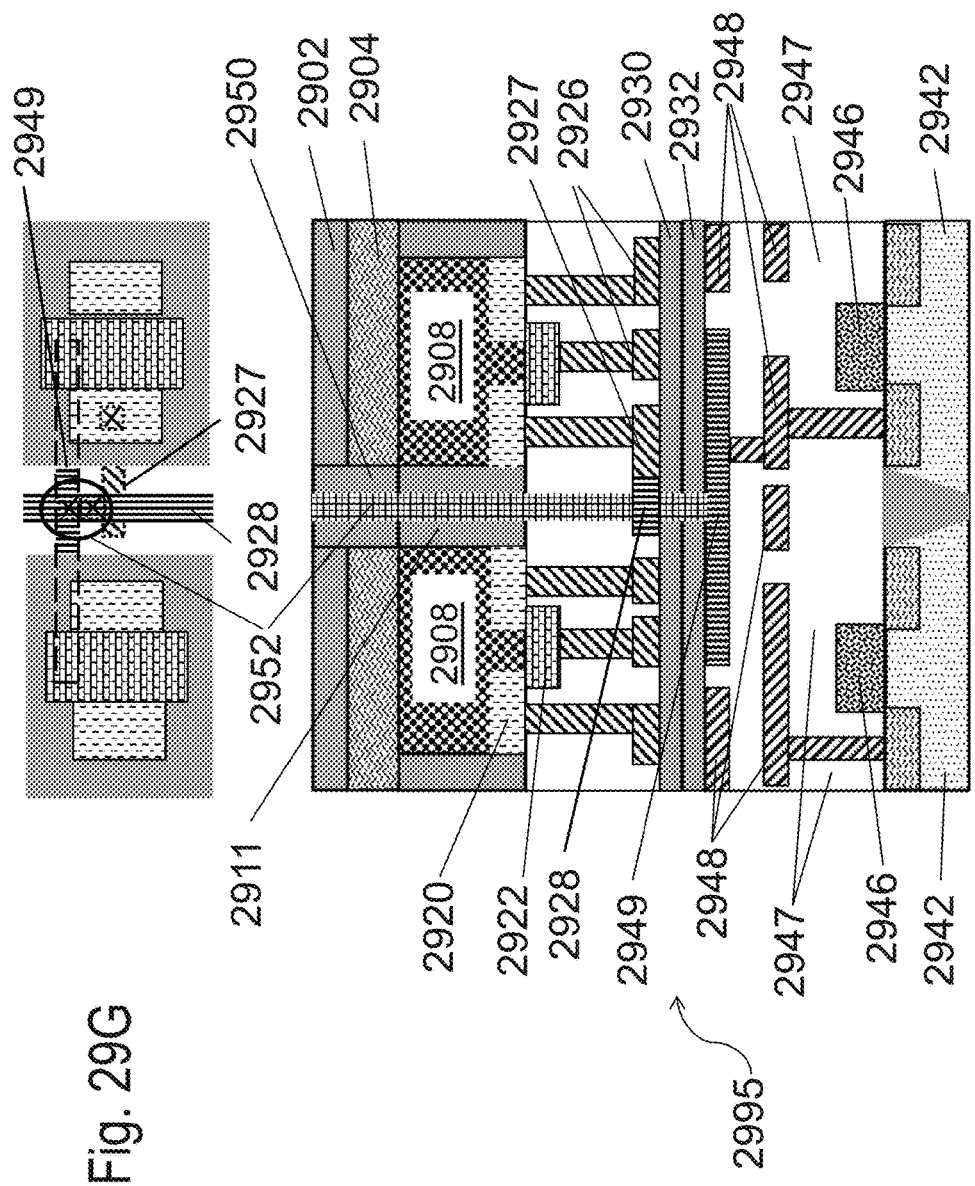
Figures 1, 29G:
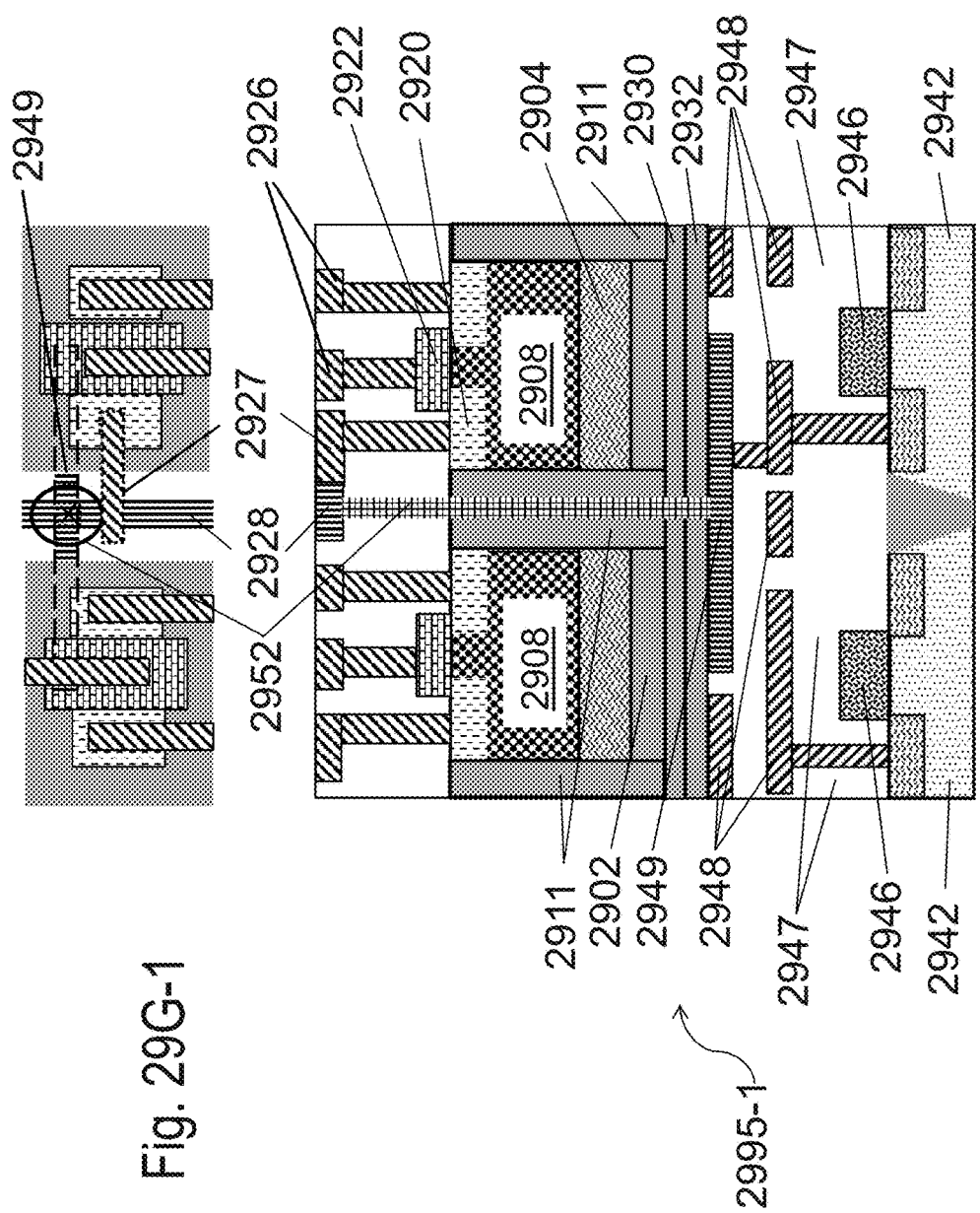

As illustrated in FIG. 29F, CS-base bonded structure 2994 may be processed to connect base substrate orthogonal connect strip 2949 to CS donor wafer orthogonal connect strip 2928 and thus form a short CS transistor to base CMOS transistor interconnect. Buried oxide layer 2902 and compound semiconductor template layer 2904 may be mask defined and etched substantially away in regions and oxide region 2950 may be formed by, for example, deposition, densification and etchback/planarization of a low temperature oxide, such as an SACVD oxide. Stitch via 2952 may be masked and etched through oxide region 2950, the indicated oxide isolation region 2910 (thus forming oxide regions 2911), CS donor substrate metallization isolation dielectric regions 2924, acceptor wafer bonding oxide 2932 and CS donor wafer bonding oxide 2930. Stitch via 2952 may be processed with a metal fill such as, for example, barrier metals such as TiN or CoN, and metal fill with Cu, W, or Al, and CMP polish to electrically (and physically) bridge or stitch base substrate orthogonal connect strip 2949 to CS donor wafer orthogonal connect strip 2928, thus forming a CS transistor to base CMOS transistor interconnect path. CS-base interconnected structure 2995 may thus be formed. FIG. 29G includes a top view of the CS-base interconnected structure 2995 showing stitch via 2952 connecting the base substrate orthogonal connect strip 2949 to CS donor wafer orthogonal connect strip 2928. Highlighted CS donor substrate metal interconnect CS source wire and via 2927 (one of the CS donor substrate metal interconnect wire and vias 2926) may provide the connection from the CS transistor to the CS donor wafer orthogonal connect strip 2928, which may be connected to the base substrate metal interconnect wires and vias 2948 (and thus the base substrate transistors) thru the stitch via 2952 and base substrate orthogonal connect strip 2949. Thus, a connection path may be formed between the CS transistor of the second, or donor, layer of the stack, and the CMOS transistors residing in the base substrate layer, or first layer.

Figure 29H:
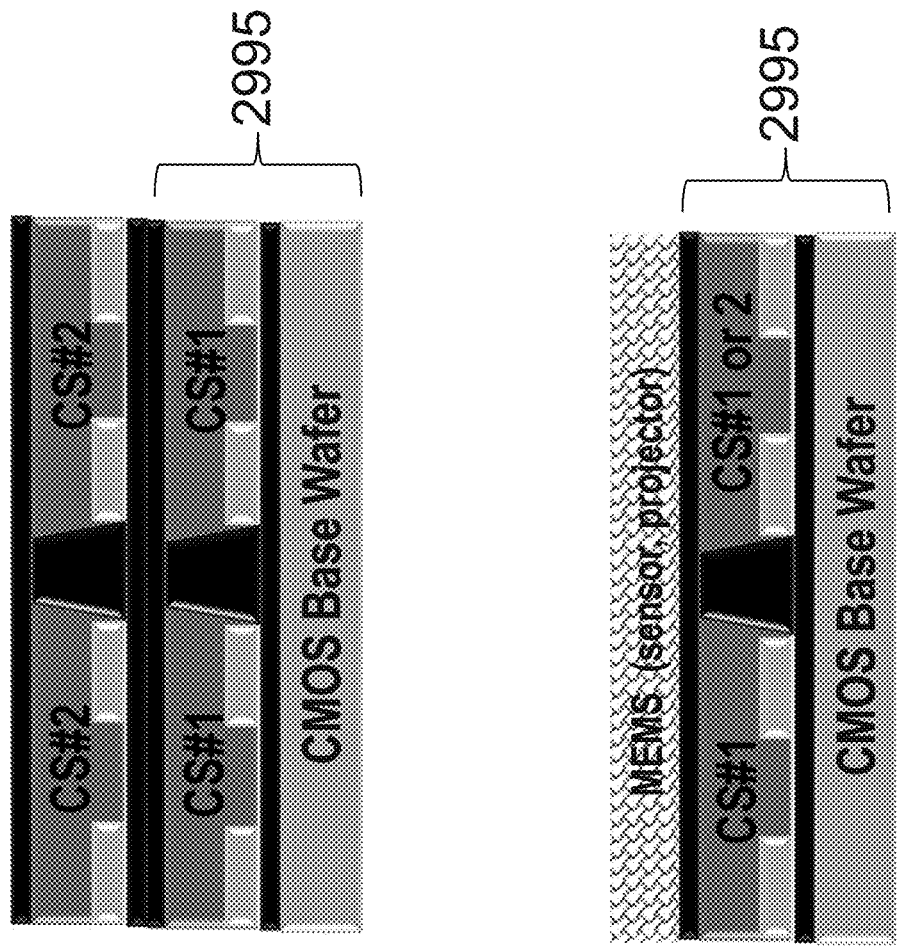

As illustrated in FIG. 29H top drawing, CS-base interconnected structure 2995 may be further processed to create orthogonal metal interconnect strips and stacking of a second CS transistor layer (thus the third layer in the stack) in a similar manner as described above in FIGS. 29A-F. Thus a third layer including CS#2 transistors, which may be a different type of CS transistor than the CS#1 transistors on the second layer, may be stacked and connected to the CS (#1) transistors of the second layer of CS-base interconnected structure 2995 and the CMOS transistors of the first layer of CS-base interconnected structure 2995. As illustrated in FIG. 29H bottom drawing, CS-base interconnected structure 2995 may be further processed to create orthogonal metal interconnect strips and stacking of a third layer in a similar manner as described above in FIGS. 29A-F, wherein that third layer may be a layer that includes, for example, MEMS sensor, image projector, SiGe transistors, or CMOS.

Persons of ordinary skill in the art will appreciate that the illustrations in FIG. 29 are exemplary and are not drawn to scale. Such skilled persons will further appreciate that many variations may be possible such as, for example, various types and structures of CS transistors may be formed and are not limited to the types and structures of transistors that may be suggested by the drawing illustrations. Moreover, non-repetitive transistor structures, techniques and formation process flows of CMOS and/or CS transistors at low temp on top of CMOS such as illustrated in at least FIGS. 57, 58, 65-68, 151, 152, 157, 158 and 160-161 and related specification sections in U.S. Pat. No. 8,273,610 may be utilized. Further, during the backside etch step of FIG. 29E to remove crystalline substrate 2940, the etch may be continued (may switch chemistries, techniques) to remove buried oxide layer 2902 and partially or substantially remove compound semiconductor template layer 2904. Moreover, bonding methods other than oxide to oxide, such as oxide to metal, hybrid (metal and oxide to metal and oxide), may be utilized. Further, an ion-cut process may be used as part of the layer transfer process. Moreover, the top layer, CS in this case, does not need to be flipped over and stitch via connected to the CMOS bottom substrate, rather, the CS substrate may be layer transferred face up, the CS transistor processing completed, and then the CS transistors interconnected and then vertically connected to the bottom CMOS substrate transistor metallization layers by utilizing the smart alignment with landing strip procedures referenced herein (exemplary resultant structure illustrated in FIG. 29G-1, 2952 being a TLV, and 2911 being an etched and oxide filled isolation region). Many other modifications within the scope of the illustrated embodiments of the invention will suggest themselves to such skilled persons after reading this specification. Thus the invention is to be limited only by the appended claims.

Three dimensional devices offer a new possibility of partitioning designs into multiple layers or strata based various criteria, such as, for example, routing demands of device blocks in a design, lithographic process nodes, speed, cost, and density. Many of the criteria are illustrated in at least FIGS. 13, 210-215, and 239 and related specification sections in U.S. Pat. No. 8,273,610, the contents are incorporated herein by reference. An additional criterion for partitioning decision-making may be one of trading cost for process complexity/attainment. For example, spacer based patterning techniques, wherein a lithographic critical dimension can be replicated smaller than the original image by single or multiple spacer depositions, spacer etches, and subsequent image (photoresist or prior spacer) removal, are becoming necessary in the industry to pattern smaller linewidths while still using the longer wavelength steppers and imagers. Other double, triple, and quad patterning techniques, such as pattern and cut, may also be utilized to overcome the lithographic constraints of the current imaging equipment. However, the spacer based and multiple patterning techniques are expensive to process and yield, and generally may be constraining to design and layout: they generally may require regular patterns, sometimes substantially all parallel lines. An embodiment of the invention is to partition a design into those blocks and components that may be amenable and efficiently constructed by the above expensive patterning techniques onto one or more layers in the 3D-IC, and partition the other blocks and components of the design onto different layers in the 3D-IC. As illustrated in FIG. 30A, third layer of circuits and transistors 3004 may be stacked on top of second layer of circuits and transistors 3002, which may be stacked on top of first layer/substrate of circuits and transistors 3000. The formation of, stacking, and interconnect within and between the three layers may be done by techniques described herein, in the incorporated by reference documents, or any other 3DIC stacking technique that can form vertical interconnects of a density greater than 10,000 vias/cm², or may be formed with conventional TSVs of lessor density. Types of transistors and circuits may include, for example, DRAM, NAND, or RRAM, RCAT, continuous array and FPGA structures, gate array, memory blocks, logic blocks, solar cell completion, CMOS p-type and n-type transistors, MOSFET transistors, junction-less transistors, JFET, replacement gate transistors, thin-side-up transistors, double gate transistors, horizontally oriented transistors, finfet transistors, JLRCAT, DSS Schottky transistors, and/or trench MOSFET transistors as described by various embodiments herein (such as FIG. 53) and incorporated references, such as U.S. Pat. No. 8,273,610. Partitioning of the overall device between the three layers may, for example, consist of the first layer/substrate of circuits and transistors 3000 including the portion of the overall design wherein the blocks and components do not require the expensive patterning techniques discussed above; and second layer of circuits and transistors 3002 may include a portion of the overall design wherein the blocks and components may lead to the expensive patterning techniques discussed above, and may be aligned in, for example, the 'x' direction, and third layer of circuits and transistors 3004 may include a portion of the overall design wherein the blocks and components may lead to the expensive patterning techniques discussed above, and may be aligned in a direction different from second layer of circuits and transistors 3002, for example, the 'y' direction (perpendicular to the second layer's pattern). The partitioning constraint discussed above related to process complexity/attainment may be utilized in combination with other partitioning constraints to provide an optimized fit to the design's logic and cost demands. For example, the procedure and algorithm (illustrated in FIG. 239 and related specification found in the referenced U.S. Pat. No. 8,273,610) to partition a design into two target technologies may be adapted to also include the constraints and criterion described herein FIG. 30A and/or FIG. 30B and or FIG. 30C.

A large portion of the circuit designs currently are layed-out in a 'Manhattan' style framework, wherein the lines, spaces and connections are in orthogonal Cartesian relationships. Some designs recently have been layed-out in a diagonal, or 45 degree fashion, commonly known as the 'X Architecture'. However, to mix both styles, X and Manhattan, on one chip in 2D has been problematic. Too much area is lost due to the clash between layout styles/frameworks. An embodiment of the invention is to partition a design into those blocks and components that may be amenable and efficiently constructed by placing substantially only Manhattan style layouts onto one or more layers in the 3D-IC, and partition the other blocks and components of the design that may be amenable and efficiently constructed using substantially only X-architecture layouts onto different layers in the 3D-IC. As illustrated in FIG. 30B, third layer of circuits and transistors 3014 may be stacked on top of second layer of circuits and transistors 3012, which may be stacked on top of first layer/substrate of circuits and transistors 3010. The formation of, stacking, and interconnect within and between the three layers may be done by techniques described herein, in the incorporated by reference documents, or any other 3DIC stacking technique that can form vertical interconnects of a density greater than 10,000 vias/cm², or may be formed with conventional TSVs of lessor density. Types of transistors and circuits may include, for example, DRAM, NAND, or RRAM, RCAT, continuous array and FPGA structures, gate array, memory blocks, logic blocks, solar cell completion, CMOS p-type and n-type transistors, MOSFET transistors, junction-less transistors, JFET, replacement gate transistors, thin-side-up transistors, double gate transistors, horizontally oriented transistors, finfet transistors, JLRCAT, DSS Schottky transistors, and/or trench MOSFET transistors as described by various embodiments herein and incorporated references, such as U.S. Pat. No. 8,273,610. Partitioning of the overall device between the three layers may, for example, consist of the first layer/substrate of circuits and transistors 3010 including the portion of the overall design wherein the blocks and components are layed-out in Manhattan style; and second layer of circuits and transistors 3012 may include a portion of the overall design wherein the blocks and components may be layed-out in an X Architecture style, and third layer of circuits and transistors 3014 may include a portion of the overall design wherein the blocks and components may be layed-out in Manhattan style. The partitioning constraint discussed above related to layout style/framework may be utilized in combination with other partitioning constraints to provide an optimized fit to the design's logic and cost demands. For example, the procedure and algorithm (illustrated in FIG. 239 and related specification found in the referenced U.S. Pat. No. 8,273,610) to partition a design into two target technologies may be adapted to also include the constraints and criterion described herein FIG. 30A and/or FIG. 30B and or FIG. 30C.

An additional layer partitioning consideration may be one of thermal design and routing of thermal conduction paths to various heat removal apparatus, such as heat sinks and external surfaces of the chip assembly that may interface with gas, solid, or liquid cooling structures and devices. Heat sinks, heat spreader layers, device, and structures are discussed herein and in the referenced patents. An embodiment of the invention is to partition a design into those blocks and components that may best served by placing the devices with the higher heat generation capability on the top and/or bottom layers (closest to the heat sinks, external surfaces, etc.) of the 3D-IC, and partition the other blocks and components of the design that may be cooler, or less thermally stressful to the heat conduction system/network, on the middle layers of the 3D-IC. As illustrated in FIG. 30C, third layer of circuits and transistors 3024 may be stacked on top of second layer of circuits and transistors 3022, which may be stacked on top of first layer/substrate of circuits and transistors 3020. The formation of, stacking, and interconnect within and between the three layers may be done by techniques described herein, in the incorporated by reference documents, or any other 3DIC stacking technique that can form vertical interconnects of a density greater than 10,000 vias/cm$^2$, or may be formed with conventional TSVs of lessor density. Types of transistors and circuits may include, for example, DRAM, NAND, or RRAM, RCAT, continuous array and FPGA structures, gate array, memory blocks, logic blocks, solar cell completion, CMOS p-type and n-type transistors, MOSFET transistors, junction-less transistors, JFET, replacement gate transistors, thin-side-up transistors, double gate transistors, horizontally oriented transistors, finfet transistors, JLRCAT, DSS Schottky transistors, and/or trench MOSFET transistors as described by various embodiments herein herein (such as FIG. 53) and incorporated references, such as U.S. Pat. No. 8,273,610. Partitioning of the overall device between the three layers may, for example, consist of the first layer/substrate of circuits and transistors 3020 including the portion of the overall design wherein the higher heat generating blocks and components are placed; and second layer of circuits and transistors 3022 may include a portion of the overall design wherein the lower heat generating blocks and components may be placed, and third layer of circuits and transistors 3024 may include a portion of the overall design wherein the higher or highest heat generating blocks and components may be placed. For example, first layer/substrate of circuits and transistors 3020 may include logic devices, second layer of circuits and transistors 3022 may include memory devices, and third layer of circuits and transistors 3024 may include logic devices. The partitioning constraint discussed above related to layout style/framework may be utilized in combination with other partitioning constraints (such as bit line length and memory access time) to provide an optimized fit to the design's logic and cost demands. For example, the procedure and algorithm (illustrated in FIG. 239 and related specification found in the referenced U.S. Pat. No. 8,273,610) to partition a design into two target technologies may be adapted to also include the constraints and criterion described herein FIG. 30A and/or FIG. 30B and or FIG. 30C.

Moreover, first layer/substrate of circuits and transistors 3020 may include logic devices, second layer of circuits and transistors 3022 may include memory devices, and third layer of circuits and transistors 3024 may include I/O logic devices, such as SerDes (Serialiser/Deserialiser). The output or input conductive pads of the I/O circuits may be coupled, for example by bonded wires, to external devices. The output or input conductive pads may also act as a contact port for the 3D device output to connect to external devices. The emf generated by the I/O circuits could be shielded from the other layers in the stack by use of, for example, the heat sink/shield layers described in at least FIGS. 33, 34, 45, 46, and 47. Placement of the I/O circuits on the same stack layer as the conductive bond pad may enable close coupling of the desired I/O energy and lower signal loss. Furthermore, first layer/substrate of circuits and transistors 3020 may include logic devices, second layer of circuits and transistors 3022 may include memory devices, and third layer of circuits and transistors 3024 may include RF (Radio Frequency) circuits and/or at least one antenna. For example, third layer of circuits and transistors 3024 may include RF circuits to enable an off-chip communication capability to external devices, for example, a wireless communication circuit or circuits such as a Bluetooth protocol or capacitive coupling. The emf generated by the RF circuits could be shielded from the other layers in the stack by use of, for example, the heat sink/shield layers described in at least FIGS. 33, 34, 45, 46, and 47.

Persons of ordinary skill in the art will appreciate that the illustrations in FIGS. 30A through 30C are exemplary only and are not drawn to scale. Such skilled persons will further appreciate that many variations are possible such as, for example, a 3DIC may be formed with two stacked layers, for example, first layer/substrate of circuits and transistors 3020 and third layer of circuits and transistors 3024. Many other modifications within the scope of the invention will suggest themselves to such skilled persons after reading this specification. Thus the invention is to be limited only by the appended claims Ion implantation damage repair, and transferred layer annealing, such as activating doping, may utilize carrier wafer liftoff techniques as illustrated in at least FIGS. 184-189 and related specification sections in U.S. Pat. No. 8,273,610, the contents are incorporated herein by reference. High temperature glass carrier substrates/wafers may be utilized, but may locally be structurally damaged or de-bond from the layer being annealed when exposed to LSA (laser spike annealing) or other optical anneal techniques that may locally exceed the softening or outgassing temperature threshold of the glass carrier. An embodiment of the invention is to improve the heat-sinking capability and structural strength of the glass carrier by inserting a layer of a material that may have a greater heat capacity and/or heat spreading capability than glass or fused quartz, and may have an optically reflective property, for example, aluminum, tungsten or forms of carbon such as carbon nanotubes. As illustrated in FIG. 31, carrier substrate 3199 may include substrate 3100, heat sink reflector material 3102, bonding material 3104, and desired transfer layer 3106. Substrate 3100 may include, for example, monocrystalline silicon wafers, high temperature glass or fused quartz wafers/substrates, germanium wafers, InP wafers, or high temperature polymer substrates. Substrate 3100 may have a thickness greater than about 50 um, such as 100 um, 1000 um, 1 mm, 2 mm, 5 mm to supply structural integrity for the subsequent processing. Heat sink reflector material 3102 may include material that may have a greater heat capacity and/or heat spreading capability than glass or fused quartz, and may have an optically reflective property, for example, aluminum, tungsten, silicon based silicides, or forms of carbon such as carbon nanotubes. Bonding material 3104 may include silicon oxides, indium tin oxides, fused quartz, high temperature glasses, and other optically transparent to the LSA beam or optical annealing wavelength materials. Bonding material 3104 may have a thickness greater than about 5 nm, such as 10 nm, 20 nm, 100 nm, 200 nm, 300 nm, 500 nm. Desired transfer layer 3106 may include any layer transfer devices and/or layer or layers contained herein this document or the referenced document, for example, the gate-last partial transistor layers, DRAM $Si/SiO_2$ layers, sub-stack layers of circuitry, RCAT doped layers, or starting material doped monocrystalline silicon. Carrier substrate 3199 may be exposed to an optical annealing beam, such as, for example, a laser-spike anneal beam from a commercial semiconductor material oriented single or dual-beam laser spike anneal DB-LSA system of Ultratech Inc., San Jose, Calif., USA, or a short pulse laser (such as 160 ns), with 308 nm wavelength, such as offered by Excico of Gennevilliers, France. Optical anneal beam 3108 may locally heat desired transfer layer 3106 to anneal defects and/or activate dopants. The portion of the optical anneal beam 3108 that is not absorbed by desired transfer layer 3106 may pass through bonding material 3104 and be absorbed and or reflected by heat sink reflector material 3102. This may increase the efficiency of the optical anneal/activation of desired transfer layer 3106, and may also provide a heat spreading capability so that the temperature of desired transfer layer 3106 and bonding material 3104 locally near the optical anneal beam 3108, and in the beam's immediate past locations, may not exceed the debond temperature of the bonding material 3104 to desired transfer layer 3106 bond. The annealed and/or activated desired transfer layer 3106 may be layer transferred to an acceptor wafer or substrate, as described, for example, in the referenced patent document FIG. 186. Substrate 3100, heat sink reflector material 3102, and bonding material 3104 may be removed/decoupled from desired transfer layer 3106 by being etched away or removed during the layer transfer process. The heat removal apparatus, such as heat sinks and heat spreaders, may include an external surface from which heat transfer may take place by methods such as air cooling, liquid cooling, or attachment to another heat sink or heat spreader structure.

One compelling advantage of the Excico's laser annealing machine is its output optical system. This optical system forms a large rectangular window of uniform laser energy with less than 10% variation over the surface to be annealed, and with sharp edges of less than 100 micron between the uniform energy and almost no energy as illustrated in FIG. 49. Accordingly a whole die or even reticle could be exposed in one shot. By setting the window size and aligning the laser to the wafer properly, it could allow the laser annealing process to have the stitching of optical energy, such as pulsed laser exposures, at a desired area, such as the scribe street, such as for example lines 104, potential dicing line 104-1, potential dicing lines 104-2, in FIG. 10 of incorporated patent reference U.S. Pat. No. 8,273,610 to Or-Bach, et al. Thus, the laser stitch may be placed between dies, thereby reducing the risk from uneven exposure at the stitching area affecting any of the desired circuit transistors or elements. Additionally, the window size may be set to cover a multiplicity of dice or tiles, such as end-device 3611 of FIG. 36 of incorporated patent reference U.S. Pat. No. 8,273,610 to Or-Bach, et al., which may also have potential dice lines, such as potential dice lines 3602 and/or actual dice lines, such as actual dice lines 3612. The optical annealing could be done sequentially across the wafer or in steppings that substantially cover the entire wafer area but spread the heat generation to allow better heat removal. Such spreading of heat generation could be done, for example, by scanning the wafer surface like a checkerboard, first exposing rectangles or areas such as the 'blacks' of the checkerboard, and then the 'white' locations.

A planar fully depleted n-channel Recessed Channel Array Transistor (FD-RCAT) suitable for a monolithic 3D IC may be constructed as follows. The FD-RCAT may provide an improved source and drain contact resistance, thereby allowing for lower channel doping (such as undoped), and the recessed channel may provide for more flexibility in the engineering of channel lengths and transistor characteristics, and increased immunity from process variations. The buried doped layer and channel dopant shaping, even to an un-doped channel, may allow for efficient adaptive and dynamic body biasing to control the transistor threshold and threshold variations, as well as provide for a fully depleted or deeply depleted transistor channel. Furthermore, the recessed gate allows for an FD transistor but with thicker silicon for improved lateral heat conduction. FIG. 32A-F illustrates an exemplary n-channel FD-RCAT which may be constructed in a 3D stacked layer using procedures outlined below and in U.S. Pat. No. 8,273,610, US patent publications 2012/0091587 and 2013/0020707, and pending U.S. patent application Ser. Nos. 13/441,923 and 13/099,010. The contents of the foregoing patent and applications are incorporated herein by reference.

As illustrated in FIG. 32A, a P− substrate donor wafer 3200 may be processed to include wafer sized layers of N+ doping 3202, P− doping 3206, channel 3203 and P+ doping 3204 across the wafer. The N+ doped layer 3202, P− doped layer 3206, channel layer 3203 and P+ doped layer 3204 may be formed by ion implantation and thermal anneal. P− substrate donor wafer 3200 may include a crystalline material, for example, mono-crystalline (single crystal) silicon. P− doped layer 3206 and channel layer 3203 may have additional ion implantation and anneal processing to provide a different dopant level than P− substrate donor wafer 3200. P− substrate donor wafer 3200 may be very lightly doped (less than 1e15 atoms/$cm^3$) or nominally un-doped (less than 1e14 atoms/$cm^3$). P− doped layer 3206, channel layer 3203, and P+ doped layer 3204 may have graded or various layers doping to mitigate transistor performance issues, such as, for example, short channel effects, after the FD-RCAT is formed, and to provide effective body biasing, whether adaptive or dynamic. The layer stack may alternatively be formed by successive epitaxially deposited doped silicon layers of N+ doped layer 3202, P− doped layer 3206, channel layer 3203 and P+ doped layer 3204, or by a combination of epitaxy and implantation. Annealing of implants and doping may include, for example, conductive/inductive thermal, optical annealing techniques or types of Rapid Thermal Anneal (RTA or spike). The N+ doped layer 3202 may have a doping concentration that may be more than 10× the doping concentration of P− doped layer 3206 and/or channel layer 3203. The P+ doped layer 3204 may have a doping concentration that may be more than 10× the doping concentration of P− doped layer 3206 and/or channel layer 3203. The P− doped layer 3206 may have a doping concentration that may be more than 10× the doping concentration of channel layer 3203. Channel layer 3203 may have a thickness and/or doping that may allow fully-depleted channel operation when the FD-RCAT transistor is substantially completely formed, such as, for example, less than 5 nm, less than 10 nm, or less than 20 nm.

As illustrated in FIG. 32B, the top surface of the P− substrate donor wafer 3200 layer stack may be prepared for oxide wafer bonding with a deposition of an oxide or by thermal oxidation of P+ doped layer 3204 to form oxide layer 3280. A layer transfer demarcation plane (shown as dashed line) 3299 may be formed by hydrogen implantation or other methods as described in the incorporated references. The P− substrate donor wafer 3200 and acceptor wafer 3210 may be prepared for wafer bonding as previously described and low temperature (less than approximately 400° C.) bonded. Acceptor wafer 3210, as described in the incorporated references, may include, for example, transistors, circuitry, and metal, such as, for example, aluminum or copper, interconnect wiring, a metal shield/heat sink layer, and thru layer via metal interconnect strips or pads. Acceptor wafer 3210 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. The portion of the N+ doped layer 3202 and the P− substrate donor wafer 3200 that may be above (when the layer stack is flipped over and bonded to the acceptor wafer) the layer transfer demarcation plane 3299 may be removed by cleaving or other low temperature processes as described in the incorporated references, such as, for example, ion-cut or other layer transfer methods.

As illustrated in FIG. 32C, oxide layer 3280, P+ doped layer 3204, channel layer 3203, P− doped layer 3206, and remaining N+ layer 3222 have been layer transferred to acceptor wafer 3210. The top surface of N+ layer 3222 may be chemically or mechanically polished. Now transistors may be formed with low effective temperature (less than approximately 400° C. exposure to the acceptor wafer 4510 sensitive layers, such as interconnect and device layers) processing and aligned to the acceptor wafer alignment marks (not shown) as described in the incorporated references.

As illustrated in FIG. 32D, the transistor isolation regions 3205 may be formed by mask defining and plasma/RIE etching remaining N+ layer 3222, P− doped layer 3206, channel layer 3203, and P+ doped layer 3204 substantially to the top of oxide layer 3280 (not shown), substantially into oxide layer 3280, or into a portion of the upper oxide layer of acceptor wafer 3210 (not shown). Additionally, a portion of the transistor isolation regions 3205 may be etched (separate step) substantially to P+ doped layer 3204, thus allowing multiple transistor regions to be connected by the same P+ doped region 3224. A low-temperature gap fill oxide may be deposited and chemically mechanically polished, the oxide remaining in isolation regions 3205. The recessed channel 3286 may be mask defined and etched thru remaining N+ doped layer 3222, P− doped layer 3206 and partially into channel layer 3203. The recessed channel surfaces and edges may be smoothed by processes, such as, for example, wet chemical, plasma/RIE etching, low temperature hydrogen plasma, or low temperature oxidation and strip techniques, to mitigate high field effects. The low temperature smoothing process may employ, for example, a plasma produced in a TEL (Tokyo Electron Labs) SPA (Slot Plane Antenna) machine. Thus N+ source and drain regions 3232, P− regions 3226, and channel region 3223 may be formed, which may substantially form the transistor body. The doping concentration of N+ source and drain regions 3232 may be more than 10× the concentration of channel region 3223. The doping concentration of the N− channel region 3223 may include gradients of concentration or layers of differing doping concentrations. The doping concentration of N+ source and drain regions 3232 may be more than 10× the concentration of P− regions 3226. The etch formation of recessed channel 3286 may define the transistor channel length. The shape of the recessed etch may be rectangular as shown, or may be spherical (generally from wet etching, sometimes called an S-RCAT: spherical RCAT), or a variety of other shapes due to etching methods and shaping from smoothing processes, and may help control for the channel electric field uniformity. The thickness of channel region 3223 in the region below recessed channel 3286 may be of a thickness that allows fully-depleted channel operation. The thickness of channel region 3223 in the region below N+ source and drain regions 3232 may be of a thickness that allows fully-depleted transistor operation.

Figure 32E:
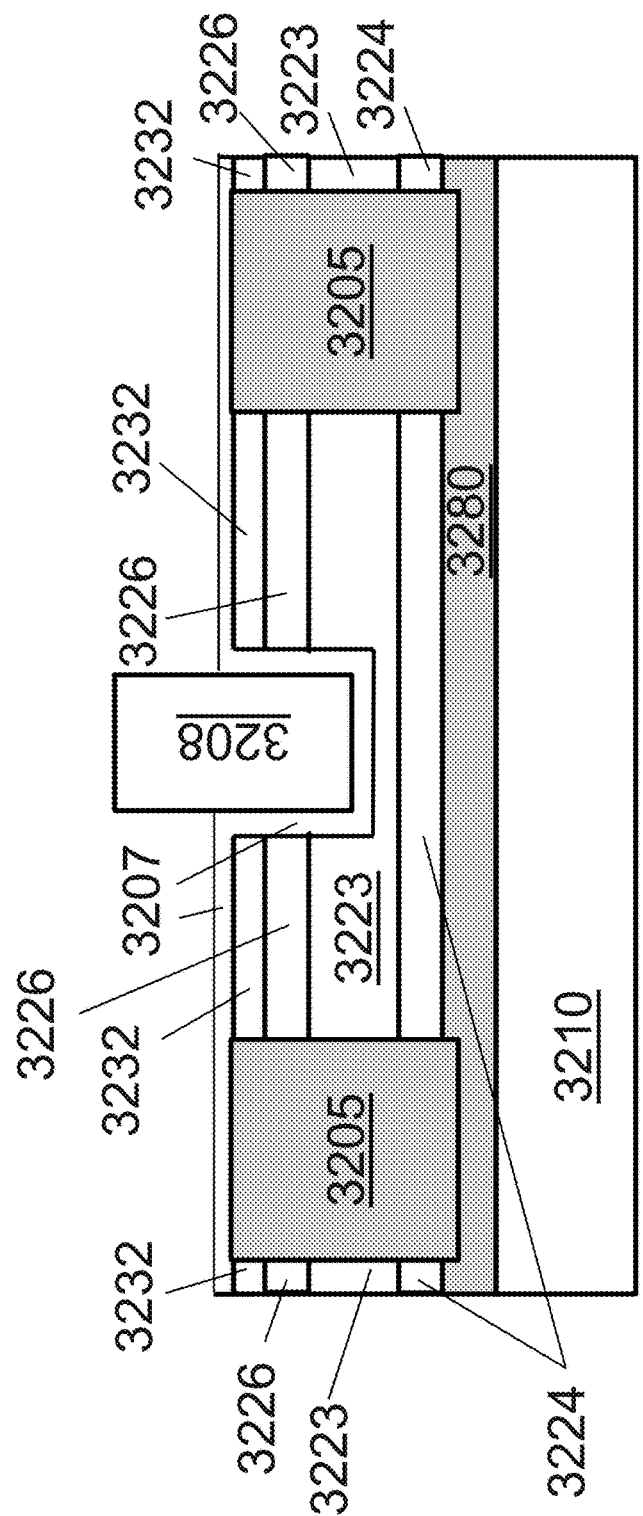

As illustrated in FIG. 32E, a gate dielectric 3207 may be formed and a gate metal material may be deposited. The gate dielectric 3207 may be an atomic layer deposited (ALD) gate dielectric that may be paired with a work function specific gate metal in the industry standard high k metal gate process schemes described in the incorporated references. Alternatively, the gate dielectric 3207 may be formed with a low temperature processes including, for example, LPCVD SiO$_2$ oxide deposition or low temperature microwave plasma oxidation of the silicon surfaces and a gate material with proper work function and less than approximately 400° C. deposition temperature such as, for example, tungsten or aluminum may be deposited. The gate material may be chemically mechanically polished, and the gate area defined by masking and etching, thus forming the gate electrode 3208. The shape of gate electrode 3208 is illustrative, the gate electrode may also overlap a portion of N+ source and drain regions 3232.

Figure 32F:
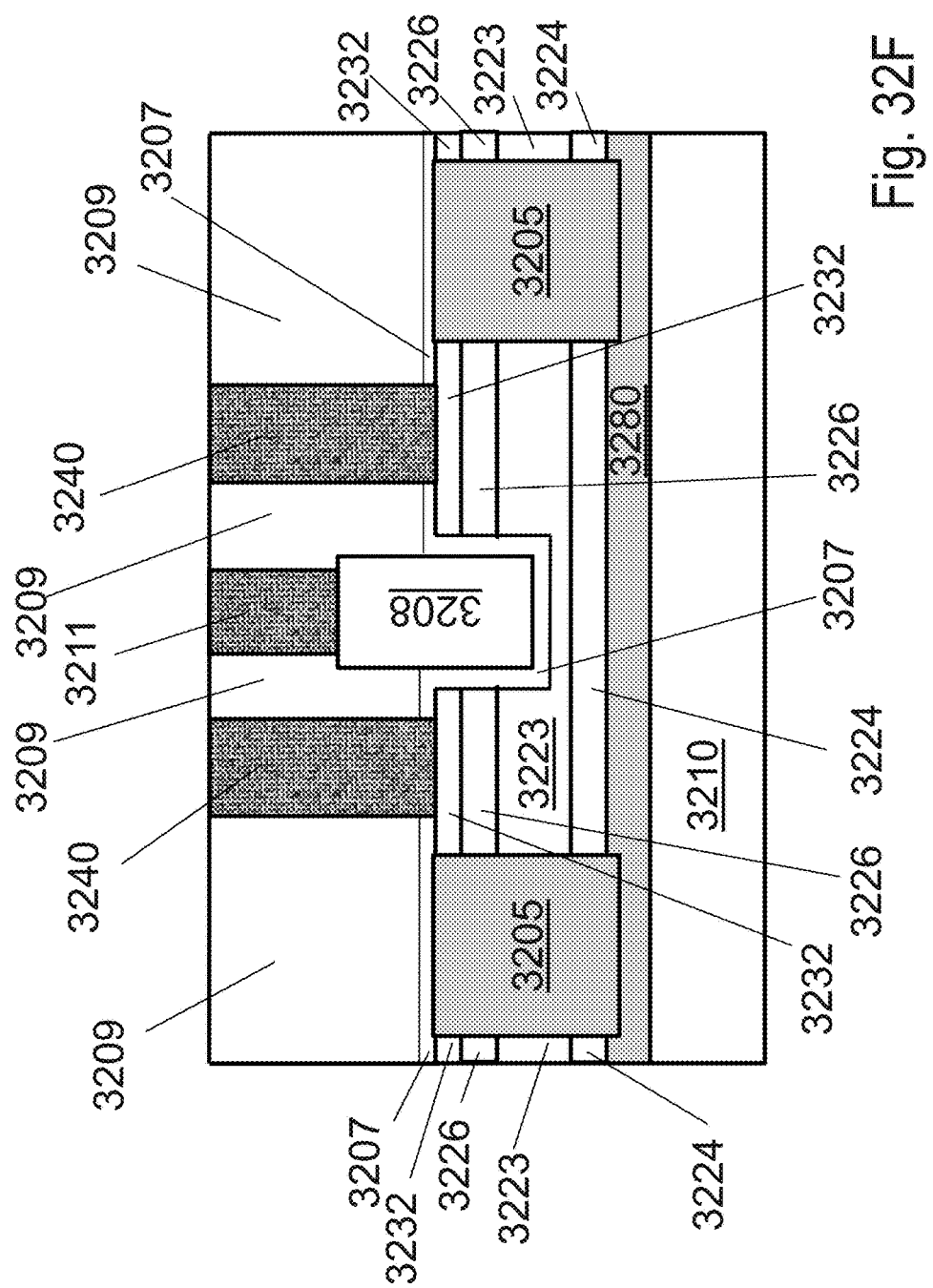

As illustrated in FIG. 32F, a low temperature thick oxide 3209 may be deposited and planarized, and source, gate, and drain contacts, P+ doped region contact (not shown) and thru layer via (not shown) openings may be masked and etched preparing the transistors to be connected via metallization. P+ doped region contact may be constructed thru isolation regions 3205, suitably when the isolation regions 3205 is formed to a shared P+ doped region 3224. Thus gate contact 3211 connects to gate electrode 3208, and source & drain contacts 3240 connect to N+ source and drain regions 3232. The thru layer via (not shown) provides electrical coupling among the donor wafer transistors and the acceptor wafer metal connect pads or strips (not shown) as described in the incorporated references.

Persons of ordinary skill in the art will appreciate that the illustrations in FIGS. 32A through 32F are exemplary only and are not drawn to scale. Such skilled persons will further appreciate that many variations are possible such as, for example, a p-channel FD-RCAT may be formed with changing the types of dopings appropriately. Moreover, the P- substrate donor wafer 3200 may be n type or un-doped. Further, P- doped channel layer 3203 may include multiple layers of different doping concentrations and gradients to fine tune the eventual FD-RCAT channel for electrical performance and reliability characteristics, such as, for example, off-state leakage current and on-state current. Furthermore, isolation regions 3205 may be formed by a hard mask defined process flow, wherein a hard mask stack, such as, for example, silicon oxide and silicon nitride layers, or silicon oxide and amorphous carbon layers, may be utilized. Moreover, CMOS FD-RCATs may be constructed with n-JLRCATs in a first mono-crystalline silicon layer and p-JLRCATs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Furthermore, P+ doped regions 3224 may be utilized for a double gate structure for the FD-RCAT and may utilize techniques described in the incorporated references. Further, efficient heat removal and transistor body biasing may be accomplished on a FD-RCAT by adding an appropriately doped buried layer (N- in the case of a n-FD-RCAT), forming a buried layer region underneath the P+ doped region 3224 for junction isolation, and connecting that buried region to a thermal and electrical contact, similar to what is described for layer 1606 and region 1646 in FIGS. 16A-G in the incorporated reference pending U.S. patent application Ser. No. 13/441,923 and U.S. Patent Publication 2012/0091587. Many other modifications within the scope of the invention will suggest themselves to such skilled persons after reading this specification. Thus the invention is to be limited only by the appended claims.

Defect annealing, such as furnace thermal or optical annealing, of thin layers of the crystalline materials generally included in 3D-ICs to the temperatures that may lead to substantial dopant activation or defect anneal, for example above 600° C., may damage or melt the underlying metal interconnect layers of the stacked 3D-IC, such as copper or aluminum interconnect layers. An embodiment of the invention is to form 3D-IC structures and devices wherein a heat spreading, heat conducting and/or optically reflecting or absorbent material layer or layers (which may be called a shield) is incorporated between the sensitive metal interconnect layers and the layer or regions being optically irradiated and annealed, or annealed from the top of the 3D-IC stack using other methods. An exemplary generalized process flow is shown in FIGS. 33A-F. An exemplary process flow for an FD-RCAT with an optional integrated heat shield/spreader is shown in FIGS. 34A-G. An exemplary process flow for a FD-MOSFET with an optional integrated heat shield/spreader is shown in FIGS. 45A-G. An exemplary process flow for a planar fully depleted n-channel MOSFET (FD-MOSFET) with an optional integrated heat shield/spreader and back planes and body bias taps is shown in FIGS. 46A-G. An exemplary process flow for a horizontally oriented JFET or JLT with an optional integrated heat shield/spreader is shown in FIGS. 47A-G. The 3D-ICs may be constructed in a 3D stacked layer using procedures outlined herein (such as, for example, FIGS. 39, 40, 41) and in U.S. Pat. No. 8,273,610, US patent publications 2012/0091587 and 2013/0020707, and pending U.S. patent application Ser. Nos. 13/441,923 and 13/099,010. The contents of the foregoing applications are incorporated herein by reference. The topside defect anneal may include optical annealing to repair defects in the crystalline 3D-IC layers and regions (which may be caused by the ion-cut implantation process), and may be utilized to activate semiconductor dopants in the crystalline layers or regions of a 3D-IC, such as, for example, LDD, halo, source/drain implants. The 3D-IC may include, for example, stacks formed in a monolithic manner with thin layers or stacks and vertical connection such as TLVs, and stacks formed in an assembly manner with thick (>2 um) layers or stacks and vertical connections such as TSVs. Optical annealing beams or systems, such as, for example, a laser-spike anneal beam from a commercial semiconductor material oriented single or dual-beam continuous wave (CW) laser spike anneal DB-LSA system of Ultratech Inc., San Jose, Calif., USA (10.6 um laser wavelength), or a short pulse laser (such as 160 ns), with 308 nm wavelength, and large area (die or step-field sized, including 1 $cm^2$) irradiation such as offered by Excico of Gennevilliers, France, may be utilized (for example, see Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012). Additionally, the defect anneal may include, for example, laser anneals (such as suggested in Rajendran, B., "Sequential 3D IC Fabrication: Challenges and Prospects", Proceedings of VLSI Multi Level Interconnect Conference 2006, pp. 57-64), Ultrasound Treatments (UST), megasonic treatments, and/or microwave treatments. The topside defect anneal ambient may include, for example, vacuum, high pressure (greater than about 760 torr), oxidizing atmospheres (such as oxygen or partial pressure oxygen), and/or reducing atmospheres (such as nitrogen or argon). The topside defect anneal may include temperatures of the layer being annealed above about 400° C. (a high temperature thermal anneal), including, for example, 600° C., 800° C., 900° C., 1000° C., 1050° C., 1100° C. and/or 1120° C., and the sensitive metal interconnect (for example, may be copper or aluminum containing) and/or device layers below may not be damaged by the annealing process, for example, which may include sustained temperatures that do not exceed 200° C., exceed 300° C., exceed 370° C., or exceed 400° C. As understood by those of ordinary skill in the art, short-timescale (nanosceonds to miliseconds) temperatures above 400° C. may also be acceptable for damage avoidance, depending on the acceptor layer interconnect metal systems used. The topside defect anneal may include activation of semiconductor dopants, such as, for example, ion implanted dopants or PLAD applied dopants. It will also be understood by one of ordinary skill in the art that the methods, such as the heat sink/shield layer and/or use of short pulse and short wavelength optical anneals, may allow almost any type of transistor, for example, such as FinFets, bipolar, nanowire transistors, to be constructed in a monolithic 3D fashion as the thermal limit of damage to the underlying metal interconnect systems is overcome. Moreover, multiple pulses of the laser, other optical annealing techniques, or other anneal treatments such as microwave, may be utilized to improve the anneal, activation, and yield of the process. The transistors formed as described herein may include many types of materials; for example, the channel and/or source and drain may include single crystal materials such as silicon, germanium, or compound semiconductors such as GaAs, InP, GaN, SiGe, and although the structures may be doped with the tailored dopants and concentrations, they may still be substantially crystalline or mono-crystalline.

Figure 33A:
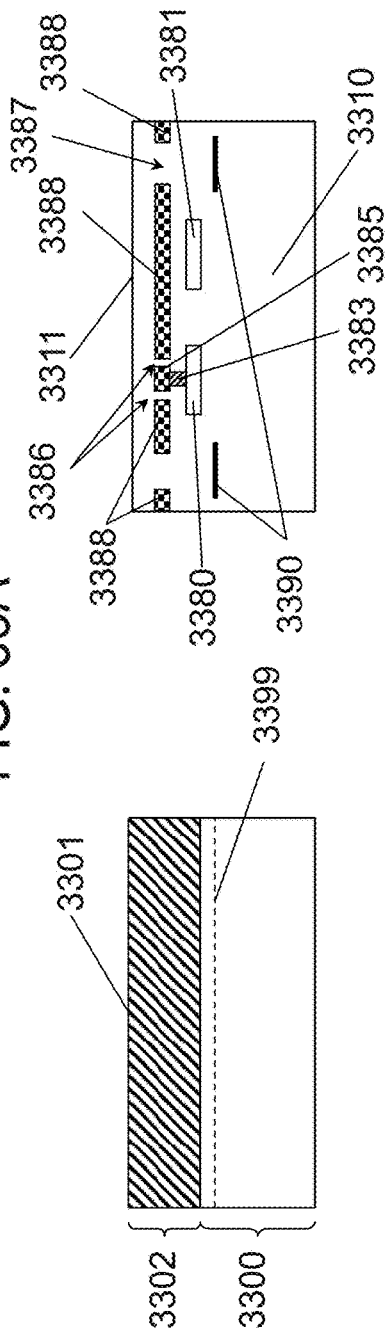

As illustrated in FIG. 33A, a generalized process flow may begin with a donor wafer 3300 that may be preprocessed with wafer sized layers 3302 of conducting, semiconducting or insulating materials that may be formed by deposition, ion implantation and anneal, oxidation, epitaxial growth, combinations of above, or other semiconductor processing steps and methods. For example, donor wafer 3300 and wafer sized layers 3302 may include semiconductor materials such as, for example, mono-crystalline silicon, germanium, GaAs, InP, and graphene. For this illustration, mono-crystalline (single crystal) silicon and associated silicon oriented processing may be used. The donor wafer 3300 may be preprocessed with a layer transfer demarcation plane (shown as dashed line) 3399, such as, for example, a hydrogen implant cleave plane, before or after (typical) wafer sized layers 3302 are formed. Layer transfer demarcation plane 3399 may alternatively be formed within wafer sized layers 3302. Other layer transfer processes, some described in the referenced patent documents, may alternatively be utilized. Damage/defects to the crystalline structure of donor wafer 3300 may be annealed by some of the annealing methods described, for example the short wavelength pulsed laser techniques, wherein the donor wafer 3300 wafer sized layers 3302 and portions of donor wafer 3300 may be heated to defect annealing temperatures, but the layer transfer demarcation plane 3399 may be kept below the temperate for cleaving and/or significant hydrogen diffusion. Dopants in at least a portion of wafer sized layers 3302 may also be electrically activated. Thru the processing, donor wafer 3300 and/or wafer sized layers 3302 could be thinned from its original thickness, and their/its final thickness could be in the range of about 0.01 um to about 50 um, for example, 10 nm, 100 nm, 200 nm, 0.4 um, 1 um, 2 um or 5 um. Donor wafer 3300 and wafer sized layers 3302 may include preparatory layers for the formation of horizontally or vertically oriented types of transistors such as, for example, MOSFETS, FinFets, FD-RCATs, BJTs, HEMTs, HBTs, JFETs, JLTs, or partially processed transistors (for example, the replacement gate HKMG process described in the referenced patent documents). Donor wafer 3300 and wafer sized layers 3302 may include the layer transfer devices and/or layer or layers contained herein this document or referenced patent documents, for example, DRAM Si/SiO$_2$ layers, RCAT doped layers, multi-layer doped structures, or starting material doped or undoped monocrystalline silicon, or polycrystalline silicon. Donor wafer 3300 and wafer sized layers 3302 may have alignment marks (not shown). Acceptor wafer 3310 may be a preprocessed wafer, for example, including monocrystalline bulk silicon or SOI, that may have fully functional circuitry including metal layers (including aluminum or copper metal interconnect layers that may connect acceptor wafer 3310 transistors and metal structures, such as TLV landing strips and pads, prepared to connect to the transferred layer devices) or may be a wafer with previously transferred layers, or may be a blank carrier or holder wafer, or other kinds of substrates suitable for layer transfer processing. Acceptor wafer 3310 may have alignment marks 3390 and metal connect pads or strips 3380 and ray blocked metal interconnect 3381. Acceptor wafer 3310 may include transistors such as, for example, MOSFETS, FinFets, FD-RCATs, BJTs, JFETs, JLTs, HEMTs, and/or HBTs. Acceptor wafer 3310 may include shield/heat sink layer 3388, which may include materials such as, for example, Aluminum, Tungsten (a refractory metal), Copper, silicon or cobalt based silicides, or forms of carbon such as carbon nanotubes or DLC (Diamond Like Carbon), and may be layered itself as described herein FIG. 50. Shield/heat sink layer 3388 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 3388 may include isolation openings 3386, and alignment mark openings 3387, which may be utilized for short wavelength alignment of top layer (donor) processing to the acceptor wafer alignment marks 3390. Shield/heat sink layer 3388 may include shield path connect 3385 and shield path via 3383. Shield path via 3383 may thermally and/or electrically couple and connect shield path connect 3385 to acceptor wafer 3310 interconnect metallization layers such as, for example, metal connect pads or strips 3380 (shown). If two shield/heat sink layers 3388 are utilized, one on top of the other and separated by an isolation layer common in semiconductor BEOL, such as carbon doped silicon oxide, shield path connect 3385 may also thermally and/or electrically couple and connect each shield/heat sink layer 3388 to the other and to acceptor wafer 3310 interconnect metallization layers such as, for example, metal connect pads or strips 3380, thereby creating a heat conduction path from the shield/heat sink layer 3388 to the acceptor wafer substrate, and a heat sink (shown in FIG. 33F). The topmost shield/heat sink layer may include a higher melting point material, for example a refractory metal such as Tungsten, and the lower heat shield layer may include a lower melting point material such as copper.

Figure 33B:
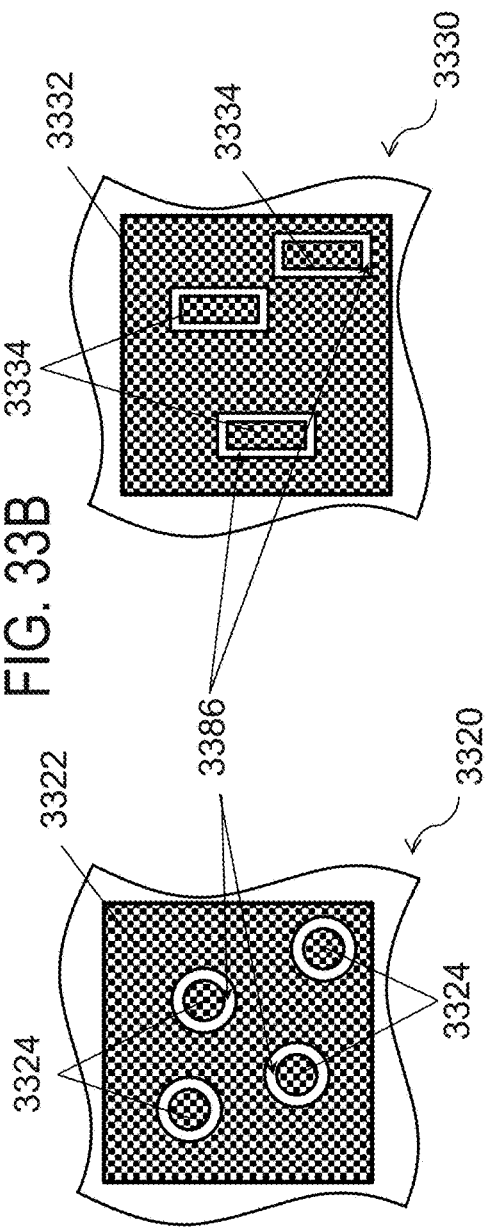
Figures 1, 33B:
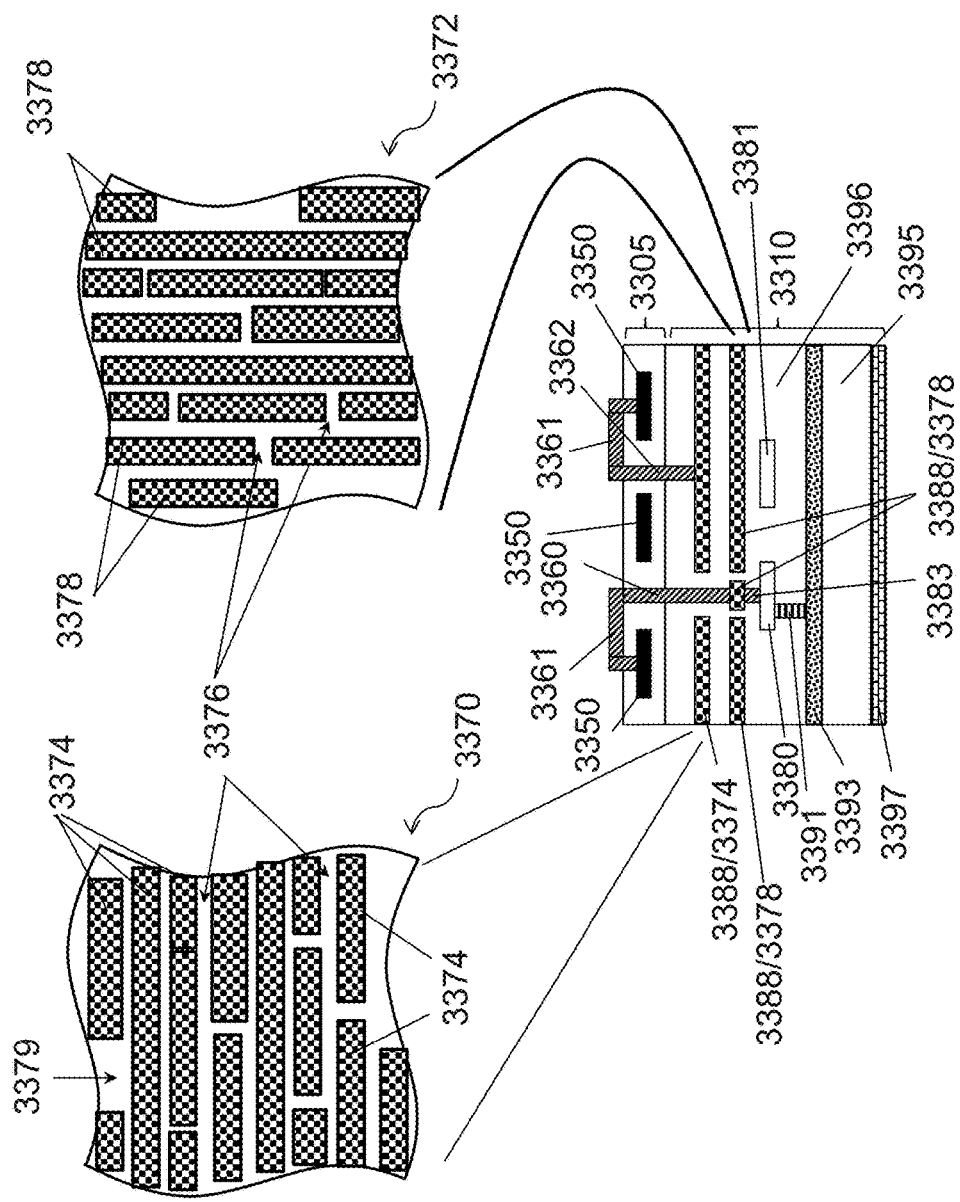

As illustrated in FIG. 33B, two exemplary top views of shield/heat sink layer 3388 are shown. In shield/heat sink portion 3320 a shield area 3322 of the shield/heat sink layer 3388 materials described above and in the incorporated references may include TLV/TSV connects 3324 and isolation openings 3386. Isolation openings 3386 may be the absence of the material of shield area 3322. TLV/TSV connects 3324 are an example of a shield path connect 3385. TLV/TSV connects 3324 and isolation openings 3386 may be drawn in the database of the 3D-IC stack and may formed during the acceptor wafer 3310 processing. In shield/heat sink portion 3330 a shield area 3332 of the shield/heat sink layer 3388 materials described above and in the incorporated references may have metal interconnect strips 3334 and isolation openings 3386. Metal interconnect strips 3334 may be surrounded by regions, such as isolation openings 3386, where the material of shield area 3332 may be etched away, thereby stopping electrical conduction from metal interconnect strips 3334 to shield area 3332 and to other metal interconnect strips. Metal interconnect strips 3334 may be utilized to connect/couple the transistors formed in the donor wafer layers, such as 3302, to themselves from the 'backside' or 'underside' and/or to transistors in the acceptor wafer level/layer. Metal interconnect strips 3334 and shield/heat sink layer 3388 regions such as shield area 3322 and shield area 3332 may be utilized as a ground plane for the transistors above it residing in the donor wafer layer or layers and/or may be utilized as power supply or back-bias, such as Vdd or Vsb, for the transistors above it residing in the transferred donor wafer layer or layers. The strips and/or regions of shield/heat sink layer 3388 may be controlled by second layer transistors when supplying power or other signals such as data or control. For example, as illustrated in FIG. 33B-1, the topmost shield/heat sink layer 3388 may include a topmost shield/heat sink portion 3370, which may be configured as fingers or stripes of conductive material, such as top strips 3374 and strip isolation spaces 3376, which may be utilized, for example, to provide back-bias, power, or ground to the second layer transistors above it residing in the donor wafer layer or layers (for example donor wafer device structures 3350). A second shield/heat sink layer 3388, below the topmost shield/heat sink layer, may include a second shield/heat sink portion 3372, which may be configured as fingers or stripes of conductive material, such as second strips 3378 and strip isolation spaces 3376, may be oriented in a different direction (although not necessarily so) than the topmost strips, and may be utilized, for example, to provide back-bias, power, or ground to the second layer transistors above it residing in the donor wafer layer or layers (for example donor wafer device structures 3350). Openings, such as opening 3379, in the topmost shield/heat sink layer may be designed to allow connection from the second layer of transistors to the second shield/heat sink layer, such as from donor wafer device structures 3350 to second strips 3378. The strips or fingers may be illustrated as orthogonally oriented layer to layer, but may also take other drawn shapes and forms; for example, such as diagonal running shapes as in the X-architecture, overlapping parallel strips, and so on. The portions of the shield/heat sink layer 3388 or layers may include a combination of the strip/finger shapes of FIG. 33B-1 and the illustrated via connects and fill-in regions of FIG. 33B.

Bonding surfaces, donor bonding surface 3301 and acceptor bonding surface 3311, may be prepared for wafer bonding by depositions (such as silicon oxide), polishes, plasma, or wet chemistry treatments to facilitate successful wafer to wafer bonding. The insulation layer, such as deposited bonding oxides and/or before bonding preparation existing oxides, between the donor wafer transferred layer and the acceptor wafer topmost metal layer, may include thicknesses of less than 1 um, less than 500 nm, less than 400 nm, less than 300 nm, less than 200 nm, or less than 100 nm.

As illustrated in FIG. 33C, the donor wafer 3300 with wafer sized layers 3302 and layer transfer demarcation plane 3399 may be flipped over, aligned, and bonded to the acceptor wafer 3310. The donor wafer 3300 with wafer sized layers 3302 may have alignment marks (not shown). Various topside defect anneals may be utilized. For this illustration, an optical beam such as the laser annealing previously described is used. Optical anneal beams may be optimized to focus light absorption and heat generation at or near the layer transfer demarcation plane (shown as dashed line) 3399 to provide a hydrogen bubble cleave with exemplary cleave ray 3351. The laser assisted hydrogen bubble cleave with the absorbed heat generated by exemplary cleave ray 3351 may also include a pre-heat of the bonded stack to, for example, about 100° C. to about 400° C., and/or a thermal rapid spike to temperatures above about 200° C. to about 600° C. The laser assisted ion-cut cleave may provide a smoother cleave surface upon which better quality transistors may be manufactured. Reflected ray 3353 may be reflected and/or absorbed by shield/heat sink layer 3388 regions thus blocking the optical absorption of ray blocked metal interconnect 3381 and potentially enhancing the efficiency of optical energy absorption of the wafer sized layers 3302. Additionally, shield/heat sink layer 3388 may laterally spread and conduct the heat generated by the topside defect anneal, and in conjunction with the dielectric materials (low heat conductivity) above and below shield/heat sink layer 3388, keep the interconnect metals and low-k dielectrics of the acceptor wafer interconnect layers cooler than a damage temperature, such as, for example, 400° C. Annealing of dopants or annealing of damage, such as from the H cleave implant damage, may be accomplished by optical annealing rays, such as repair ray 3355. A small portion of the optical energy, such as unblocked ray 3357, may hit and heat, or be reflected, by (a few rays as the area of the heat shield openings, such as 3324, is small compared to the die or device area) such as metal connect pads or strips 3380. Heat generated by absorbed photons from, for example, cleave ray 3351, reflected ray 3353, and/or repair ray 3355 may also be absorbed by shield/heat sink layer 3388 regions and dissipated laterally and may keep the temperature of underlying metal layers, such as ray blocked metal interconnect 3381, and other metal layers below it, cooler and prevent damage. Shield/heat sink layer 3388 may act as a heat spreader. A second layer of shield/heat sink layer 3388 (not shown) may have been constructed (during the acceptor wafer 3310 formation) with a low heat conductive material sandwiched between the two heat sink layers, such as silicon oxide or carbon doped 'low-k' silicon oxides, for improved thermal protection of the acceptor wafer interconnect layers, metal and dielectrics. Electrically conductive materials may be used for the two layers of shield/heat sink layer 3388 and thus may provide, for example, a Vss and a Vdd plane and/or grid for power delivery that may be connected to the donor layer transistors above, as well may be connected to the acceptor wafer transistors below. Shield/heat sink layer 3388 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 3388 may be sandwiched and/or substantially enclosed by materials with a low thermal conductivity less than 10 W/m-K, for example, silicon dioxide (about 1.4 W/m-K). The sandwiching of high and low thermal conductivity materials in layers, such as shield/heat sink layer 3388 and under & overlying dielectric layers, spreads the localized heat/light energy of the topside anneal laterally and protect the underlying layers of interconnect metallization & dielectrics, such as in the acceptor wafer, from harmful temperatures or damage. Further, absorber layers or regions, for example, including amorphous carbon, amorphous silicon, and phase changing materials (see U.S. Pat. Nos. 6,635,588 and 6,479,821 to Hawryluk et al. for example), may be utilized to increase the efficiency of the optical energy capture in conversion to heat for the desired annealing or activation processes. Photoresist may also be utilized to attenuate the optical energy. For example, pre-processed layers 3302 may include a layer or region of optical absorbers such as transferred absorber region 3375, acceptor wafer 3310 may include a layer or region of optical absorbers such as acceptor absorber region 3373, and second device layer 3305 may include a layer or region of optical absorbers such as post transfer absorber regions 3377 (shown in FIG. 33E). Transferred absorber region 3375, acceptor absorber region 3373, and/or post transfer absorber regions 3377 may be permanent (could be found within the device when manufacturing is complete) or temporary so is removed during the manufacturing process.

As illustrated in FIG. 33D, the donor wafer 3300 may be cleaved at or thinned to (or past, not shown) the layer transfer demarcation plane 3399, leaving donor wafer portion 3303 and the pre-processed layers 3302 bonded to the acceptor wafer 3310, by methods such as, for example, ion-cut or other layer transfer methods. The layer transfer demarcation plane 3399 may instead be placed in the pre-processed layers 3302. Optical anneal beams, in conjunction with reflecting layers and regions and absorbing enhancement layers and regions, may be optimized to focus light absorption and heat generation within or at the surface of donor wafer portion 3303 and provide surface smoothing and/or defect annealing (defects may be from the cleave and/or the ion-cut implantation), and/or post ion-implant dopant activation with exemplary smoothing/annealing ray 3366. The laser assisted smoothing/annealing with the absorbed heat generated by exemplary smoothing/annealing ray 3366 may also include a pre-heat of the bonded stack to, for example, about 100° C. to about 400° C., and/or a thermal rapid spike to temperatures above about 200° C. to about 600° C. Moreover, multiple pulses of the laser may be utilized to improve the anneal, activation, and yield of the process. Reflected ray 3363 may be reflected and/or absorbed by shield/heat sink layer 3388 regions thus blocking the optical absorption of ray blocked metal interconnect 3381. Annealing of dopants or annealing of damage, such as from the H cleave implant damage, may be also accomplished by a set of rays such as repair ray 3365. A small portion of the optical energy, such as unblocked ray 3367, may hit and heat, or be reflected, by a few rays (as the area of the heat shield openings, such as 3324, is small) such as metal connect pads or strips 3380. Heat generated by absorbed photons from, for example, smoothing/annealing ray 3366, reflected ray 3363, and/or repair ray 3365 may also be absorbed by shield/heat sink layer 3388 regions and dissipated laterally and may keep the temperature of underlying metal layers, such as ray blocked metal interconnect 3381, and other metal layers below it, cooler and prevent damage. A second layer of shield/heat sink layer 3388 may be constructed with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 3388 may act as a heat spreader. When there may be more than one shield/heat sink layer 3388 in the device, the heat conducting layer closest to the second crystalline layer may be constructed with a different material, for example a high melting point material, for example a refractory metal such as tungsten, than the other heat conducting layer or layers, which may be constructed with, for example, a lower melting point material such as aluminum or copper. Electrically conductive materials may be used for the two layers of shield/heat sink layer 3388 and thus may provide, for example, a Vss and a Vdd plane and/or grid that may be connected to the donor layer transistors above, as well may be connected to the acceptor wafer transistors below. Noise on the power grids, such as the Vss and Vdd plane power conducting lines/wires, may be mitigated by attaching/connecting decoupling capacitors onto the power conducting lines of the grids. The decoupling caps, which may be within the second layer (donor, for example, donor wafer device structures 3350) or first layer (acceptor, for example acceptor wafer transistors and devices 3393), may include, for example, trench capacitors such as described by Pei, C., et al., "A novel, low-cost deep trench decoupling capacitor for high-performance, low-power bulk CMOS applications," ICSICT (9$^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Furthermore, some or all of the layers utilized as shield/heat sink layer 3388, which may include shapes of material such as the strips or fingers as illustrated in FIG. 33B-1, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 3388 layer or layers. Moreover, some or all of the layers utilized as shield/heat sink layer 3388, which may include strips or fingers as illustrated in FIG. 33B-1, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 3388 layer or layers. The Vsupply on line 17C12 and the control signals on control line 17C16 may be controlled by and/or generated in the second layer transistors (donor, for example donor wafer device structures 3350) or first layer transistors (acceptor, for example acceptor wafer transistors and devices 3393), or off chip circuits. Furthermore, some or all of the layers utilized as shield/heat sink layer 3388, which may include strips or fingers as illustrated in FIG. 33B-1 or other shapes such as those in FIG. 33B, may be utilized to distribute independent power supplies to various portions of the second layer transistors (donor, for example donor wafer device structures 3350) or first layer transistors (acceptor, for example acceptor wafer transistors and devices 3393) and circuits; for example, one power supply and/or voltage may be routed to the sequential logic circuits of the second layer and a different power supply and/or voltage routed to the combinatorial logic circuits of the second layer. Moreover, the power distribution circuits/grid may be designed so that Vdd may have a different value for each stack layer. Patterning of shield/heat sink layer 3388 or layers can impact their heat-shielding capacity. This impact may be mitigated, for example, by enhancing the top shield/heat sink layer 3388 areal density, creating more of the secondary shield/heat sink layers 3388, or attending to special CAD rules regarding their metal density, similar to CAD rules that are required to accommodate Chemical-Mechanical Planarization (CMP). These constraints would be integrated into a design and layout EDA tool. Moreover, the second layer of circuits and transistors, for example, donor wafer device structures 3350, may include I/O logic devices, such as SerDes (Serialiser/Deserialiser), and conductive bond pads (not shown). The output or input conductive pads of the I/O circuits may be coupled, for example by bonded wires, to external devices. The output or input conductive pads may also act as a contact port for the 3D device output to connect to external devices. The emf generated by the I/O circuits could be shielded from the other layers in the stack by use of, for example, the heat shield/heat sink layer 3388. Placement of the I/O circuits on the same stack layer as the conductive bond pad may enable close coupling of the desired I/O energy and lower signal loss. Furthermore, the second layer of circuits and transistors, for example, donor wafer device structures 3350, may include RF (Radio Frequency) circuits and/or at least one antenna. For example, the second layer of circuits and transistors, for example, donor wafer device structures 3350, may include RF circuits to enable an off-chip communication capability to external devices, for example, a wireless communication circuit or circuits such as a Bluetooth protocol or capacitive coupling. The emf generated by the RF circuits could be shielded from the other layers in the stack by use of, for example, the heat shield/heat sink layer 3388.

As illustrated in FIG. 33E, the remaining donor wafer portion 3303 may be removed by polishing or etching and the transferred layers 3302 may be further processed to create second device layer 3305 which may include donor wafer device structures 3350 and metal interconnect layers (such as second device layer metal interconnect 3361) that may be precisely aligned to the acceptor wafer alignment marks 3390. Donor wafer device structures 3350 may include, for example, CMOS transistors such as N type and P type transistors, or at least any of the other transistor or device types discussed herein this document or referenced patent documents. The details of CMOS in one transferred layer and the orthogonal connect strip methodology may be found as illustrated in at least FIGS. 30-33, 73-80, and 94 and related specification sections of U.S. Pat. No. 8,273,610. As discussed above and herein this document and referenced patent documents, annealing of dopants or annealing of damage, such as from the dopant application such as ion-implantation, or from etch processes during the formation of the transferred layer transistor and device structures, may be accomplished by optical annealing. Donor wafer device structures 3350 may include transistors and/or semiconductor regions wherein the dopant concentration of the regions in the horizontal plane, such as shown as exemplary dopant plane 3349, may have regions that differ substantially in dopant concentration, for example, 10× greater, and/or may have a different dopant type, such as, for example p-type or n-type dopant. Additionally, the annealing of deposited dielectrics and etch damage, for example, oxide depositions and silicon etches utilized in the transferred layer isolation processing, for example, STI (Shallow Trench Isolation) processing or strained source and drain processing, may be accomplished by optical annealing. An optical step may be performed to densify and/or remove defects from gate dielectric, anneal defects and activate dopants such as LDD and S/D implants, densify ILDs, form DSS junctions (Dopant Segregated Schottky such as $NiSi_2$), and/or form contact and S/D silicides (not shown). The optical anneal may be performed at each sub-step as desired, or may be done at prior to the HKMG deposition (such as after the dummy gate but before the HKMG formation), or various combinations. Second device layer metal interconnect 3361 may include electrically conductive materials such as copper, aluminum, conductive forms of carbon, and tungsten. Donor wafer device structures 3350 may utilize second device layer metal interconnect 3361 and thru layer vias (TLVs) 3360 to electrically couple (connection paths) the donor wafer device structures 3350 to the acceptor wafer metal connect pads or strips 3380, and thus couple donor wafer device structures (the second layer transistors) with acceptor wafer device structures (first layer transistors). Thermal TLVs 3362 may be constructed of thermally conductive but not electrically conductive materials, for example, DLC (Diamond Like Carbon), and may connect donor wafer device structures 3350 thermally to shield/heat sink layer 3388. TLVs 3360 may be constructed out of electrically and thermally conductive materials, such as Tungsten, Copper, or aluminum, and may provide a thermal and electrical connection path from donor wafer device structures 3350 to shield/heat sink layer 3388, which may be a ground or Vdd plane in the design/layout. TLVs 3360 and thermal TLVs 3362 may be also constructed in the device scribelanes (pre-designed in base layers or potential dicelines) to provide thermal conduction to the heat sink, and may be sawed/diced off when the wafer is diced for packaging. Shield/heat sink layer 3388 may be configured to act as an emf (electro-motive force) shield to prevent direct layer to layer cross-talk between transistors in the donor wafer layer and transistors in the acceptor wafer. In addition to static ground or Vdd biasing, shield/heat sink layer 3388 may be actively biased with an anti-interference signal from circuitry residing on, for example, a layer of the 3D-IC or off chip. TLVs 3360 may be formed through the transferred layers 3302. As the transferred layers 3302 may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers 3302, the smaller the thru layer via diameter obtainable, which may result from maintaining manufacturable via aspect ratios. Thus, the transferred layers 3302 (and hence, TLVs 3360) may be, for example, less than about 2 microns thick, less than about 1 micron thick, less than about 0.4 microns thick, less than about 200 nm thick, less than about 150 nm thick, less than about 100 nm thick, less than about 50 nm thick, less than about 20 nm thick, or less than about 5 nm thick. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers. The above TLV dimensions and alignment capability and transferred layer thicknesses may be also applied to any of the discussed TLVs or transferred layers described elsewhere herein. Transferred layers 3302 may be considered to be overlying the metal layer or layers of acceptor wafer 3310. Alignment marks in acceptor wafer 3310 and/or in transferred layers 3302 may be utilized to enable reliable contact to transistors and circuitry in transferred layers 3302 and donor wafer device structures 3350 and electrically couple them to the transistors and circuitry in the acceptor wafer 3310. Transferred layer or layers may have regions of STI or other transistor elements within it or on it when transferred, but would then use alignment and connection schemes for layer transfer of patterned layers as described in incorporated patent references. The donor wafer 3300 may now also be processed, such as smoothing and annealing, and reused for additional layer transfers. The transferred layers 3302 and other additional regions created in the transferred layers during transistor processing are thin and small, having small volumes on the order of $2 \times 10^{-16}$ $cm^3$ ($2 \times 10^5$ $nm^3$ for a 100 nm by 100 nm×20 nm thick device). As a result, the amount of energy to manufacture with known in the art transistor and device formation processing, for example, annealing of ion-cut created defects or activation of dopants and annealing of doping or etching damages, is very small and may lead to only a small amount of shield layer or layers or regions or none to effectively shield the underlying interconnect metallization and dielectrics from the manufacturing processing generated heat. The energy may be supplied by, for example, pulsed and short wavelength optical annealing techniques described herein and incorporated references, and may include the use of optical absorbers and reflectors and optical/thermal shielding and heat spreaders, some of which are described herein and incorporated references. The optical anneal may be performed at each sub-step as desired, or may be done at prior to the HKMG deposition (such as after the dummy gate but before the HKMG formation), or various combinations. Moreover, multiple pulses of the laser may be utilized to improve the anneal, activation, and yield of the process.

As illustrated in FIG. 33F, a thermal conduction path may be constructed from the devices in the upper layer, the transferred donor layer and formed transistors, to the acceptor wafer substrate and associated heat sink. The thermal conduction path from the donor wafer device structures 3350 to the acceptor wafer heat sink 3397 may include second device layer metal interconnect 3361, TLVs 3360, shield path connect 3385, shield path via 3383, metal connect pads or strips 3380, first (acceptor) layer metal interconnect 3391, acceptor wafer transistors and devices 3393, and acceptor substrate 3395. The elements of the thermal conduction path may include materials that have a thermal conductivity greater than 10 W/m-K, for example, copper (about 400 W/m-K), aluminum (about 237 W/m-K), and Tungsten (about 173 W/m-K), and may include material with thermal conductivity lower than 10 W/m-K but have a high heat transfer capacity due to the wide area available for heat transfer and thickness of the structure (Fourier's Law), such as, for example, acceptor substrate 3395. The elements of the thermal conduction path may include materials that are thermally conductive but may not be substantially electrically conductive, for example, Plasma Enhanced Chemical Vapor Deposited Diamond Like Carbon-PECVD DLC (about 1000 W/m-K), and Chemical Vapor Deposited (CVD) graphene (about 5000 W/m-K). The acceptor wafer interconnects may be substantially surrounded by BEOL dielectric 3396. In general, within the active device or devices (that are generating the heat that is desired to be conducted away thru at least the thermal conduction path), it would be advantageous to have an effective conduction path to reduce the overall space and area that a designer would allocate for heat transfer out of the active circuitry space and area. A designer may select to use only materials with a high thermal conductivity (such as greater than 10 W/m-K), much higher for example than that for monocrystalline silicon, for the desired thermal conduction path. However, there may need to be lower than desired thermal conductivity materials in the heat conduction path due to requirements such as, for example, the mechanical strength of a thick silicon substrate, or another heat spreader material in the stack. The area and volume allocated to that structure, such as the silicon substrate, is far larger than the active circuit area and volume. Accordingly, since a copper wire of 1 um$^2$ profile is about the same as a 286 um$^2$ profile of a column of silicon, and the thermal conduction path may include both a copper wire/TLV/via and the bulk silicon substrate, a proper design may take into account and strive to align the different elements of the conductive path to achieve effective heat transfer and removal, for example, may attempt to provide about 286 times the silicon substrate area for each Cu thermal via utilized in the thermal conduction path. The heat removal apparatus, which may include acceptor wafer heat sink 3397, may include an external surface from which heat transfer may take place by methods such as air cooling, liquid cooling, or attachment to another heat sink or heat spreader structure.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 33 formation techniques. Transferred layer or layers may have regions of STI or other transistor elements within it or on it when transferred, but would then use alignment and connection schemes for layer transfer of patterned layers as described in incorporated patent references.

A planar fully depleted n-channel Recessed Channel Array Transistor (FD-RCAT) with an integrated shield/heat sink layer suitable for a monolithic 3D IC may be constructed as follows. The FD-RCAT may provide an improved source and drain contact resistance, thereby allowing for lower channel doping (such as undoped), and the recessed channel may provide for more flexibility in the engineering of channel lengths and transistor characteristics, and increased immunity from process variations. The buried doped layer and channel dopant shaping, even to an undoped channel, may allow for efficient adaptive and dynamic body biasing to control the transistor threshold and threshold variations, as well as provide for a fully depleted or deeply depleted transistor channel. Furthermore, the recessed gate allows for an FD transistor but with thicker silicon for improved lateral heat conduction. Moreover, a heat spreading, heat conducting and/or optically reflecting material layer or layers may be incorporated between the sensitive metal interconnect layers and the layer or regions being optically irradiated and annealed to repair defects in the crystalline 3D-IC layers and regions and to activate semiconductor dopants in the crystalline layers or regions of a 3D-IC without harm to the sensitive metal interconnect and associated dielectrics. FIG. 34A-G illustrates an exemplary n-channel FD-RCAT which may be constructed in a 3D stacked layer using procedures outlined below and in U.S. Pat. No. 8,273,610, US patent publications 2012/0091587 and 2013/0020707, and pending U.S. patent application Ser. Nos. 13/441,923 and 13/099,010. The contents of the foregoing applications are incorporated herein by reference.

As illustrated in FIG. 34A, a P− substrate donor wafer 3400 may be processed to include wafer sized layers of N+ doping 3402, P− doping 3406, channel 3403 and P+ doping 3404 across the wafer. The N+ doped layer 3402, P− doped layer 3406, channel layer 3403 and P+ doped layer 3404 may be formed by ion implantation and thermal anneal. P− substrate donor wafer 3400 may include a crystalline material, for example, mono-crystalline (single crystal) silicon. P− doped layer 3406 and channel layer 3403 may have additional ion implantation and anneal processing to provide a different dopant level than P− substrate donor wafer 3400. P− substrate donor wafer 3400 may be very lightly doped (less than 1e15 atoms/cm$^3$) or nominally un-doped (less than 1e14 atoms/cm$^3$). P− doped layer 3406, channel layer 3403, and P+ doped layer 3404 may have graded or various layers doping to mitigate transistor performance issues, such as, for example, short channel effects, after the FD-RCAT is formed, and to provide effective body biasing, whether adaptive or dynamic. The layer stack may alternatively be formed by successive epitaxially deposited doped silicon layers of N+ doped layer 3402, P− doped layer 3406, channel layer 3403 and P+ doped layer 3404, or by a combination of epitaxy and implantation, or by layer transfer. Annealing of implants and doping may include, for example, conductive/inductive thermal, optical annealing techniques or types of Rapid Thermal Anneal (RTA or spike). The N+ doped layer 3402 may have a doping concentration that may be more than 10× the doping concentration of P− doped layer 3406 and/or channel layer 3403. The P+ doped layer 3404 may have a doping concentration that may be more than 10× the doping concentration of P− doped layer 3406 and/or channel layer 3403. The P− doped layer 3406 may have a doping concentration that may be more than 10× the doping concentration of channel layer 3403. Channel layer 3403 may have a thickness and/or doping that may allow fully-depleted channel operation when the FD-RCAT transistor is substantially completely formed, such as, for example, less than 5 nm, less than 10 nm, or less than 20 nm.

As illustrated in FIG. 34B, the top surface of the P− substrate donor wafer 3400 layer stack may be prepared for oxide wafer bonding with a deposition of an oxide or by thermal oxidation of P+ doped layer 3404 to form oxide layer 3480. A layer transfer demarcation plane (shown as dashed line) 3499 may be formed by hydrogen implantation or other methods as described in the incorporated references. The P− substrate donor wafer 3400 and acceptor wafer 3410 may be prepared for wafer bonding as previously described and low temperature (less than approximately 400° C.) bonded. Acceptor wafer 3410, as described in the incorporated references, may include, for example, transistors, circuitry, and metal, such as, for example, aluminum or copper, interconnect wiring, a metal shield/heat sink layer, and thru layer via metal interconnect strips or pads. Acceptor wafer 3410 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. SOI Acceptor wafer 3410 may include transistors such as, for example, MOSFETS, FinFets, FD-RCATs, BJTs, HEMTs, and/or HBTs. The portion of the N+ doped layer 3402 and the P− substrate donor wafer 3400 that may be above (when the layer stack is flipped over and bonded to the acceptor wafer) the layer transfer demarcation plane 3499 may be removed by cleaving or other low temperature processes as described in the incorporated references, such as, for example, ion-cut or other layer transfer methods. Damage/defects to crystalline structure of N+ doped layer 3402, P− doped layer 3406, channel layer 3403 and P+ doped layer 3404 may be annealed by some of the annealing methods described, for example the short wavelength pulsed laser techniques, wherein the N+ doped layer 3402, P− doped layer 3406, channel layer 3403 and P+ doped layer 3404 or portions of them may be heated to defect annealing temperatures, but the layer transfer demarcation plane 3499 may be kept below the temperate for cleaving and/or significant hydrogen diffusion. The optical energy may be deposited in the upper layer of the stack, for example in P+ doped layer 3404, and annealing of the other layer may take place via heat diffusion. Dopants in at least a portion of N+ doped layer 3402, P− doped layer 3406, channel layer 3403 and P+ doped layer 3404 may also be electrically activated by the anneal.

Figure 34C:
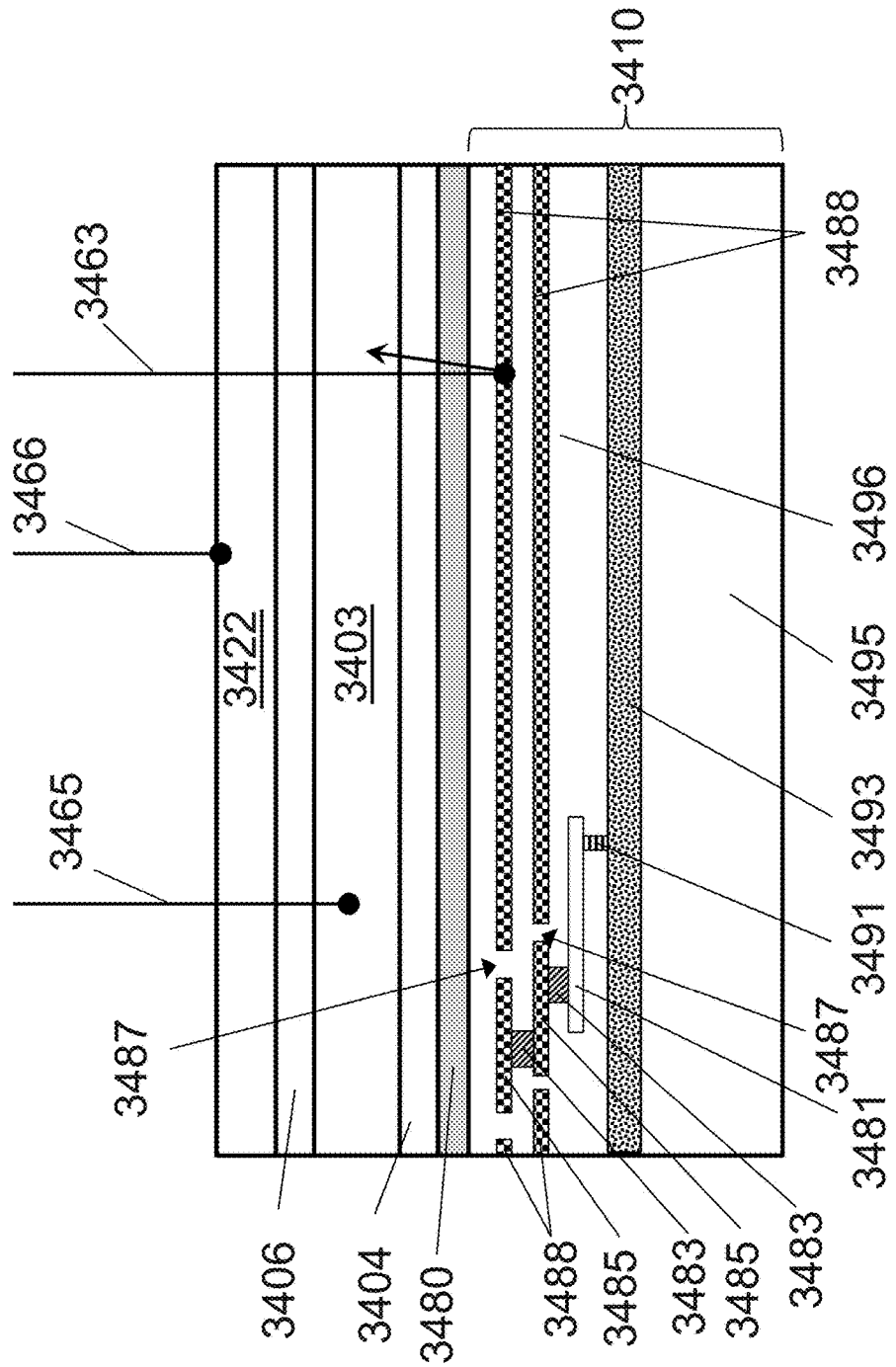

As illustrated in FIG. 34C, oxide layer 3480, P+ doped layer 3404, channel layer 3403, P− doped layer 3406, and remaining N+ layer 3422 have been layer transferred to acceptor wafer 3410. The top surface of N+ layer 3422 may be chemically or mechanically polished. Thru the processing, the wafer sized layers such as N+ layer 3422 P+ doped layer 3404, channel layer 3403, and P− doped layer 3406, could be thinned from its original total thickness, and their/its final total thickness could be in the range of about 0.01 um to about 50 um, for example, 10 nm, 100 nm, 200 nm, 0.4 um, 1 um, 2 um or 5 um. Acceptor wafer 3410 may include one or more (two are shown in this example) shield/heat sink layers 3488, which may include materials such as, for example, Aluminum, Tungsten (a refractory metal), Copper, silicon or cobalt based silicides, or forms of carbon such as carbon nanotubes, and may be layered itself as described herein FIG. 50. Each shield/heat sink layer 3488 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 3488 may include isolation openings 3487, and alignment mark openings (not shown), which may be utilized for short wavelength alignment of top layer (donor) processing to the acceptor wafer alignment marks (not shown). Shield/heat sink layer 3488 may include one or more shield path connect 3485 and shield path via 3483. Shield path via 3483 may thermally and/or electrically couple and connect shield path connect 3485 to acceptor wafer 3410 interconnect metallization layers such as, for example, acceptor metal interconnect 3481 (shown). Shield path connect 3485 may also thermally and/or electrically couple and connect each shield/heat sink layer 3488 to the other and to acceptor wafer 3410 interconnect metallization layers such as, for example, acceptor metal interconnect 3481, thereby creating a heat conduction path from the shield/heat sink layer 3488 to the acceptor substrate 3495, and a heat sink (shown in FIG. 34G.). Isolation openings 3487 may include dielectric materials, similar to those of BEOL isolation 3496. Acceptor wafer 3410 may include first (acceptor) layer metal interconnect 3491, acceptor wafer transistors and devices 3493, and acceptor substrate 3495. Various topside defect anneals may be utilized. For this illustration, an optical beam such as the laser annealing previously described is used. Optical anneal beams may be optimized to focus light absorption and heat generation within or at the surface of N+ layer 3422 and provide surface smoothing and/or defect annealing (defects may be from the cleave and/or the ion-cut implantation) with exemplary smoothing/annealing ray 3466. The laser assisted smoothing/annealing with the absorbed heat generated by exemplary smoothing/annealing ray 3466 may also include a pre-heat of the bonded stack to, for example, about 100° C. to about 400° C., and/or a rapid thermal spike to temperatures above about 200° C. to about 600° C. Additionally, absorber layers or regions, for example, including amorphous carbon, amorphous silicon, and phase changing materials (see U.S. Pat. Nos. 6,635,588 and 6,479, 821 to Hawryluk et al. for example), may be utilized to increase the efficiency of the optical energy capture in conversion to heat for the desired annealing or activation processes. Reflected ray 3463 may be reflected and/or absorbed by shield/heat sink layer 3488 regions thus blocking the optical absorption of ray blocked metal interconnect 3481. Annealing of dopants or annealing of damage, such as from the H cleave implant damage, may be also accomplished by a set of rays such as repair ray 3465. Heat generated by absorbed photons from, for example, smoothing/annealing ray 3466, reflected ray 3463, and/or repair ray 3465 may also be absorbed by shield/heat sink layer 3488 regions and dissipated laterally and may keep the temperature of underlying metal layers, such as metal interconnect 3481, and other metal layers below it, cooler and prevent damage. Shield/heat sink layer 3488 and associated dielectrics may laterally spread and conduct the heat generated by the topside defect anneal, and in conjunction with the dielectric materials (low heat conductivity) above and below shield/heat sink layer 3488, keep the interconnect metals and low-k dielectrics of the acceptor wafer interconnect layers cooler than a damage temperature, such as, for example, 400° C. A second layer of shield/heat sink layer 3488 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 3488 may act as a heat spreader. Electrically conductive materials may be used for the two layers of shield/heat sink layer 3488 and thus may provide, for example, a Vss and a Vdd plane and/or grid that may be connected to the donor layer transistors above, as well may be connected to the acceptor wafer transistors below. Noise on the power grids, such as the Vss and Vdd plane power conducting lines/wires, may be mitigated by attaching/connecting decoupling capacitors onto the power conducting lines of the grids. The decoupling caps, which may be within the second layer (donor, for example, donor wafer device structures) or first layer (acceptor, for example acceptor wafer transistors and devices 3493), may include, for example, trench capacitors such as described by Pei, C., et al., "A novel, low-cost deep trench decoupling capacitor for high-performance, low-power bulk CMOS applications," ICSICT ($9^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Shield/heat sink layer 3488 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 3488 may be sandwiched and/or substantially enclosed by materials with a low thermal conductivity (less than 10 W/m-K), for example, silicon dioxide (about 1.4 W/m-K). The sandwiching of high and low thermal conductivity materials in layers, such as shield/heat sink layer 3488 and under & overlying dielectric layers, spreads the localized heat/light energy of the topside anneal laterally and protect the underlying layers of interconnect metallization & dielectrics, such as in the acceptor wafer, from harmful temperatures or damage. When there may be more than one shield/heat sink layer 3488 in the device, the heat conducting layer closest to the second crystalline layer or oxide layer 3480 may be constructed with a different material, for example a high melting point material, for example a refractory metal such as tungsten, than the other heat conducting layer or layers, which may be constructed with, for example, a lower melting point material, for example, such as aluminum or copper. Now transistors may be formed with low effective temperature (less than approximately 400° C. exposure to the acceptor wafer 4510 sensitive layers, such as interconnect and device layers) processing, and may be aligned to the acceptor wafer alignment marks (not shown) as described in the incorporated references. This may include further optical defect annealing or dopant activation steps. The donor wafer 3400 may now also be processed, such as smoothing and annealing, and reused for additional layer transfers. The insulator layer, such as deposited bonding oxides (for example oxide layer 3480) and/or before bonding preparation existing oxides (for example the BEOL isolation 3496 on top of the topmost metal layer of shield/heat sink layer 3488), between the donor wafer transferred monocrystalline layer and the acceptor wafer topmost metal layer, may include thicknesses of less than 1 um, less than 500 nm, less than 400 nm, less than 300 nm, less than 200 nm, or less than 100 nm.

Figure 34D:
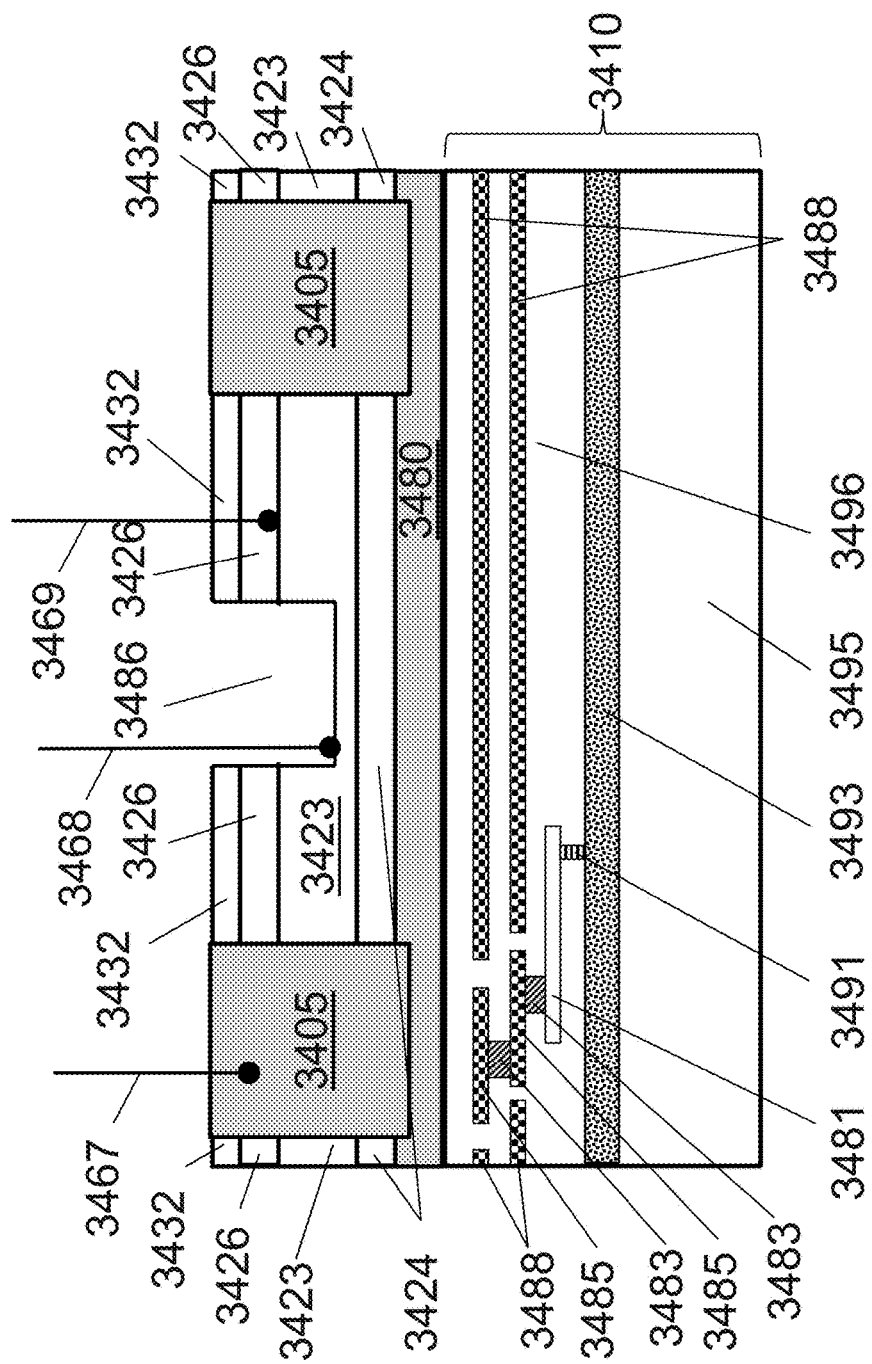

As illustrated in FIG. 34D, transistor isolation regions 3405 may be formed by mask defining and plasma/RIE etching remaining N+ layer 3422, P− doped layer 3406, channel layer 3403, and P+ doped layer 3404 substantially to the top of oxide layer 3480 (not shown), substantially into oxide layer 3480, or into a portion of the upper oxide layer of acceptor wafer 3410 (not shown). Additionally, a portion of the transistor isolation regions 3405 may be etched (separate step) substantially to P+ doped layer 3404, thus allowing multiple transistor regions to be connected by the same P+ doped region 3424. A low-temperature gap fill oxide may be deposited and chemically mechanically polished, the oxide remaining in isolation regions 3405. An optical step, such as illustrated by exemplary STI ray 3467, may be performed to anneal etch damage and densify the STI oxide in isolation regions 3405. The recessed channel 3486 may be mask defined and etched thru remaining N+ doped layer 3422, P− doped layer 3406 and partially into channel layer 3403. The recessed channel surfaces and edges may be smoothed by processes, such as, for example, wet chemical, plasma/RIE etching, low temperature hydrogen plasma, or low temperature oxidation and strip techniques, or optical annealing (such as illustrated by exemplary channel smoothing ray 3468, which may induce local short term high temperatures) as described herein, to mitigate high field effects (see Kim, J. Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, 10-12 Jun. 2003, for CDE (chemical dry etch) smoothing). The low temperature smoothing process may employ, for example, a plasma produced in a TEL (Tokyo Electron Labs) SPA (Slot Plane Antenna) machine. Thus N+ source and drain regions 3432, P− regions 3426, and channel region 3423 may be formed, which may substantially form the transistor body. The doping concentration of N+ source and drain regions 3432 may be more than 10× the concentration of channel region 3423. The doping concentration of the N− channel region 3423 may include gradients of concentration or layers of differing doping concentrations. The doping concentration of N+ source and drain regions 3432 may be more than 10× the concentration of P− regions 3426. The etch formation of recessed channel 3486 may define the transistor channel length. The shape of the recessed etch may be rectangular as shown, or may be spherical (generally from wet etching, sometimes called an S-RCAT: spherical RCAT), or a variety of other shapes due to etching methods and shaping from smoothing processes, and may help control for the channel electric field uniformity. The thickness of channel region 3423 in the region below recessed channel 3486 may be of a thickness that allows fully-depleted channel operation. The thickness of channel region 3423 in the region below N+ source and drain regions 3432 may be of a thickness that allows fully-depleted transistor operation. Any additional doping, such as ion-implanted halo implants, may be activated and annealed with optical annealing, such as illustrated by exemplary implant ray 3469, as described herein. The optical anneal, such as exemplary STI ray 3467, exemplary channel smoothing ray 3468, and/or exemplary implant ray 3469 may be performed at separate times and processing parameters (such as laser energy, frequency, etc.) or may be done in combination or as one optical anneal.

Figure 34E:
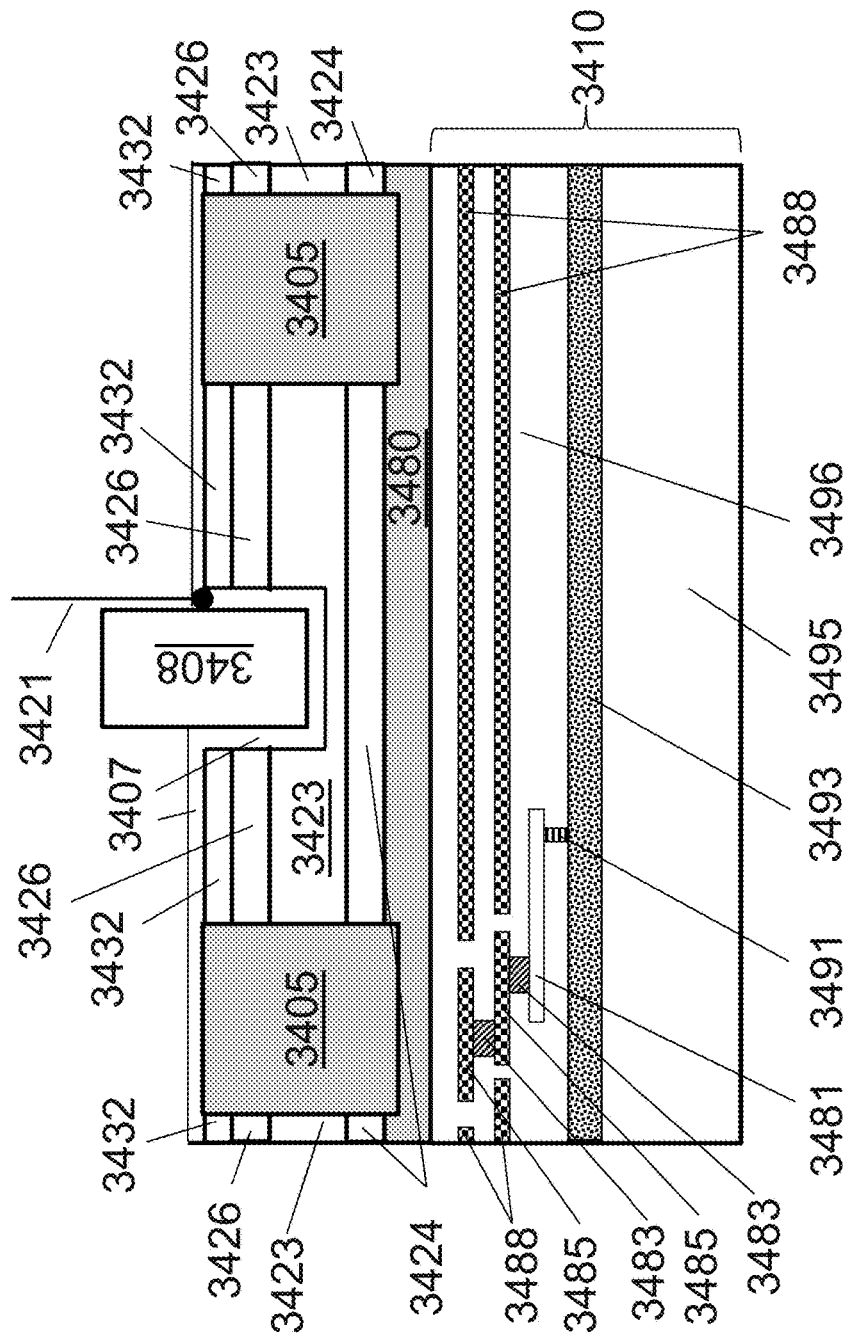

As illustrated in FIG. 34E, a gate dielectric 3407 may be formed and a gate metal material may be deposited. The gate dielectric 3407 may be an atomic layer deposited (ALD) gate dielectric that may be paired with a work function specific gate metal in the industry standard high k metal gate process schemes described in the incorporated references. Alternatively, the gate dielectric 3407 may be formed with a low temperature processes including, for example, LPCVD $SiO_2$ oxide deposition (see Ahn, J., et al., "High-quality MOSFET's with ultrathin LPCVD gate SiO2," IEEE Electron Device Lett., vol. 13, no. 4, pp. 186-188, April 1992) or low temperature microwave plasma oxidation of the silicon surfaces (see Kim, J. Y., et al., "The excellent scalability of the RCAT (recess-channel-array-transistor) technology for sub-70 nm DRAM feature size and beyond," 2005 IEEE VLSI-TSA International Symposium, pp. 33-34, 25-27 Apr. 2005) and a gate material with proper work function and less than approximately 400° C. deposition temperature such as, for example, tungsten or aluminum may be deposited. An optical step, such as represented by exemplary gox ray 3421, may be performed to densify and/or remove defects from gate dielectric 3407. The gate material may be chemically mechanically polished, and the gate area defined by masking and etching, thus forming the gate electrode 3408. The shape of gate electrode 3408 is illustrative, the gate electrode may also overlap a portion of N+ source and drain regions 3432. An optical step, such as represented by exemplary gox ray 3421, may be performed to anneal defects and activate dopants such as LDD and S/D implants, densify an ILD thick oxide 3409, form DSS junctions (Dopant Segregated Schottky such as $NiSi_2$), and/or form contact and S/D silicides (not shown). The optical anneal may be performed at each sub-step as desired, or may be done at prior to the HKMG deposition (such as after the dummy gate but before the HKMG formation), or various combinations. Moreover, multiple pulses of the laser may be utilized to improve the anneal, activation, and yield of the process.

As illustrated in FIG. 34F, a low temperature thick oxide 3409 may be deposited and planarized. Source, gate, and drain contacts, P+ doped region contact (not shown) openings may be masked and etched preparing the transistors to be connected via metallization. P+ doped region contact may be constructed thru isolation regions 3405, suitably when the isolation regions 3405 is formed to a shared P+ doped region 3424. Thus gate contact 3411 connects to gate electrode 3408, and source & drain contacts 3440 connect to N+ source and drain regions 3432. An optical step, such as illustrated by exemplary STI ray 3431, may be performed to anneal contact etch damage and densify the thick oxide 3409.

Figure 34G:
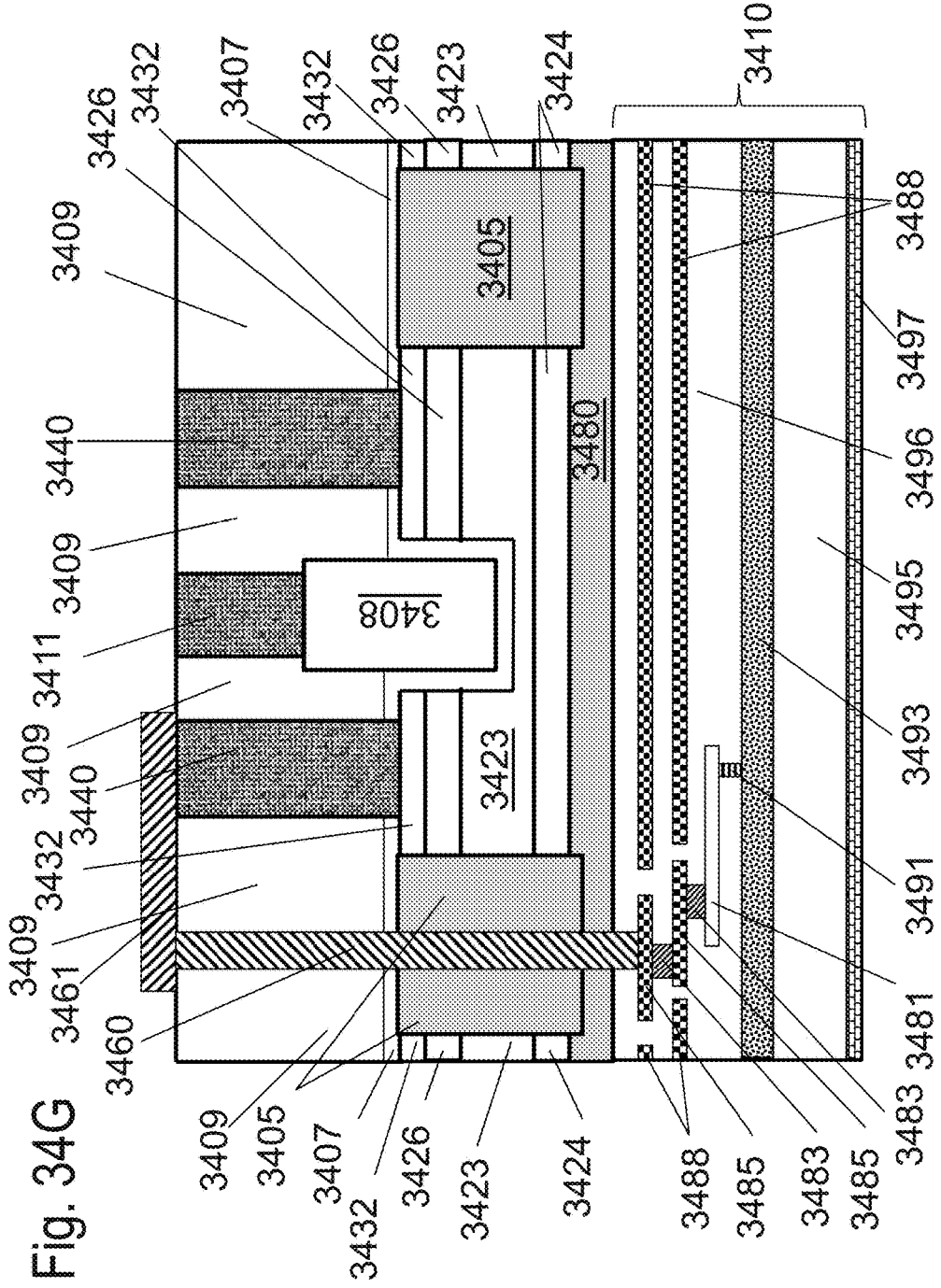

As illustrated in FIG. 34G, thru layer vias (TLVs) 3460 may be formed by etching thick oxide 3409, gate dielectric 3407, isolation regions 3405, oxide layer 3480, into a portion of the upper oxide layer BEOL isolation 3496 of acceptor wafer 3410 BEOL, and filling with an electrically and thermally conducting material or an electrically non-conducting but thermally conducting material. Second device layer metal interconnect 3461 may be formed by conventional processing. TLVs 3460 may be constructed of thermally conductive but not electrically conductive materials, for example, DLC (Diamond Like Carbon), and may connect the FD-RCAT transistor device and other devices on the top (second) crystalline layer thermally to shield/heat sink layer 3488. TLVs 3460 may be constructed out of electrically and thermally conductive materials, such as Tungsten, Copper, or aluminum, and may provide a thermal and electrical connection path from the FD-RCAT transistor device and other devices on the top (second) crystalline layer to shield/heat sink layer 3488, which may be a ground or Vdd plane in the design/layout. TLVs 3460 may be also constructed in the device scribelanes (pre-designed in base layers or potential dicelines) to provide thermal conduction to the heat sink, and may be sawed/diced off when the wafer is diced for packaging not shown). Shield/heat sink layer 3488 may be configured to act (or adapted to act) as an emf (electro-motive force) shield to prevent direct layer to layer cross-talk between transistors in the donor wafer layer and transistors in the acceptor wafer. In addition to static ground or Vdd biasing, shield/heat sink layer 3488 may be actively biased with an anti-interference signal from circuitry residing on, for example, a layer of the 3D-IC or off chip. A thermal conduction path may be constructed from the devices in the upper layer, the transferred donor layer and formed transistors, to the acceptor wafer substrate and associated heat sink. The thermal conduction path from the FD-RCAT transistor device and other devices on the top (second) crystalline layer, for example, N+ source and drain regions 3432, to the acceptor wafer heat sink 3497 may include source & drain contacts 3440, second device layer metal interconnect 3461, TLV 3460, shield path connect 3485 (shown as twice), shield path via 3483 (shown as twice), metal interconnect 3481, first (acceptor) layer metal interconnect 3491, acceptor wafer transistors and devices 3493, and acceptor substrate 3495. The elements of the thermal conduction path may include materials that have a thermal conductivity greater than 10 W/m-K, for example, copper (about 400 W/m-K), aluminum (about 237 W/m-K), and Tungsten (about 173 W/m-K). The heat removal apparatus, which may include acceptor wafer heat sink 3497, may include an external surface from which heat transfer may take place by methods such as air cooling, liquid cooling, or attachment to another heat sink or heat spreader structure.

It should be noted that one of the design requirements for a monolithic 3D IC design may be that substantially all of the stacked layers and the base or substrate would have their respective dice lines (may be called scribelines) aligned. As the base wafer or substrate is processed and multiple circuits may be constructed on semiconductor layers that overlay each other, the overall device may be designed wherein each overlaying layer would have its respective dice lines overlying the dice lines of the layer underneath, thus at the end of processing the entire layer stacked wafer/substrate could be diced in a dicing step. There may be test structures in the streets between dice lines, which overall may be called scribelanes or dicelanes. These scribelanes or dicelanes may be 10 um wide, 20 um wide, 50 um wide 100 um wide, or greater than 100 um wide depending on design choice and die singulation process capability. The scribelanes or dicelanes may include guard-ring structures and/or other die border structures. In a monolithic 3D design each layer test structure could be connected through each of the overlying layers and then to the top surface to allow access to these 'buried' test structure before dicing the wafer. Accordingly the design may include these vertical connections and may offset the layer test structures to enable such connection. In many cases the die borders comprise a protection structure, such as, for example, a guard-ring structure, die seal structure, ESD structure, and others elements. Accordingly in a monolithic 3D device these structures, such as guard rings, would be designed to overlay each other and may be aligned to each other during the course of processing. The die edges may be sealed by a process and structure such as, for example, described in relation to FIG. 183C of incorporated U.S. Pat. No. 8,273,610, and may include aspects as described in relation to FIG. 183A and 183B of same reference. One skilled in the art would recognize that the die seal can be passive or electrically active. On each 3D stack layer, or stratum, the electronic circuits within one die, that may be circumscribed by a dicelane, may not be connected to the electronic circuits of a second die on that same wafer, that second die also may be circumscribed by a dicelane. Further, the dicelane/scribelane of one stratum in the 3D stack may be aligned to the dicelane/scribelane of another stratum in the 3D stack, thus providing a direct die singulation vector for the 3D stack of stratums/layers.

Furthermore, some or all of the layers utilized as shield/heat sink layer 3488, which may include shapes of material such as the strips or fingers as illustrated in FIG. 33B-1, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 3488 layer or layers. Moreover, some or all of the layers utilized as shield/heat sink layer 3488, which may include strips or fingers as illustrated in FIG. 33B-1, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 3488 layer or layers. The Vsupply on line 17C12 and the control signals on control line 17C16 may be controlled by and/or generated in the second layer transistors (for example donor wafer device structures such as the FD-RCATs formed as described in relation to FIG. 34) or first layer transistors (acceptor, for example acceptor wafer transistors and devices 3493), or off chip circuits. Furthermore, some or all of the layers utilized as shield/heat sink layer 3488, which may include strips or fingers as illustrated in FIG. 33B-1 or other shapes such as those in FIG. 33B, may be utilized to distribute independent power supplies to various portions of the second layer transistors (for example donor wafer device structures such as the FD-RCATs formed as described in relation to FIG. 34) or first layer transistors (acceptor, for example acceptor wafer transistors and devices 3493) and circuits; for example, one power supply and/or voltage may be routed to the sequential logic circuits of the second layer and a different power supply and/or voltage routed to the combinatorial logic circuits of the second layer. Moreover, the power distribution circuits/grid may be designed so that Vdd may have a different value for each stack layer. Patterning of shield/heat sink layer 3488 or layers can impact their heat-shielding capacity. This impact may be mitigated, for example, by enhancing the top shield/heat sink layer 3488 areal density, creating more of the secondary shield/heat sink layers 3488, or attending to special CAD rules regarding their metal density, similar to CAD rules that are required to accommodate Chemical-Mechanical Planarization (CMP). These constraints would be integrated into a design and layout EDA tool TLVs 3460 may be formed through the transferred layers. As the transferred layers may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers, the smaller the thru layer via diameter obtainable, which may result from maintaining manufacturable via aspect ratios. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers.

As illustrated in FIG. 34G-1, at least one conductive bond pad 3464 for interfacing electrically (and may thermally) to external devices may be formed on top of the completed device and may include at least one metal layer of second device layer metal interconnect 3461. Bond pad 3464 may overlay second device layer metal interconnect 3461 or a portion of (some of the metal and insulator layers of) second device layer metal interconnect 3461. Bond pad 3464 may be directly aligned to the acceptor wafer alignment marks (not shown) and the I/O driver circuitry may be formed by the second layer (donor) transistors, for example, donor wafer device structures such as the FD-RCATs formed as described in relation to FIG. 34. Bond pad 3464 may be connected to the second layer transistors thru the second device layer metal interconnect 3461 which may include vias 3462. The I/O driver circuitry may be formed by transistors from the acceptor wafer transistors and devices 3493, or from transistors in other strata if the 3DIC device has more than two layers of transistors. I/O pad control metal segment 3467 may be formed directly underneath bond pad 3464 and may influence the noise and ESD (Electro Static Discharge) characteristics of bond pad 3464. The emf influence of I/O pad control metal segment 3467 may be controlled by circuitry formed from a portion of the second layer transistors. I/O pad control metal segment 3467 may be formed with second device layer metal interconnect 3461.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 34 formation techniques herein. Transferred layer or layers may have regions of STI or other transistor elements within it or on it when transferred, but would then use alignment and connection schemes for layer transfer of patterned layers as described in incorporated patent references.

Persons of ordinary skill in the art will appreciate that the illustrations in FIGS. 34A through 34G are exemplary only and are not drawn to scale. Such skilled persons will further appreciate that many variations are possible such as, for example, a p-channel FD-RCAT may be formed with changing the types of dopings appropriately. Moreover, the P− substrate donor wafer 3400 may be n type or un-doped. Further, P− doped channel layer 3403 may include multiple layers of different doping concentrations and gradients to fine tune the eventual FD-RCAT channel for electrical performance and reliability characteristics, such as, for example, off-state leakage current and on-state current. Furthermore, isolation regions 3405 may be formed by a hard mask defined process flow, wherein a hard mask stack, such as, for example, silicon oxide and silicon nitride layers, or silicon oxide and amorphous carbon layers, may be utilized. Moreover, CMOS FD-RCATs may be constructed with n-JLRCATs in a first mono-crystalline silicon layer and p-JLRCATs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Furthermore, P+ doped regions 3424 may be utilized for a double gate structure for the FD-RCAT and may utilize techniques described in the incorporated references. Further, efficient heat removal and transistor body biasing may be accomplished on a FD-RCAT by adding an appropriately doped buried layer (N− in the case of a n-FD-RCAT), forming a buried layer region underneath the P+ doped regions 3424 for junction isolation, and connecting that buried region to a thermal and electrical contact, similar to what is described for layer 1606 and region 1646 in FIGS. 16A-G in the incorporated reference pending U.S. patent application Ser. No. 13/441,923 and U.S. Patent Publication 2012/0091587. Moreover, implants after the formation of the isolation regions 3405 may be annealed by optical (such as pulsed laser) means as previously described and the acceptor wafer metallization may be protected by the shield/heat sink layer 3488. Furthermore, raised source and drain contact structures, such as etch and epi SiGe and SiC, may be utilized for strain and contact resistance improvements and the damage from the processes may be optically annealed. Moreover, the optical anneal may be performed at each sub-step as desired, or may be done at prior to the HKMG deposition (such as after the dummy gate but before the HKMG formation), or various combinations. Moreover, multiple pulses of the laser may be utilized to improve the anneal, activation, and yield of the process. Many other modifications within the scope of the invention will suggest themselves to such skilled persons after reading this specification. Thus the invention is to be limited only by the appended claims.

A planar fully depleted n-channel MOSFET (FD-MOSFET) with an optional integrated heat shield/spreader suitable for a monolithic 3D IC may be constructed as follows. The FD-MOSFET may provide an improved transistor variability control and conduction channel electrostatic control, as well as the ability to utilize an updoped channel, thereby improving carrier mobility. In addition, the FD-MOSFET does not demand doping or pocket implants in the channel to control the electrostatic characteristics and tune the threshold voltages. Sub-threshold slope, DIBL, and other short channel effects are greatly improved due to the firm gate electrostatic control over the channel. Moreover, a heat spreading, heat conducting and/or optically reflecting material layer or layers may be incorporated between the sensitive metal interconnect layers and the layer or regions being optically irradiated and annealed to repair defects in the crystalline 3D-IC layers and regions and to activate semiconductor dopants in the crystalline layers or regions of a 3D-IC without harm to the sensitive metal interconnect and associated dielectrics. FIG. 45A-G illustrates an exemplary n-channel FD-MOSFET which may be constructed in a 3D stacked layer using procedures outlined below and in U.S. Pat. No. 8,273,610, US patent publications 2012/0091587 and 2013/0020707, and pending U.S. patent application Ser. Nos. 13/441,923 and 13/099,010. The contents of the foregoing applications are incorporated herein by reference.

As illustrated in FIG. 45A, a P− substrate donor wafer 4500 may be processed to include a wafer sized layer of doping across the wafer. The channel layer 4502 may be formed by ion implantation and thermal anneal. P− substrate donor wafer 4500 may include a crystalline material, for example, mono-crystalline (single crystal) silicon. P− substrate donor wafer 4500 may be very lightly doped (less than 1e15 atoms/cm$^3$) or nominally un-doped (less than 1e14 atoms/cm$^3$). Channel layer 4502 may have additional ion implantation and anneal processing to provide a different dopant level than P− substrate donor wafer 4500 and may have graded or various layers of doping concentration. The layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike). The preferred crystalline channel layer 4502 will be undoped to eventually create an FD-MOSFET transistor with an updoped conduction channel.

As illustrated in FIG. 45B, the top surface of the P− substrate donor wafer 4500 layer stack may be prepared for oxide wafer bonding with a deposition of an oxide or by thermal oxidation of channel layer 4502 to form oxide layer 4580. A layer transfer demarcation plane (shown as dashed line) 4599 may be formed by hydrogen implantation or other methods as described in the incorporated references. The P− substrate donor wafer 4500, such as surface 4582, and acceptor wafer 4510 may be prepared for wafer bonding as previously described and low temperature (less than approximately 400° C.) bonded. Acceptor wafer 4510, as described in the incorporated references, may include, for example, transistors, circuitry, and metal, such as, for example, aluminum or copper, interconnect wiring, a metal shield/heat sink layer or layers, and thru layer via metal interconnect strips or pads. Acceptor wafer 4510 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 4510 may include transistors such as, for example, MOSFETS, FD-MOSFETS, Fin-Fets, FD-RCATs, BJTs, HEMTs, and/or HBTs. The portion of the channel layer 4502 and the P− substrate donor wafer 4500 that may be above (when the layer stack is flipped over and bonded to the acceptor wafer 4510) the layer transfer demarcation plane 4599 may be removed by cleaving or other low temperature processes as described in the incorporated references, such as, for example, ion-cut with mechanical or thermal cleave or other layer transfer methods, thus forming remaining channel layer 4503. Damage/defects to crystalline structure of channel layer 4502 may be annealed by some of the annealing methods described, for example the short wavelength pulsed laser techniques, wherein the channel layer 4502 or portions of channel layer 4502 may be heated to defect annealing temperatures, but the layer transfer demarcation plane 4599 may be kept below the temperate for cleaving and/or significant hydrogen diffusion. The optical energy may be deposited in the upper layer of the stack, for example near surface 4582, and annealing of a portion of channel layer 4502 may take place via heat diffusion.

As illustrated in FIG. 45C, oxide layer 4580 and remaining channel layer 4503 have been layer transferred to acceptor wafer 4510. The top surface of remaining channel layer 4503 may be chemically or mechanically polished, and/or may be thinned by low temperature oxidation and strip processes, such as the TEL SPA tool radical oxidation and HF:H$_2$O solutions as described herein and in referenced patents and patent applications. Thru the processing, the wafer sized layer remaining channel layer 4503 could be thinned from its original total thickness, and its final total thickness could be in the range of about 5 nm to about 20 nm, for example, 5 nm, 7 nm, 10 nm, 12 nm, 15 nm, or 20 nm. Remaining channel layer 4503 may have a thickness and doping that may allow fully-depleted channel operation when the FD-MOSFET transistor is substantially completely formed. Acceptor wafer 4510 may include one or more (two are shown in this example) shield/heat sink layers 4588, which may include materials such as, for example, Aluminum, Tungsten (a refractory metal), Copper, silicon or cobalt based silicides, or forms of carbon such as carbon nanotubes, and may be layered itself as described herein FIG. 50. Each shield/heat sink layer 4588 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 4588 may include isolation openings 4587, and alignment mark openings (not shown), which may be utilized for short wavelength alignment of top layer (donor) processing to the acceptor wafer alignment marks (not shown). Shield/heat sink layer 4588 may include one or more shield path connects 4585 and shield path vias 4583. Shield path via 4583 may thermally and/or electrically couple and connect shield path connect 4585 to acceptor wafer 4510 interconnect metallization layers such as, for example, exemplary acceptor metal interconnect 4581 (shown). Shield path connect 4585 may also thermally and/or electrically couple and connect each shield/heat sink layer 4588 to the other and to acceptor wafer 4510 interconnect metallization layers such as, for example, acceptor metal interconnect 4581, thereby creating a heat conduction path from the shield/heat sink layer 4588 to the acceptor substrate 4595, and a heat sink (shown in FIG. 45G.). Isolation openings 4587 may include dielectric materials, similar to those of BEOL isolation 4596. Acceptor wafer 4510 may include first (acceptor) layer metal interconnect 4591, acceptor wafer transistors and devices 4593, and acceptor substrate 4595. Various topside defect anneals may be utilized. For this illustration, an optical beam such as the laser annealing previously described is used. Optical anneal beams may be optimized to focus light absorption and heat generation within or at the surface of remaining channel layer 4503 and provide surface smoothing and/or defect annealing (defects may be from the cleave and/or the ion-cut implantation) with exemplary smoothing/annealing ray 4566. The laser assisted smoothing/annealing with the absorbed heat generated by exemplary smoothing/annealing ray 4566 may also include a pre-heat of the bonded stack to, for example, about 100° C. to about 400° C., and/or a rapid thermal spike to temperatures above about 200° C. to about 600° C. Additionally, absorber layers or regions, for example, including amorphous carbon, amorphous silicon, and phase changing materials (see U.S. Pat. Nos. 6,635,588 and 6,479,821 to Hawryluk et al. for example), may be utilized to increase the efficiency of the optical energy capture in conversion to heat for the desired annealing or activation processes. Moreover, multiple pulses of the laser may be utilized to improve the anneal, activation, and yield of the process. Reflected ray 4563 may be reflected and/or absorbed by shield/heat sink layer 4588 regions thus blocking the optical absorption of ray blocked metal interconnect 4581. Annealing of dopants or annealing of damage, such as from the H cleave implant damage, may be also accomplished by a set of rays such as repair ray 4565. Heat generated by absorbed photons from, for example, smoothing/annealing ray 4566, reflected ray 4563, and/or repair ray 4565 may also be absorbed by shield/heat sink layer 4588 regions and dissipated laterally and may keep the temperature of underlying metal layers, such as metal interconnect 4581, and other metal layers below it, cooler and prevent damage. Shield/heat sink layer 4588 and associated dielectrics may laterally spread and conduct the heat generated by the topside defect anneal, and in conjunction with the dielectric materials (low heat conductivity) above and below shield/heat sink layer 4588, keep the interconnect metals and low-k dielectrics of the acceptor wafer interconnect layers cooler than a damage temperature, such as, for example, 400° C. A second layer of shield/heat sink layer 4588 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 4588 may act as a heat spreader. Electrically conductive materials may be used for the two layers of shield/heat sink layer 4588 and thus may provide, for example, a Vss and a Vdd plane and/or grid that may be connected to the donor layer transistors above, as well may be connected to the acceptor wafer transistors below, and/or may provide below transferred layer device interconnection. Noise on the power grids, such as the Vss and Vdd plane power conducting lines/wires, may be mitigated by attaching/connecting decoupling capacitors onto the power conducting lines of the grids. The decoupling caps, which may be within the second layer (donor, for example, donor wafer device structures) or first layer (acceptor, for example acceptor wafer transistors and devices 4593), may include, for example, trench capacitors such as described by Pei, C., et al., "A novel, low-cost deep trench decoupling capacitor for high-performance, low-power bulk CMOS applications," ICSICT ($9^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Shield/heat sink layer 4588 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 4588 may be sandwiched and/or substantially enclosed by materials with a low thermal conductivity (less than 10 W/m-K), for example, silicon dioxide (about 1.4 W/m-K). The sandwiching of high and low thermal conductivity materials in layers, such as shield/heat sink layer 4588 and under & overlying dielectric layers, spreads the localized heat/light energy of the topside anneal laterally and protects the underlying layers of interconnect metallization & dielectrics, such as in the acceptor wafer 4510, from harmful temperatures or damage. When there may be more than one shield/heat sink layer 4588 in the device, the heat conducting layer closest to the second crystalline layer or oxide layer 4580 may be constructed with a different material, for example a high melting point material, for example a refractory metal such as tungsten, than the other heat conducting layer or layers, which may be constructed with, for example, a lower melting point material, for example, such as aluminum or copper. Now transistors may be formed with low effective temperature (less than approximately 400° C. exposure to the acceptor wafer 4510 sensitive layers, such as interconnect and device layers) processing, and may be aligned to the acceptor wafer alignment marks (not shown) as described in the incorporated references. This may include further optical defect annealing or dopant activation steps. The donor wafer 4500 may now also be processed, such as smoothing and annealing, and reused for additional layer transfers. The insulator layer, such as deposited bonding oxides (for example oxide layer 4580) and/or before bonding preparation existing oxides (for example the BEOL isolation 4596 on top of the topmost metal layer of shield/heat sink layer 4588), between the donor wafer transferred monocrystalline layer and the acceptor wafer topmost metal layer, may include thicknesses of less than 1 um, less than 500 nm, less than 400 nm, less than 300 nm, less than 200 nm, or less than 100 nm.

Figure 45D:
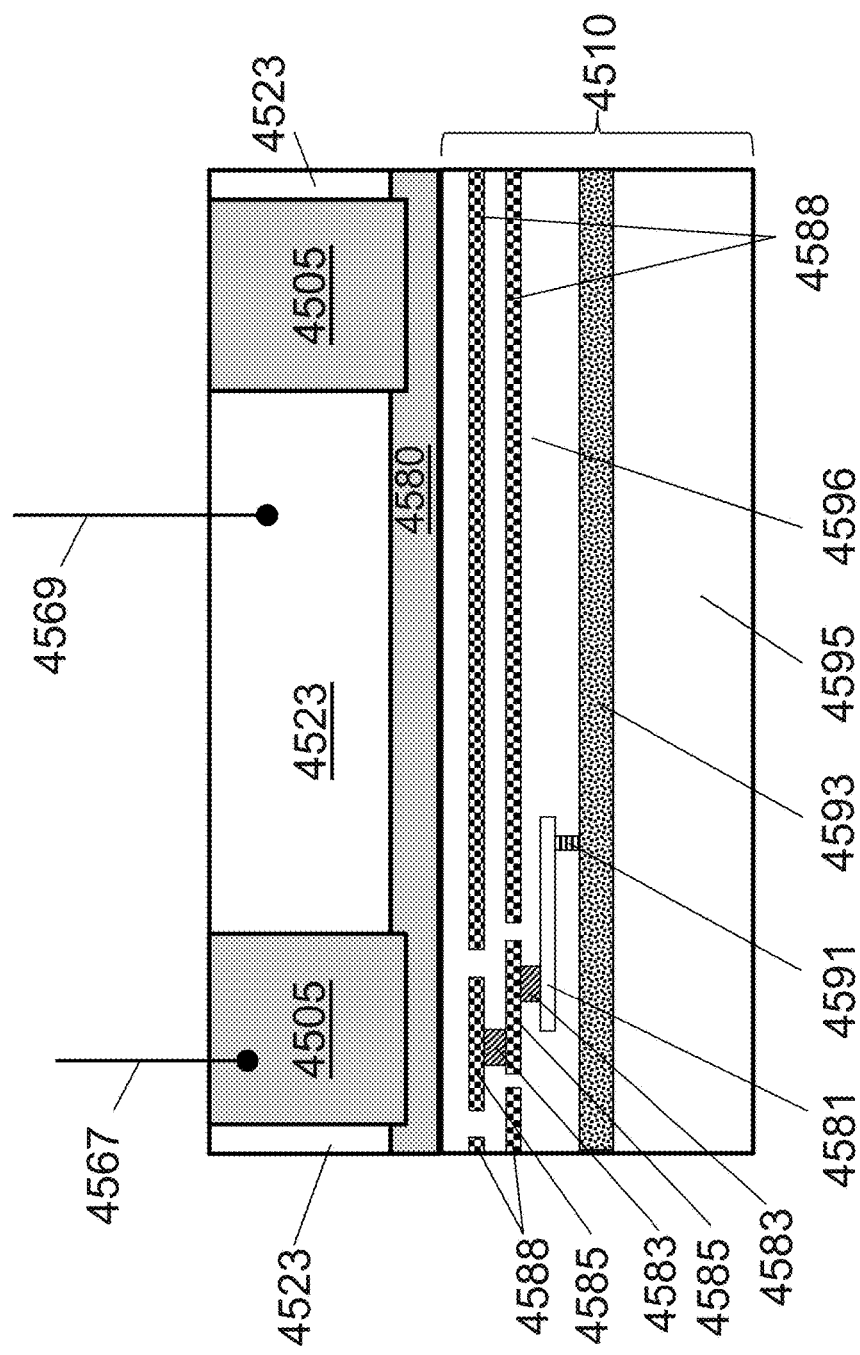

As illustrated in FIG. 45D, transistor isolation regions 4505 may be formed by mask defining and plasma/RIE etching remaining channel layer 4503 substantially to the top of oxide layer 4580 (not shown), substantially into oxide layer 4580, or into a portion of the upper oxide layer of acceptor wafer 4510 (not shown). Thus channel region 4523 may be formed, which may substantially form the transistor body. A low-temperature gap fill dielectric, such as SACVD oxide, may be deposited and chemically mechanically polished, the oxide remaining in isolation regions 4505. An optical step, such as illustrated by exemplary STI ray 4567, may be performed to anneal etch damage and densify the STI oxide in isolation regions 4505. The doping concentration of the channel region 4523 may include gradients of concentration or layers of differing doping concentrations. Any additional doping, such as ion-implanted channel implants, may be activated and annealed with optical annealing, such as illustrated by exemplary implant ray 4569, as described herein. The optical anneal, such as exemplary STI ray 4567, and/or exemplary implant ray 4569 may be performed at separate times and processing parameters (such as laser energy, frequency, etc.) or may be done in combination or as one optical anneal. Optical absorber and or reflective layers or regions may be employed to enhance the anneal and/or protect the underlying sensitive structures. Moreover, multiple pulses of the laser may be utilized to improve the anneal, activation, and yield of the process.

Figure 45E:
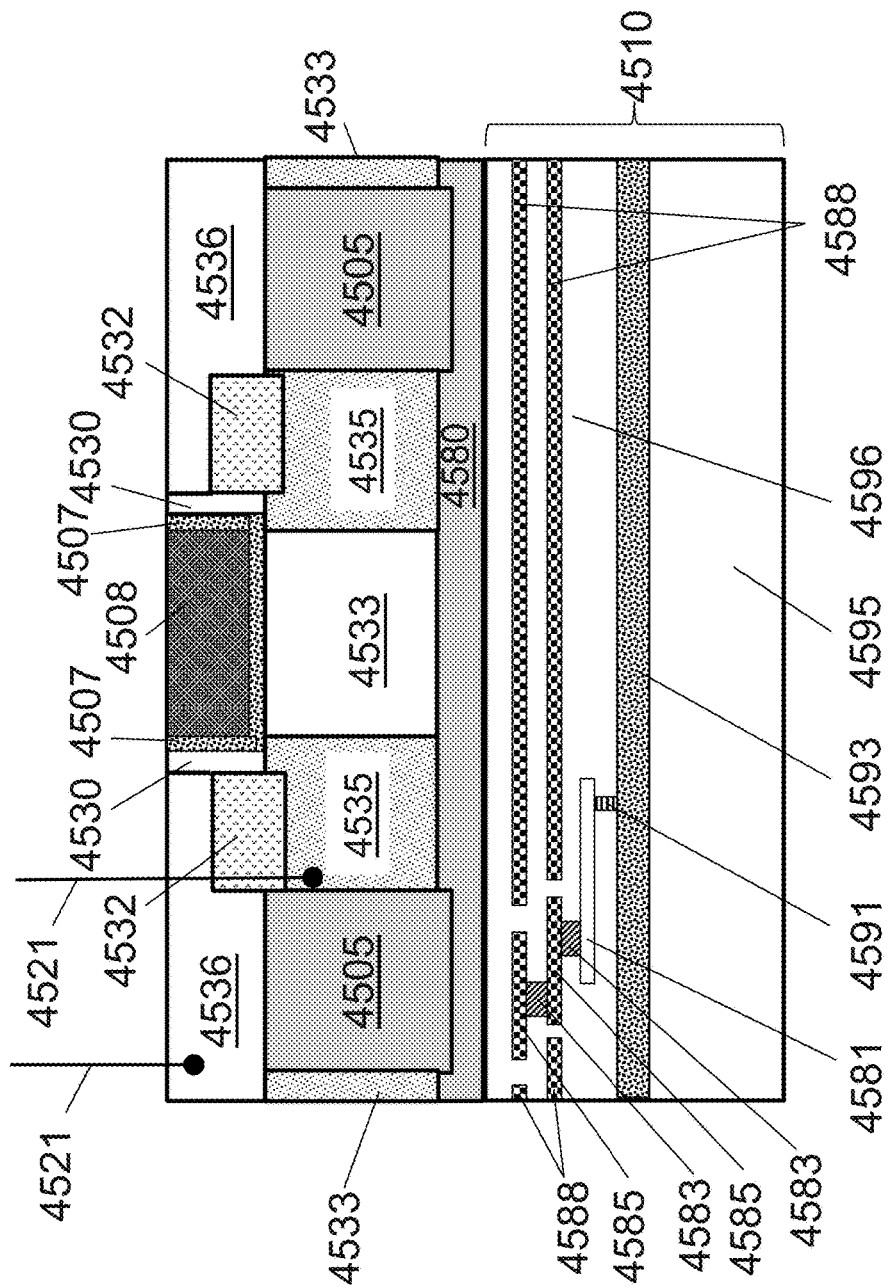
Figure 45F:
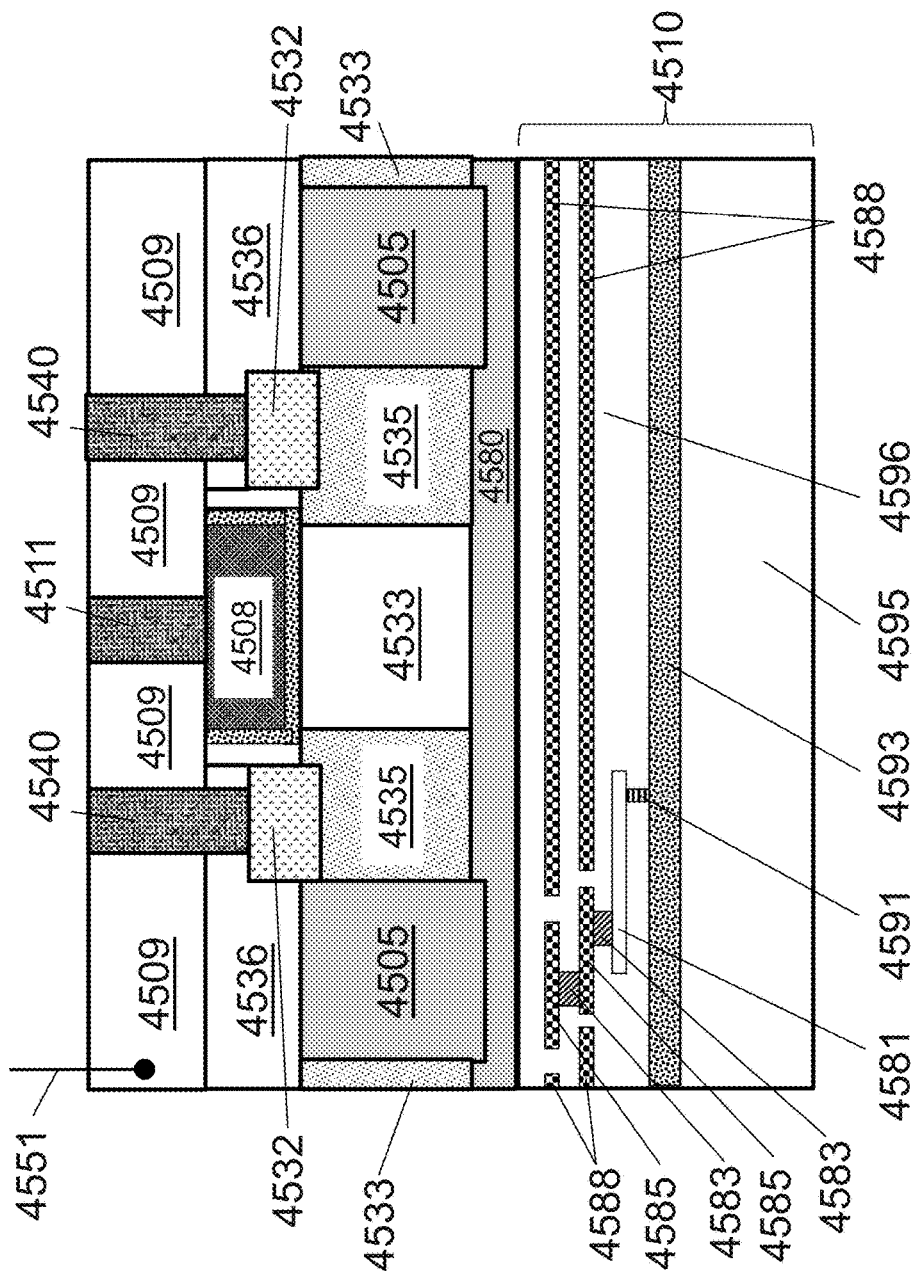

As illustrated in FIG. 45E, a transistor forming process, such as a conventional HKMG with raised source and drains (S/D), may be performed. For example, a dummy gate stack (not shown), utilizing oxide and polysilicon, may be formed, gate spacers 4530 may be formed, raised S/D regions 4532 and channel stressors may be formed by etch and epitaxial deposition, for example, of SiGe and/or SiC depending on P or N channel, LDD and S/D ion-implantations may be performed, and first ILD 4536 may be deposited and CMP'd to expose the tops of the dummy gates. Thus transistor channel 4533 and S/D & LDD regions 4535 may be formed. The dummy gate stack may be removed and a gate dielectric 4507 may be formed and a gate metal material gate electrode 4508, including a layer of proper work function metal ($Ti_xAl_yN_z$ for example) and a conductive fill, such as aluminum, may be deposited and CMP'd. The gate dielectric 4507 may be an atomic layer deposited (ALD) gate dielectric that may be paired with a work function specific gate metal in the industry standard high k metal gate process schemes, for example, as described in the incorporated references. Alternatively, the gate dielectric 4507 may be formed with a low temperature processes including, for example, LPCVD $SiO_2$ oxide deposition (see Ahn, J., et al., "High-quality MOSFET's with ultrathin LPCVD gate SiO2," IEEE Electron Device Lett., vol. 13, no. 4, pp. 186-188, April 1992) or low temperature microwave plasma oxidation of the silicon surfaces (see Kim, J. Y., et al., "The excellent scalability of the RCAT (recess-channel-array-transistor) technology for sub-70 nm DRAM feature size and beyond," 2005 IEEE VLSI-TSA International Symposium, pp. 33-45, 25-27 Apr. 2005) and a gate material with proper work function and less than approximately 400° C. deposition temperature such as, for example, tungsten or aluminum may be deposited. An optical step, such as represented by exemplary anneal ray 4521, may be performed to densify and/or remove defects from gate dielectric 4507, anneal defects and activate dopants such as LDD and S/D implants, densify the first ILD 4536, form DSS junctions (Dopant Segregated Schottky such as $NiSi_2$), and/or form contact and S/D silicides (not shown). The optical anneal may be performed at each sub-step as desired, or may be done at prior to the HKMG deposition (such as after the dummy gate but before the HKMG formation), or various combinations. Moreover, multiple pulses of the laser may be utilized to improve the anneal, activation, and yield of the process. Raised S/D regions 4532 may be formed by low temperature (less than 400° C.) deposition of in-situ doped polysilicon or amorphous silicon into the S/D openings, an optical anneal to further crystallize and dopant activate the raised S/D material, and removal of excess raised S/D material As illustrated in FIG. 45F, a low temperature thick oxide 4509 may be deposited and planarized. Source, gate, and drain contacts openings may be masked and etched preparing the transistors to be connected via metallization. Thus gate contact 4511 connects to gate electrode 4508, and source & drain contacts 4540 connect to raised S/D regions 4532. An optical step, such as illustrated by exemplary ILD anneal ray 4551, may be performed to anneal contact etch damage and densify the thick oxide 4509.

Figure 45G:
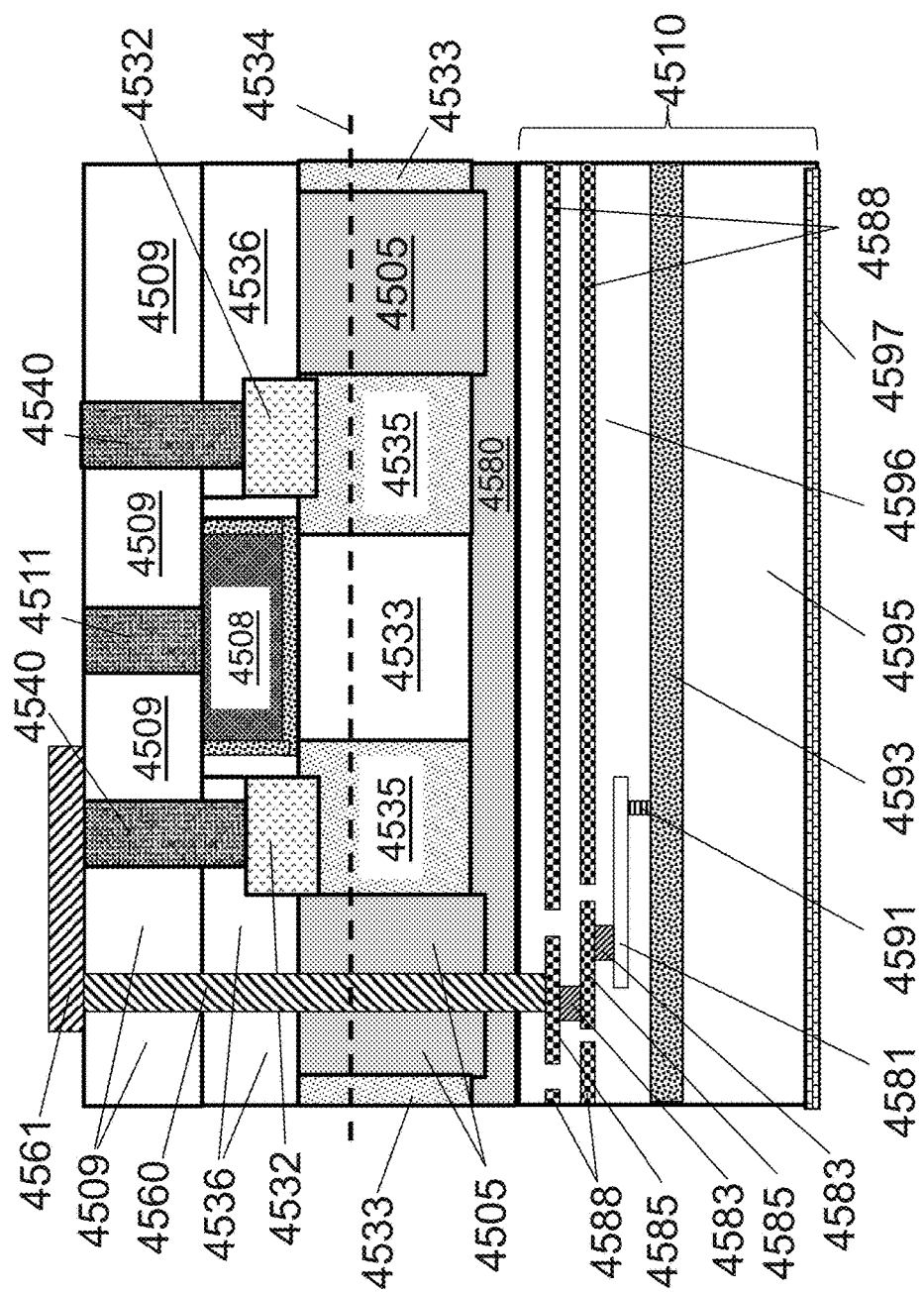
Figures 1, 45G:
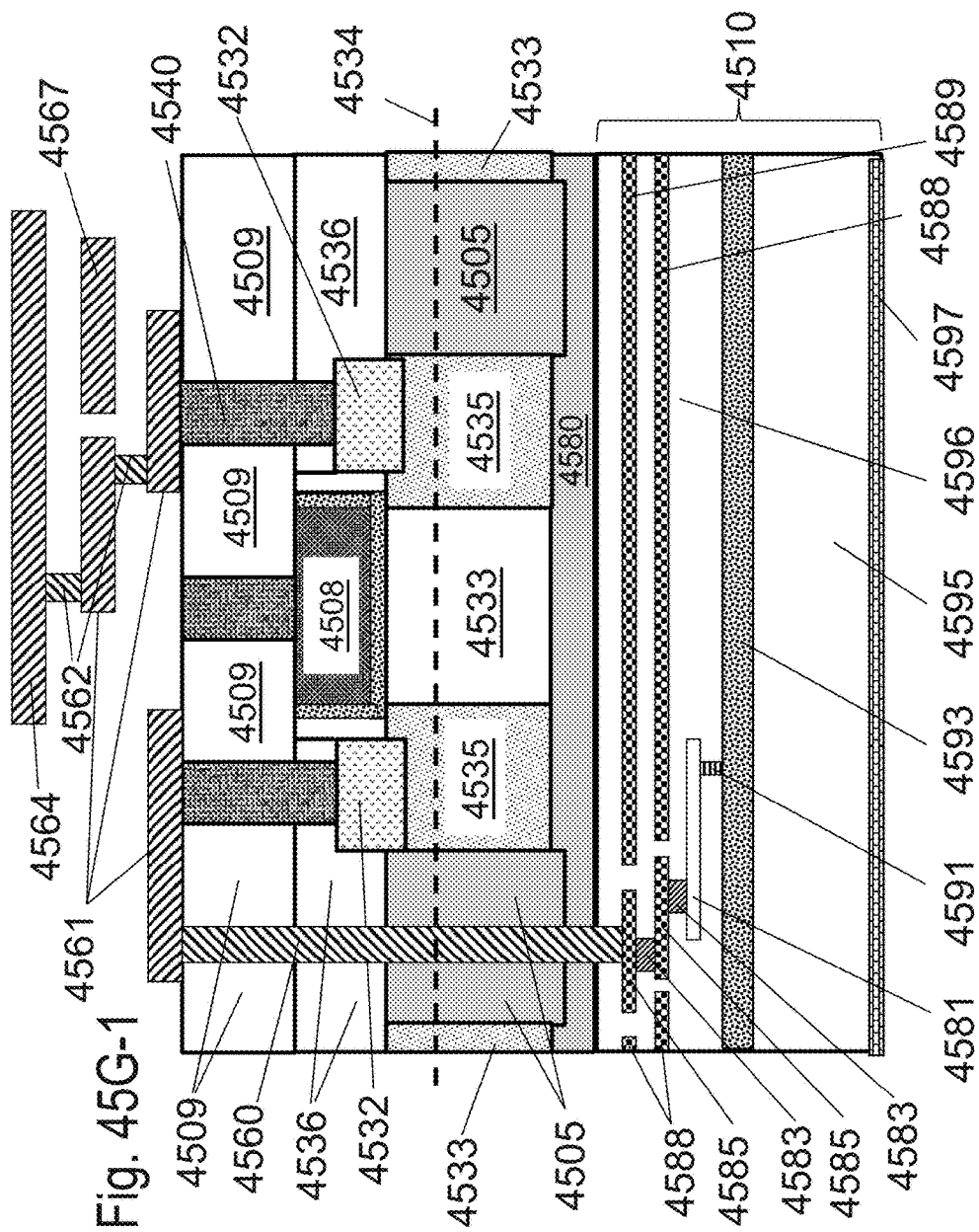

As illustrated in FIG. 45G, thru layer vias (TLVs) 4560 may be formed by etching thick oxide 4509, first ILD 4536, isolation regions 4505, oxide layer 4580, into a portion of the upper oxide layer BEOL isolation 4596 of acceptor wafer 4510 BEOL, and filling with an electrically and thermally conducting material (such as tungsten or cooper) or an electrically non-conducting but thermally conducting material (such as described elsewhere within). Second device layer metal interconnect 4561 may be formed by conventional processing. TLVs 4560 may be constructed of thermally conductive but not electrically conductive materials, for example, DLC (Diamond Like Carbon), and may connect the FD-MOSFET transistor device and other devices on the top (second) crystalline layer thermally to shield/heat sink layer 4588. TLVs 4560 may be constructed out of electrically and thermally conductive materials, such as Tungsten, Copper, or aluminum, and may provide a thermal and electrical connection path from the FD-MOS- FET transistor device and other devices on the top (second) crystalline layer to shield/heat sink layer 4588, which may be a ground or Vdd plane in the design/layout. TLVs 4560 may be also constructed in the device scribelanes (pre-designed in base layers or potential dicelines) to provide thermal conduction to the heat sink, and may be sawed/diced off when the wafer is diced for packaging not shown). Shield/heat sink layer 4588 may be configured to act (or adapted to act) as an emf (electro-motive force) shield to prevent direct layer to layer cross-talk between transistors in the donor wafer layer and transistors in the acceptor wafer. In addition to static ground or Vdd biasing, shield/heat sink layer 4588 may be actively biased with an anti-interference signal from circuitry residing on, for example, a layer of the 3D-IC or off chip. The formed FD-MOSFET transistor device may include semiconductor regions wherein the dopant concentration of neighboring regions of the transistor in the horizontal plane, such as traversed by exemplary dopant plane 4534, may have regions, for example, transistor channel 4533 and S/D & LDD regions 4535, that differ substantially in dopant concentration, for example, a 10 times greater doping concentration in S/D & LDD regions 4535 than in transistor channel 4533, and/or may have a different dopant type, such as, for example p-type or n-type dopant, and/or may be doped and substantially undoped in the neighboring regions. For example, transistor channel 4533 may be very lightly doped (less than 1e15 atoms/cm$^3$) or nominally un-doped (less than 1e14 atoms/cm$^3$) and S/D & LDD regions 4535 may be doped at greater than 1e15 atoms/cm$^3$ or greater than 1e16 atoms/cm$^3$. For example, transistor channel 4533 may be doped with p-type dopant and S/D & LDD regions 4535 may be doped with n-type dopant.

A thermal conduction path may be constructed from the devices in the upper layer, the transferred donor layer and formed transistors, to the acceptor wafer substrate and associated heat sink. The thermal conduction path from the FD-MOSFET transistor device and other devices on the top (second) crystalline layer, for example, raised S/D regions 4532, to the acceptor wafer heat sink 4597 may include source & drain contacts 4540, second device layer metal interconnect 4561, TLV 4560, shield path connect 4585 (shown as twice), shield path via 4583 (shown as twice), metal interconnect 4581, first (acceptor) layer metal interconnect 4591, acceptor wafer transistors and devices 4593, and acceptor substrate 4595. The elements of the thermal conduction path may include materials that have a thermal conductivity greater than 10 W/m-K, for example, copper (about 400 W/m-K), aluminum (about 237 W/m-K), and Tungsten (about 173 W/m-K), and may include material with thermal conductivity lower than 10 W/m-K but have a high heat transfer capacity due to the wide area available for heat transfer and thickness of the structure (Fourier's Law), such as, for example, acceptor substrate 4595. The elements of the thermal conduction path may include materials that are thermally conductive but may not be substantially electrically conductive, for example, Plasma Enhanced Chemical Vapor Deposited Diamond Like Carbon-PECVD DLC (about 1000 W/m-K), and Chemical Vapor Deposited (CVD) graphene (about 5000 W/m-K). The acceptor wafer interconnects may be substantially surrounded by BEOL isolation 4596 dielectric. The heat removal apparatus, which may include acceptor wafer heat sink 4597, may include an external surface from which heat transfer may take place by methods such as air cooling, liquid cooling, or attachment to another heat sink or heat spreader structure.

Furthermore, some or all of the layers utilized as shield/heat sink layer 4588, which may include shapes of material such as the strips or fingers as illustrated in FIG. 33B-1, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 4588 layer or layers. Moreover, some or all of the layers utilized as shield/heat sink layer 4588, which may include strips or fingers as illustrated in FIG. 33B-1, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 4588 layer or layers. The Vsupply on line 17C12 and the control signals on control line 17C16 may be controlled by and/or generated in the second layer transistors (for example donor wafer device structures such as the FD-MOSFETs formed as described in relation to FIG. 45) or first layer transistors (acceptor, for example acceptor wafer transistors and devices 4593), or off chip circuits. Furthermore, some or all of the layers utilized as shield/heat sink layer 4588, which may include strips or fingers as illustrated in FIG. 33B-1 or other shapes such as those in FIG. 33B, may be utilized to distribute independent power supplies to various portions of the second layer transistors (for example donor wafer device structures such as the FD-MOSFETs formed as described in relation to FIG. 45) or first layer transistors (acceptor, for example acceptor wafer transistors and devices 4593) and circuits; for example, one power supply and/or voltage may be routed to the sequential logic circuits of the second layer and a different power supply and/or voltage routed to the combinatorial logic circuits of the second layer. Moreover, the power distribution circuits/grid may be designed so that Vdd may have a different value for each stack layer. Patterning of shield/heat sink layer 4588 or layers can impact their heat-shielding capacity. This impact may be mitigated, for example, by enhancing the top shield/heat sink layer 4588 areal density, creating more of the secondary shield/heat sink layers 4588, or attending to special CAD rules regarding their metal density, similar to CAD rules that are required to accommodate Chemical-Mechanical Planarization (CMP). These constraints would be integrated into a design and layout EDA tool. Second layer metallization and power grid wires (such as second device layer metal interconnect 4561) may be constructed thicker and wider than the first layer metal interconnect (such as metal interconnect 4581), and hence have a higher current conduction capacity. Moreover, the second layer of circuits and transistors, for example, for example donor wafer device structures such as the FD-MOSFETs formed as described in relation to FIG. 45, may include I/O logic devices, such as SerDes (Serialiser/Deserialiser), and conductive bond pads (not shown) (herein such as FIG. 53). The output or input conductive pads of the I/O circuits may be coupled, for example by bonded wires, to external devices. The output or input conductive pads may also act as a contact port for the 3D device output to connect to external devices. The emf generated by the I/O circuits could be shielded from the other layers in the stack by use of, for example, the shield/heat sink layer 4588. Placement of the I/O circuits on the same stack layer as the conductive bond pad may enable close coupling of the desired I/O energy and lower signal loss. Furthermore, the second layer of circuits and transistors, for example donor wafer device structures such as the FD-MOSFETs formed as described in relation to FIG. 45, may include RF (Radio Frequency) circuits and/or at least one antenna. For example, the second layer of circuits and transistors may include RF circuits to enable an off-chip communication capability to external devices, for example, a wireless communication circuit or circuits such as a Bluetooth protocol or capacitive coupling. The emf generated by the RF circuits could be shielded from the other layers in the stack by use of, for example, the shield/heat sink layer 4588.

TLVs 4560 may be formed through the transferred layers. As the transferred layers may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers, the smaller the thru layer via diameter obtainable, which may result from maintaining manufacturable via aspect ratios. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers.

As illustrated in FIG. 45G-1, at least one conductive bond pad 4564 for interfacing electrically (and may thermally) to external devices may be formed on top of the completed device and may include at least one metal layer of second device layer metal interconnect 4561. Bond pad 4564 may overlay second device layer metal interconnect 4561 or a portion of (some of the metal and insulator layers of) second device layer metal interconnect 4561. Bond pad 4564 may be directly aligned to the acceptor wafer alignment marks (not shown) and the I/O driver circuitry may be formed by the second layer (donor) transistors, for example, donor wafer device structures such as the FD-MOSFETs formed as described in relation to FIG. 45. Bond pad 4564 may be connected to the second layer transistors thru the second device layer metal interconnect 4561 which may include vias 4562. The I/O driver circuitry may be formed by transistors from the acceptor wafer transistors and devices 4593, or from transistors in other strata if the 3DIC device has more than two layers of transistors. I/O pad control metal segment 4567 may be formed directly underneath bond pad 4564 and may influence the noise and ESD (Electro Static Discharge) characteristics of bond pad 4564. The emf influence of I/O pad control metal segment 4567 may be controlled by circuitry formed from a portion of the second layer transistors. I/O pad control metal segment 4567 may be formed with second device layer metal interconnect 4561. Furthermore, metal segment 4589 of the topmost shield/heat sink layer 4588 may be used to influence the FD-MOSFET transistor or transistors above it by emf, and influence the noise and ESD (Electro Static Discharge) characteristics of bond pad 4564. Metal segment 4589 may be controlled by second layer (donor) transistors, for example, donor wafer device structures such as the FD-MOSFETs formed as described in relation to FIG. 45 and/or by transistors from the acceptor wafer transistors and devices 4593, or from transistors in other strata if the 3DIC device has more than two layers of transistors. Power from external sources may be routed to conductive bond pad 4564 to the 3D device, wherein at least a portion of the second layer interconnections such as second device layer metal interconnect 4561 and associated vias, may be constructed as a power distribution grid/network, and the power distribution grid/network may be connected electrically and thermally via TLVs 4560 to the transistor layer below's (such as acceptor wafer transistors and devices 4593) power distribution grid/network, the power distribution grid/network may include for example, shield/heat sink layer 4588 or Vss/Vdd strategy as described herein at least FIG. 51, and it's associated portion of a thermal conduction path (shield path connect 4585, shield path vias 4583, metal interconnect 4581, first (acceptor) layer metal interconnect 4591) to acceptor wafer transistors and devices 4593, acceptor substrate 4595, and acceptor wafer heat sink 4597.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 45 formation techniques herein. Transferred layer or layers may have regions of STI or other transistor elements within it or on it when transferred, but would then use alignment and connection schemes for layer transfer of patterned layers as described in incorporated patent references.

Persons of ordinary skill in the art will appreciate that the illustrations in FIGS. 45A through 45G are exemplary only and are not drawn to scale. Such skilled persons will further appreciate that many variations are possible such as, for example, a p-channel FD-MOSFET may be formed with changing the types of dopings appropriately. Moreover, the P− substrate donor wafer 4500 may be n type or un-doped. Furthermore, isolation regions 4505 may be formed by a hard mask defined process flow, wherein a hard mask stack, such as, for example, silicon oxide and silicon nitride layers, or silicon oxide and amorphous carbon layers, may be utilized. Moreover, CMOS FD MOSFET s may be constructed with n-MOSFETs in a first mono-crystalline silicon layer and p-MOSFET s in a second mono-crystalline layer, which may include different crystalline orientations of the mono-crystalline silicon layers, such as for example, <100>, <111> or <551>, and may include different contact silicides for optimum contact resistance to p or n type source, drains, and gates. Further, dopant segregation techniques (DST) may be utilized to efficiently modulate the source and drain Schottky barrier height for both p and n type junctions formed. Furthermore, raised source and drain contact structures, such as etch and epi SiGe and SiC, may be utilized for strain and contact resistance improvements and the damage from the processes may be optically annealed. Many other modifications within the scope of the invention will suggest themselves to such skilled persons after reading this specification. Thus the invention is to be limited only by the appended claims.

A planar fully depleted n-channel MOSFET (FD-MOSFET) with an optional integrated heat shield/spreader and back planes and body bias taps suitable for a monolithic 3D IC may be constructed as follows. The FD-MOSFET may provide an improved transistor variability control and conduction channel electrostatic control, as well as the ability to utilize an updoped channel, thereby improving carrier mobility. In addition, the FD-MOSFET does not demand doping or pocket implants in the channel to control the electrostatic characteristics and tune the threshold voltages. Sub-threshold slope, DIBL, and other short channel effects are greatly improved due to the firm gate electrostatic control over the channel. In this embodiment, a ground plane is constructed that may provide improved electrostatics and/or Vt adjustment and/or back-bias of the FD-MOSFET. In addition, selective regions may be constructed to provide body bias and/or partially depleted/bulk-like transistors. Moreover, a heat spreading, heat conducting and/or optically reflecting material layer or layers may be incorporated between the sensitive metal interconnect layers and the layer or regions being optically irradiated and annealed to repair defects in the crystalline 3D-IC layers and regions and to activate semiconductor dopants in the crystalline layers or regions of a 3D-IC without harm to the sensitive metal interconnect and associated dielectrics. FIG. 46A-G illustrates an exemplary n-channel FD-MOSFET which may be constructed in a 3D stacked layer using procedures outlined below and in U.S. Pat. No. 8,273,610, US patent publications 2012/0091587 and 2013/0020707, and pending U.S. patent application Ser. Nos. 13/441,923 and 13/099,010. The contents of the foregoing applications are incorporated herein by reference.

As illustrated in FIG. 46A, SOI donor wafer substrate 4600 may include back channel layer 4602 above Buried Oxide BOX layer 4601. Back channel layer 4602 may be doped by ion implantation and thermal anneal, may include a crystalline material, for example, mono-crystalline (single crystal) silicon and may be heavily doped (greater than 1e16 atoms/cm$^3$), lightly doped (less than 1e16 atoms/cm$^3$) or nominally un-doped (less than 1e14 atoms/cm$^3$). SOI donor wafer substrate 4600 may include a crystalline material, for example, mono-crystalline (single crystal) silicon and at least the upper layer near BOX layer 4601 may be very lightly doped (less than 1e15 atoms/cm$^3$) or nominally un-doped (less than 1e14 atoms/cm$^3$). Back channel layer 4602 may have additional ion implantation and anneal processing to provide a different dopant level than SOI donor wafer substrate 4600 and may have graded or various layers of doping concentration. SOI donor wafer substrate 4600 may have additional ion implantation and anneal processing to provide a different dopant level than back channel layer 4602 and may have graded or various layers of doping concentration. The layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike). The preferred at least top of SOI donor wafer substrate 4600 doping will be undoped to eventually create an FD-MOSFET transistor with an updoped conduction channel. SOI donor wafer may be constructed by layer transfer techniques described herein or elsewhere as known in the art, or by laser annealed SIMOX at a post donor layer transfer to acceptor wafer step. BOX layer 4601 may be thin enough to provide for effective back and/or body bias, for example, 25 nm, or 20 nm, or 10 nm, or 35 nm.

As illustrated in FIG. 46B, the top surface of the SOI donor wafer substrate 4600 layer stack may be prepared for oxide wafer bonding with a deposition of an oxide or by thermal oxidation of back channel layer 4602 to form oxide layer 4680. A layer transfer demarcation plane (shown as dashed line) 4699 may be formed by hydrogen implantation or other methods as described in the incorporated references, and may reside within the SOI donor wafer substrate 4600. The SOI donor wafer substrate 4600 stack, such as surface 4682, and acceptor wafer 4610 may be prepared for wafer bonding as previously described and low temperature (less than approximately 400° C.) bonded. Acceptor wafer 4610, as described in the incorporated references, may include, for example, transistors, circuitry, and metal, such as, for example, aluminum or copper, interconnect wiring, a metal shield/heat sink layer or layers, and thru layer via metal interconnect strips or pads. Acceptor wafer 4610 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 4610 may include transistors such as, for example, MOSFETS, FD-MOSFETS, FinFets, FD-RCATs, BJTs, HEMTs, and/or HBTs. The portion of the SOI donor wafer substrate 4600 that may be above (when the layer stack is flipped over and bonded to the acceptor wafer 4610) the layer transfer demarcation plane 4699 may be removed by cleaving or other low temperature processes as described in the incorporated references, such as, for example, ion-cut with mechanical or thermal cleave or other layer transfer methods, thus forming remaining channel layer 4603. Damage/defects to crystalline structure of back channel layer 4602 may be annealed by some of the annealing methods described, for example the short wavelength pulsed laser techniques, wherein the back channel layer 4602 and/or portions of the SOI donor wafer substrate 4600 may be heated to defect annealing temperatures, but the layer transfer demarcation plane 4699 may be kept below the temperate for cleaving and/or significant hydrogen diffusion. The optical energy may be deposited in the upper layer of the stack, for example near surface 4682, and annealing of back channel layer 4602 and/or portions of the SOI donor wafer substrate 4600 may take place via heat diffusion. Moreover, multiple pulses of the laser may be utilized to improve the anneal, activation, and yield of the process and/or to control the maximum temperature of various structures in the stack.

Figure 46C:
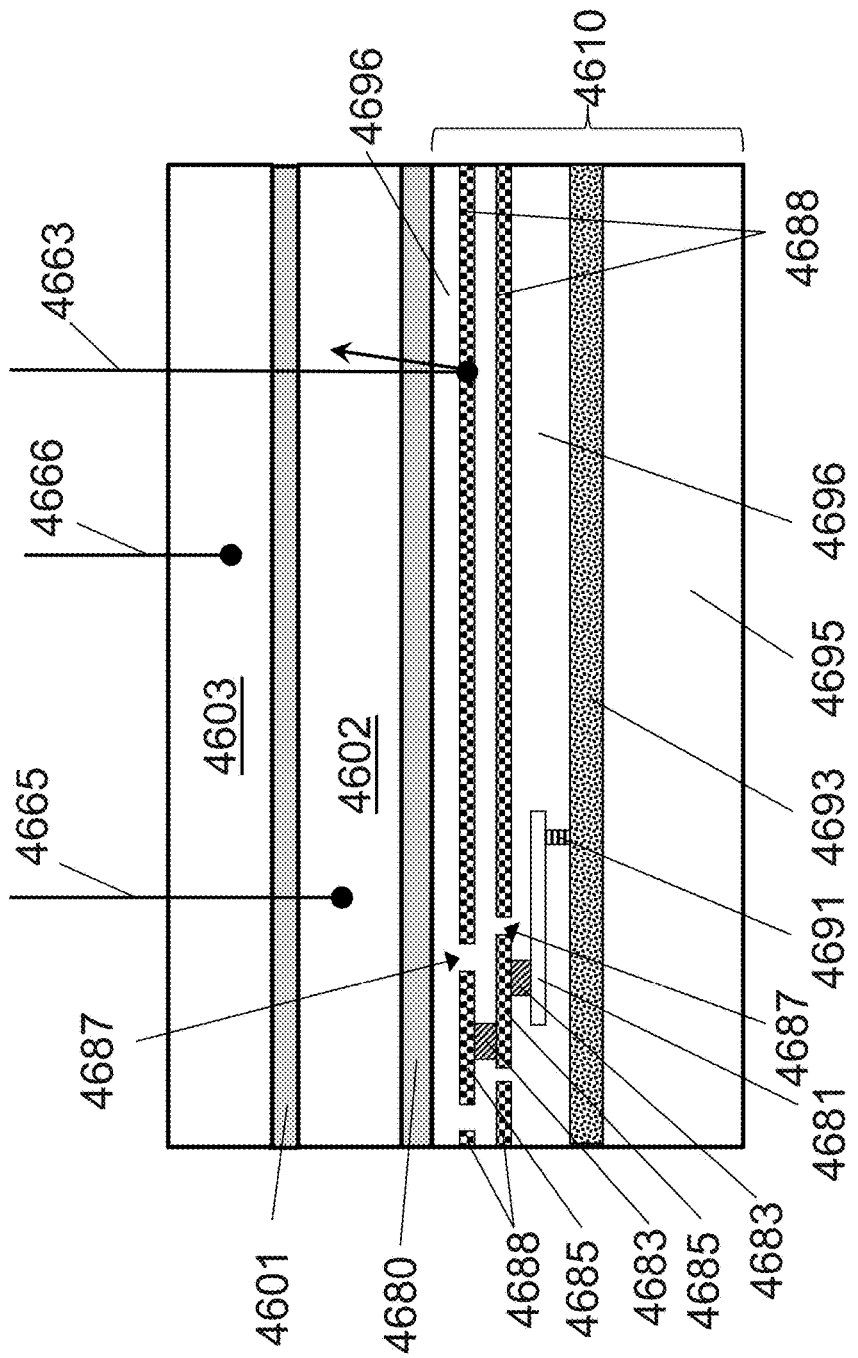

As illustrated in FIG. 46C, oxide layer 4680, back channel layer 4602, BOX layer 4601 and channel layer 4603 may be layer transferred to acceptor wafer 4610. The top surface of channel layer 4603 may be chemically or mechanically polished, and/or may be thinned by low temperature oxidation and strip processes, such as the TEL SPA tool radical oxidation and HF:H$_2$O solutions as described herein and in referenced patents and patent applications. Thru the processing, the wafer sized layer channel layer 4603 could be thinned from its original total thickness, and its final total thickness could be in the range of about 5 nm to about 20 nm, for example, 5 nm, 7 nm, 10 nm, 12 nm, 15 nm, or 20 nm. Channel layer 4603 may have a thickness and/or doping that may allow fully-depleted channel operation when the FD-MOSFET transistor is substantially completely formed. Acceptor wafer 4610 may include one or more (two are shown in this example) shield/heat sink layers 4688, which may include materials such as, for example, Aluminum, Tungsten (a refractory metal), Copper, silicon or cobalt based silicides, or forms of carbon such as carbon nanotubes, and may be layered itself as described herein FIG. 50. Each shield/heat sink layer 4688 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 4688 may include isolation openings 4687, and alignment mark openings (not shown), which may be utilized for short wavelength alignment of top layer (donor) processing to the acceptor wafer alignment marks (not shown). Shield/heat sink layer 4688 may include one or more shield path connects 4685 and shield path vias 4683. Shield path via 4683 may thermally and/or electrically couple and connect shield path connect 4685 to acceptor wafer 4610 interconnect metallization layers such as, for example, exemplary acceptor metal interconnect 4681 (shown). Shield path connect 4685 may also thermally and/or electrically couple and connect each shield/heat sink layer 4688 to the other and to acceptor wafer 4610 interconnect metallization layers such as, for example, acceptor metal interconnect 4681, thereby creating a heat conduction path from the shield/heat sink layer 4688 to the acceptor substrate 4695, and a heat sink (shown in FIG. 46G.). Isolation openings 4687 may include dielectric materials, similar to those of BEOL isolation 4696. Acceptor wafer 4610 may include first (acceptor) layer metal interconnect 4691, acceptor wafer transistors and devices 4693, and acceptor substrate 4695. Various topside defect anneals may be utilized. For this illustration, an optical beam such as the laser annealing previously described is used. Optical anneal beams may be optimized to focus light absorption and heat generation within or at the surface of channel layer 4603 and provide surface smoothing and/or defect annealing (defects may be from the cleave and/or the ion-cut implantation) with exemplary smoothing/annealing ray 4666. The laser assisted smoothing/annealing with the absorbed heat generated by exemplary smoothing/annealing ray 4666 may also include a pre-heat of the bonded stack to, for example, about 100° C. to about 400° C., and/or a rapid thermal spike to temperatures above about 200° C. to about 600° C. Additionally, absorber layers or regions, for example, including amorphous carbon, amorphous silicon, and phase changing materials (see U.S. Pat. Nos. 6,635,588 and 6,479,821 to Hawryluk et al. for example), may be utilized to increase the efficiency of the optical energy capture in conversion to heat for the desired annealing or activation processes. Moreover, multiple pulses of the laser may be utilized to improve the anneal, activation, and yield of the process. Reflected ray 4663 may be reflected and/or absorbed by shield/heat sink layer 4688 regions thus blocking the optical absorption of ray blocked metal interconnect 4681. Annealing of dopants or annealing of damage in back channel layer 4602 and/or BOX 4610 and/or channel layer 4603, such as from the H cleave implant damage, may be also accomplished by a set of rays such as repair ray 4665, illustrated is focused on back channel layer 4602. Heat generated by absorbed photons from, for example, smoothing/annealing ray 4666, reflected ray 4663, and/or repair ray 4665 may also be absorbed by shield/heat sink layer 4688 regions and dissipated laterally and may keep the temperature of underlying metal layers, such as metal interconnect 4681, and other metal layers below it, cooler and prevent damage. Shield/heat sink layer 4688 and associated dielectrics may laterally spread and conduct the heat generated by the topside defect anneal, and in conjunction with the dielectric materials (low heat conductivity) above and below shield/heat sink layer 4688, keep the interconnect metals and low-k dielectrics of the acceptor wafer interconnect layers cooler than a damage temperature, such as, for example, 400° C. A second layer of shield/heat sink layer 4688 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 4688 may act as a heat spreader. Electrically conductive materials may be used for the two layers of shield/heat sink layer 4688 and thus may provide, for example, a Vss and a Vdd plane and/or grid that may be connected to the donor layer transistors above, as well may be connected to the acceptor wafer transistors below, and/or may provide below transferred layer device interconnection. Noise on the power grids, such as the Vss and Vdd plane power conducting lines/wires, may be mitigated by attaching/connecting decoupling capacitors onto the power conducting lines of the grids. The decoupling caps, which may be within the second layer (donor, for example, donor wafer device structures) or first layer (acceptor, for example acceptor wafer transistors and devices 4693), may include, for example, trench capacitors such as described by Pei, C., et al., "A novel, low-cost deep trench decoupling capacitor for high-performance, low-power bulk CMOS applications," ICSICT ($9^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Shield/heat sink layer 4688 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 4688 may be sandwiched and/or substantially enclosed by materials with a low thermal conductivity (less than 10 W/m-K), for example, silicon dioxide (about 1.4 W/m-K). The sandwiching of high and low thermal conductivity materials in layers, such as shield/heat sink layer 4688 and under & overlying dielectric layers, spreads the localized heat/light energy of the topside anneal laterally and protects the underlying layers of interconnect metallization & dielectrics, such as in the acceptor wafer 4610, from harmful temperatures or damage. When there may be more than one shield/heat sink layer 4688 in the device, the heat conducting layer closest to the second crystalline layer or oxide layer 4680 may be constructed with a different material, for example a high melting point material, for example a refractory metal such as tungsten, than the other heat conducting layer or layers, which may be constructed with, for example, a lower melting point material, for example such as aluminum or copper. Now transistors may be formed with low effective temperature (less than approximately 400° C. exposure to the acceptor wafer 4610 sensitive layers, such as interconnect and device layers) processing, and may be aligned to the acceptor wafer alignment marks (not shown) as described in the incorporated references. This may include further optical defect annealing or dopant activation steps. The remaining SOI donor wafer substrate 4600 may now also be processed, such as smoothing and annealing, and reused for additional layer transfers. The insulator layer, such as deposited bonding oxides (for example oxide layer 4680) and/or before bonding preparation existing oxides (for example the BEOL isolation 4696 on top of the topmost metal layer of shield/heat sink layer 4688), between the donor wafer transferred monocrystalline layer and the acceptor wafer topmost metal layer, may include thicknesses of less than 1 um, less than 500 nm, less than 400 nm, less than 300 nm, less than 200 nm, or less than 100 nm.

Figure 46D:
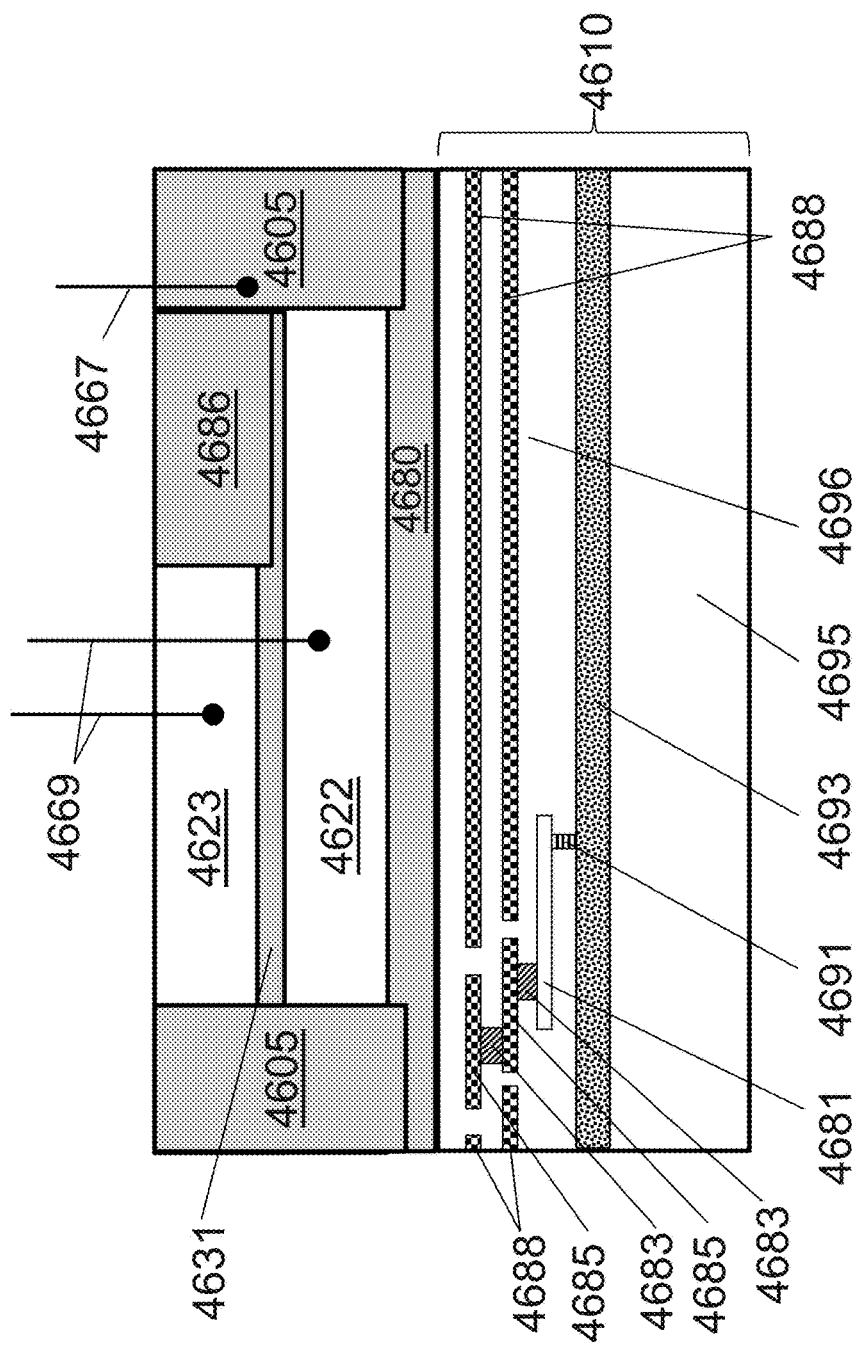

As illustrated in FIG. 46D, transistor and back channel isolation regions 4605 and/or transistor isolation regions 4686 may be formed. Transistor isolation region 4686 may be formed by mask defining and plasma/RIE etching channel layer 4603, substantially to the top of BOX layer 4601 (not shown), substantially into BOX layer 4601, or back channel layer 4602 (not shown). Transistor and back channel isolation regions 4605 may be formed by mask defining and plasma/RIE etching channel layer 4603, BOX layer 4601 and back channel layer 4602, substantially to the top of oxide layer 4680 (not shown), substantially into oxide layer 4680, or further into the top BEOL dielectric layer in acceptor wafer 4610 (not shown). Thus channel region 4623 may be formed, which may substantially form the transistor body, back-channel region 4622 may be formed, which may provide a back bias and/or Vt control by doping or bias to one or more channel regions 4623, and BOX region 4631. Back-channel region 4622 may be ion implanted for Vt control and/or body bias efficiency. A low-temperature gap fill dielectric, such as SACVD oxide, may be deposited and chemically mechanically polished, the oxide remaining in transistor and back channel isolation regions 4605 and transistor isolation regions 4686. Back-channel region 4622 may be ion implanted for Vt control and/or body bias efficiency. An optical step, such as illustrated by exemplary STI ray 4667, may be performed to anneal etch damage and densify the STI oxide in transistor and back channel isolation regions 4605. The doping concentration of channel region 4623 may include vertical or horizontal gradients of concentration or layers of differing doping concentrations. The doping concentration of back-channel region 4622 may include vertical or horizontal gradients of concentration or layers of differing doping concentrations. Any additional doping, such as ion-implanted channel implants, may be activated and annealed with optical annealing, such as illustrated by exemplary implant ray 4669, as described herein. The optical anneal, such as exemplary STI ray 4667, and/or exemplary implant ray 4669 may be performed at separate times and processing parameters (such as laser energy, frequency, etc.) or may be done in combination or as one optical anneal. Optical absorber and or reflective layers or regions may be employed to enhance the anneal and/or protect the underlying sensitive structures. Moreover, multiple pulses of the laser may be utilized to improve the anneal, activation, and yield of the process. BOX region 4631 may be a relatively thin dielectric, including the thickness range of 5 nm to 100 nm, at least a portion of which being between the back-channel region 4622 and channel region 4623. Back-channel region 4622 could be constructed from a material that would not be damaged by the optical anneal process. Such could be a refractory metal or doped silicon in crystallized form, poly or amorphous, or other conductive material that are acceptable for semiconductor processing and can withstand high temperature of 700° C. or higher.

As illustrated in FIG. 46E, a transistor forming process, such as a conventional HKMG with raised source and drains (S/D), may be performed. For example, a dummy gate stack (not shown), utilizing oxide and polysilicon, may be formed, gate spacers 4630 may be formed, raised S/D regions 4632 and channel stressors may be formed by etch and epitaxial deposition, for example, of SiGe and/or SiC depending on P or N channel (and may be doped in-situ or ion-implantation and optical anneal activation), LDD and S/D ion-implantations may be performed, and first ILD 4636 may be deposited and CMP'd to expose the tops of the dummy gates. Thus transistor channel region 4633 and S/D & LDD regions 4635 may be formed. The dummy gate stack may be removed and a gate dielectric 4607 may be formed and a gate metal material gate electrode 4608, including a layer of proper work function metal ($Ti_xAl_yN_z$ for example) and a conductive fill, such as aluminum, and may be deposited and CMP'd. The gate dielectric 4607 may be an atomic layer deposited (ALD) gate dielectric that may be paired with a work function specific gate metal in the industry standard high k metal gate process schemes, for example, as described in the incorporated references. Alternatively, the gate dielectric 4607 may be formed with a low temperature processes including, for example, LPCVD $SiO_2$ oxide deposition (see Ahn, J., et al., "High-quality MOSFET's with ultrathin LPCVD gate SiO2," IEEE Electron Device Lett., vol. 13, no. 4, pp. 186-188, April 1992) or low temperature microwave plasma oxidation of the silicon surfaces (see Kim, J. Y., et al., "The excellent scalability of the RCAT (recess-channel-array-transistor) technology for sub-70 nm DRAM feature size and beyond," 2005 IEEE VLSI-TSA International Symposium, pp. 33-46, 25-27 Apr. 2005) and a gate material with proper work function and less than approximately 400° C. deposition temperature such as, for example, tungsten or aluminum may be deposited. An optical step, such as represented by exemplary anneal ray 4621, may be performed to densify and/or remove defects from gate dielectric 4607, anneal defects and activate dopants such as LDD and S/D implants, densify the first ILD 4636, form DSS junctions (Dopant Segregated Schottky such as $NiSi_2$), and/or form contact and S/D silicides (not shown). The optical anneal may be performed at each sub-step as desired, or may be done at prior to the HKMG deposition (such as after the dummy gate but before the HKMG formation), or various combinations. Optionally, portions of transistor isolation region 4686 and BOX region 4631 may be lithographically defined and etched away, thus forming second transistor isolation regions 4676 and PD transistor area 4668. Partially depleted transistors (not shown) may be constructed in a similar manner as the FD-MOSFETs constructed on transistor channel region 4633 herein, but now with the thicker back-channel region 4622 silicon as its channel body. PD transistor area 4668 may also be utilized to later form a direct connection thru a contact to the back-channel region 4622 for back bias and Vt control of the transistor with transistor channel region 4633. If no PD devices are desired, then it may be more efficient to later form a direct connection thru a contact to the back-channel region 4622 for back bias and Vt control of the transistor with transistor channel region 4633 by etching a contact thru transistor isolation region 4686. Raised S/D regions 4632 may be formed by low temperature (less than 400° C.) deposition of in-situ doped polysilicon or amorphous silicon into the S/D openings, an optical anneal to further crystallize and dopant activate the raised S/D material, and removal of excess raised S/D material.

As illustrated in FIG. 46F, a low temperature thick oxide 4609 may be deposited and planarized. Source, gate, drain, two types of back contact openings may be masked, etched, and filled with electrically conductive materials preparing the transistors to be connected via metallization. Thus gate contact 4611 connects to gate electrode 4608, source & drain contacts 4640 connect to raised S/D regions 4632, back channel contact 4644 may connect to back-channel region 4622, and direct back contact 4645 may connect to back-channel region 4622. An optical step, such as illustrated by exemplary ILD anneal ray 4651, may be performed to anneal contact etch damage and densify the thick oxide 4609. Back channel contact 4644 and direct back contact 4645 may be formed to connect to shield/heat sink layer 4688 by further etching, and may be useful for hard wiring a back bias that may be controlled by, for example, the second layer or first layer circuitry into the FD MOSFET.

Figure 46G:
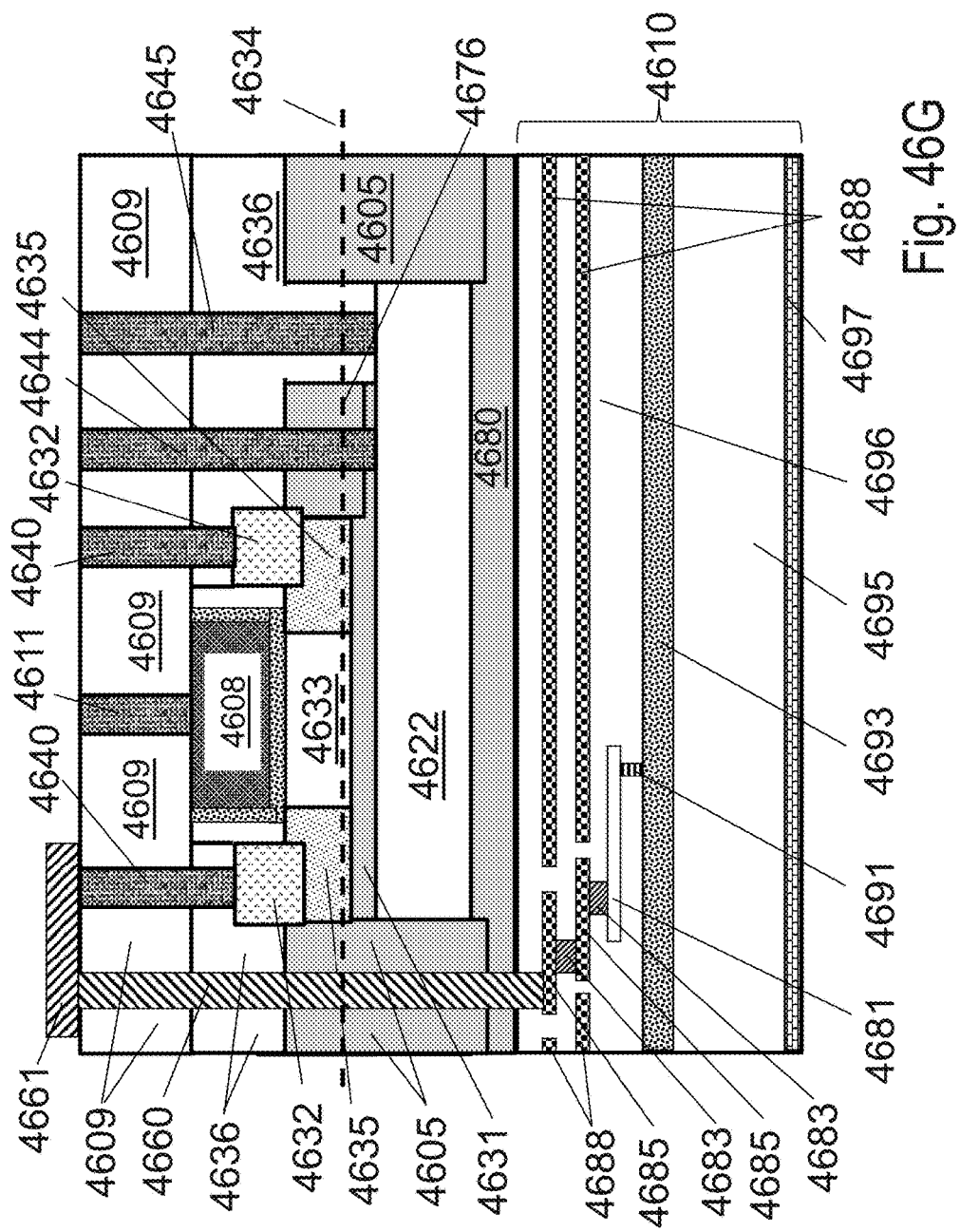

As illustrated in FIG. 46G, thru layer vias (TLVs) 4660 may be formed by etching thick oxide 4609, first ILD 4636, transistor and back channel isolation regions 4605, oxide layer 4680, into a portion of the upper oxide layer BEOL isolation 4696 of acceptor wafer 4610 BEOL, and filling with an electrically and thermally conducting material (such as tungsten or cooper) or an electrically non-conducting but thermally conducting material (such as described elsewhere within). Second device layer metal interconnect 4661 may be formed by conventional processing. TLVs 4660 may be constructed of thermally conductive but not electrically conductive materials, for example, DLC (Diamond Like Carbon), and may connect the FD-MOSFET transistor device and other devices on the top (second) crystalline layer thermally to shield/heat sink layer 4688. TLVs 4660 may be constructed out of electrically and thermally conductive materials, such as Tungsten, Copper, or aluminum, and may provide a thermal and electrical connection path from the FD-MOSFET transistor device and other devices on the top (second) crystalline layer to shield/heat sink layer 4688, which may be a ground or Vdd plane in the design/layout. TLVs 4660 may be also constructed in the device scribelanes (pre-designed in base layers or potential dicelines) to provide thermal conduction to the heat sink, and may be sawed/diced off when the wafer is diced for packaging not shown). Shield/heat sink layer 4688 may be configured to act (or adapted to act) as an emf (electromotive force) shield to prevent direct layer to layer crosstalk between transistors in the donor wafer layer and transistors in the acceptor wafer. In addition to static ground or Vdd biasing, shield/heat sink layer 4688 may be actively biased with an anti-interference signal from circuitry residing on, for example, a layer of the 3D-IC or off chip. The formed FD-MOSFET transistor device may include semiconductor regions wherein the dopant concentration of neighboring regions of the transistor in the horizontal plane, such as traversed by exemplary dopant plane 4634, may have regions, for example, transistor channel region 4633 and S/D & LDD regions 4635, that differ substantially in dopant concentration, for example, a 10 times greater doping concentration in S/D & LDD regions 4635 than in transistor channel region 4633, and/or may have a different dopant type, such as, for example p-type or n-type dopant, and/or may be doped and substantially undoped in the neighboring regions. For example, transistor channel region 4633 may be very lightly doped (less than 1e15 atoms/cm$^3$) or nominally un-doped (less than 1e14 atoms/cm$^3$) and S/D & LDD regions 4635 may be doped at greater than 1e15 atoms/cm$^3$ or greater than 1e16 atoms/cm$^3$. For example, transistor channel region 4633 may be doped with p-type dopant and S/D & LDD regions 4635 may be doped with n-type dopant.

A thermal conduction path may be constructed from the devices in the upper layer, the transferred donor layer and formed transistors, to the acceptor wafer substrate and associated heat sink. The thermal conduction path from the FD-MOSFET transistor device and other devices on the top (second) crystalline layer, for example, raised S/D regions 4632, to the acceptor wafer heat sink 4697 may include source & drain contacts 4640, second device layer metal interconnect 4661, TLV 4660, shield path connect 4685 (shown as twice), shield path via 4683 (shown as twice), metal interconnect 4681, first (acceptor) layer metal interconnect 4691, acceptor wafer transistors and devices 4693, and acceptor substrate 4695. The elements of the thermal conduction path may include materials that have a thermal conductivity greater than 10 W/m-K, for example, copper (about 400 W/m-K), aluminum (about 237 W/m-K), and Tungsten (about 173 W/m-K), and may include material with thermal conductivity lower than 10 W/m-K but have a high heat transfer capacity due to the wide area available for heat transfer and thickness of the structure (Fourier's Law), such as, for example, acceptor substrate 4695. The elements of the thermal conduction path may include materials that are thermally conductive but may not be substantially electrically conductive, for example, Plasma Enhanced Chemical Vapor Deposited Diamond Like Carbon-PECVD DLC (about 1000 W/m-K), and Chemical Vapor Deposited (CVD) graphene (about 5000 W/m-K). The acceptor wafer interconnects may be substantially surrounded by BEOL isolation 4696, which may be a dielectric such as, for example, carbon doped silicon oxides. The heat removal apparatus, which may include acceptor wafer heat sink 4697, may include an external surface from which heat transfer may take place by methods such as air cooling, liquid cooling, or attachment to another heat sink or heat spreader structure.

Furthermore, some or all of the layers utilized as shield/heat sink layer 4688, which may include shapes of material such as the strips or fingers as illustrated in FIG. 33B-1, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 4688 layer or layers. Moreover, some or all of the layers utilized as shield/heat sink layer 4688, which may include strips or fingers as illustrated in FIG. 33B-1, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 4688 layer or layers. The Vsupply on line 17C12 and the control signals on control line 17C16 may be controlled by and/or generated in the second layer transistors (for example donor wafer device structures such as the FD-MOSFETs formed as described in relation to FIG. 46) or first layer transistors (acceptor, for example acceptor wafer transistors and devices 4693), or off chip circuits. Furthermore, some or all of the layers utilized as shield/heat sink layer 4688, which may include strips or fingers as illustrated in FIG. 33B-1 or other shapes such as those in FIG. 33B, may be utilized to distribute independent power supplies to various portions of the second layer transistors (for example donor wafer device structures such as the FD-MOSFETs formed as described in relation to FIG. 46) or first layer transistors (acceptor, for example acceptor wafer transistors and devices 4693) and circuits; for example, one power supply and/or voltage may be routed to the sequential logic circuits of the second layer and a different power supply and/or voltage routed to the combinatorial logic circuits of the second layer. Moreover, the power distribution circuits/grid may be designed so that Vdd may have a different value for each stack layer. Patterning of shield/heat sink layer 4688 or layers can impact their heat-shielding capacity. This impact may be mitigated, for example, by enhancing the top shield/heat sink layer 4688 areal density, creating more of the secondary shield/heat sink layers 4688, or attending to special CAD rules regarding their metal density, similar to CAD rules that are required to accommodate Chemical-Mechanical Planarization (CMP). These constraints would be integrated into a design and layout EDA tool. Moreover, the second layer of circuits and transistors, for example, for example donor wafer device structures such as the FD-MOSFETs formed as described in relation to FIG. 46, may include I/O logic devices, such as SerDes (Serialiser/Deserialiser), and conductive bond pads (not shown) (herein such as FIG. 53). The output or input conductive pads of the I/O circuits may be coupled, for example by bonded wires, to external devices. The output or input conductive pads may also act as a contact port for the 3D device output to connect to external devices. The emf generated by the I/O circuits could be shielded from the other layers in the stack by use of, for example, the shield/heat sink layer 4688. Placement of the I/O circuits on the same stack layer as the conductive bond pad may enable close coupling of the desired I/O energy and lower signal loss. Furthermore, the second layer of circuits and transistors, for example donor wafer device structures such as the FD-MOSFETs formed as described in relation to FIG. 46, may include RF (Radio Frequency) circuits and/or at least one antenna. For example, the second layer of circuits and transistors may include RF circuits to enable an off-chip communication capability to external devices, for example, a wireless communication circuit or circuits such as a Bluetooth protocol or capacitive coupling. The emf generated by the RF circuits could be shielded from the other layers in the stack by use of, for example, the shield/heat sink layer 4688.

TLVs 4660 may be formed through the transferred layers. As the transferred layers may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers, the smaller the thru layer via diameter obtainable, which may result from maintaining manufacturable via aspect ratios. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 46 formation techniques herein. Transferred layer or layers may have regions of STI or other transistor elements within it or on it when transferred, but would then use alignment and connection schemes for layer transfer of patterned layers as described in incorporated patent references.

Persons of ordinary skill in the art will appreciate that the illustrations in FIGS. 46A through 46G are exemplary only and are not drawn to scale. Such skilled persons will further appreciate that many variations are possible such as, for example, a p-channel FD-MOSFET may be formed with changing the types of dopings appropriately. Moreover, the SOI donor wafer substrate 4600 may be n type or un-doped. Furthermore, transistor and back channel isolation regions 4605 and transistor isolation region 4686 may be formed by a hard mask defined process flow, wherein a hard mask stack, such as, for example, silicon oxide and silicon nitride layers, or silicon oxide and amorphous carbon layers, may be utilized. Moreover, CMOS FD MOSFETs may be constructed with n-MOSFETs in a first mono-crystalline silicon layer and p-MOSFETs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Further, dopant segregation techniques (DST) may be utilized to efficiently modulate the source and drain Schottky barrier height for both p and n type junctions formed. Furthermore, raised source and drain contact structures, such as etch and epi SiGe and SiC, may be utilized for strain and contact resistance improvements and the damage from the processes may be optically annealed. Many other modifications within the scope of the invention will suggest themselves to such skilled persons after reading this specification. Thus the invention is to be limited only by the appended claims.

A planar n-channel JFET or JLT with an optional integrated heat shield/spreader suitable for a monolithic 3D IC may be constructed as follows. Being bulk conduction devices rather than surface conduction devices, the JFET and JLT may provide an improved transistor variability control and conduction channel electrostatic control. Sub-threshold slope, DIBL, and other short channel effects are greatly improved due to the firm gate electrostatic control over the channel. Moreover, a heat spreading, heat conducting and/or optically reflecting material layer or layers may be incorporated between the sensitive metal interconnect layers and the layer or regions being optically irradiated and annealed to repair defects in the crystalline 3D-IC layers and regions and to activate semiconductor dopants in the crystalline layers or regions of a 3D-IC without harm to the sensitive metal interconnect and associated dielectrics. Furthermore, a buried doped layer and channel dopant shaping, even to an un-doped channel, may allow for efficient adaptive and dynamic body biasing to control the transistor threshold and threshold variations, the concepts shown in FIG. 32 herein may be applied to the JFET. As well, the back plane and body bias tap concepts shown in FIG. 46 herein may be utilized for the JFET and JLT devices. As one of ordinary skill in the art would understand, many other types of transistors, such as a FinFet transistor, could be made utilizing similar concepts in their construction. FIG. 47A-G illustrates an exemplary n-channel JFET which may be constructed in a 3D stacked layer using procedures outlined below and in U.S. Pat. No. 8,273,610, US patent publications 2012/0091587 and 2013/0020707, and pending U.S. patent application Ser. Nos. 13/441,923 and 13/099,010. The contents of the foregoing applications are incorporated herein by reference.

As illustrated in FIG. 47A, an N− substrate donor wafer 4700 may be processed to include a wafer sized layer of doping across the wafer, N− doped layer 4702. The N-doped layer 4702 may be formed by ion implantation and thermal anneal. N− substrate donor wafer 4700 may include a crystalline material, for example, mono-crystalline (single crystal) silicon. N− doped layer 4702 may be very lightly doped (less than 1e15 atoms/cm$^3$) or lightly doped (less than 1e16 atoms/cm$^3$) or nominally un-doped (less than 1e14 atoms/cm$^3$). N− doped layer 4702 may have additional ion implantation and anneal processing to provide a different dopant level than N− substrate donor wafer 4700 and may have graded or various layers of doping concentration. The layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike).

As illustrated in FIG. 47B, the top surface of N− substrate donor wafer 4700 layer stack may be prepared for oxide wafer bonding with a deposition of an oxide or by thermal oxidation of N− doped layer 4702 to form oxide layer 4780. A layer transfer demarcation plane (shown as dashed line) 4799 may be formed by hydrogen implantation or other methods as described in the incorporated references. The N− substrate donor wafer 4700, such as surface 4782, and acceptor wafer 4710 may be prepared for wafer bonding as previously described and low temperature (less than approximately 400° C.) bonded. Acceptor wafer 4710, as described in the incorporated references, may include, for example, transistors, circuitry, and metal, such as, for example, aluminum or copper, interconnect wiring, a metal shield/heat sink layer or layers, and thru layer via metal interconnect strips or pads. Acceptor wafer 4710 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 4710 may include transistors such as, for example, MOSFETS, FD-MOSFETS, Fin-Fets, FD-RCATs, BJTs, HEMTs, and/or HBTs. The portion of the N− doped layer 4702 and the N− substrate donor wafer 4700 that may be above (when the layer stack is flipped over and bonded to the acceptor wafer 4710) the layer transfer demarcation plane 4799 may be removed by cleaving or other low temperature processes as described in the incorporated references, such as, for example, ion-cut with mechanical or thermal cleave or other layer transfer methods, thus forming remaining N− layer 4703. Damage/defects to crystalline structure of N− doped layer 4702 may be annealed by some of the annealing methods described herein, for example the short wavelength pulsed laser techniques, wherein the N− doped layer 4702 may be heated to defect annealing temperatures, but the layer transfer demarcation plane 4799 may be kept below the temperate for cleaving and/or significant hydrogen diffusion. The optical energy may be deposited in the upper layer of the stack, for example near surface 4782, and annealing of the N− doped layer 4702 may take place via heat diffusion. Moreover, multiple pulses of the laser may be utilized to improve the anneal, activation, and yield of the process.

Figure 47C:
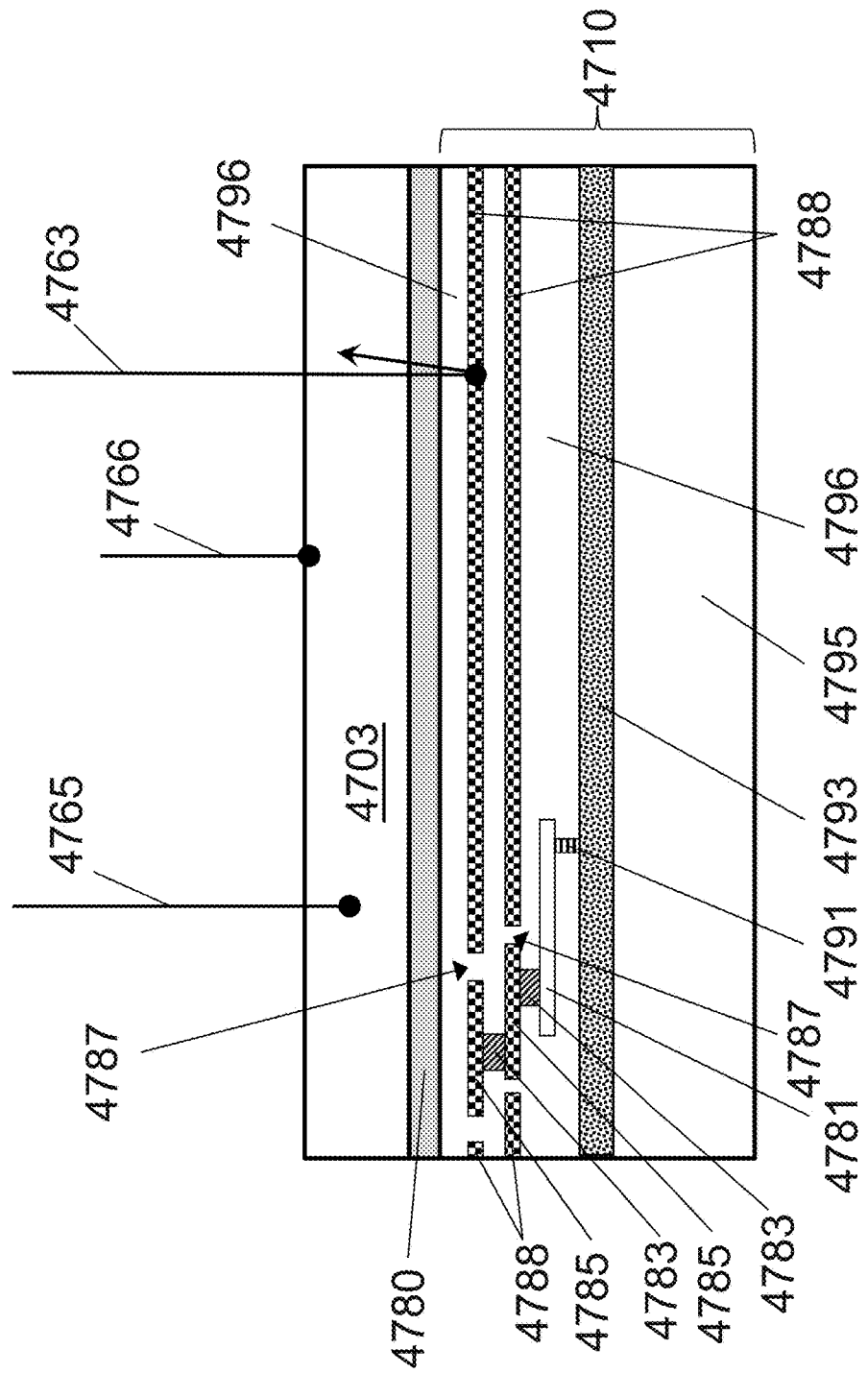

As illustrated in FIG. 47C, oxide layer 4780 and remaining N− layer 4703 have been layer transferred to acceptor wafer 4710. The top surface of remaining N− layer 4703 may be chemically or mechanically polished, and/or may be thinned by low temperature oxidation and strip processes, such as the TEL SPA tool radical oxidation and HF:H$_2$O solutions as described herein and in referenced patents and patent applications. Thru the processing, the wafer sized layer remaining N− layer 4703 could be thinned from its original total thickness, and its final total thickness could be in the range of about 3 nm to about 30 nm, for example, 3 nm, 5 nm, 7 nm, 10 nm, 150 nm, 20 nm, or 30 nm. Remaining N− layer 4703 may have a thickness that may allow full gate control of channel operation when the JFET (or JLT) transistor is substantially completely formed. Acceptor wafer 4710 may include one or more (two are shown in this example) shield/heat sink layers 4788, which may include materials such as, for example, Aluminum, Tungsten (a refractory metal), Copper, silicon or cobalt based silicides, or forms of carbon such as carbon nanotubes, and may be layered itself as described herein FIG. 50. Each shield/heat sink layer 4788 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 4788 may include isolation openings 4787, and alignment mark openings (not shown), which may be utilized for short wavelength alignment of top layer (donor) processing to the acceptor wafer alignment marks (not shown). Shield/heat sink layer 4788 may include one or more shield path connects 4785 and shield path vias 4783. Shield path via 4783 may thermally and/or electrically couple and connect shield path connect 4785 to acceptor wafer 4710 interconnect metallization layers such as, for example, exemplary acceptor metal interconnect 4781 (shown). Shield path connect 4785 may also thermally and/or electrically couple and connect each shield/heat sink layer 4788 to the other and to acceptor wafer 4710 interconnect metallization layers such as, for example, acceptor metal interconnect 4781, thereby creating a heat conduction path from the shield/heat sink layer 4788 to the acceptor substrate 4795, and a heat sink (shown in FIG. 47G.). Isolation openings 4787 may include dielectric materials, similar to those of BEOL isolation 4796. Acceptor wafer 4710 may include first (acceptor) layer metal interconnect 4791, acceptor wafer transistors and devices 4793, and acceptor substrate 4795. Various topside defect anneals may be utilized. For this illustration, an optical beam such as the laser annealing previously described is used. Optical anneal beams may be optimized to focus light absorption and heat generation within or at the surface of remaining N− layer 4703 and provide surface smoothing and/or defect annealing (defects may be from the cleave and/or the ion-cut implantation) with exemplary smoothing/annealing ray 4766. The laser assisted smoothing/annealing with the absorbed heat generated by exemplary smoothing/annealing ray 4766 may also include a pre-heat of the bonded stack to, for example, about 100° C. to about 400° C., and/or a rapid thermal spike to temperatures above about 200° C. to about 600° C. Additionally, absorber layers or regions, for example, including amorphous carbon, amorphous silicon, and phase changing materials (see U.S. Pat. Nos. 6,635,588 and 6,479,821 to Hawryluk et al. for example), may be utilized to increase the efficiency of the optical energy capture in conversion to heat for the desired annealing or activation processes. Moreover, multiple pulses of the laser may be utilized to improve the anneal, activation, and yield of the process. Reflected ray 4763 may be reflected and/or absorbed by shield/heat sink layer 4788 regions thus blocking the optical absorption of ray blocked metal interconnect 4781. Annealing of dopants or annealing of damage in remaining N-layer 4703, such as from the H cleave implant damage, may be also accomplished by a set of rays such as repair ray 4765. Heat generated by absorbed photons from, for example, smoothing/annealing ray 4766, reflected ray 4763, and/or repair ray 4765 may also be absorbed by shield/heat sink layer 4788 regions and dissipated laterally and may keep the temperature of underlying metal layers, such as metal interconnect 4781, and other metal layers below it, cooler and prevent damage. Shield/heat sink layer 4788 and associated dielectrics may laterally spread and conduct the heat generated by the topside defect anneal, and in conjunction with the dielectric materials (low heat conductivity) above and below shield/heat sink layer 4788, keep the interconnect metals and low-k dielectrics of the acceptor wafer interconnect layers cooler than a damage temperature, such as, for example, 400° C. A second layer of shield/heat sink layer 4788 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 4788 may act as a heat spreader. Electrically conductive materials may be used for the two layers of shield/heat sink layer 4788 and thus may provide, for example, a Vss and a Vdd plane and/or grid that may be connected to the donor layer transistors above, as well may be connected to the acceptor wafer transistors below, and/or may provide below transferred layer device interconnection. Noise on the power grids, such as the Vss and Vdd plane power conducting lines/wires, may be mitigated by attaching/connecting decoupling capacitors onto the power conducting lines of the grids. The decoupling caps, which may be within the second layer (donor, for example, donor wafer device structures) or first layer (acceptor, for example acceptor wafer transistors and devices 4793), may include, for example, trench capacitors such as described by Pei, C., et al., "A novel, low-cost deep trench decoupling capacitor for high-performance, low-power bulk CMOS applications," ICSICT ($9^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Shield/heat sink layer 4788 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 4788 may be sandwiched and/or substantially enclosed by materials with a low thermal conductivity (less than 10 W/m-K), for example, silicon dioxide (about 1.4 W/m-K). The sandwiching of high and low thermal conductivity materials in layers, such as shield/heat sink layer 4788 and under & overlying dielectric layers, spreads the localized heat/light energy of the topside anneal laterally and protects the underlying layers of interconnect metallization & dielectrics, such as in the acceptor wafer 4710, from harmful temperatures or damage. When there may be more than one shield/heat sink layer 4788 in the device, the heat conducting layer closest to the second crystalline layer or oxide layer 4780 may be constructed with a different material, for example a high melting point material, for example a refractory metal such as tungsten, than the other heat conducting layer or layers, which may be constructed with, for example, a lower melting point material, for example such as aluminum or copper. Now transistors may be formed with low effective temperature (less than approximately 400° C. exposure to the acceptor wafer 4710 sensitive layers, such as interconnect and device layers) processing, and may be aligned to the acceptor wafer alignment marks (not shown) as described in the incorporated references. This may include further optical defect annealing or dopant activation steps. The N− donor wafer 4700 may now also be processed, such as smoothing and annealing, and reused for additional layer transfers. The insulator layer, such as deposited bonding oxides (for example oxide layer 4780) and/or before bonding preparation existing oxides (for example the BEOL isolation 4796 on top of the topmost metal layer of shield/heat sink layer 4788), between the donor wafer transferred monocrystalline layer and the acceptor wafer topmost metal layer, may include thicknesses of less than 1 um, less than 500 nm, less than 400 nm, less than 300 nm, less than 200 nm, or less than 100 nm.

Figure 47D:
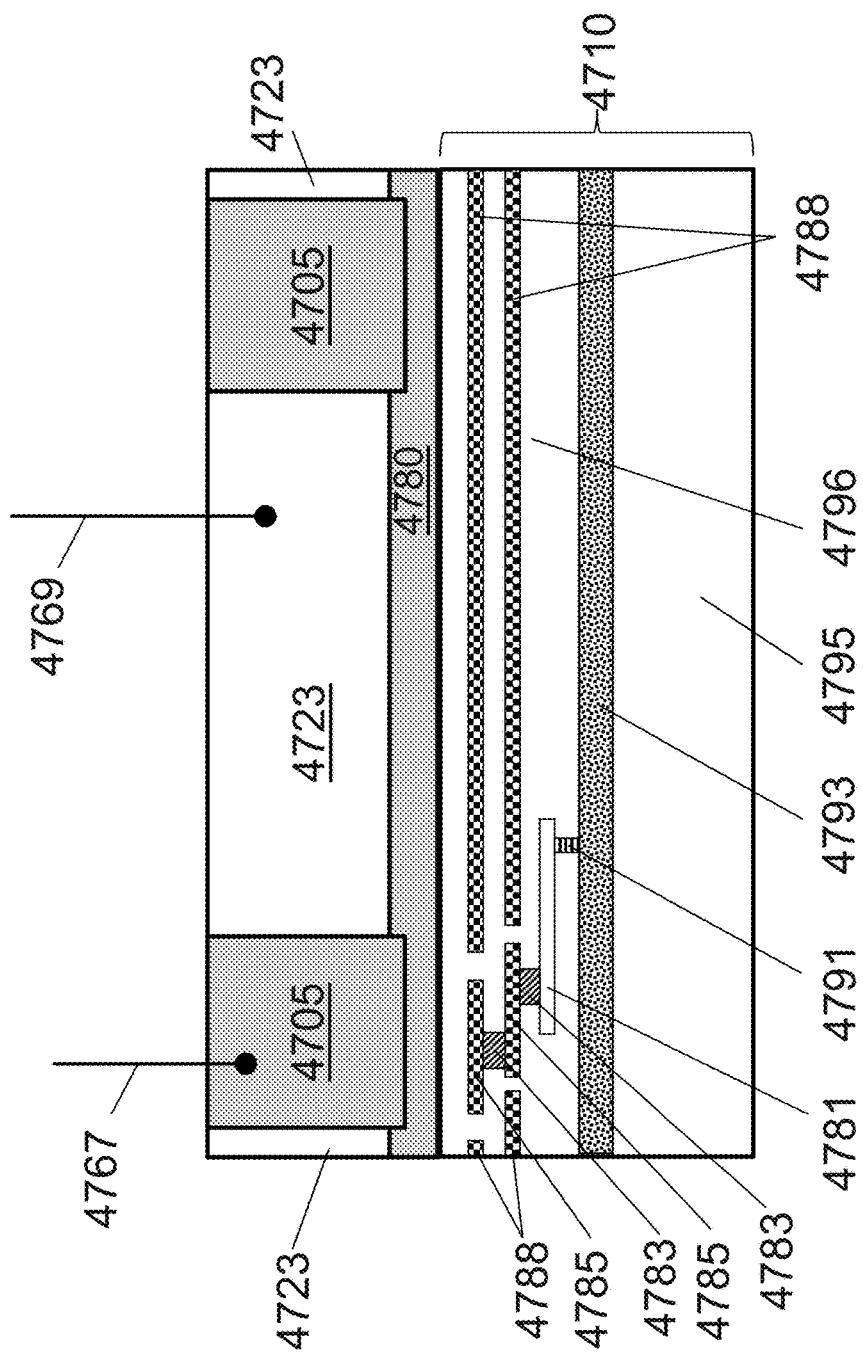

As illustrated in FIG. 47D, transistor isolation regions 4705 may be formed by mask defining and plasma/RIE etching remaining N− layer 4702 substantially to the top of oxide layer 4780 (not shown), substantially into oxide layer 4780, or into a portion of the upper oxide layer of acceptor wafer 4710 (not shown). Thus N− channel region 4723 may be formed. A low-temperature gap fill dielectric, such as SACVD oxide, may be deposited and chemically mechanically polished, the oxide remaining in isolation regions 4705. An optical step, such as illustrated by exemplary STI ray 4767, may be performed to anneal etch damage and densify the STI oxide in isolation regions 4705. The doping concentration of N− channel region 4723 may include gradients of concentration or layers of differing doping concentrations. Any additional doping, such as ion-implanted channel implants, may be activated and annealed with optical annealing, such as illustrated by exemplary implant ray 4769, as described herein. The optical anneal, such as exemplary STI ray 4767, and/or exemplary implant ray 4769 may be performed at separate times and processing parameters (such as laser energy, frequency, etc.) or may be done in combination or as one optical anneal. Optical absorber and or reflective layers or regions may be employed to enhance the anneal and/or protect the underlying sensitive structures. Moreover, multiple pulses of the laser may be utilized to improve the anneal, activation, and yield of the process.

Figure 47E:
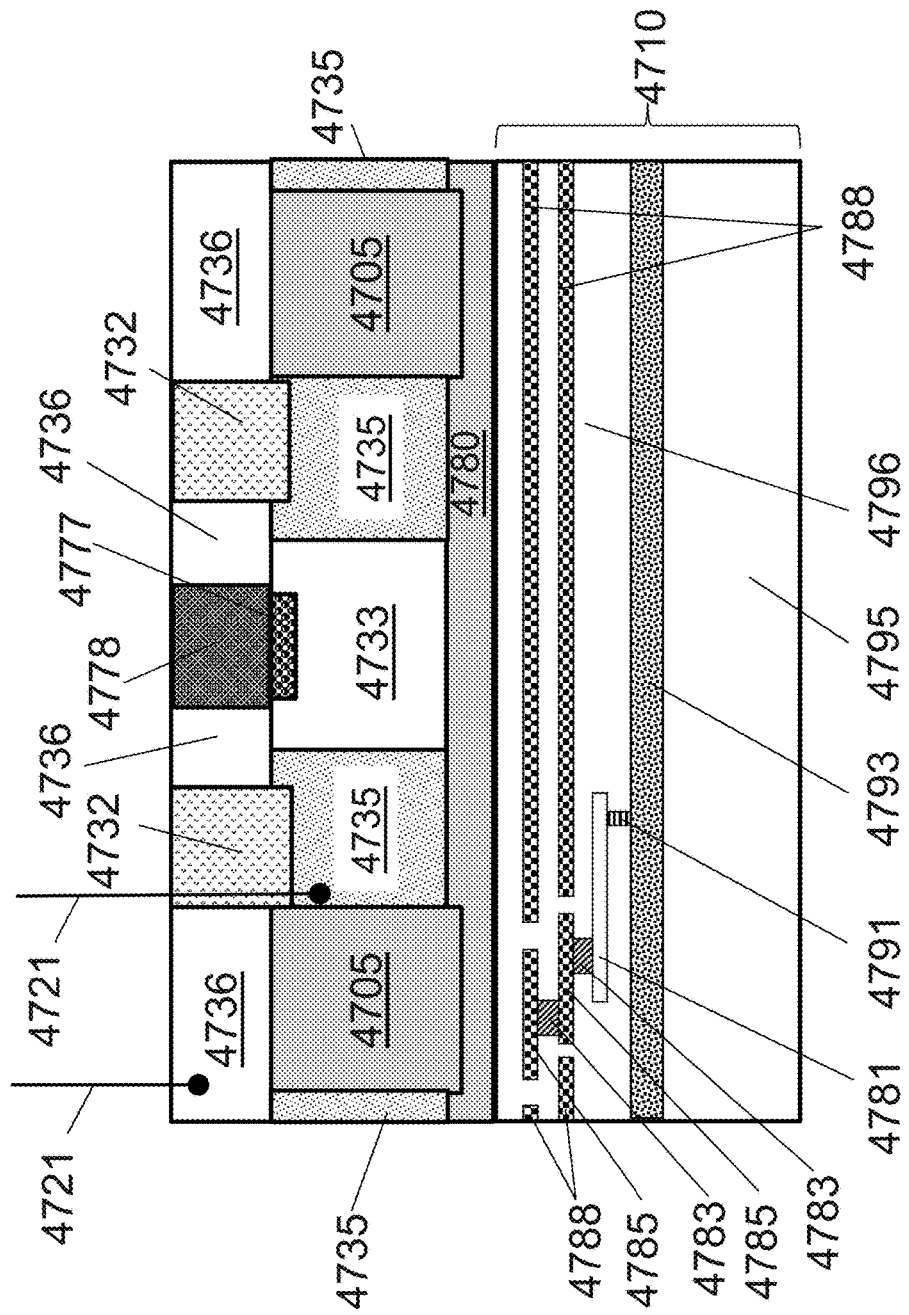
Figures 1, 47E:
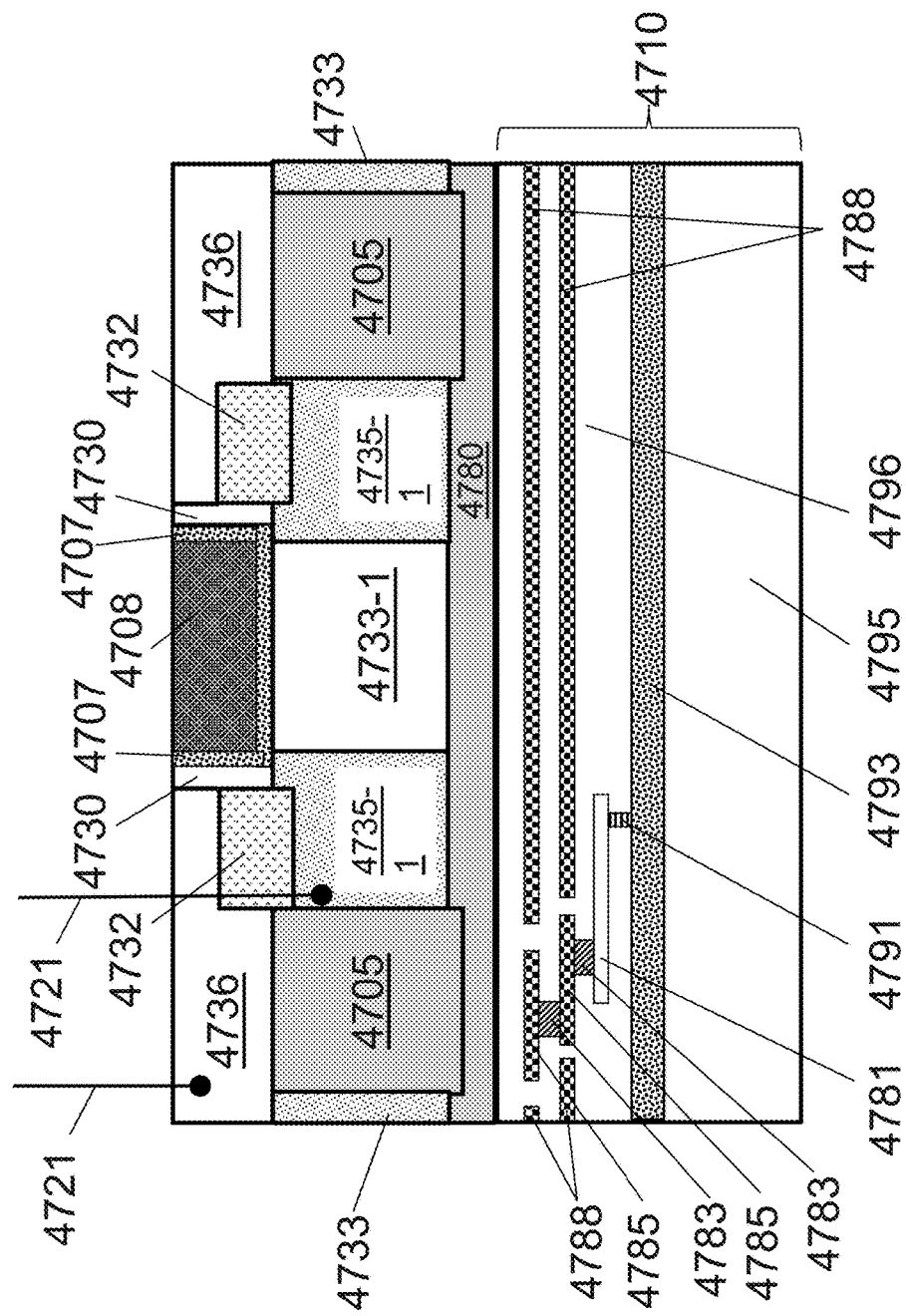

As illustrated in FIG. 47E, a JFET transistor forming process with raised source and drains (S/D), may be performed. For example, a shallow P+ region 4777 may be performed to create a JFET gate by utilizing a mask defined implant of P+ type dopant, such as, for example, Boron. A laser or other method of optical annealing may be utilized to activate the P+ implanted dopant. Alternatively, a directly in contact with the silicon channel P+ doped poly gate may be formed, with appropriate isolation from the source and drains, and dopant from that gate may also be utilized to form shallow P+ region 4777, for example, by diffusion from an optical anneal. S/D ion-implantations may be performed and laser annealed to create N+ regions 4735, and thus forming N− channel region 4733. The N+ regions 4735 may have a doping concentration that may be more than 10× the doping concentration of N− channel region 4733. First ILD 4736 may be deposited and CMP'd, and then openings may be etched to enable formation of gate 4778 and raised S/D regions 4732. Raised S/D regions 4732 and channel stressors may be formed by etch and epitaxial deposition, for example, of SiGe and/or SiC depending on P or N channel, and may be doped in-situ or ion-implantation and optical anneal activation. Gate 4778 may be formed with a metal to enable an optimal Schottky contact, for example aluminum, or may make an electrical connection to shallow P+ region 4777. An optical step, such as represented by exemplary anneal ray 4721, may be performed to densify and/or remove defects from gate 4778 and its connection to shallow P+ region 4777, anneal defects and activate dopants such as S/D and other buried channel tailoring implants, densify the first ILD 4736, form DSS junctions (Dopant Segregated Schottky such as $NiSi_2$), and/or form contact and S/D silicides (not shown). The optical anneal may be performed at each sub-step as desired, or may be done at prior to Schottky metal deposition, or various combinations. Moreover, multiple pulses of the laser may be utilized to improve the anneal, activation, and yield of the process. Raised S/D regions 4732 may be formed by low temperature (less than 400° C.) deposition of in-situ doped polysilicon or amorphous silicon into the S/D openings, an optical anneal to further crystallize and dopant activate the raised S/D material, and removal of excess raised S/D material.

As illustrated in FIG. 47E-1, an alternate transistor forming process to form a JLT with a conventional HKMG with raised source and drains (S/D), may be performed. For example, a dummy gate stack (not shown), utilizing oxide and polysilicon, may be formed, gate spacers 4730 may be formed, raised S/D regions 4732 and channel stressors may be formed by etch and epitaxial deposition, for example, of SiGe and/or SiC depending on P or N channel (and may be doped in-situ or ion-implantation and optical anneal activation), LDD and N++S/D ion-implantations may be performed, and first ILD 4736 may be deposited and CMP'd to expose the tops of the dummy gates. Thus JLT transistor channel 4733-1 and N++S/D & LDD regions 4735-1 may be formed. N− doped layer in FIG. 47A may be doped to N+, concentrations in excess of $1 \times 10^{19}$ atms/cm$^3$, to enable a conductive JLT channel (JLT transistor channel 4733-1) and has been described elsewhere in referenced patents and patent applications. JLT transistor channel 4733-1 may also be doped by implantation after the layer transfer, and activated/annealed with optical techniques. The dummy gate stack may be removed and a gate dielectric 4707 may be formed and a gate metal material gate electrode 4708, including a layer of proper work function metal to enable channel cut-off at 0 gate bias (described in referenced U.S. Pat. No. 8,273,610) and a conductive fill, such as aluminum, and may be deposited and CMP'd. The gate dielectric 4707 may be an atomic layer deposited (ALD) gate dielectric that may be paired with a work function specific gate metal in the industry standard high k metal gate process schemes, for example, as described in the incorporated references. Alternatively, the gate dielectric 4707 may be formed with a low temperature processes including, for example, LPCVD $SiO_2$ oxide deposition (see Ahn, J., et al., "High-quality MOSFET's with ultrathin LPCVD gate SiO2," IEEE Electron Device Lett., vol. 13, no. 4, pp. 186-188, April 1992) or low temperature microwave plasma oxidation of the silicon surfaces (see Kim, J. Y., et al., "The excellent scalability of the RCAT (recess-channel-array-transistor) technology for sub-70 nm DRAM feature size and beyond," 2005 IEEE VLSI-TSA International Symposium, pp. 33-47, 25-27 Apr. 2005) and a gate material with proper work function and less than approximately 400° C. deposition temperature such as, for example, tungsten or aluminum may be deposited. An optical step, such as represented by exemplary anneal ray 4721, may be performed to densify and/or remove defects from gate dielectric 4707, anneal defects and activate dopants such as N+ channel, LDD and N++S/D implants, densify the first ILD 4736, form DSS junctions (Dopant Segregated Schottky such as $NiSi_2$), and/or form contact and S/D silicides (not shown). The optical anneal may be performed at each sub-step as desired, or may be done at prior to the HKMG deposition (such as after the dummy gate but before the HKMG formation), or various combinations. Raised S/D regions 4732 may be formed by low temperature (less than 400° C.) deposition of in-situ doped polysilicon or amorphous silicon into the S/D openings, an optical anneal to further crystallize and dopant activate the raised S/D material, and removal of excess raised S/D material. The following steps may be applied to the JFET or JLT flows.

Figure 47F:
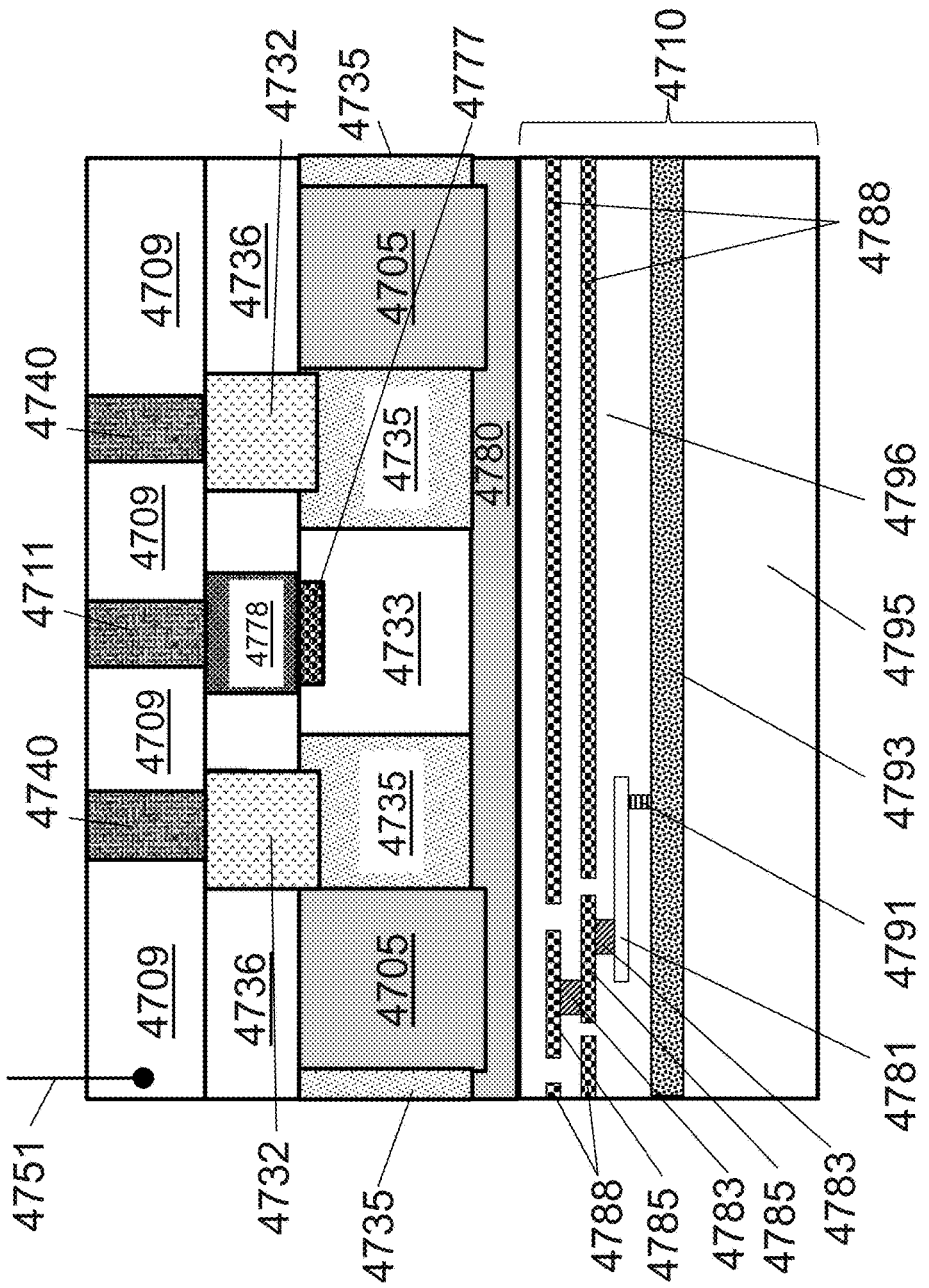

As illustrated in FIG. 47F, a low temperature thick oxide 4709 may be deposited and planarized. Source, gate, and drain contacts openings may be masked and etched preparing the transistors to be connected via metallization. Thus gate contact 4711 connects to gate 4778, and source & drain contacts 4740 connect to raised S/D regions 4732. An optical step, such as illustrated by exemplary ILD anneal ray 4751, may be performed to anneal contact etch damage and densify the thick oxide 4709.

Figure 47G:
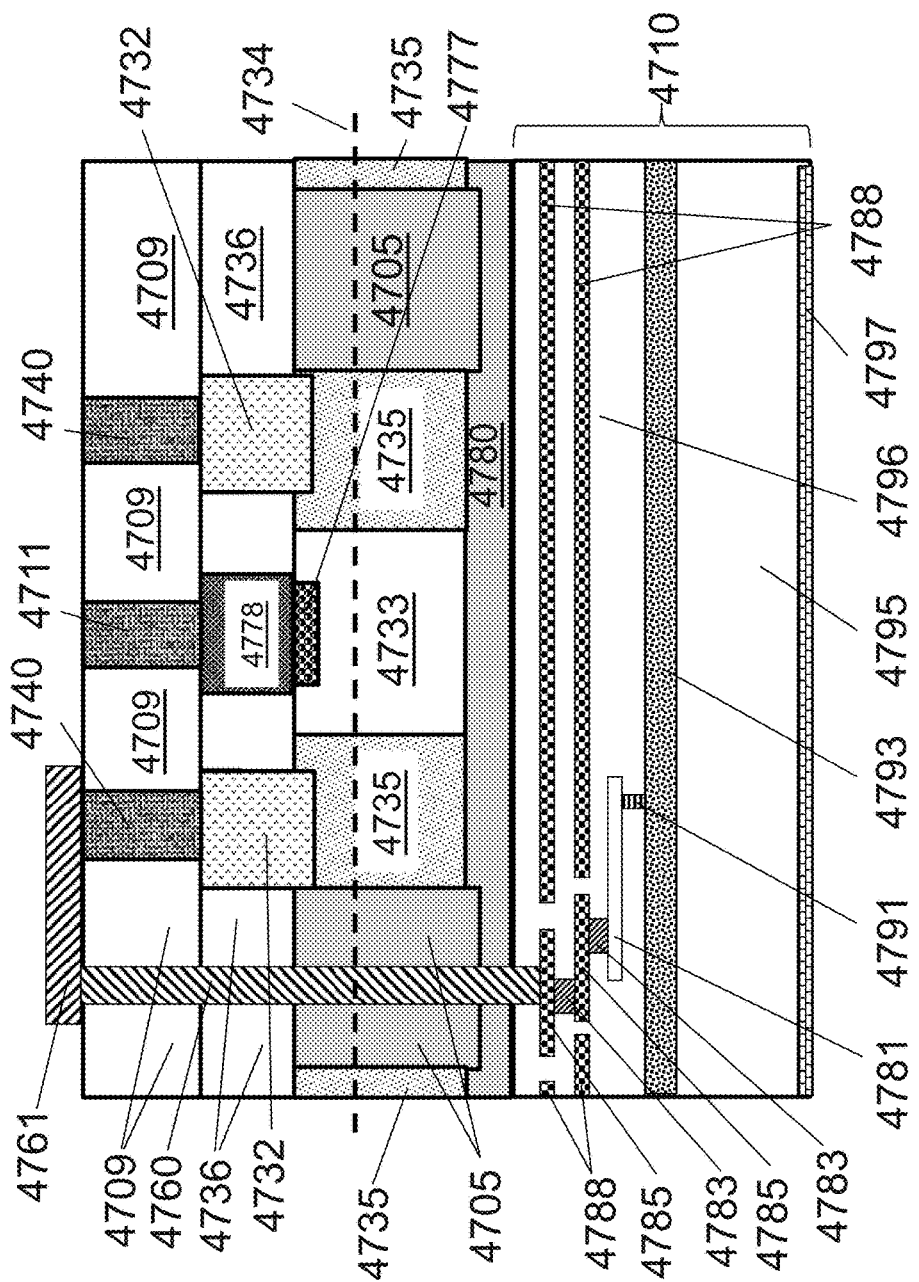

As illustrated in FIG. 47G, thru layer vias (TLVs) 4760 may be formed by etching thick oxide 4709, first ILD 4736, isolation regions 4705, oxide layer 4780, into a portion of the upper oxide layer BEOL isolation 4796 of acceptor wafer 4710 BEOL, and filling with an electrically and thermally conducting material (such as tungsten or cooper) or an electrically non-conducting but thermally conducting material (such as described elsewhere within). Second device layer metal interconnect 4761 may be formed by conventional processing. TLVs 4760 may be constructed of thermally conductive but not electrically conductive materials, for example, DLC (Diamond Like Carbon), and may connect the JFET or JLT transistor device and other devices on the top (second) crystalline layer thermally to shield/heat sink layer 4788. TLVs 4760 may be constructed out of electrically and thermally conductive materials, such as Tungsten, Copper, or aluminum, and may provide a thermal and electrical connection path from the JFET or JLT transistor device and other devices on the top (second) crystalline layer to shield/heat sink layer 4788, which may be a ground or Vdd plane in the design/layout. TLVs 4760 may be also constructed in the device scribelanes (pre-designed in base layers or potential dicelines) to provide thermal conduction to the heat sink, and may be sawed/diced off when the wafer is diced for packaging not shown). Shield/heat sink layer 4788 may be configured to act (or adapted to act) as an emf (electro-motive force) shield to prevent direct layer to layer cross-talk between transistors in the donor wafer layer and transistors in the acceptor wafer. In addition to static ground or Vdd biasing, shield/heat sink layer 4788 may be actively biased with an anti-interference signal from circuitry residing on, for example, a layer of the 3D-IC or off chip. The formed JFET (or JLT) transistor device may include semiconductor regions wherein the dopant concentration of neighboring regions of the transistor in the horizontal plane, such as traversed by exemplary dopant plane 4734, may have regions, for example, N− channel region 4733 and S/D N+ regions 4735, that differ substantially in dopant concentration, for example, a 10 times greater doping concentration in N+ regions 4735 than in N− channel region 4733, and/or may be doped and substantially undoped in the neighboring regions.

A thermal conduction path may be constructed from the devices in the upper layer, the transferred donor layer and formed transistors, to the acceptor wafer substrate and associated heat sink. The thermal conduction path from the JFET or JLT transistor device and other devices on the top (second) crystalline layer, for example, raised S/D regions 4732, to the acceptor wafer heat sink 4797 may include source & drain contacts 4740, second device layer metal interconnect 4761, TLV 4760, shield path connect 4785 (shown as twice), shield path via 4783 (shown as twice), metal interconnect 4781, first (acceptor) layer metal interconnect 4791, acceptor wafer transistors and devices 4793, and acceptor substrate 4795. The elements of the thermal conduction path may include materials that have a thermal conductivity greater than 10 W/m-K, for example, copper (about 400 W/m-K), aluminum (about 237 W/m-K), and Tungsten (about 173 W/m-K), and may include material with thermal conductivity lower than 10 W/m-K but have a high heat transfer capacity due to the wide area available for heat transfer and thickness of the structure (Fourier's Law), such as, for example, acceptor substrate 4795. The elements of the thermal conduction path may include materials that are thermally conductive but may not be substantially electrically conductive, for example, Plasma Enhanced Chemical Vapor Deposited Diamond Like Carbon-PECVD DLC (about 1000 W/m-K), and Chemical Vapor Deposited (CVD) graphene (about 5000 W/m-K). The acceptor wafer interconnects may be substantially surrounded by BEOL isolation 4796. The heat removal apparatus, which may include acceptor wafer heat sink 4797, may include an external surface from which heat transfer may take place by methods such as air cooling, liquid cooling, or attachment to another heat sink or heat spreader structure.

Furthermore, some or all of the layers utilized as shield/heat sink layer 4788, which may include shapes of material such as the strips or fingers as illustrated in FIG. 33B-1, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 4788 layer or layers. Moreover, some or all of the layers utilized as shield/heat sink layer 4788, which may include strips or fingers as illustrated in FIG. 33B-1, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 4788 layer or layers. The Vsupply on line 17C12 and the control signals on control line 17C16 may be controlled by and/or generated in the second layer transistors (for example donor wafer device structures such as the JFETs or JLTs formed as described in relation to FIG. 47) or first layer transistors (acceptor, for example acceptor wafer transistors and devices 4793), or off chip circuits. Furthermore, some or all of the layers utilized as shield/heat sink layer 4788, which may include strips or fingers as illustrated in FIG. 33B-1 or other shapes such as those in FIG. 33B, may be utilized to distribute independent power supplies to various portions of the second layer transistors (for example donor wafer device structures such as the JFETs or JLTs formed as described in relation to FIG. 47) or first layer transistors (acceptor, for example acceptor wafer transistors and devices 4793) and circuits; for example, one power supply and/or voltage may be routed to the sequential logic circuits of the second layer and a different power supply and/or voltage routed to the combinatorial logic circuits of the second layer. Moreover, the power distribution circuits/grid may be designed so that Vdd may have a different value for each stack layer. Patterning of shield/heat sink layer 4788 or layers can impact their heat-shielding capacity. This impact may be mitigated, for example, by enhancing the top shield/heat sink layer 4788 areal density, creating more of the secondary shield/heat sink layers 4788, or attending to special CAD rules regarding their metal density, similar to CAD rules that are required to accommodate Chemical-Mechanical Planarization (CMP). These constraints would be integrated into a design and layout EDA tool. Moreover, the second layer of circuits and transistors, for example, for example donor wafer device structures such as the JFETs or JLTs formed as described in relation to FIG. 47, may include I/O logic devices, such as SerDes (Serialiser/Deserialiser), and conductive bond pads (not shown) (herein such as FIG. 53). The output or input conductive pads of the I/O circuits may be coupled, for example by bonded wires, to external devices. The output or input conductive pads may also act as a contact port for the 3D device output to connect to external devices. The emf generated by the I/O circuits could be shielded from the other layers in the stack by use of, for example, the shield/heat sink layer 4788. Placement of the I/O circuits on the same stack layer as the conductive bond pad may enable close coupling of the desired I/O energy and lower signal loss. Furthermore, the second layer of circuits and transistors, for example donor wafer device structures such as the JFETs or JLTs formed as described in relation to FIG. 47, may include RF (Radio Frequency) circuits and/or at least one antenna. For example, the second layer of circuits and transistors may include RF circuits to enable an off-chip communication capability to external devices, for example, a wireless communication circuit or circuits such as a Bluetooth protocol or capacitive coupling. The emf generated by the RF circuits could be shielded from the other layers in the stack by use of, for example, the shield/heat sink layer 4788

TLVs 4760 may be formed through the transferred layers. As the transferred layers may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers, the smaller the thru layer via diameter obtainable, which may result from maintaining manufacturable via aspect ratios. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers.

Formation of CMOS, such as for the described JFETs or JLTs, in one transferred layer and the orthogonal connect strip methodology may be found as illustrated in at least FIGS. 30-33, 73-80, and 94 and related specification sections of U.S. Pat. No. 8,273,610, and may be applied to at least the FIG. 47 formation techniques herein. Transferred layer or layers may have regions of STI or other transistor elements within it or on it when transferred, but would then use alignment and connection schemes for layer transfer of patterned layers as described in incorporated patent references.

Persons of ordinary skill in the art will appreciate that the illustrations in FIGS. 47A through 47G are exemplary only and are not drawn to scale. Such skilled persons will further appreciate that many variations are possible such as, for example, a p-channel JFET or JLT may be formed with changing the types of dopings appropriately. Moreover, the N− substrate donor wafer 4700 may be p type or un-doped. Furthermore, isolation regions 4705 may be formed by a hard mask defined process flow, wherein a hard mask stack, such as, for example, silicon oxide and silicon nitride layers, or silicon oxide and amorphous carbon layers, may be utilized. Moreover, CMOS JFETs or JLTs may be constructed with n-JFETs or JLTs in a first mono-crystalline silicon layer and p-JFETs or JLTs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Further, dopant segregation techniques (DST) may be utilized to efficiently modulate the source and drain Schottky barrier height for both p and n type junctions formed. Furthermore, raised source and drain contact structures, such as etch and epi SiGe and SiC, may be utilized for strain and contact resistance improvements and the damage from the processes may be optically annealed. Back gated and/or multi Vt JFETs or JLTs may be constructed utilizing the inventive concepts in FIGS. 46A-G herein. Many other modifications within the scope of the invention will suggest themselves to such skilled persons after reading this specification. Thus the invention is to be limited only by the appended claims.

The ion-cut implant that forms the layer transfer demarcation plane in the donor wafer in many of the 3D stacked layer procedures outlined herein and in U.S. Pat. No. 8,273,610, US patent publications 2012/0091587 and 2013/0020707, and pending U.S. patent application Ser. Nos. 13/441,923 and 13/099,010, the contents of the foregoing applications are incorporated herein by reference, is implanted into a doped layer or region. This now allows the ion-cut process to take advantage of the co-implantation effect, wherein the effect of ion-cut species, generally hydrogen, is enhanced die to the presence of another dopant and/or that dopant's damage creation, for example, boron, in the crystalline silicon. This may allow a lower temperature cleaving, for example, under about 400° C. and under about 250° C., may allow the use of a lower ion-cut species dose (and the resultant lower cost process), and may allow a smoother cleave. Two of the papers on the co-implantation topic are Tong, Q.-Y., et al., "Low Temperature Si Layer Splitting", Proceedings 1997 IEEE International SOI Conference, October 1997, pp. 126-127 and Ma, X., et al., "A high-quality SOI structure fabricated by low-temperature technology with B+/H+co-implantation and plasma bonding", Semiconductor Science and Technology, Vol., 21, 2006, pp. 959-963.

Figure 35:
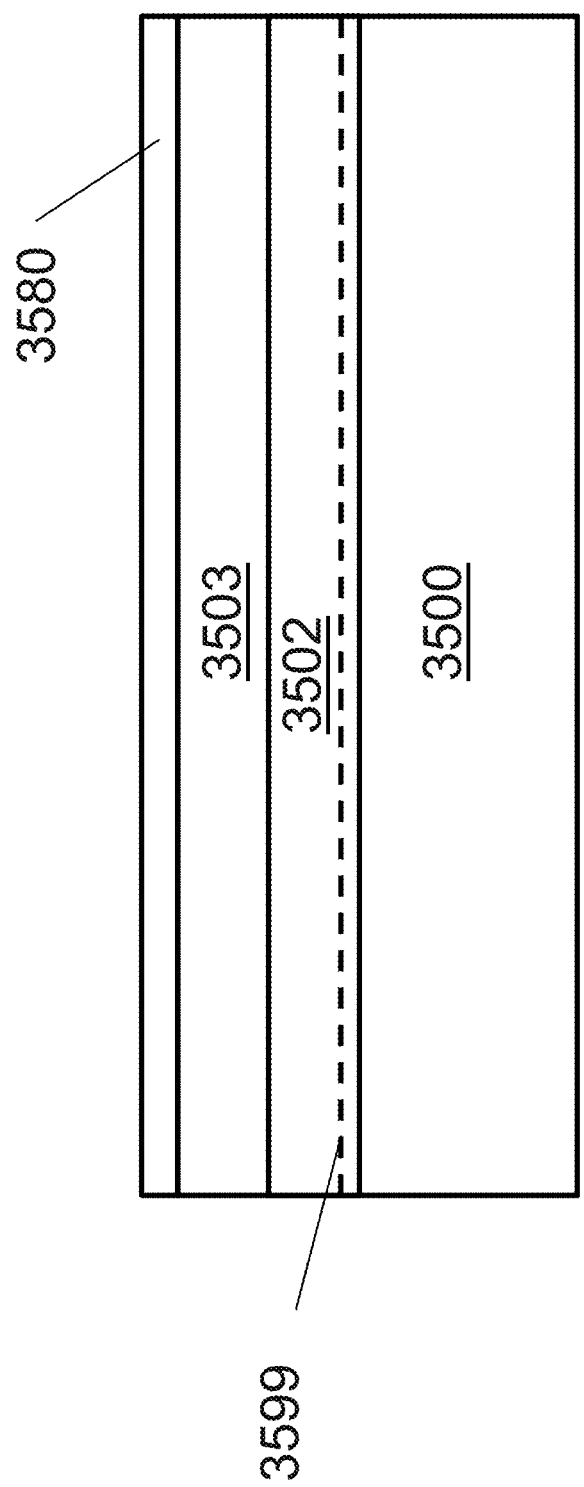
FIG. 35 is an exemplary drawing illustration of the co-implantation ion-cut utilized in forming a 3D-IC.

As illustrated in FIG. 35, a P− substrate donor wafer 3500 may be processed to include wafer sized layers of P+ doping 3502, and N− doping 3503 across the wafer, or in regions across the wafer (not shown). The P+ doped layer 3502 may be formed by ion implantation and thermal anneal. N− doped layer 3503 may have additional ion implantation and anneal processing to provide a different dopant level than P− substrate donor wafer 3500. N− doped layer 3503 and P+ doped layer 3502 may have graded or various layers of N− doping. The layer stack may alternatively be formed by successive epitaxially deposited doped silicon layers of P+ 3502 and N− 3503, or by a combination of epitaxy and implantation. Annealing of implants and doping may include, for example, conductive/inductive thermal, optical annealing techniques or types of Rapid Thermal Anneal (RTA or spike). The P+ doped layer 3502 may have a doping concentration that may be more than 10× the doping concentration of N− doped layer 3503. N− doped layer 3503 may have a thickness and/or doping that may allow fully-depleted channel operation. The types of doping of P− substrate donor wafer 3500, N− doped layer 3503, and P+ doped layer 3502 may be changed according to the type, such an n-channel or p-channel, of transistor desired. P− substrate donor wafer 3500 and/or N− doped layer 3503 may be undoped. There may also be more layers or regions formed, such as, for example, as shown herein this document for the FD-RCAT. The top surface of P− substrate donor wafer 3500 may be prepared for oxide wafer bonding with a deposition of an oxide or by thermal oxidation of N− doped layer 3503 to form oxide layer 3580. A layer transfer demarcation plane (shown as dashed line) 3599 may be formed by hydrogen implantation or other methods as described in the incorporated references. Layer transfer demarcation plane 3599 may be formed within or close to P+ doped layer 3502 to take advantage of the co-implantation effect.

Various methods and procedures to form Finfet transistors and thin-side-up transistors, many as part of a 3D stacked layer formation, are outlined herein and in U.S. Pat. No. 8,273,610 (at least in FIGS. 58, 146, 220 and associated specification paragraphs), US patent publications 2012/0091587 and 2013/0020707, and pending U.S. patent application Ser. Nos. 13/441,923 and 13/099,010, the contents of the foregoing applications are incorporated herein by reference. An embodiment of the invention is to modify the finfet/thin-side-up transistor formation process wherein multiple regions of differing fin thickness are formed, thus allowing multiple Vt finfet transistors on the same circuit, device, die or substrate. Threshold voltage dependence of fin height has been described in Pei, G., et al., *IEEE Transactions on Electron Devices*, vol. 49, no. 8, p. 1411-1419 (2002).

Figure 36:
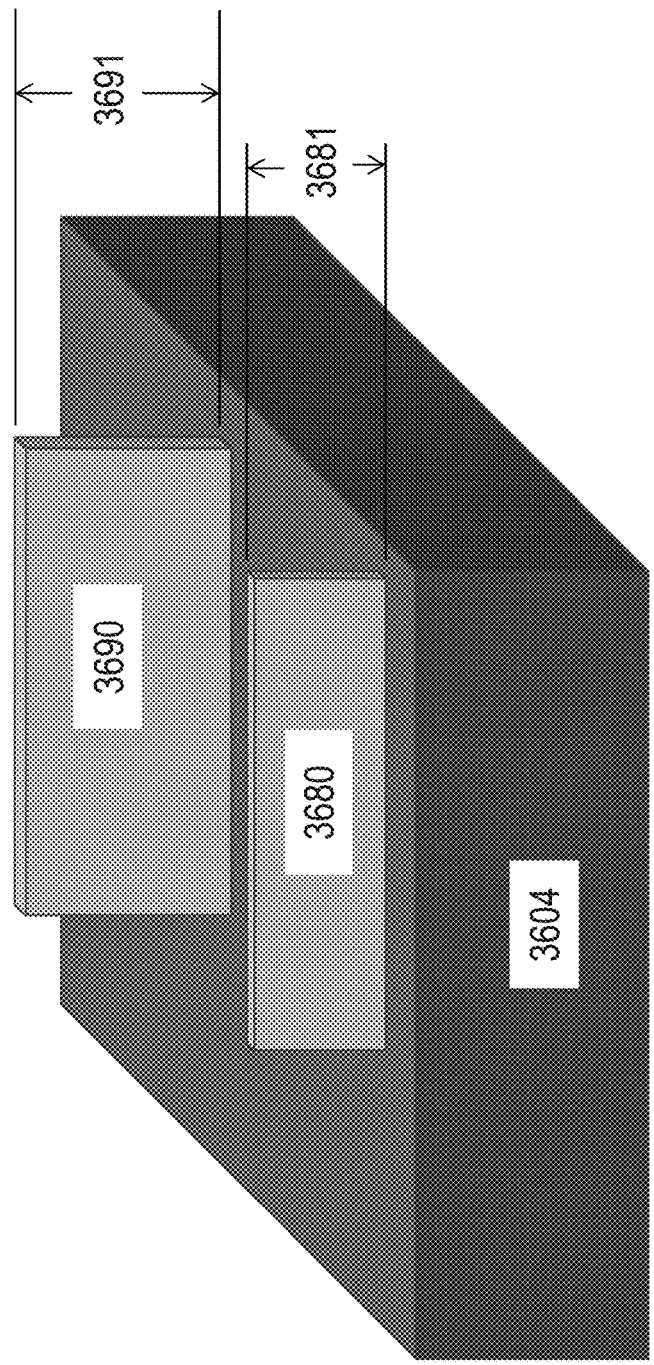
FIG. 36 is an exemplary drawing illustration of forming multiple Vt finfet transistors on the same circuit, device, die or substrate.

As illustrated in FIG. 36, the crystalline fins, for example, monocrystalline silicon fins, made be formed by conventional lithography (spacer enabled) and etch, forming a multiplicity of tall fins 3690 on substrate 3604. Substrate 3604 may be a bulk crystalline substrate or wafer, such as monocrystalline silicon, doped or undoped, or substrate 3604 may be and SOI wafer (Silicon On Insulator). Tall fins 3690 may have a fin height 3691, which may be in a range from about 3 nm to about 300 nm. Short fins 3680 may be formed by protecting the desired at end-of-process tall fins 3690, lithographically exposing the tall fins 3690 that are desired to become short fins 3680, and partially etching (by plasma, RIE, or wet etching) the crystalline material of the exposed tall fins 3690. An approach may be to deposit a filling material (not shown), such as an oxide, covering tall fins 3690, and planarize (with CMP or like processes). The planarized level may be above the top of the tall fins 3690, or just at the top level exposing the tops of tall fins 3690, or below the top of tall fins 3690. Lithography processes (may have hard masks employed as well) may be utilized to cover the desired at end-of-process tall fins 3690 and exposing the tall fins 3690 that are desired to become short fins 3680, and partially etching (by plasma, RIE, or wet etching) the crystalline material of the exposed tall fins 3690, thus resulting in short fins 3680 of short fin height 3681, which may be in a range from about 3 nm to about 300 nm. Short fin height 3681 may be less than fin height 3691, typically by at least 10% of fin height 3691. The filling material may be fully or partially removed, and the conventional finfet processing may continue.

Figure 37:
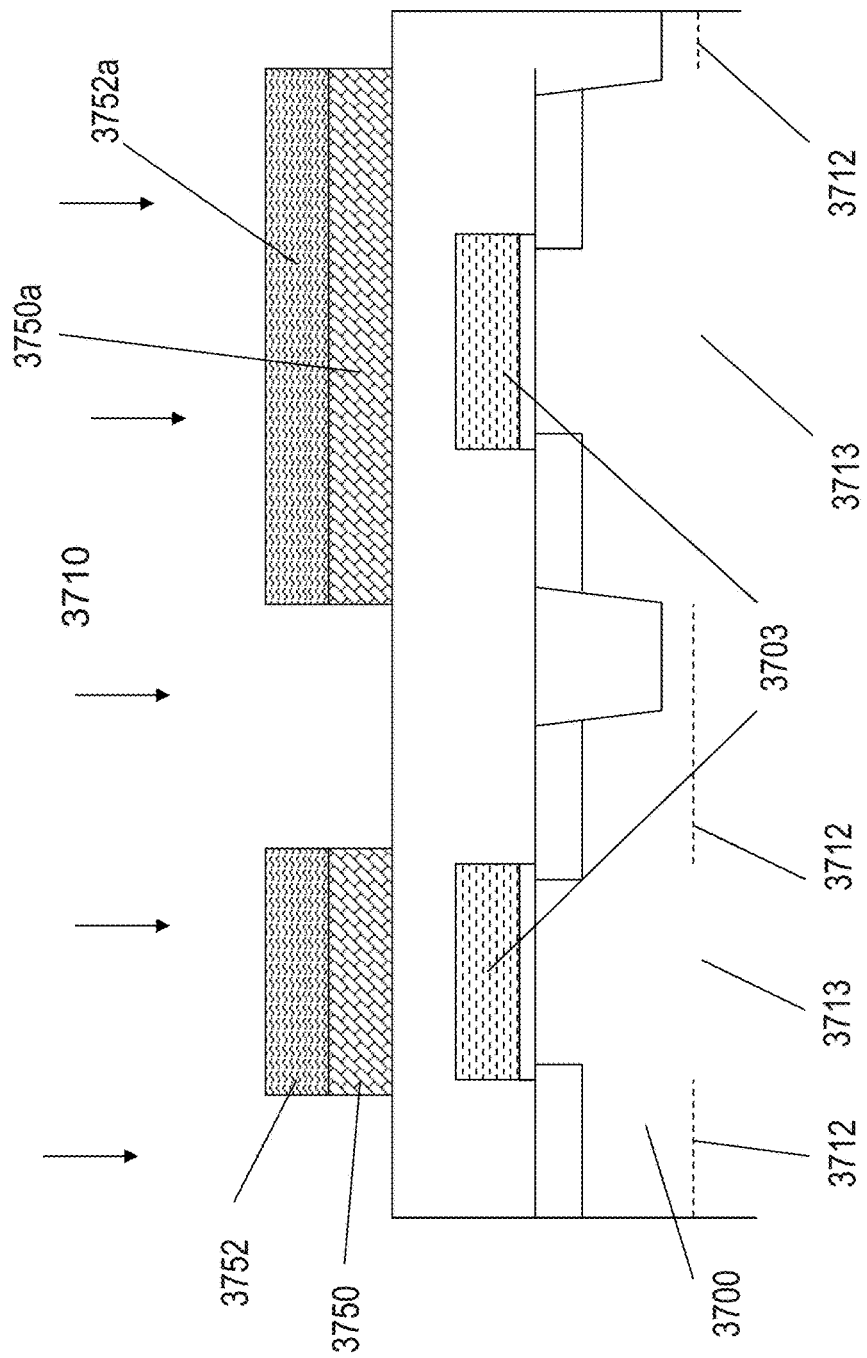
FIG. 37 is an exemplary drawing illustration of an ion implant screen to protect transistor structures such as gate stacks and junctions.

With reference to at least FIG. 70B-1 and associated specification descriptions in U.S. Pat. No. 8,273,610, the contents of the foregoing patent are incorporated herein by reference, an ion-implant may be screened from regions on a chip. For example, this may be applied to the ion-cut implant may be used to form the layer transfer demarcation plane and form various 3D structures as described herein this document and the referenced applications incorporated. As illustrated in FIG. 37, the implant of an atomic species 3710 (illustrated as arrows), such as, for example, H+, may be screened from the sensitive gate areas 3703, which may include gate dielectrics and gate metals, by first masking and etching a shield implant stopping layer of a dense material 3750, for example about 5000 angstroms of Tantalum, and may be combined with about 5,000 angstroms of photoresist 3752. The ion implant screen may also be formed by a thick layer of photoresist, for example, about 3 microns of KTI 950K PMMA and Shipley 1400-30 as described in Yun, C. H., et al., "Transfer of patterned ion-cut silicon layers", *Applied Physics Letters*, vol. 73, no. 19, p. 2772-2774 (November 2008). Various materials and thicknesses could be utilized for the defined screen layer dense material 3750 and photoresist 3752 to effectively screen the implant from harming the underlying structures. In general, the higher the atomic weight and denser the material, the more effective implant screening that can be obtained for a given thickness of the material. The implant of an atomic species 3710 may create a segmented cleave plane 3712 in the bulk (or other layers) of the donor substrate 3700, for example, a monocrystalline silicon wafer. Thus, ion masked region 3713 may be formed. The source and drain of a transistor structure may also be protected from the implant of an atomic species 3710 by the dense material 3750a and photoresist 3752a, thus ion masked region 3713a may be formed. Ion masked regions 3713a may be combined by merging the regions of dense material 3750a and photoresist 3752a to create large regions of ion masked regions. The large regions of ion-masking could be, for example, in the range of 100×100 nm and even greater than 4 um by 4 um, and may protect a multiplicity of transistors at a time. Many top-viewed shapes and sizes of the ion-masked and ion-implanted regions may be utilized. After cleaving, additional polishing may be applied to provide a smooth bonding surface for layer transfer suitability. To mitigate the inclined ion profile after implant from the sloping edge of the photoresist, photoresist 3752 could be removed prior to the implant and the thickness of dense material 3750 may be adjusted appropriately to substantially block the implant.

It is desirable to tightly integrate compound semiconductor (CS) devices, such as GaN HBTs, InP HEMTs, etc. with silicon based CMOS devices; substantially all formed monolithically (2D or 3D) on the same die and in close proximity to each other (a few microns, etc.). An approach to doing so is to manufacture a hybrid substrate that can be processed to form CS and silicon (Si) based CMOS transistors wherein the hybrid substrate may have high quality and close proximity silicon and CS regions and high quality surfaces. An approach to generating this CS/Si hybrid substrate is to take a monocrystalline silicon wafer (bulk or SOI), etch holes entirely thru the thickness of the monocrystalline silicon wafer, such as TSVs, oxidize to form a thin layer of silicon dioxide, attach the TSV'd monocrystalline silicon wafer to one or more CS template wafers or portions (generally a substantially pure crystalline CS so to provide a perfect epi template), and grow high quality CS epi in the TSV hole, generally via LPE (Liquid Phase Epitaxy) or MOCVD (Metal-Organic Chemical Vapor Deposition) techniques. The TSVs may have many possible sidewall angles with respect to the top surface of the monocrystalline silicon wafer, such as, for example, at about a 90 degree angle or about a 45 degree angle. Generally, the TSV'd silicon substrate may be thinner than the standard thickness-for-wafer-diameter standard (to enable good epitaxial growth quality, rates and efficiencies), and as such, may not be acceptable for standard conventional transistor processing in a production wafer fabrication facility. As well, reuse of the CS/Si hybrid wafer may be desired, as it may generate multiple usable thin layers for processing hybrid (heterogeneous) circuits and devices. It may be desirable to ion-cut a thin layer of the CS/Si hybrid substrate and layer transfer this thin layer (about 5 nm to 1000 nm thick, can be as thick as about 50 um if the transferred to substrate is thinned) to a standard sized silicon substrate, which could be conventionally processed in a production wafer fab. The TSVs of CS may also be trenches, or other shaped regions. The TSVs may be selectively filled with different CS materials, for example, one region of CS filled TSVs may include GaAs, another region on the same silicon substrate may have GaN filled TSVs, and so on, by use of different CS templates attached to the bottom of the TSV'd silicon substrate.

As illustrated in FIG. 38A, a silicon/CS hybrid wafer may include monocrystalline silicon substrate 3800, CS#1 in CS#1 via 3857, CS#2 in CS#2 via 3858, and surface 3801. For this example, CS#1 and CS#2 are different CS materials and CS#1 may have a higher atomic density than CS#2. An ion-cut implant 3810 of an atomic species, for example hydrogen, may be performed to generate a plane of defects (a perforation layer) in silicon substrate 3800, CS#1 in CS#1 via 3857, CS#2 in CS#2 via 3858 that may be utilized for cleaving a thin hybrid layer to transfer to another substrate for further processing/manufacturing. However, an uneven cleave plane of defects may result from the differing ion-implant ranges from surface 3801 due to the differing densities of material into which it is implanted. This may substantially preclude a high quality ion-cut cleave for the desired layer transfer. For example, Si perforation plane 3899 may be deeper with respect to surface 3801 than CS#2 perforation plane 3898, both which may be deeper than CS#1 perforation plane 3897. If the three perforation planes are close enough in depth to each other, on the order of about 0-100 nm or less, the ion-cut implant dose may be increased and a high quality cut may be obtained. However, this may also create a higher electrical and physical defectivity in the thin films and material that the ion implant travels thru. The defects may be annealed with techniques disclosed in the referenced documents and herein, such as, for example, short wavelength pulsed laser anneals and perforated carrier wafer techniques.

As illustrated in FIG. 38B, if a higher implant dose cannot accomplish a high quality ion-cut cleave, the material stack that ion-cut implant 3810 travels thru may be modulated over each substrate region by deposition/growth of an implant depth modulation material. Implant modulation material for silicon regions 3840 may be deposited, etched, formed over the silicon substrate 3800 regions at exposed surface 3801, and an implant modulation material for CS#2 regions 3842 may be deposited, etched, formed over CS#2 via 3858 regions at exposed surface 3801. Thus, the three perforation planes, Si perforation plane 3899, CS#2 perforation plane 3898, and CS#1 perforation plane 3897, may be brought close enough in depth to each other to allow a high quality cleave with an even cleave plane. Implant modulation material for silicon regions 3840 and implant modulation material for CS#2 regions 3842 may include, for example, silicon oxide, indium tin oxide, photoresist, silicon nitride, and other semiconductor thin film materials, including combinations of materials, such as, for example, photoresist and silicon oxide. Implant modulation material for silicon regions 3840 and implant modulation material for CS#2 regions 3842 may be constructed with different materials from each other, or may simply be the same material with a different thickness. The edges of implant modulation material for silicon regions 3840 and implant modulation material for CS#2 regions 3842 may be sloped (shown) to approximately match the slope of the silicon substrate TSVs so that the perforated planes at the interface between Si and CS#1 or Si and CS#2 may be substantially even. The sloping may be accomplished with well-known photoresist exposure and develop techniques or with etching (plasma and wet chemical) techniques. Alternatively to or in combination with the modulation layer regions, a selective chemical etch that is selective to the denser CS#1 material may be utilized to remove a the top portion (not shown) of CS#1 via 3857 to achieve an even cleave plane. The process illustrated with respect to FIG. 38A and FIG. 38B may be performed multiple times on silicon substrate 3800. There may be a surface touch-up and/or repair, such as, for example, at least a chemical mechanical polish, of the cleaved surface of the previously cleaved silicon substrate 3800 before the next ion-cut process commences or completes.

Multi-layer semiconductor devices including vertically oriented transistors as illustrated in at least FIGS. 27, 28, 39, 40, 54, 55 and related specification sections in U.S. Pat. No. 8,273,610, the contents are incorporated herein by reference, may be constructed. Some of the embodiments presented herein this document to heal and repair the damages caused by the ion implant associated with the ion-cut process, and any other defect caused in the layer transfer process, are applicable to the vertically oriented transistors, those disclosed herein, and other transistors and multi-layer semiconductor devices.

In various types of transistor formation there may be a need to change the doping profile along the current flow between source to drain (or emitter to collector). In many cases there is an advantage to having a high level of doping concentration at the surface of and near to source and drain contacts, for example, at the level of $5\times10^{19}$ atoms/cm$^3$ or greater, to achieve a low resistivity connection. While on the other hand it might be desirable to have far lower level of doping concentration in the junction and transistor channel areas to allow for a more complete off state of the transistor and/or better junction breakdown characteristics. In some cases the transistor channel might be undoped. An important part of some of the embodiments of the multilayer semiconductor process is the two phase formation of transistors. A high temperature step (>400° C.) before the layer transfer step, forming activated semiconductor generic structure, may be followed by low temperature (<400° C.) processes including etch and deposition after the layer transfer, as well as completion of transistors in the desired locations. Creating a variation of doping along the current path between source to drain is relatively easier for vertically oriented transistors than for horizontally oriented transistors.

As illustrated in FIGS. 39 and 40, formation of a 3D device wherein the second layer may include a junction-less transistor, is shown. As illustrated in FIGS. 39 and 41, formation of a 3D device wherein the second layer may include a JFET transistor, is shown. The first exemplary flow presented describes formation of N type Junction-Less Transistors with variable doping along the current path between source and drain. The inventive principles (from both flows) could be applied by a person skilled in the art to many other type of transistors, such as, for example, P type Junction-Less Transistors, MOSFETs, JFETs, Bipolars, JBT, and others.

Figure 39A:
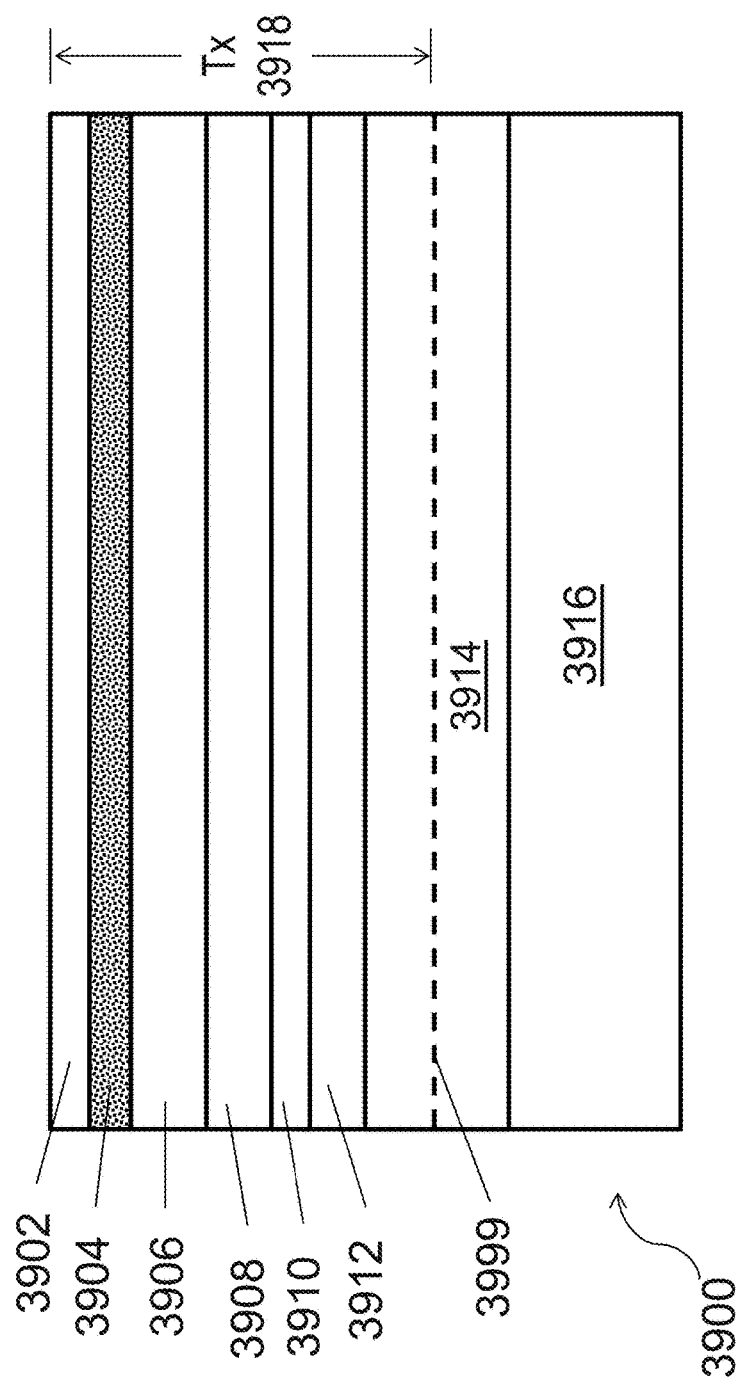
FIGS. 39A-39C are exemplary drawing illustrations of the formation of a transferred multi-layer doped structure.

As illustrated in FIG. 39A, multi-layer multi-doped structure 3900 may include donor wafer 3916 and layers of doped material, wherein many of the doped layers may be single crystal layers and may have its own doping concentration. Other layers within multi-layer multi-doped structure 3900 may include deposited layers, for example, metals and oxides. Structure 3900 could be formed in part by successive steps of doping processes, or successive epi-steps, or other known techniques in the art, or a combination of such processes. Accordingly, N++ layer 3914 with doping concentration of about $5\times10^{19}$ atoms/cm$^3$ or greater may be the first layer on top of donor wafer 3916. N+ layer 3912 may be formed on top of N++ layer 3914, and may have a one or more order of magnitude (10× or more) lower doping concentration than N++ layer 3914. N layer 3910 may be formed on top of N+ layer 3912, and may have a one or more order of magnitude (10× or more) lower doping concentration than N+ layer 3912. N layer 3910 in some cases might be very lightly doped or may include no dopant (undoped), as some of the state of the art transistor channels are now constructed. Second N+ layer 3908 may be formed on top of N layer 3910, and may have a similar doping level as N+ layer 3912. Second N++ layer 3906 may be formed on top of N+ layer 3908, and may have similar doping level as N++ layer 3914 (about $5\times10^{19}$ atoms/cm$^3$ or greater).

The interim structure of donor wafer 3916 including top doping layers N++ layer 3914, N+ layer 3912, N layer 3910, second N+ layer 3908, and second N++ layer 3906 could go through a high temperature, typically greater than 700° C., annealing step to activate the doping. Alternately, the activation and any defect repair annealing may be done within, during, or after each layer formation, or in groups. An ion-cut doping step may be performed to form a layer transfer demarcation plane 3999, which may be within the bottom N++ layer 3914, in preparation for the layer transfer step, as had been previously described. Donor wafer 3916, N++ layer 3914, N+ layer 3912, N layer 3910, second N+ layer 3908, and second N++ layer 3906 may be substantially single crystal or monocrystalline and may include materials such as Silicon and Germanium.

Metal layer 3904 may be deposited on top of the second N++ layer 3906. This metal layer formation may include any step or steps to provide good ohmic connection between the metal layer 3904 and the second N++ layer 3906, such as silicidation metal or compounds, for example, Titanium, or Titanium Nitride, Tantalum, or Tantalum Nitride. Metal layer 3904 could be substantially made of various types of metal such as aluminum or copper, or refractory metals such tungsten, or degenerately doped polysilicon or amorphous silicon, or other metals with a high thermal conductivity (such as greater than 10 W/m-K) and/or optical energy reflective properties, and may have a melting point above 900° C. Metal layer 3904 could be later used to form connection of the lower side of the vertical transistor (for example, back-bias or body bias/tie) and may provide a shield for the ion-cut implant damage repair or dopant annealing and activation as previously discussed herein and in the referenced patent applications. Metal layer 3904 could also support shielding the top transistors from electromagnetic noise and provide other benefits such as heat spreading as previously described. The transferred metal layer concept, such as metal layer 3904, described herein FIG. 39, may be utilized in the horizontal transistor devices and flows described herein and in incorporated references.

Oxide layer 3902 may be deposited in preparation for the bonding step as previously discussed. Bonding could be done metal to metal or oxide to oxide or a hybrid.

The multilayer structure above the layer transfer demarcation plane 3999 could be quite thin, for example, the total thickness of layers N++ layer 3914 portion above the layer transfer demarcation plane 3999, N+ layer 3912, N layer 3910, second N+ layer 3908, second N++ layer 3906, metal layer 3904, and oxide layer 3902 may typically be 100 nm, as indicated by the arrows and Tx 3918. Tx 3918 may be made thicker, such as 400 nm, and for other applications Tx 3918 could be made thinner such as 30 nm or even less.

Thus, multi-layer multi-doped structure 3900 may include donor wafer 3916, N++ layer 3914, layer transfer demarcation plane 3999, N+ layer 3912, N layer 3910, second N+ layer 3908, second N++ layer 3906, metal layer 3904, and oxide layer 3902.

Figure 39B:
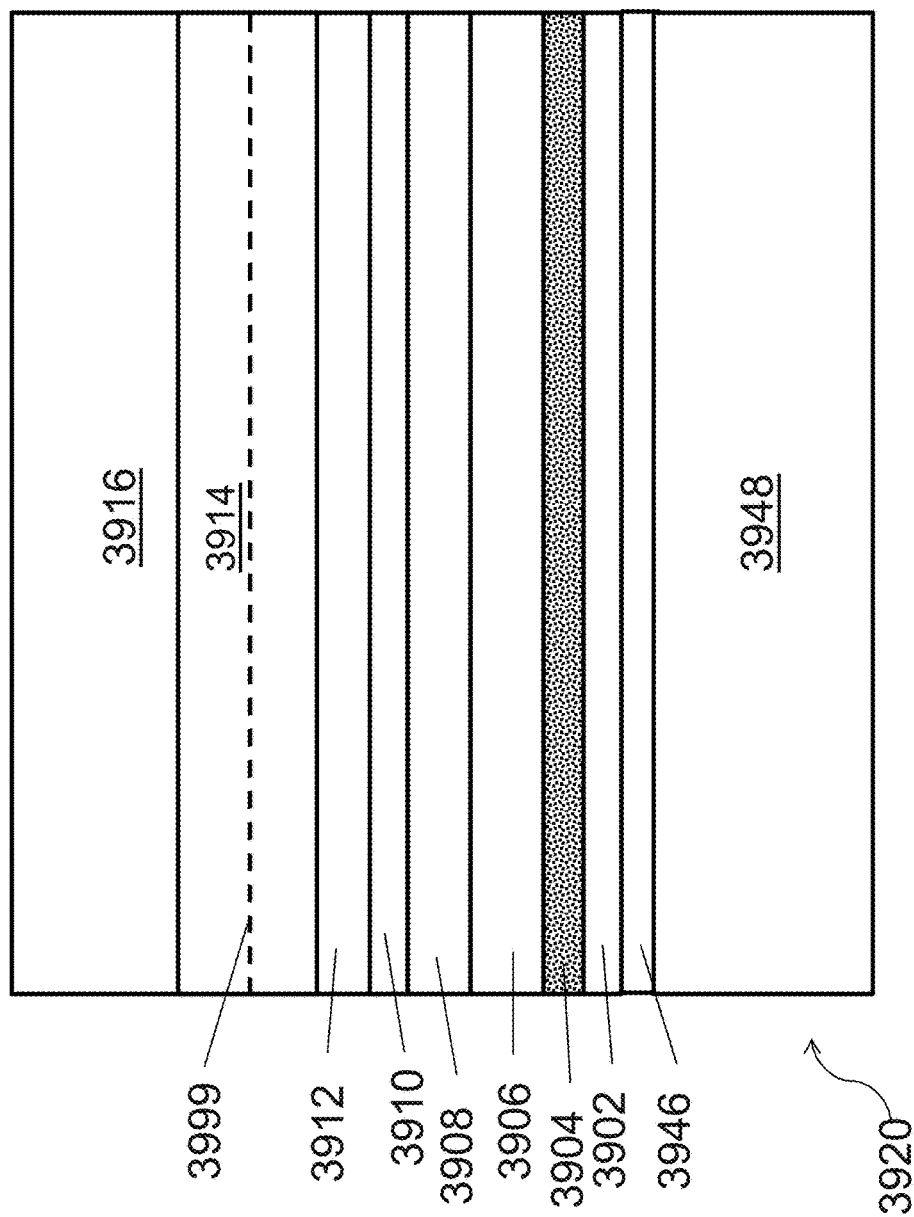

As illustrated in FIG. 39B, donor bonded to target substrate structure 3920 may be formed by bonding the multi-layer multi-doped structure 3900 to a previously prepared target substrate 3948. Target substrate 3948 may have bonding oxide layer 3946 formed prior to an oxide to oxide bonding step. Details of the bonding process have been described elsewhere herein and in incorporated references. Target substrate 3948 may include monocrystalline preprocessed transistors and metal interconnect as described related to acceptor substrates, base wafers, etc. elsewhere herein and in incorporated references. Thus donor bonded to target substrate structure 3920 may include target substrate 3948, bonding oxide layer 3946, donor wafer 3916, N++ layer 3914, layer transfer demarcation plane 3999, N+ layer 3912, N layer 3910, second N+ layer 3908, second N++ layer 3906, metal layer 3904, and oxide layer 3902.

Figure 39C:
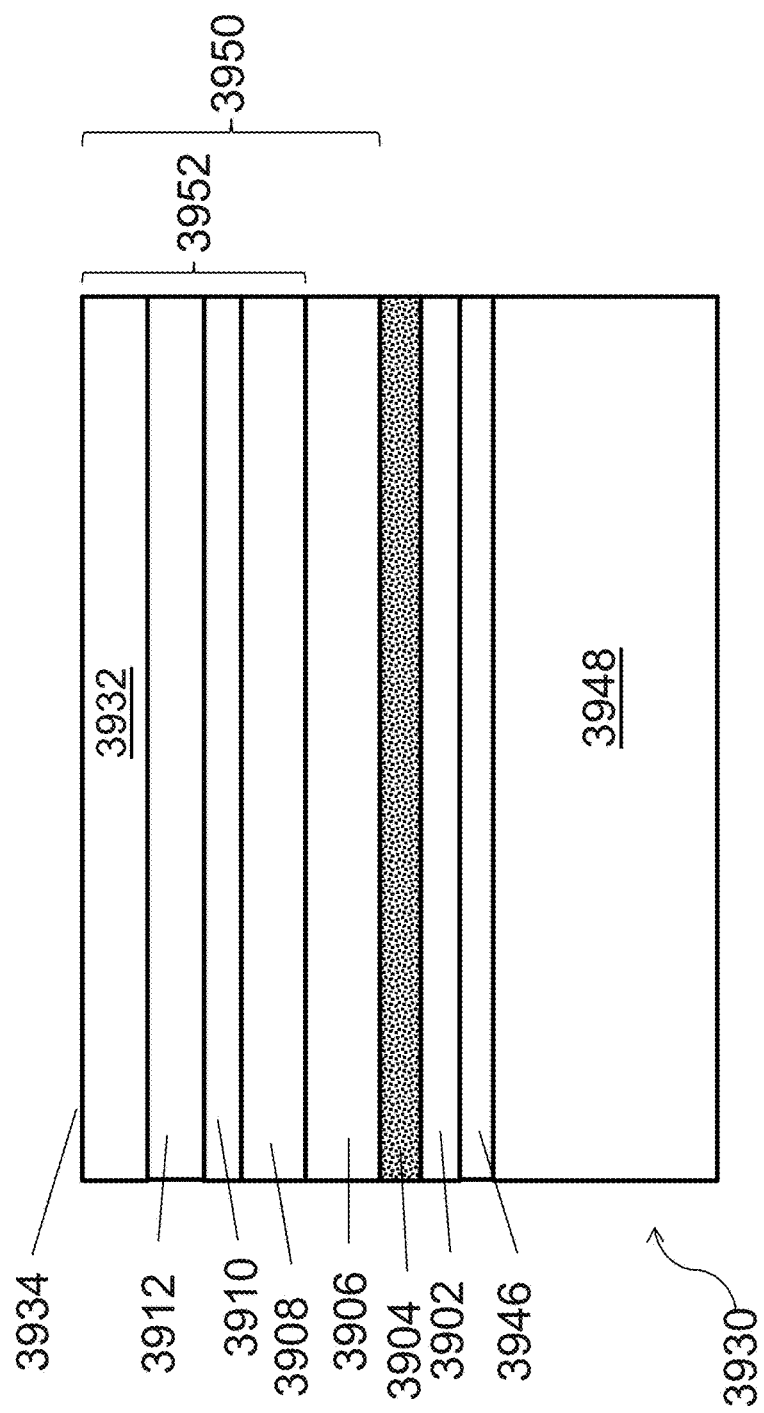

As illustrated in FIG. 39C, target substrate with transferred multi-layer structure 3930 is shown after the layer transfer step is substantially complete. Donor wafer 3916 and a portion of N++ layer may be removed by, for example, cleaving operations as described elsewhere herein and in incorporated references. Thus top N++ layer 3932 may be formed. Surface 3934 may be processed with smoothing, defect removal, and other operations, such as, for example, low temperature oxidation and strip, and chemical mechanical polishing, as described elsewhere herein and in incorporated references. Defects, such as ion-cut induced damage, may be annealed with optical annealing, such as, for example, short wavelength laser annealing, as described elsewhere herein and in incorporated references. Thus target substrate with transferred multi-layer structure 3930 may include surface 3934, top N++ layer 3932, N+ layer 3912, N layer 3910, second N+ layer 3908, second N++ layer 3906, metal layer 3904, oxide layer 3902, bonding oxide layer 3946, and target substrate 3948.

Persons of ordinary skill in the art will appreciate that the illustrations in FIG. 39A through FIG. 39C are exemplary only and are not drawn to scale. Such skilled persons will further appreciate that many variations are possible such as, for example, other types of transistors could be formed using a similar transferred multi-layers structure flow including changing the doping concentration and/or type. Accordingly various combinations of N or P doping to layers top N++ layer 3932, N+ layer 3912, N layer 3910, second N+ layer 3908, second N++ layer 3906 could result in different types of vertical transistors. Many other modifications within the scope of the invention will suggest themselves to such skilled persons after reading this specification. Thus the invention is to be limited only by the appended claims.

As illustrated in FIGS. 40A and 40B, and with reference to FIG. 39, formation of a vertically oriented junction-less transistor (JLT), which may utilize the transferred multi-layer structure 3930, is shown. N layer 3910 may be doped N+, similar to N+ layer 3912 and second N+ layer 3908, or N layer 3910 may be omitted in the formation of the transferred multi-layer structure 3930. The transistor formation including forming gates and contacts will be presented. Accordingly different gate formation and contact formation, as well as different layers within the transferred multi-layer structure 3930, might be preferred for various types of transistors as could be designed by a person skilled in the art. Furthermore, monolithic 3D horizontal JLTs are described in at least FIGS. 56-58, 61, 65, 96 and 145 of U.S. Pat. No. 8,273,610, and FIGS. 9-14 and 35 of U.S. patent application Ser. No. 13/441,923, and may utilize doped polysilicon gates substantially directly in contact with the transistor channel surface. Electrically conductive doped oxides such as, for example, IGZ (InGaZn) compounds, may be utilized fully or partially in place of the doped polysilicon for gate formation.

As illustrated in FIG. 40A, etched structure 4000 may be formed by etch processing portions of transferred multi-layer structure 3930. Base wafer 4002, which may be target substrate 3948, may include a metal strip or pad such as landing metal 4001, which may be part of the transistor-to-transistor and 3D layer-to-layer interconnect layers of target substrate 3948. Bonding oxide layer 4003 may be the combination of bonding oxide layer 3946 and oxide layer 3902. Bonding oxide layer 4003 may include thicknesses of less than 1 um, less than 500 nm, less than 400 nm, less than 300 nm, less than 200 nm, or less than 100 nm. A hard mask, such as, for example, silicon nitride or amorphous carbon, may be utilized in the lithography and etch processes to form the etched regions of etched structure 4000, thus resulting in remaining hard mask regions 4005 for example. Metal layer 3904 of transferred multi-layer structure 3930 may be processed with lithographically and etching processes to form first metal segment 4004, second metal segment 4006, and third metal segment 4008 by etching portions of the multi dopant structure indicated by layer stack 3950 and portions of metal layer 3904, stopping substantially on bonding oxide layer 4003. First transistor body 4012, second transistor body 4014, third transistor body 4016, and fourth transistor body 4020 may be formed by etch processes on layers of transferred multi-layer structure 3930. First transistor body 4012, second transistor body 4014, third transistor body 4016 may be formed by etching the multi dopant structure indicated by layer stack 3950, stopping substantially on the associated first metal segment 4004 or second metal segment 4006. Formation of fourth transistor body 4020 may be done in two steps. Fourth transistor body 4020 may be formed by etching the multi dopant structure indicated by layer stack 3952, stopping substantially on N++ layer 3906, and then an additional step of lithography and etching of N++ layer 3906, stopping substantially on the associated third metal segment 4008, using a different pattern thus forming N++ region 4018. This may be utilized to leave room to make connection at a following contact step so that N++ region 4018 may make connection to the lower part of fourth transistor body 4020 of the vertical transistor.

As illustrated in FIG. 40B, additional processing steps such as the addition of gate oxide and gate material, additional interlayer dielectrics (ILD), and contacts to form and connect substantially all or some of the vertical junction-less transistors 4044, 4054, 4080, 4088, may be performed. The exemplary multi-transistor structure 4030 may be formed by multiple steps of deposition and etch using masks and processing that are common in the art. A unique part of this flow is that substantially all the processing steps done after the layer transfer are done under the consideration of a limited thermal budget in order to avoid damage to the underlying interconnect structures, for example, landing metal 4001, and other elements, for example, transistors and capacitors, of base wafer 4002, wherein those structures typically are staying below about 400° C.

The gate oxide 4036 may be formed, for example, by a deposition using Atomic Layer Deposition ("ALD") or low temperature plasma oxidation, such as the TEL SPA tool and processes. Shared gate electrode 4046, second gate electrode 4062, and third gate electrode 4084 may be formed by gate electrode material deposition, such as, for example, TiAlN and Al for a HKMG electrode, and then lithographic definition and plasma/RIE etching, for example. The gate electrodes, shared gate electrode 4046, second gate electrode 4062, and third gate electrode 4084, could be constructed one sided, two sided, three sided, or all around with respect to the associated transistor body. In many cases the gate all around construction might be preferred, sometimes called a surrounding gate transistor (SGT). Additional dielectric depositions (not shown), for example, by SACVD or SOG and etchback processes, may be done before or after the gate formation to minimize gate to source capacitance (for example, thicker than gate ox dielectric between gate electrode 4062 and the source node second metal segment 4006 and/or the bottom N++ and N+ of third transistor body 4016). Alternatively, formation of gate oxide 4036 may be omitted and a P+ doped poly or amorphous silicon gate may be formed to control the JLT channel. Proper isolation dielectrics to isolate the gate from the source and drain is important. Electrically conductive doped oxides such as, for example, IGZ (InGaZn) compounds, may be utilized fully or partially in place of the doped polysilicon for gate formation.

A thick dielectric may be deposited, chemically mechanically polished, and contact and via holes etched within to form ILD regions 4090 that may electrically isolate, as desired, one transistor and each connection to it from another connection or transistor and associated connections. Metals may be deposited and processed to form contacts and 3D vias to provide interconnection to and from the formed transistors.

First vertical junction-less transistor 4044 and second vertical junction-less transistor 4054 may share source contact 4034 which may be coupled to first metal segment 4004, first metal segment 4004 being coupled to the bottom N++ regions of first transistor body 4012 and second transistor body 4014, and may share gate electrode contact 4042 which may be coupled to shared gate electrode 4046. First vertical junction-less transistor 4044 may be connected with first drain contact 4038, which may be coupled to the top N++ region of first transistor body 4012.

Second vertical junction-less transistor 4054 may be connected with second drain contact 4048, which may be coupled to the top N++ region of second transistor body 4014.

Third vertical junction-less transistor 4080 may be connected with third source contact 4072 which may be coupled to third metal segment 4006, third metal segment 4006 being coupled to the bottom N++ region of third transistor body 4016, and third gate electrode contact 4070 which may be coupled to second gate electrode 4062. Third vertical junction-less transistor 4080 may be connected with third drain contact 4066, which may be coupled to the top N++ region of third transistor body 4016.

Fourth vertical junction-less transistor 4088 may be connected with fourth source contact 4086 which may be coupled to N++ region 4018, which may be coupled to the bottom N+ region of fourth transistor body 4020, and fourth gate electrode contact 4081 which may be coupled to third gate electrode 4084. Fourth vertical junction-less transistor 4088 may be connected with fourth drain contact 4082, which may be coupled to the top N++ region of fourth transistor body 4020.

TLV 4060 may be formed by lithographic and etch processes to couple the second layer transistors and/or metal interconnect, for example transistors third vertical junction-less transistor 4080 and fourth vertical junction-less transistor 4088, with the first layer metal interconnect and transistors, for example, landing metal 4001 and base wafer 4002 with associated transistors and interconnect. The diameter of TLV 4060 may be less than about 100 nm, or 50 nm, or 20 nm, due to the thinness of the transferred layer and manufacturable deposition and etch aspect ratio limitations.

An important part of this (and many of the other devices formations and methods herein) second layer transistor formation flow is that the second layer (transferred monocrystalline layer) transistor location is defined after the layer transfer. Accordingly the location of the vertical transistors could be precisely aligned to the alignment marks associated with base wafer 4002. As the transferred layer or layers is quite thin, for example, less than about 10 nm, 50 nm, 100 nm, 200 nm, 500 nm, the lithography tool, such as a wafer stepper, could provide a second layer to first layer alignment that may be less than an about 40 nm alignment error or even less than about 10 nm alignment error with respect to the base silicon alignment marks.

Persons of ordinary skill in the art will appreciate that the illustrations in FIG. 40A and FIG. 40B are exemplary only and are not drawn to scale. Such skilled persons will further appreciate that many variations are possible such as, for example, other types of transistors could be formed using a similar transferred multi-layers structure flow including changing the doping concentration and/or type. Further, the transistor bodies (such as first transistor body 4012) could be lithographically defined and etched prior to the definition and etch of the metal segments (such as first metal segment 4004). Moreover, if better visibility of the base wafer 4002 alignment marks is desired, the transferred layer or layers could be further etched in regions that are above the alignment marks, so to allow better visibility. Furthermore, if metal to metal bonding or hybrid metal-oxide bonding is utilized (described in reference previous patent applications), then bottom connections can be made directly to the transistor bodies from the lower layer base wafer 4002 interconnect. Moreover, N++ layer 3914 and/or second N++ layer 3906 may not be necessary if the contact resistance to the N+ layers (N+ layer 3912 and/or second N+ layer 3908) is lowered by use of other schemes, such as salicidation. Furthermore, gate electrodes shared gate electrode 4046, second gate electrode 4062, and third gate electrode 4084 may be planarized and then selectively etched back to help minimize gate to drain capacitance. Many other modifications within the scope of the invention will suggest themselves to such skilled persons after reading this specification. Thus the invention is to be limited only by the appended claims.

An additional transistor structure to the vertical junctionless transistor shown in FIG. 40 is the vertical JFET transistor. JFETs may be constructed wherein the gate may be formed with heavily doped poly silicon that is doped with a reverse type dopant with respect to the channel, for example, an N channel would have a P doped gate, the polysilicon gate in substantially direct contact with a portion of the transistor channel surface. Polysilicon including doped poly silicon could be constructed without exceeding the thermal budget for the underlying base wafer. Monolithic 3D horizontal JFETs are described in at least FIGS. 24, 25, and 26 of U.S. Pat. No. 8,273,610, and FIGS. 15 and 16 of U.S. patent application Ser. No. 13/441,923, and may utilize doped polysilicon gates substantially directly in contact with the transistor channel surface. Further, it might be desirable to mix JFET transistors with Junction-less or other type of transistors. Shown herein is a flow to form a vertical polysilicon gated JFET. Electrically conductive doped oxides such as, for example, IGZ (InGaZn) compounds, may be utilized fully or partially in place of the doped polysilicon for gate formation.

Figure 41A:
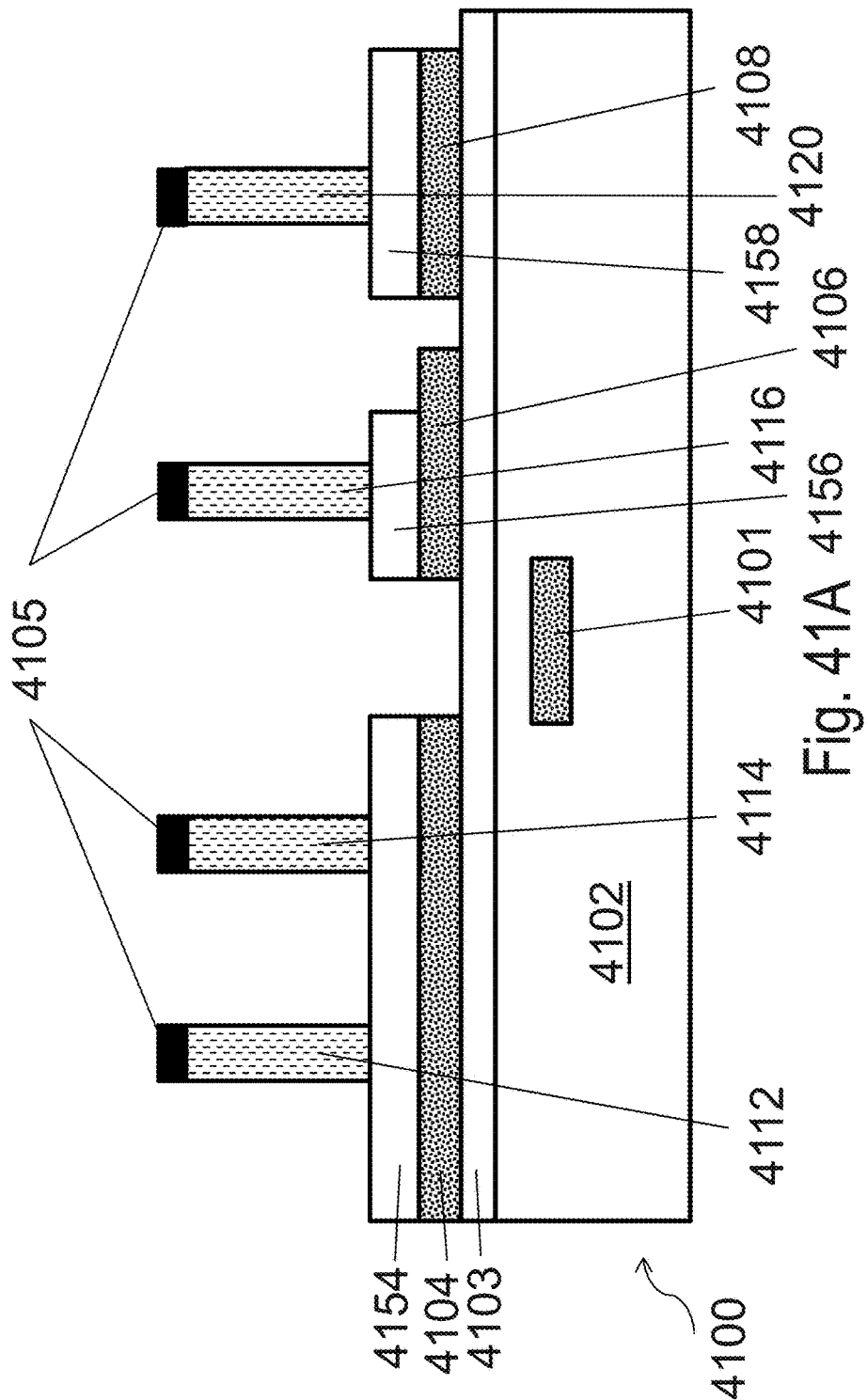

As illustrated in FIGS. 41A and 41B, and with reference to FIG. 39, formation of a vertically oriented JFET, which may utilize the transferred multi-layer structure 3930, is shown. The transistor formation including forming gates and contacts will be presented. Accordingly different gate formation and contact formation, as well as different layers within the transferred multi-layer structure 3930, might be preferred for various types of transistors as could be designed by a person skilled in the art.

As illustrated in FIG. 41A, etched structure 4100 may be formed by etch processing portions of transferred multi-layer structure 3930. Base wafer 4102, which may be target substrate 3948, may include a metal strip or pad such as landing metal 4101, which may be part of the transistor-to-transistor and 3D layer-to-layer interconnect layers of target substrate 3948. Bonding oxide layer 4103 may be the combination of bonding oxide layer 3946 and oxide layer 3902. Bonding oxide layer 4103 may include thicknesses of less than 1 um, less than 500 nm, less than 400 nm, less than 300 nm, less than 200 nm, or less than 100 nm. A hard mask, such as, for example, silicon nitride or amorphous carbon, may be utilized in the lithography and etch processes to form the etched regions of etched structure 4100, thus resulting in remaining hard mask regions 4105 for example. Metal layer 3904 of transferred multi-layer structure 3930 may be processed with lithographically and etching processes to form first metal segment 4104, second metal segment 4106, and third metal segment 4108 by etching portions of the multi dopant structure indicated by layer stack 3950 and portions of metal layer 3904, stopping substantially on bonding oxide layer 4103. First transistor body 4112, second transistor body 4114, third transistor body 4116, and fourth transistor body 4120 may be formed by etch processes on layers of transferred multi-layer structure 3930. First transistor body 4112, second transistor body 4114, third transistor body 4116, and fourth transistor body 4120 may be formed by etching the multi dopant structure indicated by layer stack 3952, stopping substantially on N++ layer 3906, or alternatively, stopping within N+ layer 3908. Thus first N++ region 4155 and third N++ region 4158 may be formed. An additional masking and etching step, using a different pattern and stopping substantially on the associated second metal segment 4106, may be performed to form second N++ region 4156, which may provide a future direct contact connection to second metal segment 4106.

As illustrated in FIG. 41B, additional processing steps such as the addition of gate to source dielectrics, gate material and formation, additional interlayer dielectrics (ILD), and contacts to form and connect substantially all or some of the vertical JFETs 4144, 4154, 4180, 4188, may be performed. The exemplary multi-transistor structure 4130 may be formed by multiple steps of deposition and etch using masks and processing that are common in the art. A unique part of this flow is that substantially all the processing steps done after the layer transfer are done under the consideration of a limited thermal budget in order to avoid damage to the underlying interconnect structures, for example, landing metal 4101, and other elements, for example, transistors and capacitors, of base wafer 4102, wherein those structures typically are staying below about 400° C.

The area between the vertical transistor bodies then be partially filled with gate to source dielectric 4136 via a Spin On Glass (SPG) spin, low temperature cure, and etch back sequence. Alternatively, a low temperature CVD gap fill oxide may be deposited, then Chemically Mechanically Polished (CMP'ed) flat, and then selectively etched back to achieve substantially the same shape. Alternatively, this step may also be accomplished by a conformal low temperature oxide CVD deposition and etch back sequence, creating a spacer profile coverage of the vertical transistor bodies and covering the bottom of the area between the vertical transistor bodies. Thus, gate to source electrical isolation may be achieved.

Shared gate electrode 4146, second gate electrode 4162, and third gate electrode 4184 may be formed by gate electrode material deposition, such as, for example, P+ doped polysilicon or P+ doped amorphous silicon or metals (metals may be utilized to form a Schottky contact to the N− channel), and then lithographic definition and plasma/RIE etching, for example. The directly in contact with the silicon channel gate electrodes may be formed, with appropriate isolation from the source and drains, and dopant from that gate may also be utilized to form a shallow P+ region for channel control, for example, by diffusion from an optical anneal. The gate electrodes, shared gate electrode 4146, second gate electrode 4162, and third gate electrode 4184, could be constructed one sided, two sided, three sided, or all around with respect to the associated transistor body. In many cases the gate all around construction might be preferred, sometimes called a surrounding gate transistor (SGT). The gate electrodes may be recessed etched past the N+ layer 3912 to N layer 3910 transition of the associated transistor body to decouple the gate electrodes from their associated drain electrode. The dopant in the gate electrode may be activated by optical annealing methods, such as short pulse and wavelength laser light exposure, use of optical absorbers and reflectors, and shielding layers as described elsewhere herein and in referenced patent applications.

A thick dielectric may be deposited, chemically mechanically polished, and contact and via holes etched within to form ILD regions 4190 that may electrically isolate, as desired, one transistor and each connection to it from another connection or transistor and associated connections. Metals may be deposited and processed to form contacts and 3D vias to provide interconnection to and from the formed transistors.

First vertical JFET 4144 and second vertical JFET 4154 may share source contact 4134 which may be coupled to first N++ region 4155 and first metal segment 4104, which is coupled to the bottom N+ or N++ regions of first transistor body 4112 and second transistor body 4114, and may share gate electrode contact 4142 which may be coupled to shared gate electrode 4146. First vertical JFET 4144 may be connected with first drain contact 4138, which may be coupled to the top N++ region of first transistor body 4112. Second vertical JFET 4154 may be connected with second drain contact 4148, which may be coupled to the top N++ region of second transistor body 4114.

Third vertical JFET 4180 may be connected with third source contact 4172 which may be coupled to second metal segment 4106, second metal segment 4106 being coupled to second N++ region 4156 which being coupled to the bottom N+ or N++ region of third transistor body 4116, and third gate electrode contact 4170 which may be coupled to second gate electrode 4162. Third vertical JFET 4180 may be connected with third drain contact 4166, which may be coupled to the top N++ region of third transistor body 4116.

Fourth vertical JFET 4188 may be connected with fourth source contact 4186 which may be coupled to the bottom N+ or N++ region of fourth transistor body 4120, and fourth gate electrode contact 4181 which may be coupled to third gate electrode 4184. Fourth vertical JFET 4188 may be connected with fourth drain contact 4182, which may be coupled to the top N++ region of fourth transistor body 4120.

TLV 4160 may be formed by lithographic and etch processes to couple the second layer transistors and/or metal interconnect, for example transistors third vertical JFET 4180 and fourth vertical JFET 4188, with the first layer metal interconnect and transistors, for example, landing metal 4101 and base wafer 4102 with associated transistors and interconnect. The diameter of TLV 4160 may be less than about 100 nm, or 50 nm, or 20 nm, due to the thinness of the transferred layer and manufacturable deposition and etch aspect ratio limitations.

An important part of this second layer transistor formation flow is that the second layer (transferred monocrystalline layer) transistor location is defined after the layer transfer. Accordingly the location of the vertical transistors could be precisely aligned to the alignment marks associated with base wafer 4102. As the transferred layer or layers is quite thin, for example, less than about 10 nm, 50 nm, 100 nm, 200 nm, 500 nm, the lithography tool, such as a wafer stepper, could provide a second layer to first layer alignment that may be less than an about 40 nm alignment error or even less than about 10 nm alignment error with respect to the base silicon alignment marks.

Persons of ordinary skill in the art will appreciate that the illustrations in FIG. 41A and FIG. 41B are exemplary only and are not drawn to scale. Such skilled persons will further appreciate that many variations are possible such as, for example, other types of transistors could be formed using a similar transferred multi-layers structure flow including changing the doping concentration and/or type. Further, the transistor bodies (such as first transistor body 4112) could be lithographically defined and etched prior to the definition and etch of the metal segments (such as first metal segment 4104). Moreover, if better visibility of the base wafer 4102 alignment marks is desired, the transferred layer or layers could be further etched in regions that are above the alignment marks, so to allow better visibility. Furthermore, if metal to metal bonding or hybrid metal-oxide bonding is utilized (described in reference previous patent applications), then bottom connections can be made directly to the N++ regions of the transistor bodies from the lower layer base wafer 4102 interconnect. Moreover, N++ layer 3914 and/or second N++ layer 3906 may not be necessary if the contact resistance to the N+ layers (N+ layer 3912 and/or second N+ layer 3908) is lowered by use of other schemes, such as salicidation. Moreover, first source contact 4134 may be etched to directly contact first metal segment 4104 during the contact opening etch, if desired. Furthermore, N layer 3910 may be doped N+, similar to N+ layer 3912 and second N+ layer 3908, or N layer 3910 may be omitted in the formation of the transferred multi-layer structure 3930, and hence, form a vertically oriented P+ doped polysilicon direct gated JLT by similar processing. Many other modifications within the scope of the invention will suggest themselves to such skilled persons after reading this specification. Thus the invention is to be limited only by the appended claims.

In many applications it is desired to use a combination of N type transistors and P type transistors. While using two overlaid layers, at least one layer of P type transistors on top of at least one layer of N type transistors, has been previously described herein and n referenced patent applications, it might be desired to have those transistors connected by the same overlaying interconnection layers coupling to one transistor layer. In U.S. Pat. No. 8,273,610, the contents of which are incorporated herein by reference, there are at least two flows to provide such. The flows could be adapted to vertical transistors just as well. The first flow suggests using repeating rows of N type and P type and is detailed in at least FIGS. 20-35 and FIGS. 73-79 of U.S. Pat. No. 8,273,610. An alternative flow suggests using layers within the strata in a vertical manner, and is described in at least FIG. 95 of U.S. Pat. No. 8,273,610.

While concepts in this document have been described with respect to 3D-ICs with two stacked device layers, those of ordinary skill in the art will appreciate that it can be valid for 3D-ICs with more than two stacked device layers. Additionally, some of the concepts may be applied to 2D ICs.

An additional embodiment of the invention is to utilize the underlying interconnection layer or layers to provide connections and connection paths (electrical and/or thermal) for the overlying transistors. While the common practice in the IC industry is that interconnection layers are overlaying the transistors that they connect, the 3D IC technology may include the possibility of constructing connections underneath (below) the transistors as well. For example, some of the connections to, from, and in-between transistors in a layer of transistors may be provided by the interconnection layer or layers above the transistor layer; and some of the connections to, from, and in-between the transistors may be provided by the interconnection layer or layers below the transistor layer or layers. In general there is an advantage to have the interconnect closer to the transistors that they are connecting and using both sides of the transistors—both above and below—provides enhanced "closeness" to the transistors. In addition, there may be less interconnect routing congestion that would impede the efficient or possible connection of a transistor to transistors in other layers and to other transistors in the same layer.

The connection layers may, for example, include power delivery, heat removal, macro-cell connectivity, and routing between macro-cells. As illustrated in FIG. 42A-D, an exemplary illustration and description of connections below a layer of transistors and macro-cell formation and connection is shown. When the same reference numbers are used in different drawing figures (among FIGS. 42A-D), they may indicate analogous, similar or identical structures to enhance the understanding of the embodiments of the invention being discussed by clarifying the relationships between the structures and embodiments presented in the various diagrams—particularly in relating analogous, similar or identical functionality to different physical structures. The term macro-cell may include one or more logic cells.

An important advantage is that the connections could be made above and below the transistor layers. A Macro-cell library could use under the transistor layer connections and over the transistor layer connections. A router can use under the transistor layer connections and over the transistor layer connections, and power delivery could use under the transistor layer connections and over the transistor layer connections. Some of the connections could be solely for the transistor of that layer and other connections could include connections to other transistor or device layers.

Figure 42A:
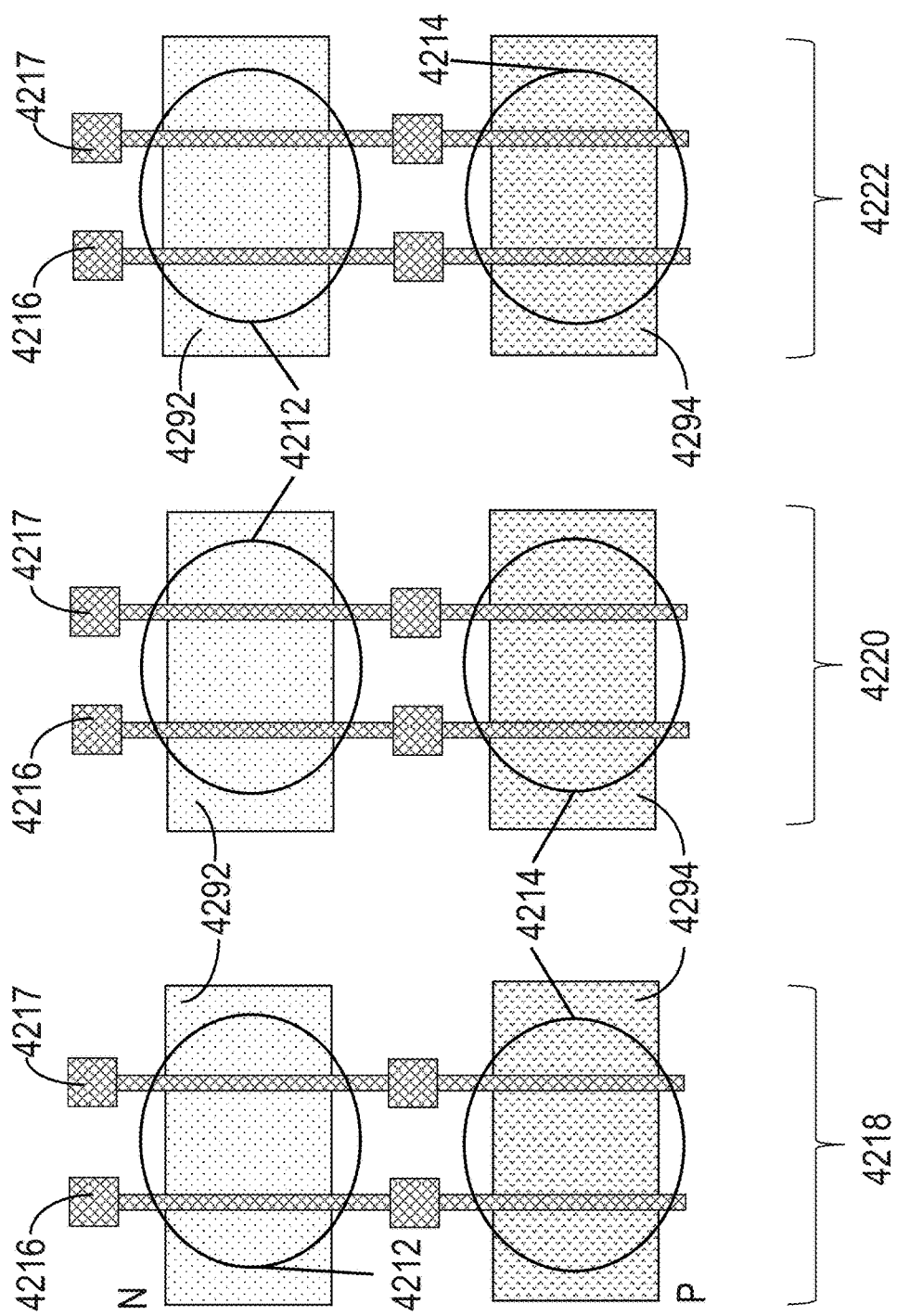
FIGS. 42A-42D are exemplary drawing illustrations of at least one layer of connections below a layer of transistors, and macro-cell formation.

As illustrated in FIG. 42A, a repeating device or circuit structure, such as, for example, a gate-array like transistor structure, may be constructed in a layer, such as for example, monocrystalline silicon, as described elsewhere herein and in U.S. Pat. No. 8,273,610, whose contents are incorporated by reference. FIG. 42A is an exemplary illustration of the top view of three of the repeating elements of the gate-array like transistor structure layer. The exemplary repeating elements of the structure may include a first element 4218, a second element 4220, and a third element 4222, and each element may include two transistor pairs, for example, N transistor pair 4212 and P transistor pair 4214. N transistor pair 4212 may include common diffusion 4292 and a portion of first common gate 4216 and second common gate 4217. P transistor pair 4214 may include common diffusion 4294 and a portion of first common gate 4216 and second common gate 4217. The structure of FIG. 42A can represent a small section of a gate-array in which the structure keeps repeating.

Figure 42B:
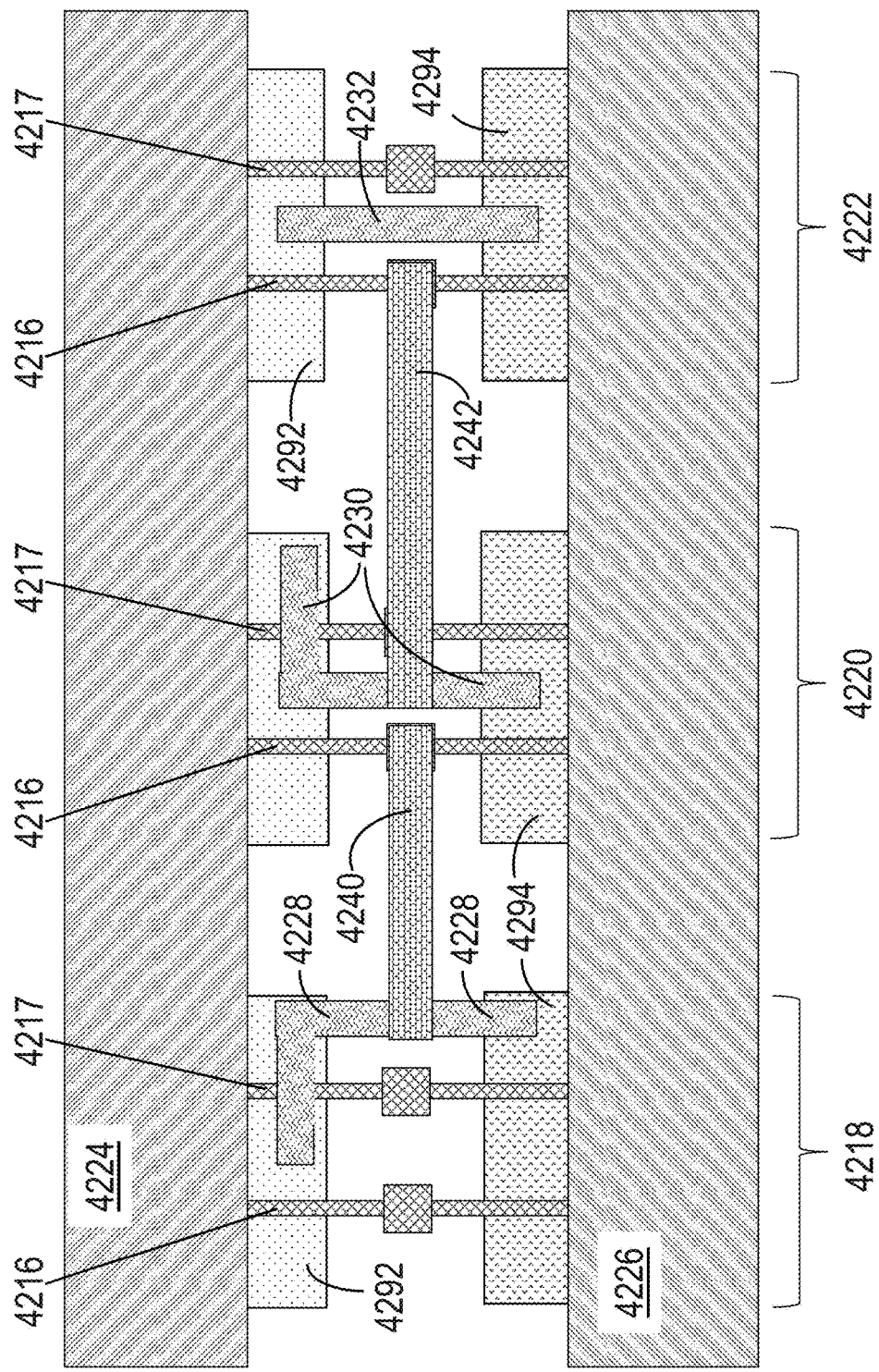

As illustrated in FIG. 42B, the interconnection layers underneath (below) the transistors of FIG. 42A may be constructed to provide connections (along with the vias of FIG. 42C) between the transistors of FIG. 42A. Underneath (below) the transistors may be defined as being in the direction of the TLVs (thru Layer Vias) or TSVs (Thru Silicon Vias) that are going through the layer of transistor structures and transistors referred to in the FIG. 42A discussion. The view of exemplary illustration FIG. 42B is from below the interconnection layers which are below the repeating device or circuit structure; however, the orientation of the repeating device or circuit structure is kept the same as FIG. 42A for clarity. The interconnection layers underneath may include a ground-'Vss' power grid 4224 and a power-'Vdd' power grid 4226. Noise on the power grids, such as the 'Vss' power grid 4224 and a power-'Vdd' power grid 4226, may be mitigated by attaching/connecting decoupling capacitors onto the power conducting lines of the grids. The decoupling caps may include, for example, trench capacitors such as described by Pei, C., et al., "A novel, low-cost deep trench decoupling capacitor for high-performance, low-power bulk CMOS applications," ICSICT ($9^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). The interconnection layers underneath may include macro-cell construction connections such as, for example, NOR gate macro-cell connection 4228 for a NOR gate cell formation formed by the four transistors of first element 4218, NAND gate macro-cell connection 4230 for a NAND gate cell formation formed by the four transistors of second element 4220, and Inverter macro-gate cell connection 4232 for an Inverter gate cell formation formed by two of the four transistors of third element 4222. The interconnection layers may include routing connection 4240 which connects the output of the NOR gate of first element 4218 to the input of the NAND gate of second element 4220, and additional routing connection 4242 which connects the output of the NAND gate of second element 4220 to the input of the inverter gate of third element 4222. The macro-cells and the routing connections (or routing structures) are part of the logic cell and logic circuit construction. The connection material may include for example, copper, aluminum, and/or conductive carbon.

Figure 42C:
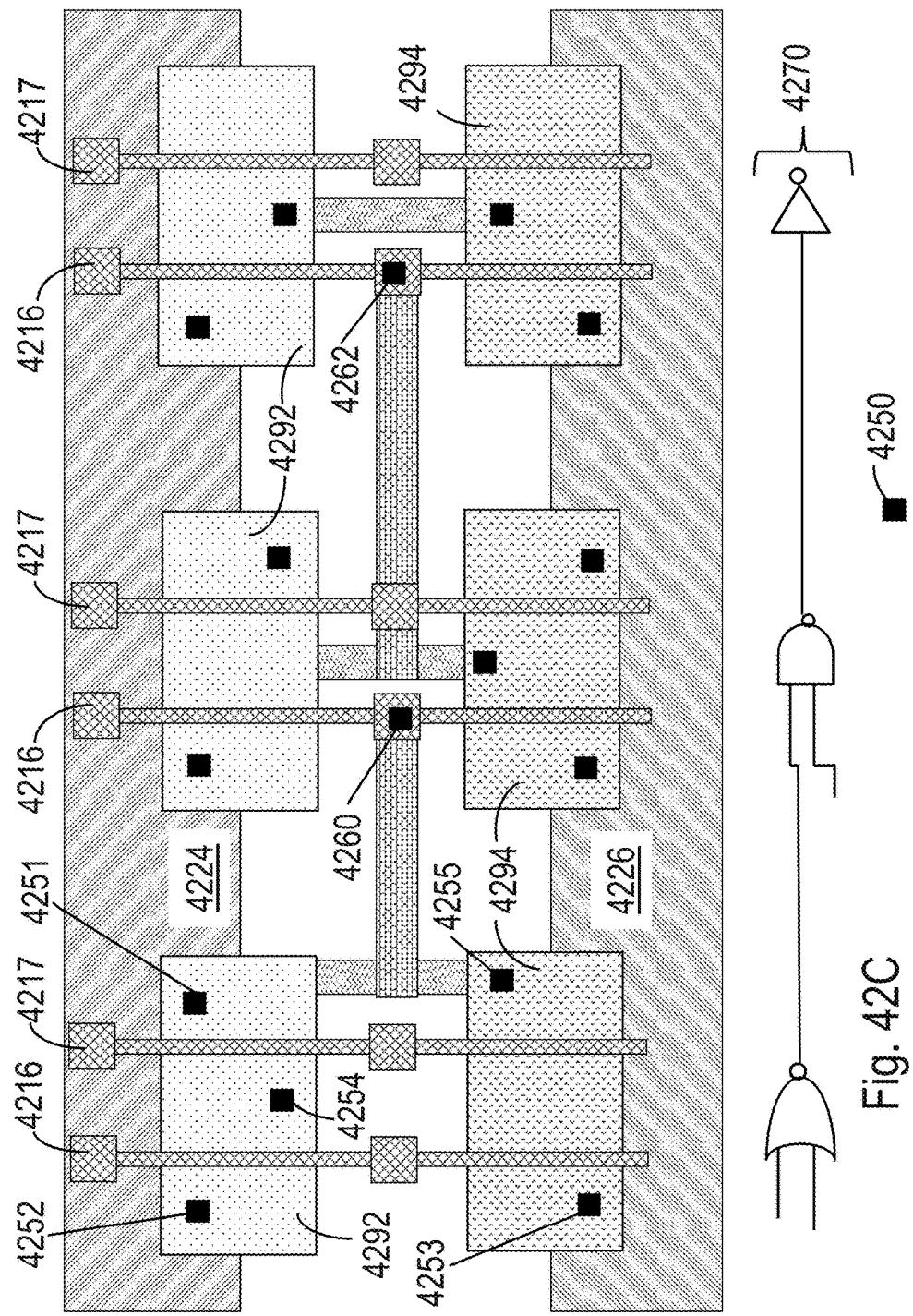

As illustrated in FIG. 42C, generic connections 4250 may be formed to electrically connect the transistors of FIG. 42A to the underlying connection layer or layers presented in FIG. 42B. Generic connections 4250 may also be called contacts as they represent the contact made between the interconnection layers and the transistors themselves, and may also be called TLVs (Thru Layer Vias), as described elsewhere herein. The diameter of the connections, such as, for example, generic connections 4250, may be, for example, less than 1 um, less than 100 nm, or less than 40 nm, and the alignment of the connections to the underlying interconnection layer or layers or to the transistors may be less than 40 nm or even less than 10 nm, and may utilize conventional industry lithography tools.

The process flow may involve first processing the connection layers such as presented in FIG. 42B. Connections such as power busses ground-'Vss' power grid 4224 and a power-'Vdd' power grid 4226 and macro cell connections segments NOR gate macro-cell connection 4228, NAND gate macro-cell connection 4230, and Inverter macro-gate cell connection 4232 and routing segments routing connection 4240 and additional routing connection 4242, could substantially all be processed at the top metal interconnect layers of the base wafer, and accordingly be aligned to the base wafer alignment marks with far less than 40 nm alignment error. An oxide layer could be deposited and a layer of single crystal silicon could be transferred over using a process flow such as been described herein or in referenced patents and patent applications. And may be followed by processing steps for forming transistors such as presented in FIG. 42A (N transistor pair 4212 and P transistor pair 4214) aligned to the base wafer alignment marks using a process flow such as been described herein or in reference patents and patent applications. The monolithic 3D transistors in the transistor layer could be made by any of the techniques presented herein or other techniques. The connections between the transistors and the underlying connection layers may be processed. For example, as illustrated in FIG. 42C (now viewing from the topside, in the direction opposite that of FIG. 42B), generic connections 4250 may be specifically employed as power grid connections, such as Vss connection 4252 and second Vss connection 4251, and Vdd connection 4253. Further, generic connections 4250 may be specifically employed as macro-cell connections, such as macro-cell connection 4254 and second macro-cell connection 4255, connecting/coupling a specific location of common diffusion 4292 to a specific location of common diffusion 4294 with NOR gate macro-cell connection 4228. Moreover, generic connections 4250 may be specifically employed as connections to routing, such as, for example, routing connection 4260 and second routing connection 4262. FIG. 42C also includes an illustration of the logic schematic 4270 represented by the physical illustrations of FIG. 42A, FIG. 42B and FIG. 42C.

Figure 42D:
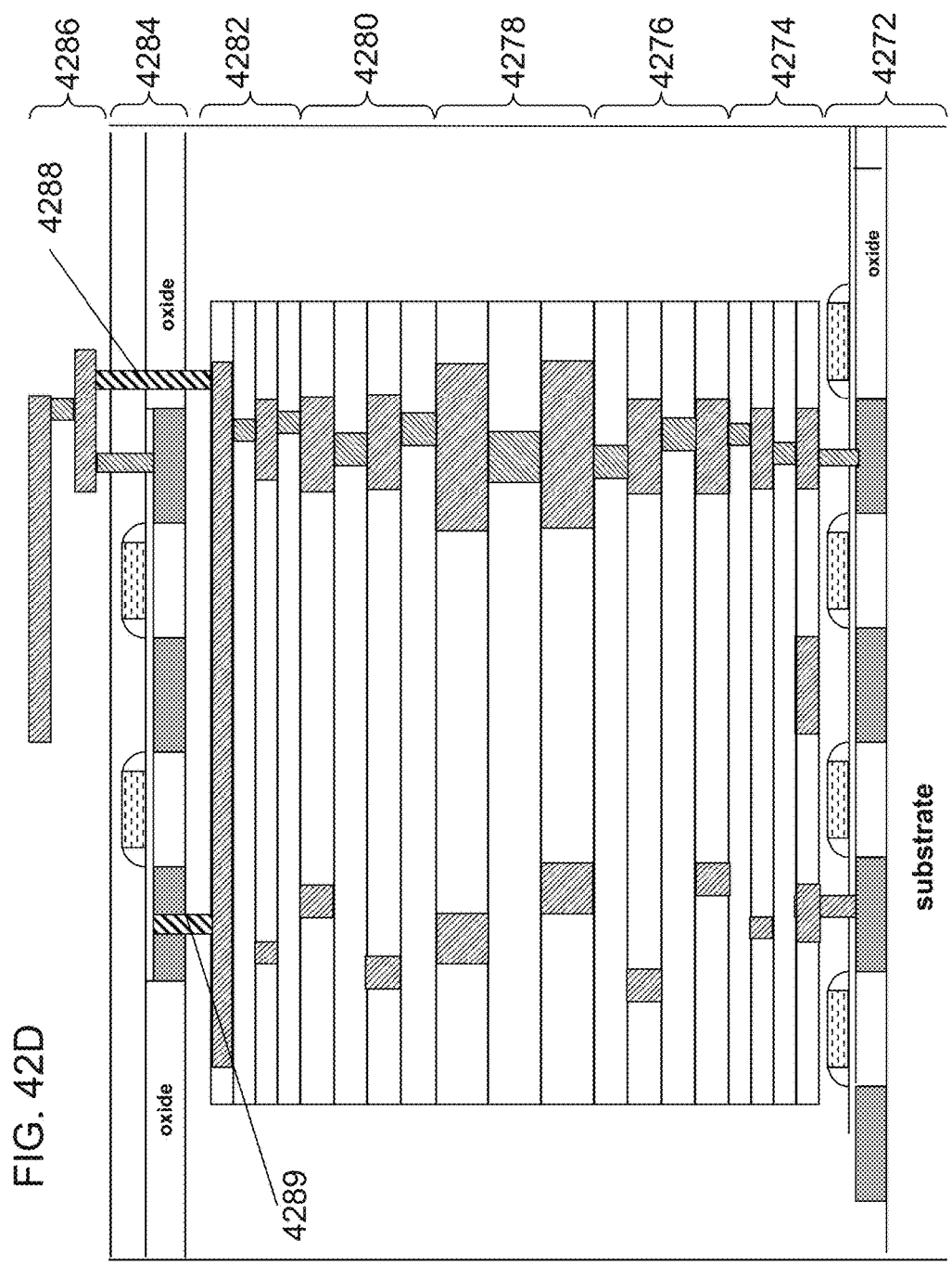

As illustrated in FIG. 42D, and with reference to the discussion of at least FIGS. 47A and 47B of U.S. patent application Ser. No. 13/441,923 and FIGS. 59 and 60 of U.S. Pat. No. 8,273,610, thru silicon connection 4289, which may be the generic connections 4250 previously discussed, may provide connection from the transistor layer 4284 to the underlying interconnection layer 4282. Underlying interconnection layer 4282 may include one or more layers of '1×' thickness metals, isolations and spacing as described with respect to the referenced FIGS. 47A&B and FIGS. 59 and 60. Alternatively, thru layer connection 4288, which may be the generic connections 4250 previously discussed, may provide connection from the transistor layer 4284 to the underlying interconnection layer 4282 by connecting to the above interconnection layer 4286 which connects to the transistor layer 4284. Further connection to the substrate transistor layer 4272 may utilize making a connection from underlying interconnection layer 4282 to 2× interconnection layer 4280, which may be connected to 4× interconnection layer 4278, which may be connected to substrate 2× interconnection layer 4276, which may be connected to substrate 1× interconnection layer 4274, which may connect to substrate transistor layer 4272. Underlying interconnection layer 4282, above interconnection layer 4286, 2× interconnection layer 4280, 4× interconnection layer 4278, substrate 2× interconnection layer 4276, and substrate 1× interconnection layer 4274 may include one or more interconnect layers, each of which may include metal interconnect lines, vias, and isolation materials. As described in detail in the referenced FIGS. 47A&B and FIGS. 59 and 60 discussions, 1× layers may be thinner than 2× layers, and 2× layers may be thinner than 4× layers.

Figure 43B:
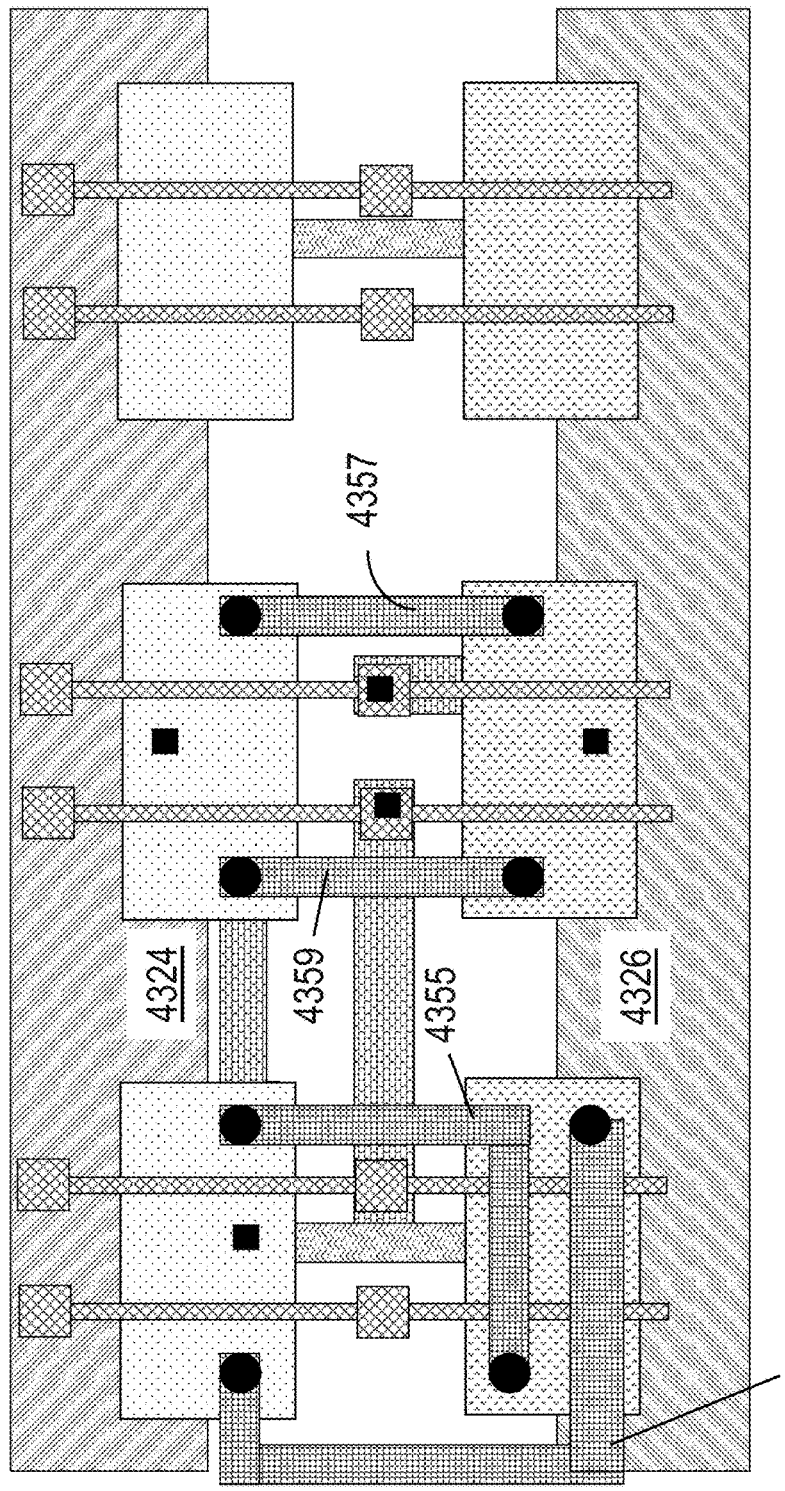

FIG. 43A and FIG. 43B illustrate additional exemplary circuits which may utilize both under transistor layer connections and over transistor layer connections. The circuits may, for example, use the array structure of FIG. 42A. N and P transistor pair element 4318 may be configured as a multiplexer cell, and N and P transistor pair second element 4320 may be configured as an inverter driving inverter. FIG. 43A illustrates the under transistors layer connections. FIG. 43A and FIG. 43B use the same drawing symbols as was used in FIG. 42B and FIG. 42C. Power buses ground-'Vss' power grid 4324 and a power-'Vdd' power grid 4326 provide power and connection segment 4328 is part of the macro-cell library for implementing a multiplexer gate. Noise on the power grids, such as the 'Vss' power grid 4324 and a power-'Vdd' power grid 4326, may be mitigated by attaching/connecting decoupling capacitors onto the power conducting lines of the grids. The decoupling caps may include, for example, trench capacitors such as described by Pei, C., et al., "A novel, low-cost deep trench decoupling capacitor for high-performance, low-power bulk CMOS applications," ICSICT ($9^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Second connection segment 4330, third connection segment 4332, and fourth connection segment 4340 are part of the routing connections forming the circuit. The specific circuit illustrated by FIG. 43A and FIG. 43B could part of a larger macro-cell of half a flip-flop. In such case the connections second connection segment 4330, third connection segment 4332, and fourth connection segment 4340 may be part of the macro-cell as well. FIG. 43B illustrates the connections over the transistor layer as well as the connections to below the transistor layer. Connections first macro-cell above connection 4353, second macro-cell above connection 4355, third macro-cell above connection 4357, and fourth macro-cell above connection 4359 may be over the transistor layer connections used as part of the macro-cell library. Symbol 4350 indicates a contact from the over the transistor layer connection and the transistor structure underneath it. Symbol 4351 indicates a contact from the under the transistor layer connection and the transistor structure above it. Many of the connections are dedicated solely for connections between the transistor on that layer to other transistor on the same layer such as first macro-cell above connection 4353, second macro-cell above connection 4355, third macro-cell above connection 4357, and connection segment 4328, second connection segment 4330, third connection segment 4332, and fourth connection segment 4340. The processing of connections over the transistor layer would be after the formation of the transistor layer and the process steps related to the formation of those transistors. The over transistor layer connections metal layers may be constructed thicker and wider, and hence have a higher current conduction capacity, than the under the transistor layer connections.

The design flow of a 3D IC that incorporates the "below-transistor" connections, such as are described for example, with respect to FIGS. 42A-D, would need to be modified accordingly. The chip power grid may need to be designed to include the below-transistors grid and connection of this grid to the overall chip power grid structure. The macro-cell library may need to be designed to include below-transistor connections. The Place and Route tool may need to be modified to make use of the below-transistor routing resources. The resources might include the power grid aspect, the macro-cell aspect, the allocation of routing resources underneath (below), heat transfer considerations, decoupling capacitor placement in position and layer, and the number of layers underneath that may be allocated for the routing task. Typically, at least two interconnection layers underneath may be allocated.

For the case of connecting below-transistor routing layers to the conventional above-transistor routing layers, each connection may pass through generic connections 4250 to cross the transistor-forming layers. Such contacts may already exist for many nets that directly connect to transistor sources, drains, and gates; and hence, such nets can be relatively freely routed using both below- and above-transistors interconnection routing layers. Other nets that may not normally include generic connections 4250 in their structure may be routed on either side of the transistor layer but not both, as crossing the transistor layer may incur creating additional generic connections 4250; and hence, potentially congest the transistor layer.

Consequently, a good approach for routing in such a situation may be to use the below-transistor layers for short-distance wiring and create wiring library macros that may tend to be short-distanced in nature. Macro outputs, on the other hand, frequently need to additionally connect to remote locations and should be made available at contacts, such as generic connections 4250, that are to be used on both sides of the transistor layer. When routing, nets that are targeted for both below and above the transistor layer and that do not include contacts such as generic connections 4250 may need special prioritized handling that may split them into two or more parts and insert additional contact[s] in the transistor layer before proceeding to route the design. An additional advantage of the availability and use of an increased number of routing layers on both sides of the transistor layer is the router's greater ability to use relaxed routing rules while not increasing routing congestion. For example, relaxing routing rules such as wider traces, wherein 1.5× or more the width of those traces used for the same layer in one sided routing for the same process node could be utilized in the two sided routing (above and below transistor layer), and may result in reduced resistance; and larger metal spacing, wherein 1.5× or more the space of those spaces used for the same layer in one sided routing for the same process node, could be utilized in the two sided routing (above and below transistor layer), and may result in decreased crosstalk and capacitance.

Persons of ordinary skill in the art will appreciate that the illustrations in FIGS. 42A through 42D and FIGS. 43A and B are exemplary only and are not drawn to scale. Such skilled persons will further appreciate that many variations are possible such as, for example, the interconnection layer or layer below or above the transistor layer may also be utilized for connection to other strata and transistor layers, not just the transistor layer that is between the above and below interconnection layer or layers. Furthermore, connections made directly underneath and to common diffusions, such as common diffusion 4292 and second common diffusion 4294, may be problematic in some process flows and TLVs through the adjacent STI (shallow trench isolation) area with routing thru the first layer of interconnect above the transistor layer to the TLV may instead be utilized. Moreover, silicon connection 4289 may be more than just a diffusion connection such as Vss connection 4252, second Vss connection 4251, and Vdd connection 4253, such as, for example, macro-cell connection 4254, second macro-cell connection 4255, routing connection 4260, or second routing connection 4262. Furthermore, substrate transistor layer 4272 may also be a transistor layer above a lower transistor layer in a 3D IC stack. Many other modifications within the scope of the invention will suggest themselves to such skilled persons after reading this specification. Thus the invention is to be limited only by the appended claims.

Figure 44:
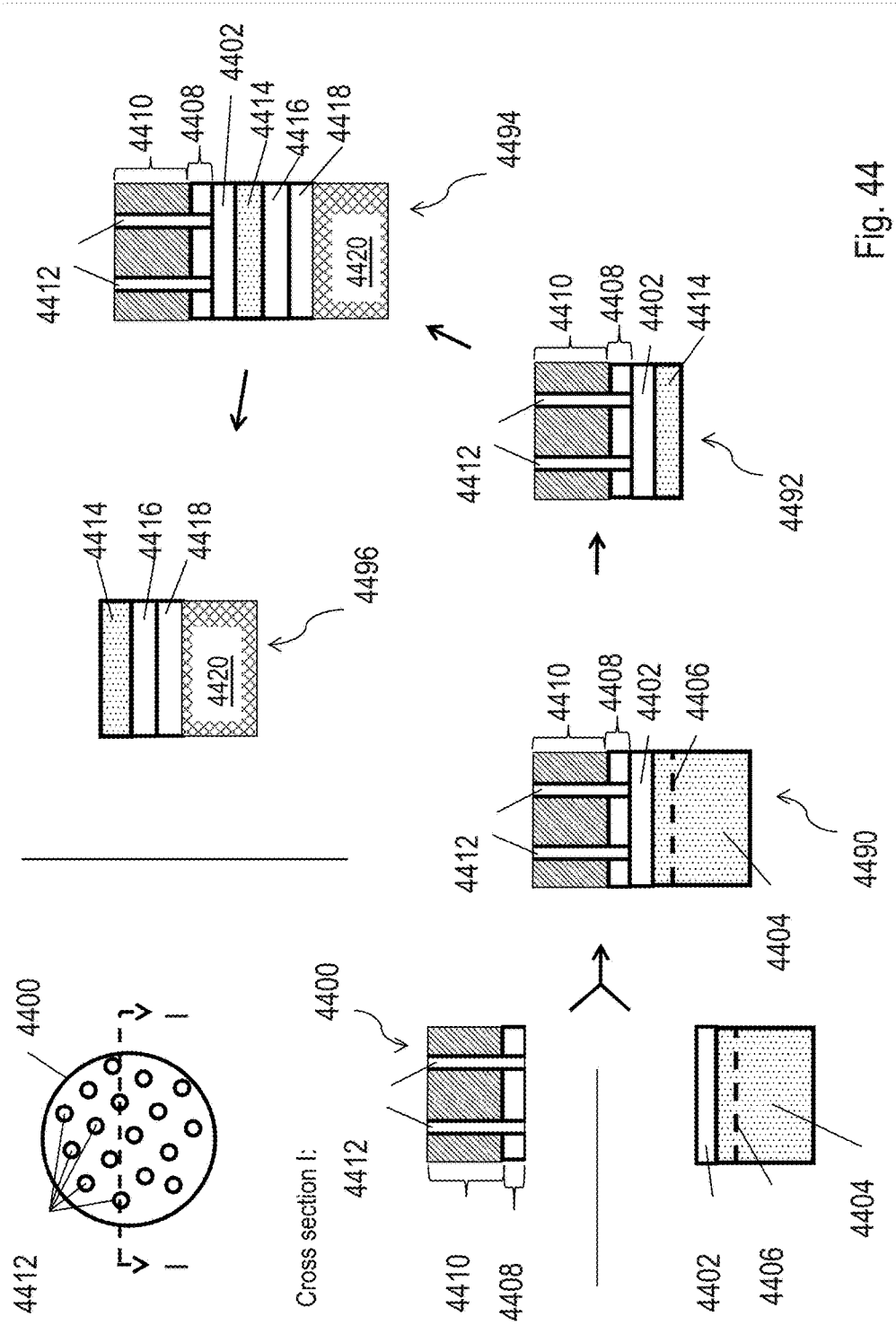
FIG. 44 is an exemplary drawing illustration of a method to repair defects or anneal a transferred layer utilizing a carrier wafer or substrate.

Ion-cut may need anneals to remove defects at temperatures higher than 400° C., so techniques to remove defects without the acceptor wafer seeing temperatures higher than 400° C. may be desirable. FIG. 44 illustrates an embodiment of this invention, wherein such a technique is described. As illustrated in FIG. 44, perforated carrier substrate 4400 may include perforations 4412, which may cover a portion of the entire surface of perforated carrier substrate 4400. The portion by area of perforations 4412 that may cover the entire surface of perforated carrier substrate 4400 may range from about 5% to about 60%, typically in the range of about 10-20%. The nominal diameter of perforations 4412 may range from about 1 micron to about 200 microns, typically in the range of about 5 microns to about 50 microns. Perforations 4412 may be formed by lithographic and etching methods or by using laser drilling. As illustrated in cross section I of FIG. 44, perforated carrier substrate 4400 may include perforations 4412 which may extend substantially through carrier substrate 4410 and carrier substrate bonding oxide 4408. Carrier substrate 4410 may include, for example, monocrystalline silicon wafers, high temperature glass wafers, germanium wafers, InP wafers, or high temperature polymer substrates. Perforated carrier substrate 4400 may be utilized as and called carrier wafer or carrier substrate or carrier herein this document or referenced patents or patent applications. Desired layer transfer substrate 4404 may be prepared for layer transfer by ion implantation of an atomic species, such as Hydrogen, which may form layer transfer demarcation plane 4406, represented by a dashed line in the illustration. Layer transfer substrate bonding oxide 4402 may be deposited on top of desired layer transfer substrate 4404. Layer transfer substrate bonding oxide 4402 may be deposited at temperatures below about 250° C. to minimize out-diffusion of the hydrogen that may have formed the layer transfer demarcation plane 4406. Layer transfer substrate bonding oxide 4402 may be deposited prior to the ion implantation, or may utilize a preprocessed oxide that may be part of desired layer transfer substrate 4404, for example, the ILD of a gate-last partial transistor layer. Desired layer transfer substrate 4404 may include any layer transfer devices and/or layer or layers contained herein this document or referenced patents or patent applications, for example, the gate-last partial transistor layers, DRAM Si/SiO$_2$ layers, multi-layer doped structures, sub-stack layers of circuitry, RCAT doped layers, or starting material doped monocrystalline silicon. Carrier substrate bonding oxide 4408 and layer transfer substrate bonding oxide 4402 may be prepared for oxide to oxide bonding, for example, for low temperature (less than about 400° C.) or high temperature (greater than about 400° C.) oxide to oxide bonding, as has been described elsewhere herein and in referenced patents or patent applications.

As further illustrated in FIG. 44, perforated carrier substrate 4400 may be oxide to oxide bonded to desired layer transfer substrate 4404 at carrier substrate bonding oxide 4408 and layer transfer substrate bonding oxide 4402, thus forming cleaving structure 4490. Cleaving structure 4490 may include layer transfer substrate bonding oxide 4402, desired layer transfer substrate 4404, layer transfer demarcation plane 4406, carrier substrate bonding oxide 4408, carrier substrate 4410, and perforations 4412.

As further illustrated in FIG. 44, cleaving structure 4490 may be cleaved at layer transfer demarcation plane 4406, removing a portion of desired layer transfer substrate 4404, and leaving desired transfer layer 4414, and may be defect annealed, thus forming defect annealed cleaved structure 4492. Defect annealed cleaved structure 4492 may include layer transfer substrate bonding oxide 4402, carrier substrate bonding oxide 4408, carrier substrate 4410, desired transfer layer 4414, and perforations 4412. The cleaving process may include thermal, mechanical, or other methods described elsewhere herein or in referenced patents or patent applications. Defect annealed cleaved structure 4492 may be annealed so to repair the defects in desired transfer layer 4414. The defect anneal may include a thermal exposure to temperatures above about 400° C. (a high temperature thermal anneal), including, for example, 600° C., 800° C., 900° C., 1000° C., 1050° C., 1100° C. and/or 1120° C. The defect anneal may include an optical anneal, including, for example, laser anneals (such as short wavelength pulsed lasers), Rapid Thermal Anneal (RTA), flash anneal, and/or dual-beam laser spike anneals. The defect anneal ambient may include, for example, vacuum, high pressure (greater than about 760 torr), oxidizing atmospheres (such as oxygen or partial pressure oxygen), and/or reducing atmospheres (such as nitrogen or argon). The defect anneal may include Ultrasound Treatments (UST). The defect anneal may include microwave treatments. The defect anneal may include other defect reduction methods described herein this document or in U.S. Pat. No. 8,273,610 incorporated herein by reference. The defect anneal may repair defects, such as those caused by the ion-cut ion implantation, in transistor gate oxides or junctions and/or other devices such as capacitors which may be pre-formed and residing in desired transfer layer 4414 at the time of the ion-cut implant. The exposed ("bottom") surface of desired transfer layer 4414 may be thermally oxidized and/or oxidized using radical oxidation to form defect annealed cleaved structure bonding oxide 4416. The techniques may smoothen the surface and reduce the surface roughness after cleave.

As illustrated in FIG. 44, defect annealed cleaved structure 4492 may be oxide to oxide bonded to acceptor wafer or substrate 4420, thus forming 3D stacked layers with carrier wafer structure 4494. 3D stacked layers with carrier wafer structure 4494 may include acceptor wafer or substrate 4420, acceptor bonding oxide 4418, defect annealed cleaved structure bonding oxide 4416, desired transfer layer 4414, layer transfer substrate bonding oxide 4402, carrier substrate bonding oxide 4408, carrier substrate 4410, and perforations 4412. Acceptor bonding oxide 4418 may be deposited onto acceptor wafer or substrate 4420 and may be prepared for oxide to oxide bonding, for example, for low temperature (less than about 400° C.) or high temperature (greater than about 400° C.) oxide to oxide bonding, as has been described elsewhere herein or in referenced patents or patent applications. Defect annealed cleaved structure bonding oxide 4416 may be prepared for oxide to oxide bonding, for example, for low temperature (less than about 400° C.) or high temperature (greater than about 400° C.) oxide to oxide bonding, as has been described elsewhere herein or in referenced patents or patent applications. Acceptor wafer or substrate 4420 may include layer or layers, or regions, of preprocessed circuitry, such as, for example, logic circuitry, microprocessors, MEMS, circuitry comprising transistors of various types, and other types of digital or analog circuitry including, but not limited to, the various embodiments described herein or in U.S. Pat. No. 8,273,610 incorporated herein by reference, such as gate last transistor formation. Acceptor wafer or substrate 4420 may include preprocessed metal interconnects including copper, aluminum, and/or tungsten, but not limited to, the various embodiments described herein or in referenced patents or patent applications, such as, for example, peripheral circuitry substrates for 3D DRAM or metal strips/pads for 3D interconnection with TLVs or TSVs. Acceptor wafer or substrate 4420 may include layer or layers of monocrystalline silicon that may be doped or undoped, including, but not limited to, the various embodiments described herein or in referenced patents or patent applications, such as, for example, for 3D DRAM, 3D NAND, or 3D RRAM formation. Acceptor wafer or substrate 4420 may include relatively inexpensive glass substrates, upon which partially or fully processed solar cells formed in monocrystalline silicon may be bonded. Acceptor wafer or substrate 4420 may include alignment marks, which may be utilized to form transistors in layers in the 3D stack, for example, desired transfer layer 4414, and the alignment marks may be used to form connections paths from transistors and transistor contacts within desired transfer layer 4414 to acceptor substrate circuitry or metal strips/pads within acceptor wafer or substrate 4420, by forming, for example, TLVs or TSVs. Acceptor bonding oxide 4418 and defect annealed cleaved structure bonding oxide 4416 may form an isolation layer between desired transfer layer 4414 and acceptor wafer or substrate 4420.

As illustrated in FIG. 44, carrier substrate 4410 with carrier substrate bonding oxide 4408 and perforations 4412, may be released ('lifted off') from the bond with acceptor wafer or substrate 4420, acceptor bonding oxide 4418, defect annealed cleaved structure bonding oxide 4416, desired transfer layer 4414, and layer transfer substrate bonding oxide 4402, thus forming 3D stacked layers structure 4496. 3D stacked layers structure 4496 may include acceptor wafer or substrate 4420, acceptor bonding oxide 4418, defect annealed cleaved structure bonding oxide 4416, and desired transfer layer 4414. The bond release, or debond, may utilize a wet chemical etch of the bonding oxides, such as layer transfer substrate bonding oxide 4402 and carrier substrate bonding oxide 4408, which may include, for example, 20:1 buffered H2O:HF, or vapor HF, or other debond/release etchants that may selectively etch the bonding oxides over the desired transfer layer 4414 and acceptor wafer or substrate 4420 material (which may include monocrystalline silicon). The debond/release etchant may substantially access the bonding oxides, such as layer transfer substrate bonding oxide 4402 and carrier substrate bonding oxide 4408, by travelling through perforations 4412. The debond/release etchant may be heated above room temperature, for example 50° C., to increase etch rates. The wafer edge sidewalls of acceptor bonding oxide 4418, defect annealed cleaved structure bonding oxide 4416, desired transfer layer 4414, and acceptor wafer or substrate 4420 may be protected from the debond/release etchant by a sidewall resist coating or other materials which do not etch quickly upon exposure to the debond/release etchant, such as, for example, silicon nitride or organic polymers such as wax or photoresist. 3D stacked layers structure 4496 may continue 3D processing the defect annealed desired transfer layer 4414 and acceptor wafer or substrate 4420 including, but not limited to, the various embodiments described herein or in referenced patents or patent applications, such as U.S. Pat. No. 8,273,610 incorporated herein by reference such as stacking Si/SiO$_2$ layers as in 3D DRAM, 3D NAND, or RRAM formation, RCAT formation, continuous array and FPGA structures, gate array, memory blocks, solar cell completion, or gate last transistor completion formation, and may include forming transistors, for example, CMOS p-type and n-type transistors. Continued 3D processing may include forming junction-less transistors, JFET, replacement gate transistors, thin-side-up transistors, double gate transistors, horizontally oriented transistors, finfet transistors, JLRCAT, DSS Schottky transistors, and/or trench MOSFET transistors as described by various embodiments herein. Continued 3D processing may include the custom function etching for a specific use as described, for example, in FIG. 183 and FIG. 84 of U.S. Pat. No. 8,273,610 incorporated herein by reference, and may include etching to form scribelines or dice lines. Continued 3D processing may include etching to form memory blocks, for example, as described in FIGS. 195, 196, 205-210 of U.S. Pat. No. 8,273,610 incorporated herein by reference. Continued 3D processing may include forming metal interconnects, such as, for example, aluminum or copper, within or on top of the defect annealed desired transfer layer 4414, and may include forming connections paths from transistors and transistor contacts within desired transfer layer 4414 to acceptor substrate circuitry or metal strips/pads within acceptor wafer or substrate 4420, by forming, for example, TLVs or TSVs. Thermal contacts which may conduct heat but not electricity may be formed and utilized as described herein and in FIG. 162 through FIG. 166 of U.S. Pat. No. 8,273,610 incorporated herein by reference. Carrier substrate 4410 with perforations 4412 may be used again ('reused' or 'recycled') for the defect anneal process flow.

Persons of ordinary skill in the art will appreciate that the illustrations in FIG. 44 are exemplary and are not drawn to scale. Such skilled persons will further appreciate that many variations may be possible such as, for example, perforations 4412 may evenly cover the entire surface of perforated carrier substrate 4400 with substantially equal distances between perforations 4412, or may have unequal spacing and coverage, such as, less or more density of perforations 4412 near the wafer edge. Moreover, perforations 4412 may extend substantially through carrier substrate 4410 and not extend through carrier substrate bonding oxide 4408. Further, perforations 4412 may be formed in perforated carrier substrate 4400 by methods, for example, such as laser drilling or ion etching, such as Reactive Ion Etching (RIE). Moreover, the cross sectional cut shape of perforations 4412 may be tapered, with the widest diameter of the perforation towards where the etchant may be supplied, which may be accomplished by, for example, inductively coupled plasma (ICP) etching or vertically controlled shaped laser drilling. Further, perforations 4412 may have top view shapes other than circles; they may be oblong, ovals, squares, or rectangles for example, and may not be of uniform shape across the face of perforated carrier substrate 4400. Furthermore, perforations 4412 may include a material coating, such as thermal oxide, to enhance wicking of the debond/release etchant, and may include micro-roughening of the perforation interiors, by methods such as plasma or wet silicon etchants or ion bombardment, to enhance wicking of the debond/release etchant. Moreover, the thickness of carrier substrate 4410, such as, for example, the 750 micron nominal thickness of a 300 mm single crystal silicon wafer, may be adjusted to optimize the technical and operational trades of attributes such as, for example, debond etchant access and debond time, strength of carrier substrate 4410 to withstand thin film stresses, CMP shear forces, and the defect anneal thermal stresses, carrier substrate 4410 reuse/recycling lifetimes, and so on. Furthermore, preparation of desired layer transfer substrate 4404 for layer transfer may utilize flows and processes described herein this document. Moreover, bonding methods other than oxide to oxide, such as oxide to metal (Titanium/TiN) to oxide, or nitride to oxide, may be utilized. Further, acceptor wafer or substrate 4420 may include a wide variety of materials and constructions, for example, from undoped or doped single crystal silicon to 3D sub-stacks. Furthermore, the exposed ("bottom") surface of desired transfer layer 4414 may be smoothed with techniques such as gas cluster ion beams, or radical oxidations utilizing, for example, the TEL SPA tool. Further, the exposed ("bottom") surface of desired transfer layer 4414 may be smoothed with "epi smoothing' techniques, whereby, for example, high temperature (about 900-1250° C.) etching with hydrogen or HCL may be coupled with epitaxial deposition of silicon. Moreover, the bond release etchant may include plasma etchant chemistries that are selective etchants to oxide and not silicon, such as, for example, $CHF_3$ plasmas. Furthermore, a combination of etchant release and mechanical force may be employed to debond/release the carrier substrate 4410 from acceptor wafer or substrate 4420 and desired transfer layer 4414. Moreover, carrier substrate 4410 may be thermally oxidized before and/or after deposition of carrier substrate bonding oxide 4408 and/or before and/or after perforations 4412 are formed. Further, the total oxide thickness of carrier substrate bonding oxide 4408 plus layer transfer substrate bonding oxide 4402 may be adjusted to make technical and operational trades between attributes, for example, such as debond time, carrier wafer perforation spacing, and thin film stress, and the total oxide thickness may be about 1 micron or about 2 micron or about 5 microns or less than 1 micron. Moreover, the composition of carrier substrate bonding oxide 4408 and layer transfer substrate bonding oxide 4402 may be varied to increase lateral etch time; for example, by changing the vertical and/or lateral oxide density and/or doping with dopants carbon, boron, phosphorous, or by deposition rate and techniques such as PECVD, SACVD, APCVD, SOG spin & cure, and so on. Furthermore, carrier substrate bonding oxide 4408 and layer transfer substrate bonding oxide 4402 may include multiple layers of oxide and types of oxides (for example 'low-k'), and may have other thin layers inserted, such as, for example, silicon nitride, to speed lateral etching in HF solutions, or Titanium to speed lateral etch rates in hydrogen peroxide solutions. Further, the wafer edge sidewalls of acceptor bonding oxide 4418 and defect annealed cleaved structure bonding oxide 4416 may not need debond/release etchant protection; depending on the design and placement of perforations 4412, design/layout keep-out zones and edge bead considerations, and the type of debond/release etchant, the wafer edge undercut may not be harmful. Moreover, a debond/release etchant resistant material, such as silicon nitride, may be deposited over substantially all or some of the exposed surfaces of acceptor wafer or substrate 4420 prior to deposition of acceptor bonding oxide 4418. Further, desired layer transfer substrate 4404 may be an SOI or GeOI substrate base and, for example, an ion-cut process may be used to form layer transfer demarcation plane 4406 in the bulk substrate of the SOI wafer and cleaving proceeds as described in FIG. 44 of U.S. patent application Ser. No. 13/441,923 and U.S. Patent Publication 2012/0091587, or after bonding with the carrier the SOI wafer may be sacrificially etched/CMP'd off with no ion-cut implant and the damage repair may not be needed (described elsewhere herein). Many other modifications within the scope of the illustrated embodiments of the invention will suggest themselves to such skilled persons after reading this specification. Thus the invention is to be limited only by the appended claims.

The damage of the to be transferred crystalline layer caused by the ion-cut implantation traversing the layer may be thermally annealed, as described in at least FIG. 44 and associated specification herein, or may be optically annealed, as described in at least FIGS. 33, 34, 45, 46 and 47 and associated specification herein, or may be annealed by other methods such as ultrasonic or megasonic energy, as described herein and in U.S. Pat. No. 8,273,610 and U.S. patent application Ser. No. 13/441,923. These techniques repair the ion-implantation and layer transfer damage that is within the transferred crystalline layer or layers. An embodiment of the invention is to perform the layer transfer of the ion-cut crystalline silicon layer, clean the surface of the transferred crystalline layer, then deposit a thin layer of amorphous silicon, and utilize optical annealing to form a layer or layer of substantially monocrystalline silicon in which the devices may be made with high quality, or the crystalized a-Si layer may be utilized as a raised source drain of high dopant concentration.

As illustrated in FIG. 48A, an doped or undoped substrate donor wafer 4800 may be processed to in preparation for layer transfer by ion-cut of a layer of monocrystalline silicon. The structure may include a wafer sized layer of doping across the wafer, N-doped layer 4802. The N– doped layer 4802 may be formed by ion implantation and thermal anneal as described elsewhere herein and may include a crystalline material, for example, mono-crystalline (single crystal) silicon. N– doped layer 4802 may be very lightly doped (less than 1e15 atoms/cm$^3$) or lightly doped (less than 1e16 atoms/cm$^3$) or nominally un-doped (less than 1e14 atoms/cm$^3$). N– doped layer 4802 may have additional ion implantation and anneal processing to provide a different dopant level than N– substrate donor wafer 4800 and may have graded or various layers of doping concentration. The layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike). The top surface of N– substrate donor wafer 4800 layer stack may be prepared for oxide wafer bonding with a deposition of an oxide or by thermal oxidation of N– doped layer 4802 to form oxide layer 4880. A layer transfer demarcation plane (shown as dashed line) 4899 may be formed by hydrogen implantation or other methods as described in the incorporated references. The N– substrate donor wafer 4800, such as surface 4882, and acceptor wafer 4810 may be prepared for wafer bonding as previously described and low temperature (less than approximately 400° C.) bonded. Acceptor wafer 4810, as described herein and in the incorporated references, may include, for example, transistors, circuitry, and metal, such as, for example, aluminum or copper, interconnect wiring, a metal shield/heat sink layer or layers, and thru layer via metal interconnect strips or pads. Acceptor wafer 4810 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 4810 may include transistors such as, for example, MOSFETS, FD-MOSFETS, FinFets, FD-RCATs, BJTs, HEMTs, and/or HBTs. The portion of the N– doped layer 4802 and the N– substrate donor wafer 4800 that may be above (when the layer stack is flipped over and bonded to the acceptor wafer 4810) the layer transfer demarcation plane 4899 may be removed by cleaving or other low temperature processes as described in the incorporated references, such as, for example, ion-cut with mechanical or thermal cleave, thus forming remaining N– layer 4803.

As illustrated in FIG. 48B, oxide layer 4880 and remaining N– layer 4803 have been layer transferred to acceptor wafer 4810. The top surface of remaining N– layer 4803 may be chemically or mechanically polished, and/or may be thinned by low temperature oxidation and strip processes, such as the TEL SPA tool radical oxidation and HF:H$_2$O solutions as described herein and in referenced patents and patent applications. Thru the processing, the wafer sized layer remaining N– layer 4803 could be thinned from its original total thickness, and its final total thickness could be in the range of about 3 nm to about 30 nm, for example, 3 nm, 5 nm, 7 nm, 10 nm, 15 nm, 20 nm, or 30 nm. Remaining N– layer 4803 may have a thickness that may allow full gate control of channel operation when the transistor, for example a JFET (or JLT) or FD-MOSFET, is substantially completely formed. Acceptor wafer 4810 may include one or more (two are shown in this example) shield/heat sink layers 4888, which may include materials such as, for example, Aluminum, Tungsten (a refractory metal), Copper, silicon or cobalt based silicides, or forms of carbon such as carbon nanotubes, and may be layered itself as described herein FIG. 50. Each shield/heat sink layer 4888 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 4888 may include isolation openings 4887, and alignment mark openings (not shown), which may be utilized for short wavelength alignment of top layer (donor) processing to the acceptor wafer alignment marks (not shown). Shield/heat sink layer 4888 may include one or more shield path connects 4885 and shield path vias 4883. Shield path via 4883 may thermally and/or electrically couple and connect shield path connect 4885 to acceptor wafer 4810 interconnect metallization layers such as, for example, exemplary acceptor metal interconnect 4881 (shown). Shield path connect 4885 may also thermally and/or electrically couple and connect each shield/heat sink layer 4888 to the other and to acceptor wafer 4810 interconnect metallization layers such as, for example, acceptor metal interconnect 4881, thereby creating a heat conduction path from the shield/heat sink layer 4888 to the acceptor substrate 4895, and a heat sink (shown in FIG. 48G.). Isolation openings 4887 may include dielectric materials, similar to those of BEOL isolation 4896. Acceptor wafer 4810 may include first (acceptor) layer metal interconnect 4891, acceptor wafer transistors and devices 4893, and acceptor substrate 4895. After cleaning the top surface of remaining N– layer 4803, a layer of amorphous silicon 4866 may be deposited. Amorphous silicon layer 4866 may have a thickness that could be in the range of about 3 nm to about 300 nm, for example, 3 nm, 5 nm, 7 nm, 10 nm, 15 nm, 20 nm, 30 nm, 50 nm, 100 nm, 200 nm or 300 nm. Using the single crystal nature of remaining N– layer 4803, amorphous silicon layer 4866 may be crystallized in an epitaxial fashion by exposure to an optical beam, for example, to short wavelength pulse lasers as described elsewhere herein. Amorphous silicon layer 4866 may be doped in-situ during deposition, or may be ion-implanted after deposition and dopants activated during the optical exposure. Further, amorphous silicon layer 4866 may be first crystallized and then ion-implanted with dopants, and then those dopants activated with an additional optical beam anneal. Optical anneal beams, such as exemplary crystallization/annealing ray 4865, may be optimized to focus light absorption and heat generation within or at the surface of amorphous silicon layer 4866 to promote the epitaxial regrow into a layer of doped single crystal silicon. The laser assisted crystallization/annealing with the absorbed heat generated by exemplary crystallization/annealing ray 4865 may also include a pre-heat of the bonded stack to, for example, about 100° C. to about 400° C., and/or a rapid thermal spike to temperatures above about 200° C. to about 600° C. Additionally, absorber layers or regions, for example, including amorphous carbon, amorphous silicon, and phase changing materials (see U.S. Pat. Nos. 6,635,588 and 6,489,821 to Hawryluk et al. for example), may be utilized to increase the efficiency of the optical energy capture in conversion to heat for the desired annealing or activation processes. Moreover, multiple pulses of the laser may be utilized to improve the anneal, activation, and yield of the process. Reflected ray 4863 may be reflected and/or absorbed by shield/heat sink layer 4888 regions thus blocking the optical absorption of ray blocked metal interconnect 4881. Heat generated by absorbed photons from, for example, crystallization/annealing ray 4865 may also be absorbed by shield/heat sink layer 4888 regions and dissipated laterally and may keep the temperature of underlying metal layers, such as metal interconnect 4881, and other metal layers below it, cooler and prevent damage. Shield/heat sink layer 4888 and associated dielectrics may laterally spread and conduct the heat generated by the topside defect anneal, and in conjunction with the dielectric materials (low heat conductivity) above and below shield/heat sink layer 4888, keep the interconnect metals and low-k dielectrics of the acceptor wafer interconnect layers cooler than a damage temperature, such as, for example, 400° C. or 370° C., or 300° C. A second layer of shield/heat sink layer 4888 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 4888 may act as a heat spreader. Electrically conductive materials may be used for the two layers of shield/heat sink layer 4888 and thus may provide, for example, a Vss and a Vdd plane and/or grid that may be connected to the donor layer transistors above, as well may be connected to the acceptor wafer transistors below, and/or may provide below transferred layer device interconnection. Shield/heat sink layer 4888 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 4888 may be sandwiched and/or substantially enclosed by materials with a low thermal conductivity (less than 10 W/m-K), for example, silicon dioxide (about 1.4 W/m-K). The sandwiching of high and low thermal conductivity materials in layers, such as shield/heat sink layer 4888 and under & overlying dielectric layers, spreads the localized heat/light energy of the topside anneal laterally and protects the underlying layers of interconnect metallization & dielectrics, such as in the acceptor wafer 4810, from harmful temperatures or damage. When there may be more than one shield/heat sink layer 4888 in the device, the heat conducting layer closest to the second crystalline layer or oxide layer 4880 may be constructed with a different material, for example a high melting point material, for example a refractory metal such as tungsten, than the other heat conducting layer or layers, which may be constructed with, for example, a lower melting point material, for example such as aluminum or copper. Now transistors may be formed with low effective temperature (less than approximately 400° C. exposure to the acceptor wafer 4810 sensitive layers, such as interconnect and device layers) processing, and may be aligned to the acceptor wafer alignment marks (not shown) as described in the incorporated references. This may include further optical defect annealing or dopant activation steps. The N– donor wafer 4800 may now also be processed, such as smoothing and annealing, and reused for additional layer transfers. The insulator layer, such as deposited bonding oxides (for example oxide layer 4880) and/or before bonding preparation existing oxides (for example the BEOL isolation 4896 on top of the topmost metal layer of shield/heat sink layer 4888), between the donor wafer transferred monocrystalline layer and the acceptor wafer topmost metal layer, may include thicknesses of less than 1 um, less than 500 nm, less than 400 nm, less than 300 nm, less than 200 nm, or less than 100 nm. Transistors and other devices, such as those described herein and in incorporated referenced patents and patent applications, may be constructed utilizing regions of the crystallized amorphous silicon layer 4866 as a portions of the transistor or device; for example, as a transistor channel for an FD-MOSFET or JFET, or as raised source and drain for an FDMOSFET or JLT.

The shield layer, for example, shield/heat sink layer 4888 described herein, could be constructed so it may have a substantially larger or better heat conductivity to the sides of the device in the horizontal orientation than the heat conductivity of the shield layer in the vertical direction toward the underlying layers or back to the top surface of the device. Such shield layer, wherein the horizontal heat conductivity or heat spreading capability is substantially greater in the horizontal direction than in the vertical direction, could include a 'sandwich' of heat conductive thin layer, such as a metal (for example copper), overlaid by a thin lower-thermally-conducting layer, for example SiO2, and may repeat the two layer stack multiple times. Vertical electrical continuity may be maintained by etching vertical vias and filling the vias with an electrically conductive material. Overlapping shorting vias or lines may also perform the same function. Such a shield layer could be designed to support various types of optical annealing. Such shielding can block even non laser optical annealing or a $CO_2$ laser that tends to penetrate very deeply. In some cases it might be desired to have the top layer of the shielding layer as non-reflective or as a defusing reflector to reduce damage to the laser annealing machine from the reflected light.

Figure 50:
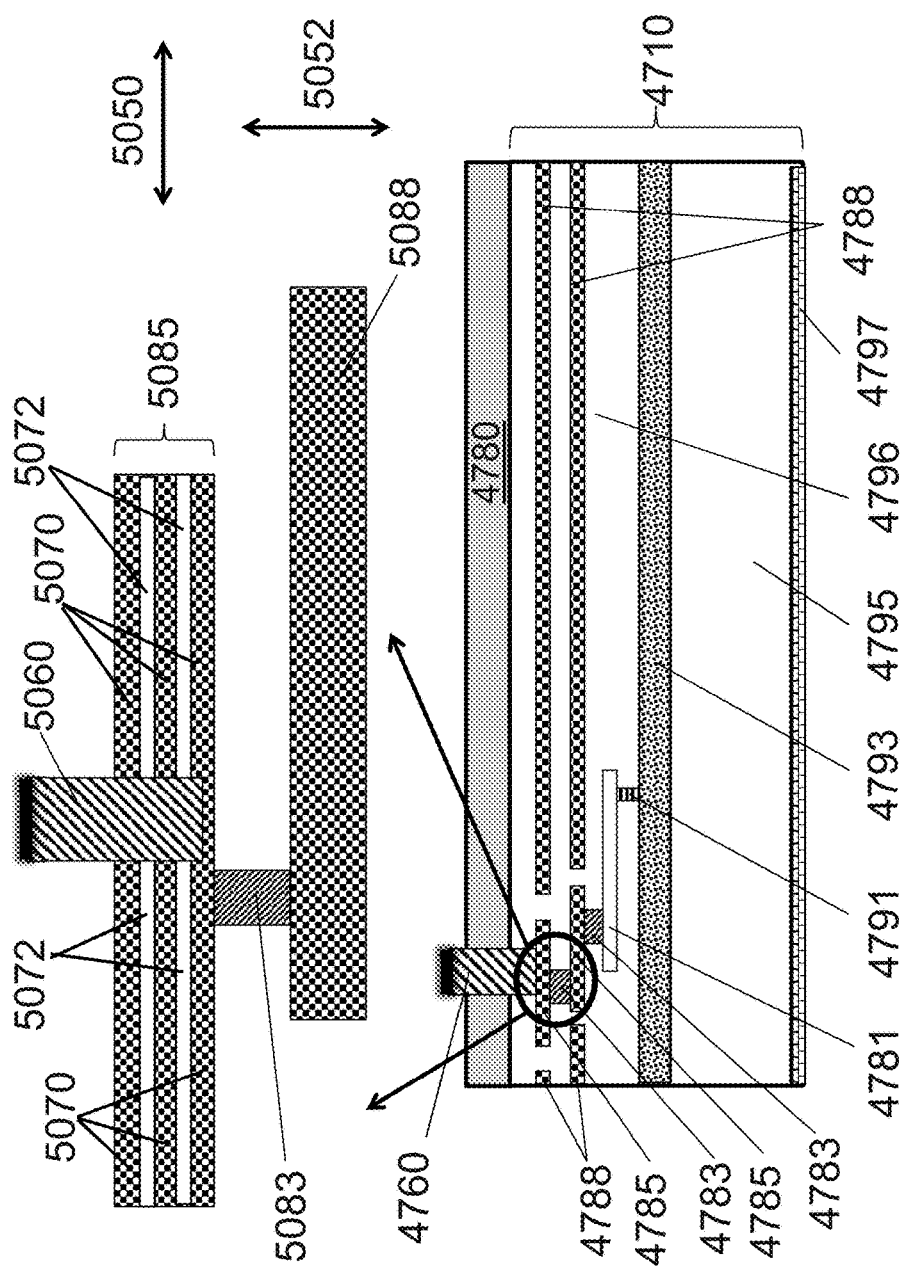
FIG. 50 is an exemplary illustration of a layered shield/heat sink layer that may be constructed wherein the horizontal heat conductivity or heat spreading capability may be substantially greater in the horizontal direction than in the vertical direction.

As illustrated in FIG. 50, a layered shield/heat sink layer may be constructed wherein the horizontal heat conductivity or heat spreading capability may be substantially greater in the horizontal direction than in the vertical direction. The horizontal direction is indicated by horizontal arrow 5050 and the vertical direction is indicated by vertical arrow 5052. A portion of FIG. 47G is repeated in FIG. 50, showing the portion of a 3D device with shield/heat sink & spreading structure below the second crystalline device layer, which may include oxide layer 4780, a portion of thru layer vias (TLVs) 4760, shield path connects 4785, shield path via 4783, BEOL isolation 4796, shield path via 4783, acceptor metal interconnect 4781, first (acceptor) layer metal interconnect 4791, acceptor wafer transistors and devices 4793, acceptor substrate 4795, and acceptor wafer heat sink 4797 (which may have an external surface or connection to one as described earlier herein), of acceptor wafer 4710. The external surface may be at the top, bottom or sides of the finished device. The device may include an external surface from which heat transfer may take place by methods such as air cooling, liquid cooling, or attachment to another heat sink or heat spreader structure. As indicated in FIG. 50, the area within the circle is blown up to enable clarity of detail for the illustration. Layered shield/heat sink region 5085 may include layers or regions of heat conductive material and heat isolative material, for example heat conducting regions 5070 and heat isolative regions 5072. Heat conducting regions 5070 may include materials with a high thermal conductivity greater than 10 W/m-K, such as, for example, (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K), barrier metals such as TiN and TaN, and may be deposited in layers interspersed with heat isolative layers. Heat isolative regions 5072 may include materials with a low thermal conductivity (less than 10 W/m-K), or substantially less thermally conductive than the material included in heat conducting regions 5070, materials such as, for example, silicon oxide (about 1.4 W/m-K), aerogels, carbon doped oxides. Accordingly, depending on material choices and construction (such as number of cond/iso layers and their thickness), layered shield/heat sink region 5085 may have a heat conductivity in the horizontal direction that is 2 times, or 4 times, or ten times greater than the heat conductivity in the vertical direction. Either or both of heat conducting regions 5070 and heat isolative regions 5072 may be electrically conductive. Heat conducting regions 5070 and heat isolative regions 5072 may be formed by lithographically defining and then etching the conductive and isolative layer stack using subtractive formation techniques known by those skilled in the art, and may also be formed in a damascene method. Electrical connection between the various heat conducting regions 5070 may be made by forming the deep TLV 5060, patterned after thru layer vias (TLVs) 4760, to short the various heat conduction regions 5070. Deep TLV 5060 may be formed by etching substantially to, within, or thru the bottom heat conducting region 5070 of layered shield/heat sink region 5085. Thus layered shield/heat sink region 5085 may be formed wherein the horizontal heat conductivity or heat spreading capability may be substantially greater in the horizontal direction (indicated by horizontal arrow 5050) than in the vertical direction (indicated by vertical arrow 5052). Shield path connect 5083 may be similar to shield path connects 4785 and additional shield/heat sink region 5088 may be layered such as, for example, layered shield/heat sink region 5085 or shield/heat sink layers 4788 of FIG. 47G. Layered shield/heat sink region 5085 may be utilized as part of a thermal conduction path, emf shield, back-bias circuits for second layer transistors, and other uses as described herein in relation to FIG. 47, and any other descriptions employing a shield/heat sink layer or region.

Persons of ordinary skill in the art will appreciate that the illustrations in FIG. 50 are exemplary and are not drawn to scale. Such skilled persons will further appreciate that many variations may be possible such as, for example, subtractive region formation techniques may be preferred over damascene for forming layered shield/heat sink region 5085 as the shield regions may comprise the majority of the device area at that formation step, and CMP processes within the damascene techniques may be difficult without breaking the shield into small regions, which may affect the heat shielding capability. Two or more layered shield/heat sink layers, properly designed and layed out with overlapping regions, may be useful for the damascene technique. Moreover, when the layered shield/heat sink region 5085 is formed by a damascene process flow, then electrical connection between the various heat conducting regions 5070 may be made at the top surface of the damascene 'metal' line trench by just a slight over-etch (CMP smearing may not be enough to couple the conductive regions) during deep TLV 5060 formation, as many of the various heat conducting regions 5070 and heat isolative regions 5072 may truncate at the top surface of the trench that is forming layered shield/heat sink region 5085. Furthermore, deep TLV 5060 may be formed to be fully or partially on the outside edge of the layered shield/heat sink region 5085 in order to couple the various heat conducting regions 5070. Many other modifications within the scope of the illustrated embodiments of the invention will suggest themselves to such skilled persons after reading this specification. Thus the invention is to be limited only by the appended claims.

Figure 51:
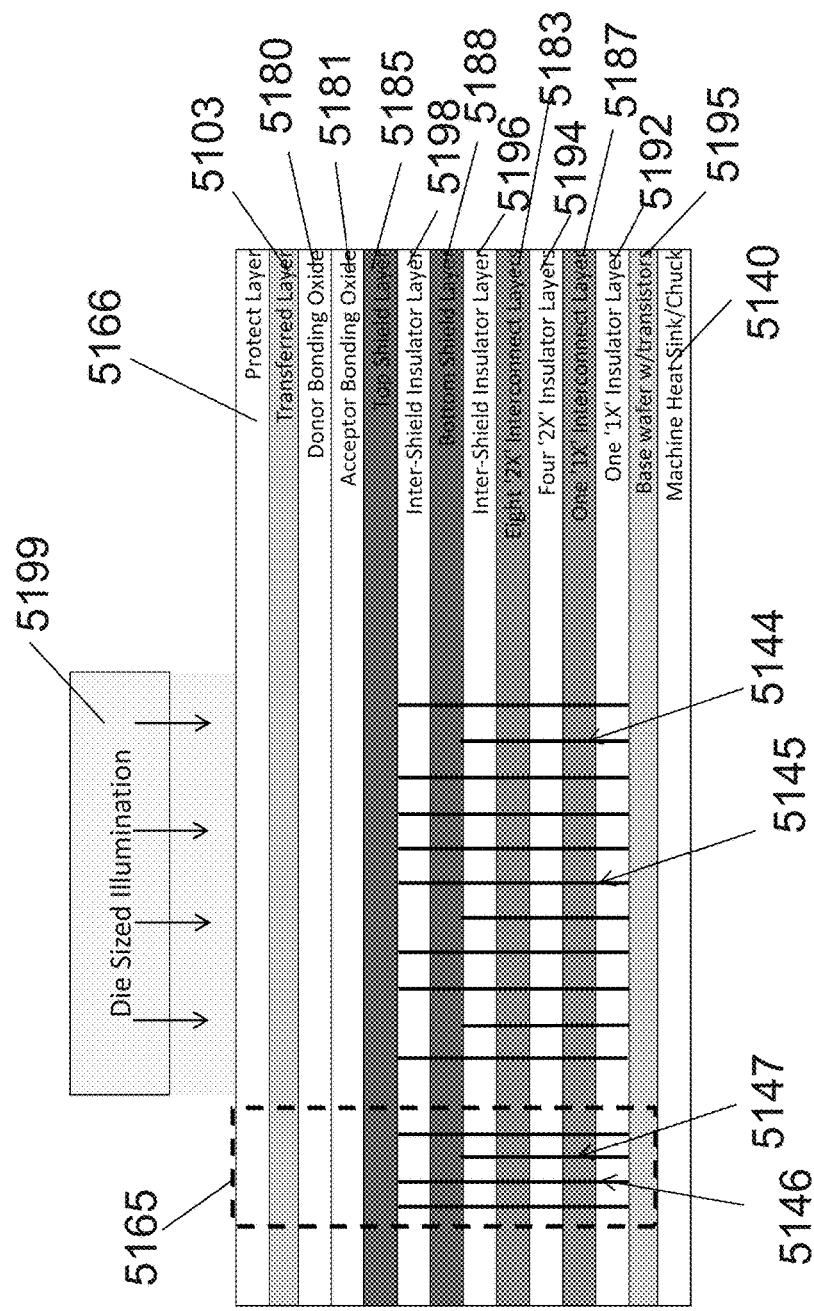
FIG. 51 is an exemplary illustration of a partially processed 3D device with substrate being processed with top-side illumination and including thermally conductive paths.

An embodiment of the invention may include an exemplary partially processed 3D device with substrate being processed with topside illumination as illustrated in FIG. 51. The topside illumination 5199 may be an optical anneal for purposes, such as, for example, dopant annealing, STI densification and annealing, silicidation, and/or ion-cut damage repair, which have been described herein and in incorporated patents and patent publications. Furthermore, topside illumination 5199 may be an optical anneal that is die sized, or reticle sized, or other size and shape as has been described herein and in incorporated patents and patent publications. A transferred layer 5103, which may be a transferred layer or layers as described herein and in incorporated patents and patent publications, may have been transferred and bonded to an acceptor wafer or substrate, and may include bonding at the interface between donor bonding oxide 5180 and acceptor bonding oxide 5181. Transferred layer 5103 may have a protect layer 5166 (or region) atop it, which may function as a optical absorber, reflector, or energy spreader as described in herein and in incorporated patents and patent publications, and may remain a part of the device at the end of device processing or be sacrificial (removed). Transferred layer 5103 may include its entirety or portions, isotopically enriched silicon (such as, for example, >99% $^{28}Si$) or germanium to enable a greater heat conductivity. The relatively higher cost of the isotopically enriched layer or regions can be mitigated by the reuse of a donor wafer comprised wholly or partially with the material. The acceptor wafer at the time of bonding to the donor wafer and at exposure to topside illumination 5199 may include acceptor bonding oxide 5181, top shield layer 5185, inter-shield insulator layer 5198, bottom shield layer 5188, second inter-shield insulator layer 5196, eight '2x' interconnect layers 5183 that may be interspersed with four '2x' insulator layers 5194, a '1x' interconnect layer 5187, a '1x' insulator layer 5192, device die thermal conduction paths 5145, device scribe-lane thermal conduction paths 5146, second device die thermal conduction paths 5144, second device scribe-lane thermal conduction paths 5147, and a base wafer with transistors and circuits 5195. The acceptor wafer may have another combination of these layers and regions as would be clear to one skilled in the art. The elements of the exemplary acceptor wafer may include the materials, process flows, construction, use, etc. as has been described herein and in incorporated patents and patent publications, for example, transferred layer 5103 may be doped or undoped silicon, and may have regions of STI or other transistor elements within it or on it, and may include multiple layers or regions of doping. Moreover, transferred layer 5103 may include layers or regions that have materials with melting points higher than 900° C. (for example doped mono-crystalline silicon or polysilicon or amorphous silicon, tungsten, tantalum nitride) that may be used, for example, as a back-bias or body bias region or layer, as has been described herein and in incorporated patents and patent publications. Top shield layer 5185 may have layered shield regions wherein the horizontal thermal conduction is substantially greater than the vertical heat conduction. The bonded stack of the acceptor wafer and transferred layers may include scribe regions 5165, either preformed and/or predetermined scribelanes and/or dicelines, or may include custom function definition and etching, or a combination of both. Scribe regions 5165 may be constructed with device scribe-lane thermal conduction paths 5146 that may provide a thermal conduction path from the top shield layer 5185 to the base wafer with transistors and circuits 5195, which could then conduct heat that may be generated from topside illumination 5199 to the illumination machine heat sink/chuck 5140 and thus help prevent damage from the topside illumination 5199 of the acceptor interconnect layers, such as, for example, the eight '2×' interconnect layers 5183, four '2×' insulator layers 5194, 1×' interconnect layer 5187, '1×' insulator layer 5192, and the transistors and circuits of base wafer with transistors and circuits 5195. Second device scribe-lane thermal conduction paths 5147 may thermally conduct from bottom shield layer 5188 to the base wafer with transistors and circuits 5195 and the illumination machine heat sink/chuck 5140. Device die thermal conduction paths 5145 within the device die, may provide a thermal conduction path from the top shield layer 5185 to the base wafer with transistors and circuits 5195, which could then conduct heat that may be generated from topside illumination 5199 to the illumination machine heat sink/chuck 5140 and thus help prevent damage from the topside illumination 5199 of the acceptor interconnect layers, such as, for example, the eight '2×' interconnect layers 5183, four '2×' insulator layers 5194, 1×' interconnect layer 5187, '1×' insulator layer 5192, and the transistors and circuits of base wafer with transistors and circuits 5195, and has been described herein and in incorporated patents and patent publications. Second device die thermal conduction paths 5144 may thermally conduct from bottom shield layer 5188 to the base wafer with transistors and circuits 5195 and the illumination machine heat sink/chuck 5140. Device scribe-lane thermal conduction paths 5146 may be removed in the later dice singulation processes whereas the device die thermal conduction paths 5145 may remain in the finished device and provide cooling of the second layer and above transistor and circuit layers when the device is in operation and generating heat from the device operation. The density of device die thermal conduction paths 5145, device scribe-lane thermal conduction paths 5146, second device die thermal conduction paths 5144, and second device scribe-lane thermal conduction paths 5147 is a device design and thermal architecture calculation, but may be on the order of 1 every 100 um$^2$ (Wei H., et al., "Cooling Three-Dimensional Integrated Circuits Using Power Delivery Networks", IEDM 2012, 14.2, December 2012. incorporated by reference in entirety). Scribelanes (or dicelanes), such as scribe regions 5165, may be 10 um wide, 20 um wide, 50 um wide 100 um wide, or greater than 100 um wide depending on design choice and die singulation process capability.

Persons of ordinary skill in the art will appreciate that the illustrations in FIG. 51 are exemplary and are not drawn to scale. Such skilled persons will further appreciate that many variations may be possible such as, for example, bottom shield layer 5188 may also be formed as a layered shield/heat sink layer or region. Moreover, although many of the elements in the FIG. 51 may be called layers, they main include within them regions. Furthermore, device scribe-lane thermal conduction paths 5146 and device die thermal conduction paths 5145 may be formed so that there is no electrical connection to bottom shield layer 5188, unless they are designed to do so as the same circuit node. Further, the choice of eight '2×' interconnect layers 5183 that may be interspersed with four '2×' insulator layers 5194, a 'IX' interconnect layer 5187, a '1×' insulator layer 5192 is a design choice and may be different according to the design considerations, both device functionally and thermally. Moreover, the various semiconductor layers within the 3D device may have various circuitry, functions and connection, for example, as described herein (such as FIG. 53) or in incorporated patent references. Thus the invention is to be limited only by the appended claims.

An alternate method to construct a planar fully depleted undoped channel MOSFET (FD-MOSFET) with an optional integrated heat shield/spreader and back planes and body bias taps suitable for a monolithic 3D IC as presented in FIG. 46A-46G may be constructed as follows. The FD-MOSFET may provide an improved transistor variability control and conduction channel electrostatic control, as well as the ability to utilize an updoped channel, thereby improving carrier mobility. In addition, the FD-MOSFET does not demand doping or pocket implants in the channel to control the electrostatic characteristics and tune the threshold voltages. Sub-threshold slope, DIBL, and other short channel effects are greatly improved due to the firm gate electrostatic control over the channel. In this embodiment, a ground plane is constructed that may provide improved electrostatics and/or Vt adjustment and/or back-bias of the FD-MOSFET. In addition, selective regions may be constructed to provide body bias and/or partially depleted/bulk-like transistors. Moreover, a heat spreading, heat conducting and/or optically reflecting material layer or layers may be incorporated between the sensitive metal interconnect layers below and the layer or regions being optically irradiated and annealed to repair defects in the crystalline 3D-IC layers and regions, crystallize an undoped transistor channel, and to activate semiconductor dopants in the crystalline layers or regions of a 3D-IC without harm to the sensitive metal interconnect and associated dielectrics. FIG. 52A-E illustrates an exemplary undoped-channel FD-MOSFET which may be constructed in a 3D stacked layer using procedures outlined below and in U.S. Pat. No. 8,273,610, US patent publications 2012/0091587 and 2013/0020707, and pending U.S. patent application Ser. Nos. 13/441,923 and 13/099,010. The contents of the foregoing applications are incorporated herein by reference.

As illustrated in FIG. 52A, SOI donor wafer substrate 5200 may include back channel layer 5202 above Buried Oxide BOX layer 5201. Back channel layer 5202 may be doped by ion implantation and thermal anneal, may include a crystalline material, for example, mono-crystalline (single crystal) silicon and may be heavily doped (greater than 1e16 atoms/cm$^3$), lightly doped (less than 1e16 atoms/cm$^3$) or nominally un-doped (less than 1e14 atoms/cm$^3$). SOI donor wafer substrate 5200 may include a crystalline material, for example, mono-crystalline (single crystal) silicon and at least the upper layer near BOX layer 5201 may be very heavily doped (greater than 1e20 atoms/cm$^3$). Back channel layer 5202 may have additional ion implantation and anneal processing to provide a different dopant level than SOI donor wafer substrate 5200 and may have graded or various layers of doping concentration. SOI donor wafer substrate 5200 may have additional ion implantation and anneal processing to provide a different dopant level than back channel layer 5202 and may have graded or various layers of doping concentration. The layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike). The preferred at least top of SOI donor wafer substrate 5200 doping will be very heavily doped to eventually create the embedded portion of the source and drain of an FD-MOSFET transistor with an undoped conduction channel. SOI donor wafer may be constructed by layer transfer techniques described herein or elsewhere as known in the art, or by laser annealed SIMOX at a post donor layer transfer to acceptor wafer step. BOX layer 5201 may be thin enough to provide for effective back and/or body bias, for example, 25 nm, or 20 nm, or 10 nm, or 35 nm.

As illustrated in FIG. 52B, the top surface of the SOI donor wafer substrate 5200 layer stack may be prepared for oxide wafer bonding with a deposition of an oxide or by thermal oxidation of back channel layer 5202 to form oxide layer 5280. A layer transfer demarcation plane (shown as dashed line) 5299 may be formed by hydrogen implantation or other methods as described in the incorporated references, and may reside within the SOI donor wafer substrate 5200. The SOI donor wafer substrate 5200 stack, such as surface 5282, and acceptor wafer 5210 may be prepared for wafer bonding as previously described and low temperature (less than approximately 400° C.) bonded. Acceptor wafer 5210, as described in the incorporated references, may include, for example, transistors, circuitry, and metal, such as, for example, aluminum or copper, interconnect wiring, a metal shield/heat sink layer or layers, and thru layer via metal interconnect strips or pads. Acceptor wafer 5210 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 5210 may include transistors such as, for example, MOSFETS, FD-MOSFETS, FinFets, FD-RCATs, BJTs, HEMTs, and/or HBTs. The portion of the SOI donor wafer substrate 5200 that may be above (when the layer stack is flipped over and bonded to the acceptor wafer 5210) the layer transfer demarcation plane 5299 may be removed by cleaving or other low temperature processes as described in the incorporated references, such as, for example, ion-cut with mechanical or thermal cleave or other layer transfer methods, thus forming remaining S/D layer 5203. Damage/defects to crystalline structure of back channel layer 5202 may be annealed by some of the annealing methods described, for example the short wavelength pulsed laser techniques, wherein the back channel layer 5202 and/or portions of the SOI donor wafer substrate 5200 may be heated to defect annealing temperatures, but the layer transfer demarcation plane 5299 may be kept below the temperature for cleaving and/or significant hydrogen diffusion. The optical energy may be deposited in the upper layer of the stack, for example near surface 5282, and annealing of back channel layer 5202 and/or portions of the SOI donor wafer substrate 5200 may take place via heat diffusion. Moreover, multiple pulses of the laser may be utilized to improve the anneal, activation, and yield of the process and/or to control the maximum temperature of various structures in the stack.

Figure 52C:
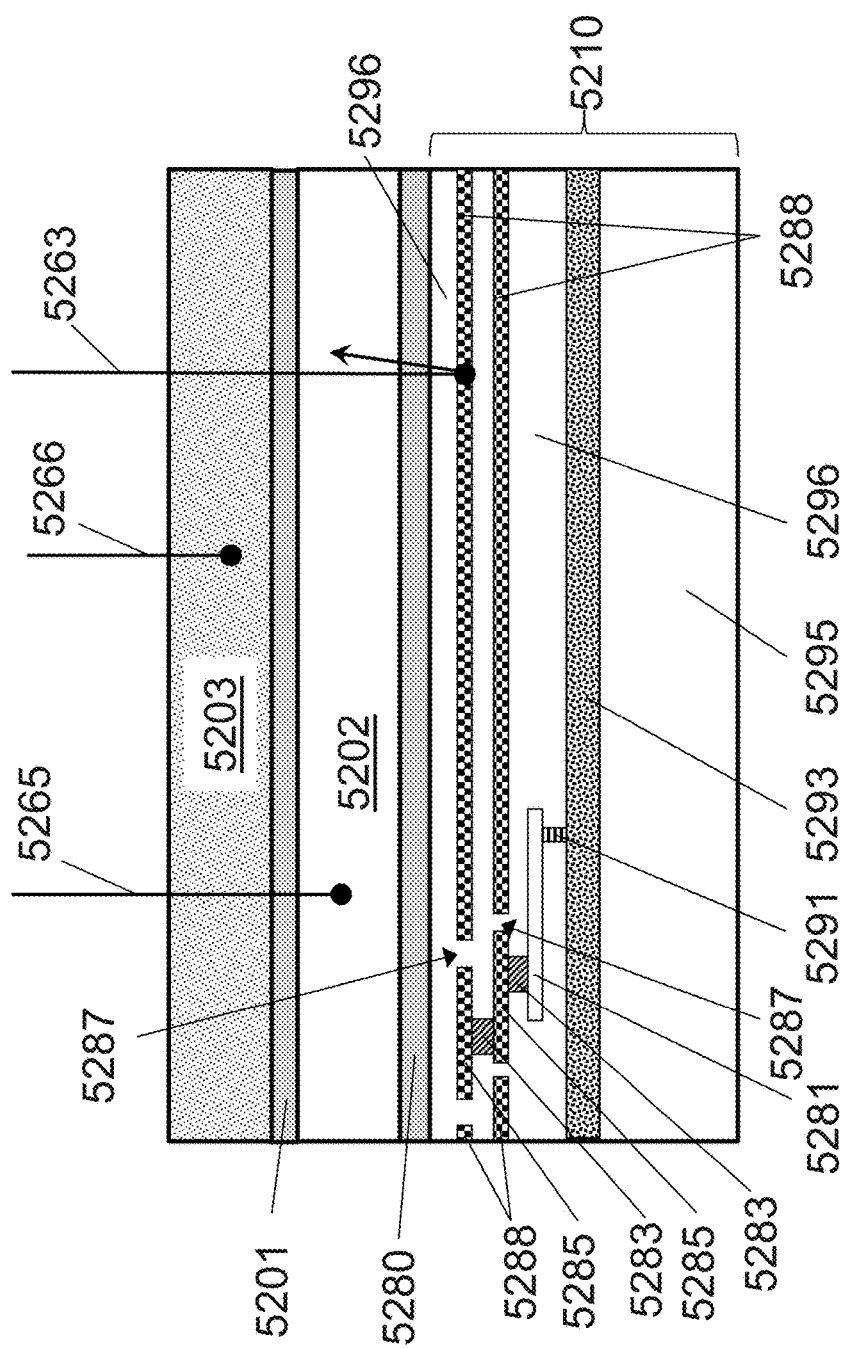

As illustrated in FIG. 52C, oxide layer 5280, back channel layer 5202, BOX layer 5201 and S/D layer 5203 may be layer transferred to acceptor wafer 5210. The top surface of S/D layer 5203 may be chemically or mechanically polished, and/or may be thinned by low temperature oxidation and strip processes, such as the TEL SPA tool radical oxidation and HF:H$_2$O solutions as described herein and in referenced patents and patent applications. Thru the processing, the wafer sized layer S/D layer 5203 could be thinned from its original total thickness, and its final total thickness could be in the range of about 5 nm to about 20 nm, for example, 5 nm, 7 nm, 10 nm, 12 nm, 15 nm, or 20 nm. S/D layer 5203 may have a thickness and/or doping that may allow a minimum Rext and maximum electron injection velocities when the FD-MOSFET transistor is substantially completely formed. Acceptor wafer 5210 may include one or more (two are shown in this example) shield/heat sink layers 5288, which may include materials such as, for example, Aluminum, Tungsten (a refractory metal), Copper, silicon or cobalt based silicides, or forms of carbon such as carbon nanotubes, and may be layered itself as described herein FIG. 50. Each shield/heat sink layer 5288 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 5288 may include isolation openings 5287, and alignment mark openings (not shown), which may be utilized for short wavelength alignment of top layer (donor) processing to the acceptor wafer alignment marks (not shown). Shield/heat sink layer 5288 may include one or more shield path connects 5285 and shield path vias 5283. Shield path via 5283 may thermally and/or electrically couple and connect shield path connect 5285 to acceptor wafer 5210 interconnect metallization layers such as, for example, exemplary acceptor metal interconnect 5281 (shown). Shield path connect 5285 may also thermally and/or electrically couple and connect each shield/heat sink layer 5288 to the other and to acceptor wafer 5210 interconnect metallization layers such as, for example, acceptor metal interconnect 5281, thereby creating a heat conduction path from the shield/heat sink layer 5288 to the acceptor substrate 5295, and a heat sink (not shown). Isolation openings 5287 may include dielectric materials, similar to those of BEOL isolation 5296. Acceptor wafer 5210 may include first (acceptor) layer metal interconnect 5291, acceptor wafer transistors and devices 5293, and acceptor substrate 5295. Various topside defect anneals may be utilized. For this illustration, an optical beam such as the laser annealing previously described is used. Optical anneal beams may be optimized to focus light absorption and heat generation within or at the surface of S/D layer 5203 and provide surface smoothing and/or defect annealing (defects may be from the cleave and/or the ion-cut implantation) with exemplary smoothing/annealing ray 5266. The laser assisted smoothing/annealing with the absorbed heat generated by exemplary smoothing/annealing ray 5266 may also include a pre-heat of the bonded stack to, for example, about 100° C. to about 400° C., and/or a rapid thermal spike to temperatures above about 200° C. to about 600° C. Additionally, absorber layers or regions, for example, including amorphous carbon, amorphous silicon, and phase changing materials (see U.S. Pat. Nos. 6,635,588 and 6,479,821 to Hawryluk et al. for example), may be utilized to increase the efficiency of the optical energy capture in conversion to heat for the desired annealing or activation processes. Moreover, multiple pulses of the laser may be utilized to improve the anneal, activation, and yield of the process. Reflected ray 5263 may be reflected and/or absorbed by shield/heat sink layer 5288 regions thus blocking the optical absorption of ray blocked metal interconnect 5281. Annealing of dopants or annealing of damage in back channel layer 5202 and/or BOX 5210 and/or S/D layer 5203, such as from the H cleave implant damage, may be also accomplished by a set of rays such as repair ray 5265, illustrated is focused on back channel layer 5202. Heat generated by absorbed photons from, for example, smoothing/annealing ray 5266, reflected ray 5263, and/or repair ray 5265 may also be absorbed by shield/heat sink layer 5288 regions and dissipated laterally and may keep the temperature of underlying metal layers, such as metal interconnect 5281, and other metal layers below it, cooler and prevent damage. Shield/heat sink layer 5288 and associated dielectrics may laterally spread and conduct the heat generated by the topside defect anneal, and in conjunction with the dielectric materials (low heat conductivity) above and below shield/heat sink layer 5288, keep the interconnect metals and low-k dielectrics of the acceptor wafer interconnect layers cooler than a damage temperature, such as, for example, 400° C. A second layer of shield/heat sink layer 5288 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 5288 may act as a heat spreader. Electrically conductive materials may be used for the two layers of shield/heat sink layer 5288 and thus may provide, for example, a Vss and a Vdd plane and/or grid that may be connected to the donor layer transistors above, as well may be connected to the acceptor wafer transistors below, and/or may provide below transferred layer device interconnection. Noise on the power grids, such as the Vss and Vdd plane power conducting lines/wires, may be mitigated by attaching/connecting decoupling capacitors onto the power conducting lines of the grids. The decoupling caps, which may be within the second layer (donor, for example, donor wafer device structures) or first layer (acceptor, for example acceptor wafer transistors and devices 5293), may include, for example, trench capacitors such as described by Pei, C., et al., "A novel, low-cost deep trench decoupling capacitor for high-performance, low-power bulk CMOS applications," ICSICT (9$^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Shield/heat sink layer 5288 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 5288 may be sandwiched and/or substantially enclosed by materials with a low thermal conductivity (less than 10 W/m-K), for example, silicon dioxide (about 1.4 W/m-K). The sandwiching of high and low thermal conductivity materials in layers, such as shield/heat sink layer 5288 and under & overlying dielectric layers, spreads the localized heat/light energy of the topside anneal laterally and protects the underlying layers of interconnect metallization & dielectrics, such as in the acceptor wafer 5210, from harmful temperatures or damage. When there may be more than one shield/heat sink layer 5288 in the device, the heat conducting layer closest to the second crystalline layer or oxide layer 5280 may be constructed with a different material, for example a high melting point material, for example a refractory metal such as tungsten, than the other heat conducting layer or layers, which may be constructed with, for example, a lower melting point material, for example such as aluminum or copper. Now transistors may be formed with low effective temperature (less than approximately 400° C. exposure to the acceptor wafer 5210 sensitive layers, such as interconnect and device layers) processing, and may be aligned to the acceptor wafer alignment marks (not shown) as described in the incorporated references. This may include further optical defect annealing or dopant activation steps. The remaining SOI donor wafer substrate 5200 may now also be processed, such as smoothing and annealing, and reused for additional layer transfers. The insulator layer, such as deposited bonding oxides (for example oxide layer 5280) and/or before bonding preparation existing oxides (for example the BEOL isolation 5296 on top of the topmost metal layer of shield/heat sink layer 5288), between the donor wafer transferred monocrystalline layer and the acceptor wafer topmost metal layer, may include thicknesses of less than 1 um, less than 500 nm, less than 400 nm, less than 300 nm, less than 200 nm, or less than 100 nm.

Figure 52D:
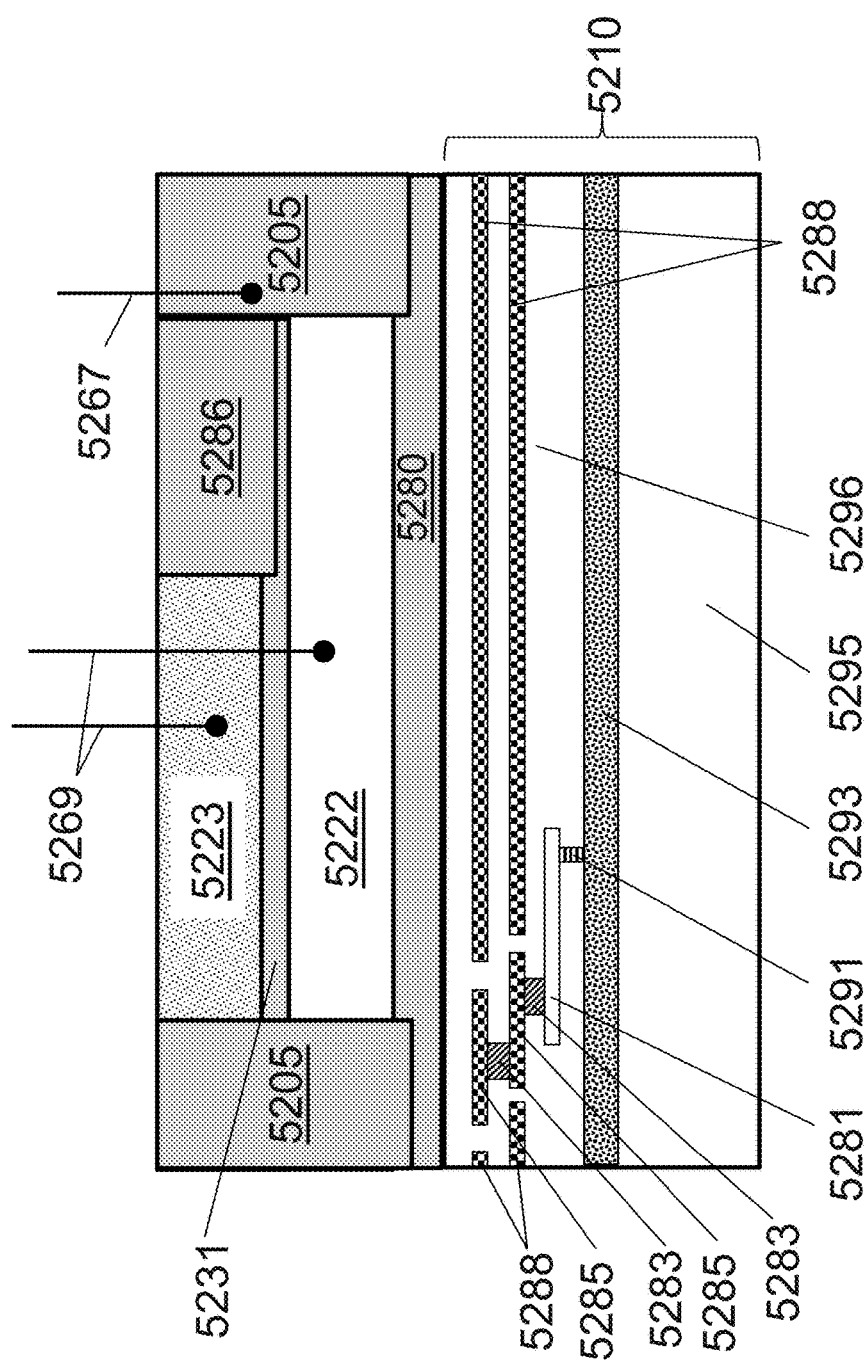
Figure 52E:
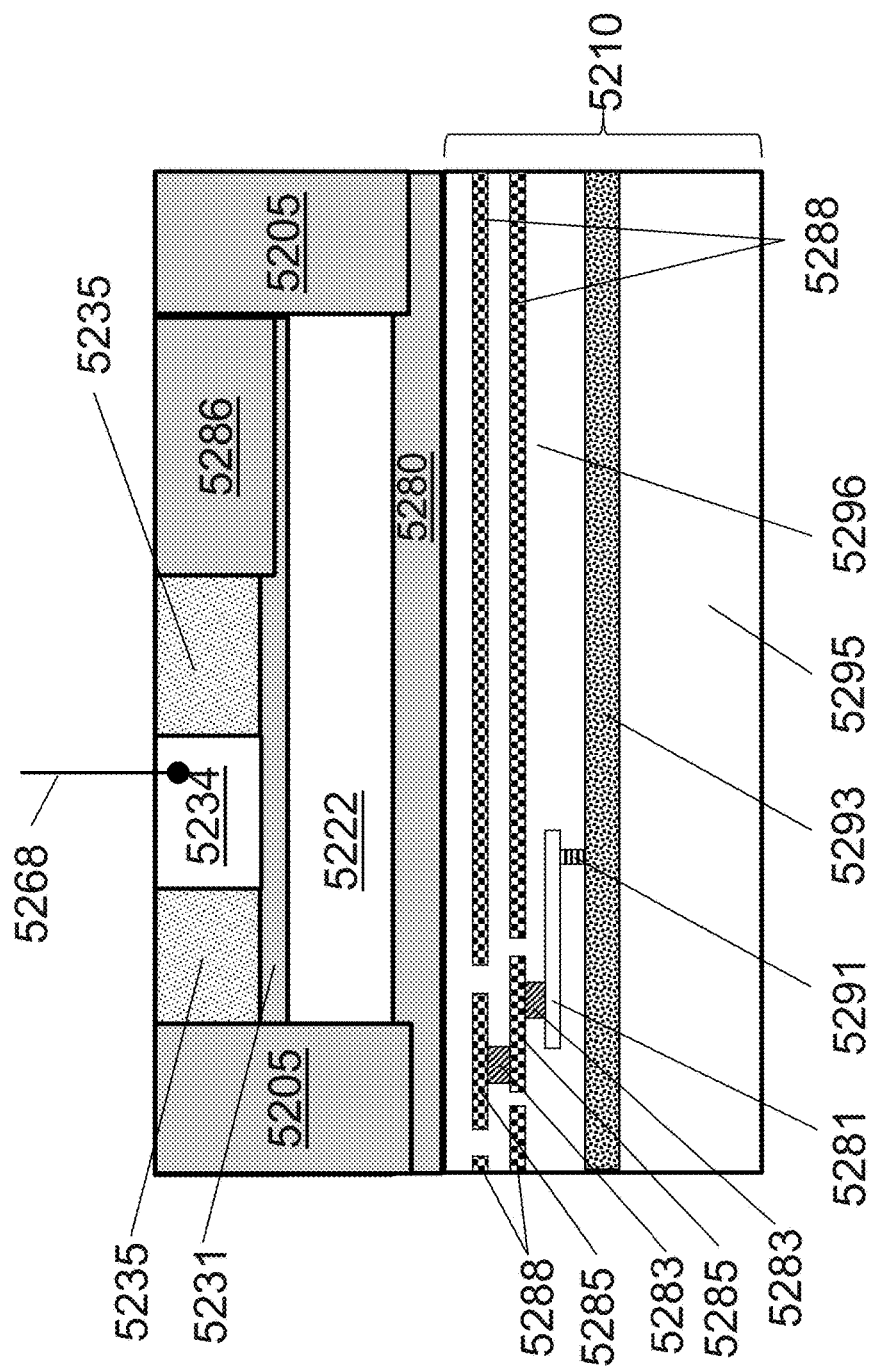

As illustrated in FIG. 52D, transistor and back channel isolation regions 5205 and/or transistor isolation regions 5286 may be formed. Transistor isolation region 5286 may be formed by mask defining and plasma/RIE etching S/D layer 5203, substantially to the top of BOX layer 5201 (not shown), substantially into BOX layer 5201, or back channel layer 5202 (not shown). Transistor and back channel isolation regions 5205 may be formed by mask defining and plasma/RIE etching channel layer 5203, BOX layer 5201 and back channel layer 5202, substantially to the top of oxide layer 5280 (not shown), substantially into oxide layer 5280, or further into the top BEOL dielectric layer in acceptor wafer 5210 (not shown). Thus intermediate S/D region 5223 may be formed, which may substantially form the transistor body, back-channel region 5222 may be formed, which may provide a back bias and/or Vt of the eventual transistor channel. Back-channel region 5222 may be ion implanted for Vt control and/or body bias efficiency. A low-temperature gap fill dielectric, such as SACVD oxide, may be deposited and chemically mechanically polished, the oxide remaining in transistor and back channel isolation regions 5205 and transistor isolation regions 5286. An optical step, such as illustrated by exemplary STI ray 5267, may be performed to anneal etch damage and densify the STI oxide in transistor and back channel isolation regions 5205. The doping concentration of intermediate S/D region 5223 may include vertical or horizontal gradients of concentration or layers of differing doping concentrations. The doping concentration of back-channel region 5222 may include vertical or horizontal gradients of concentration or layers of differing doping concentrations. The optical anneal, such as exemplary STI ray 5267, and/or exemplary implant ray 5269 may be performed at separate times and processing parameters (such as laser energy, frequency, etc.) or may be done in combination or as one optical anneal. Optical absorber and or reflective layers or regions may be employed to enhance the anneal and/or protect the underlying sensitive structures. Moreover, multiple pulses of the laser may be utilized to improve the anneal, activation, and yield of the process. BOX region 5231 may be a relatively thin dielectric, including the thickness range of 5 nm to 100 nm, at least a portion of which being between the back-channel region 5222 and channel region 5223. Back-channel region 5222 could be constructed from a material that would not be damaged by the optical anneal process. Such could be a refractory metal or doped silicon in crystallized form, poly or amorphous, or other conductive material that are acceptable for semiconductor processing and can withstand high temperature of 700° C. or higher.

As illustrated in FIG. 52 E, an undoped transistor channel may be formed within the intermediate S/D region 5223. Regions of intermediate S/D region 5223 may be lithographically defined and etched away, clearing the eventual channel region of substantially any silicon material and may etch slightly into BOX region 5231. Undoped amorphous silicon or poly silicon may be deposited to fill the eventual channel region. A CMP process may be utilized to remove substantially all of the deposited amorphous silicon or polysilicon not in the etched regions, thus forming undoped channel region 5234 and S/D & LDD regions 5235. The CMP process may be performed to overpolish and remove a small portion of the tops of S/D & LDD regions 5235, back channel isolation regions 5205, and transistor isolation regions 5286, and any smeared doping material from the S/D & LDD regions 5235 may be removed by <400 C oxidation and strip utilizing a process such as the TEL SPA tool described herein and in incorporated patent references. The amorphous silicon or polysilicon in undoped channel region 5234 may be crystallized to a near mono-crystalline state by optical annealing such as illustrated by exemplary channel smoothing ray 5268, by nano epitaxial ordering from the sidewalls of the mono-crystalline S/D & LDD regions 5235. Remaining damages and surface roughness may also be repaired and smoothed respectively by optical annealing, such as illustrated by exemplary channel smoothing ray 5268.

Figure 52F:
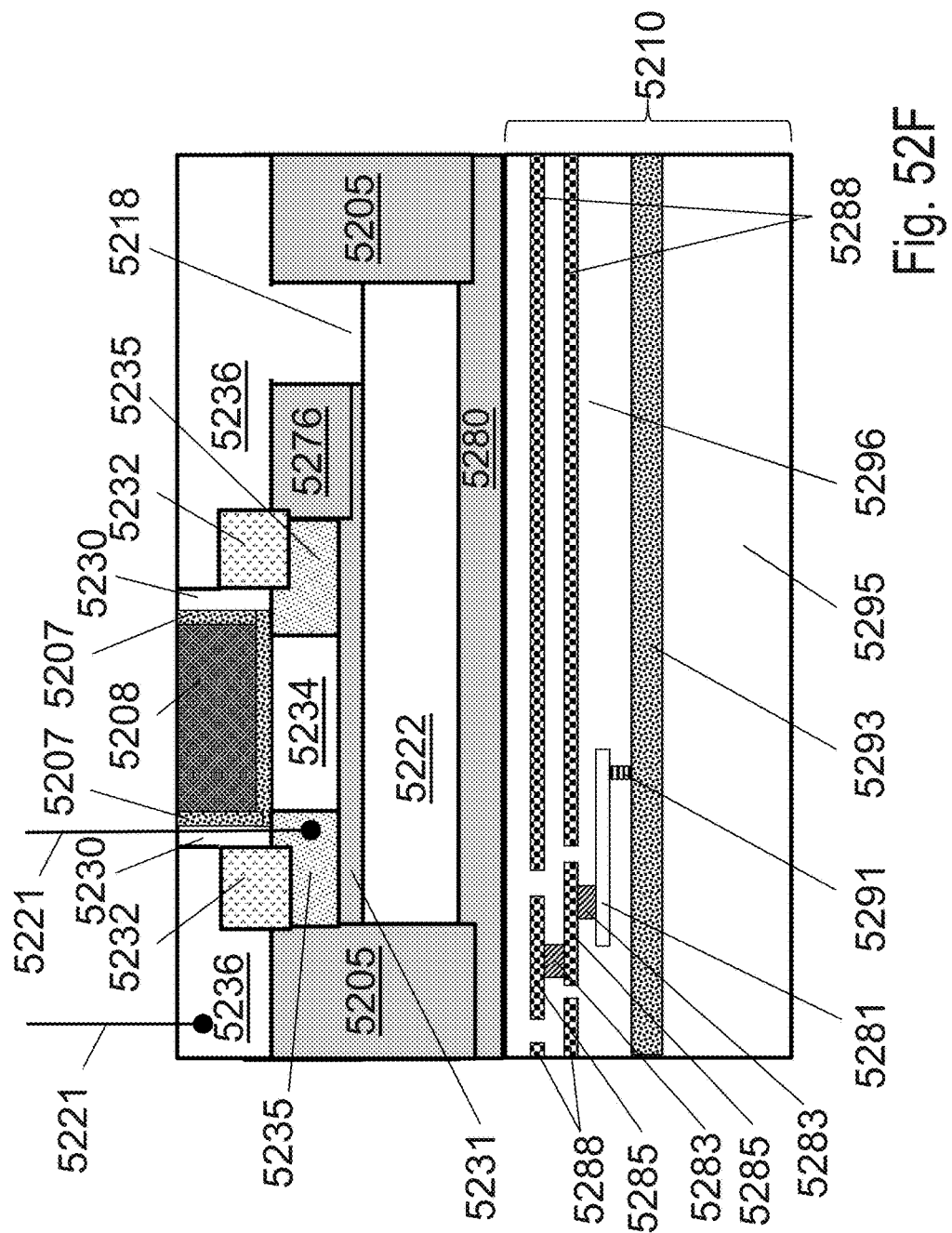

As illustrated in FIG. 52F, a transistor forming process, such as a conventional HKMG with raised source and drains (S/D), may be performed. For example, a dummy gate stack (not shown), utilizing oxide and polysilicon, may be formed, gate spacers 5230 may be formed, raised S/D regions 5232 and channel stressors may be formed by etch and epitaxial deposition, for example, of SiGe and/or SiC depending on P or N channel (and may be doped in-situ or ion-implantation and optical anneal activation), LDD, halo, and S/D ion-implantations may be performed, and first ILD 5236 may be deposited and CMP'd to expose the tops of the dummy gates. Thus transistor channel region 5234 and S/D & LDD regions 5235 may be formed. The dummy gate stack may be removed and a gate dielectric 5207 may be formed and a gate metal material gate electrode 5208, including a layer of proper work function metal ($Ti_xAl_yN_z$ for example) and a conductive fill, such as aluminum, and may be deposited and CMP'd. The gate dielectric 5207 may be an atomic layer deposited (ALD) gate dielectric that may be paired with a work function specific gate metal in the industry standard high k metal gate process schemes, for example, as described in the incorporated references. Alternatively, the gate dielectric 5207 may be formed with a low temperature processes including, for example, LPCVD $SiO_2$ oxide deposition (see Ahn, J., et al., "High-quality MOSFET's with ultrathin LPCVD gate SiO2," IEEE Electron Device Lett., vol. 13, no. 4, pp. 186-188, April 1992) or low temperature microwave plasma oxidation of the silicon surfaces (see Kim, J. Y., et al., "The excellent scalability of the RCAT (recess-channel-array-transistor) technology for sub-70 nm DRAM feature size and beyond," 2005 IEEE VLSI-TSA International Symposium, pp. 33-52, 25-27 Apr. 2005) and a gate material with proper work function and less than approximately 400° C. deposition temperature such as, for example, tungsten or aluminum may be deposited. An optical step, such as represented by exemplary anneal ray 5221, may be performed to densify and/or remove defects from gate dielectric 5207, anneal defects and activate dopants such as LDD and S/D implants, densify the first ILD 5236, form DSS junctions (Dopant Segregated Schottky such as $NiSi_2$), and/or form contact and S/D silicides (not shown). The optical anneal may be performed at each sub-step as desired, or may be done at prior to the HKMG deposition (such as after the dummy gate but before the HKMG formation), or various combinations. Optionally, portions of transistor isolation region 5286 and BOX region 5231 may be lithographically defined and etched away, thus forming second transistor isolation regions 5276 and PD transistor area 5218. Partially depleted transistors (not shown) may be constructed in a similar manner as the FD-MOSFETs constructed on transistor channel region 5233 herein, but now with the thicker back-channel region 5222 silicon as its channel body. PD transistor area 5218 may also be utilized to later form a direct connection thru a contact to the back-channel region 5222 for back bias and Vt control of the transistor with transistor channel region 5233. If no PD devices are desired, then it may be more efficient to later form a direct connection thru a contact to the back-channel region 5222 for back bias and Vt control of the transistor with transistor channel region 5234 by etching a contact thru transistor isolation region 5286. Raised S/D regions 5232 may be formed by low temperature (less than 400° C.) deposition of in-situ doped polysilicon or amorphous silicon into the S/D openings, an optical anneal to further crystallize and dopant activate the raised S/D material, and removal of excess raised S/D material. Further processing to connect the transistors and make vertical connections may follow the processing described in at least FIGS. 46F and 46G.

Figure 53:
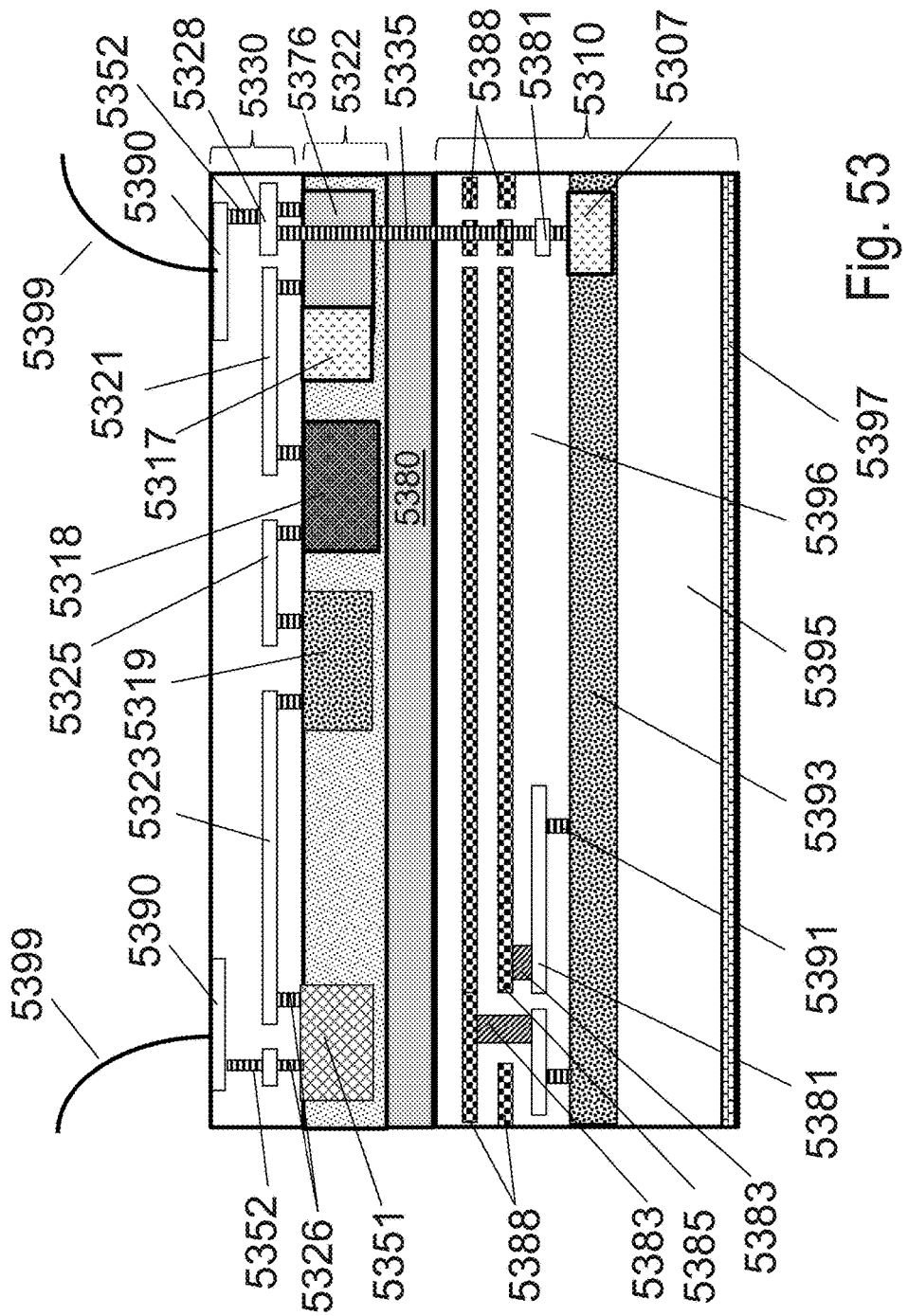
FIG. 53 is an exemplary illustration of some additional embodiments and combinations of devices, circuits, paths, and connections of a 3D device.

The various layers of a 3D device may include many types of circuitry, which may be formed by regions of transistors and other semiconductor device elements within that layer or in combination with other layers of the 3D device, and connections between the transistors within the same region, region to region and vertically (layer to layer) may be provided by layers of interconnect metallization and vertical connections such as TLVs and TSVs. In addition, power routing within the 3D device may utilize thicker and more conductive interconnect metallization than another layer, especially if the layer is closest to the source of external power and/or has a greater current load/supply requirement. Many individual device and interconnect embodiments for 3D devices have been described herein and in the incorporated patent references. As illustrated in FIG. 53, some additional embodiments and combinations (further embodiments) of devices, circuits, paths, and connections are described and may utilize similar materials, constructions and methods as the incorporated references or discussed herein. With reference to embodiments described herein, for example with respect to FIG. 46, and in the incorporated patent references, a substrate layer, which may have a thicker body than other semiconductor layers above or within the 3D device, such as acceptor 5310 may be formed and may include heat sink 5397, acceptor substrate 5395, acceptor wafer transistors and circuits 5393, first (acceptor) layer metal interconnect 5381 which may include first layer contacts 5391, first layer vias 5383, at least one shield layer/region 5388 (two layers and many regions, such as lower level shield layer region 5385, shown), interconnect insulator regions 5396 and ESD diode structures 5307. A second semiconductor layer may be transferred and constructed on top of the first layer with isolation layer 5380 in-between and vertical layer to layer interconnections may be provided by TLV/TSV 5335, only one is shown. A layer of transistors and circuits 5322 may include second layer input device structures 5376, FD ESD structures 5317, Phase Lock Loop circuits PLL 5318, SERDES circuitry 5319, and output device structure 5351. Second interconnections layer 5330 may include at least one layer/regions of metallization and associated contacts and via, for example, second layer metallization M1 segments 5328, 5321, 5323, 5325, second layer contacts 5326, second layer vias 5352, and conductive pads 5390. The 3D device may be connected to external devices utilizing many structures known to those skilled in the art, for example, bond wires 5399. Input device structures 5376 and output device structure 5351 may be connected to external devices through, for example, second layer contacts 5326, second layer metallization M1 segments 5328, second layer vias 5352, conductive pads 5390, and bond wires 5399. A portion of the transistors within input device structures 5376 and output device structure 5351 may be larger in either or both width and length than most transistors within acceptor wafer transistors and circuits 5393. Input device structures 5376 (and output device structure 5351) may be subjected to voltage and/or current transients from external devices or generated externally and traveling to the 3D device along bond wires 5399. Input device structures 5376 (and output device structure 5351) may be protected by dissipating the transient energy in diode structures, such as ESD diode structures 5307 on the relatively thicker (than for example, the second semiconductor layer) acceptor substrate 5395, which may be connected by a multiplicity of connection stacks such as first (acceptor) layer metal interconnect 5381 which may include first layer contacts 5391, first layer vias 5383, at least one shield layer/region 5388, TLV/TSV 5335, and second layer metallization M1 segments 5328. Input device structures 5376 (and output device structure 5351) may be protected by dissipating the transient energy in a transient filtering circuitry such as for example, FD ESD structures 5317, which may reside on a relatively thin semiconductor layer in the 3D device and may effectively utilize fully depleted transistors in the filter circuitry. FD ESD structures 5317 may be coupled to input device structures 5376 (and output device structure 5351) by second layer interconnections (not shown). Input device structures 5376 may be connected to PLL 5318, for example, thru second layer metallization M1 segment 5321 and second layer contacts 5326. Input device structures 5376 may be connected to SERDES circuitry 5319, for example, thru second layer metallization (not shown). Output device structures 5351 may be connected to SERDES circuitry 5319, for example, thru second layer metallization M1 segment 5323 and second layer contacts 5326. Output device structures 5351 may drive signals thru the connection to conductive pads 5390 and then out to external devices thru bond wires 5399. Transistors within a lower layer, for example within acceptor wafer transistors and circuits 5393, may be connected (not shown) to the output device structure 5351 and drive a signal to the output device structure 5351, and a portion of the transistors of output device structure 5351 may have a larger width and/or length than the transistors within acceptor wafer transistors and circuits 5393. Power from external sources may be routed thru bond wires 5399 to conductive pads 5390 to the 3D device, wherein at least a portion of the second interconnections layer 5330 may be constructed with thicker and/or wider metallization wiring (for example 4× wiring as described in incorporated patent references) so to provide the higher current carrying capability required for the second layer power distribution grid/network than that of the lower layer, in this example, first layer metallization wiring (for example 1× or 2× wiring as described in incorporated patent references). The width and/or length of the transistors of the second layer of transistors and circuits 5322, for example a portion of those in second layer input device structures 5376 and/or FD ESD structures 5317 and/or output device structures 5351, may be substantially larger than the width and/or length of transistors in acceptor wafer transistors and circuits 5393.

Persons of ordinary skill in the art will appreciate that the illustrations in FIG. 53 are exemplary and are not drawn to scale. Such skilled persons will further appreciate that many variations may be possible such as, for example, a thick enough semiconductor layer to enable ESD diode style protection circuitry to be constructed need not only be on the base or substrate layer, but may reside elsewhere in the 3D device stack. Moreover, the output circuitry including output device structures 5351 may wholly or partially reside on a semiconductor transistor layer that is not on top, and vertical connections including TLVs/TSV may be utilized to connect the output device structures 5351 to conductive pads 5390. Furthermore, the input circuitry including input device structures 5376 may wholly or partially reside on a semiconductor transistor layer that is not on top, and vertical connections including TLVs/TSV may be utilized to connect the input device structures 5376 to conductive pads 5390. Similarly, SERDES circuitry and 5319 PLL 5318 may wholly or partially reside on a semiconductor transistor layer that is not on top, thee choices being one of design choice and device characteristics driven. Furthermore, connection to external devices (signal and/or power supply) may be made on the backside of acceptor substrate 5395. Moreover, connection to external devices form the 3D device may utilize many types of structures other than bond wires 5399 shown in the illustration, for example, flipchip and bumps, wireless circuitry. Thus the invention is to be limited only by the appended claims.

Some embodiments of the invention may include alternative techniques to build IC (Integrated Circuit) devices including techniques and methods to construct 3D IC systems. Some embodiments of the invention may enable device solutions with far less power consumption than prior art. The device solutions could be very useful for the growing application of mobile electronic devices and mobile systems such as, for example, mobile phones, smart phone, and cameras, those mobile systems may also connect to the internet. For example, incorporating the 3D IC semiconductor devices according to some embodiments of the invention within the mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some non-volatile 3D NAND charge trap or RRAM described in some embodiments of the invention. Mobile system applications of the 3DIC technology described herein may be found at least in FIG. 156 of U.S. Pat. No. 8,273,610, the contents of which are incorporated by reference.

In this document, the connection made between layers of, generally single crystal, transistors, which may be variously named for example as thermal contacts and vias, Thru Layer Via (TLV), TSV (Thru Silicon Via), may be made and include electrically and thermally conducting material or may be made and include an electrically non-conducting but thermally conducting material or materials. A device or method may include formation of both of these types of connections, or just one type. By varying the size, number, composition, placement, shape, or depth of these connection structures, the coefficient of thermal expansion exhibited by a layer or layers may be tailored to a desired value. For example, the coefficient of thermal expansion of the second layer of transistors may be tailored to substantially match the coefficient of thermal expansion of the first layer, or base layer of transistors, which may include its (first layer) interconnect layers.

Base wafers or substrates, or acceptor wafers or substrates, or target wafers substrates herein may be substantially comprised of a crystalline material, for example, mono-crystalline silicon or germanium, or may be an engineered substrate/wafer such as, for example, an SOI (Silicon on Insulator) wafer or GeOI (Germanium on Insulator) substrate.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Moreover, epitaxial regrow of source and drains may utilize processes such as liquid phase epitaxial regrowth or solid phase epitaxial regrowth, and may utilize flash or laser processes to freeze dopant profiles in place and may also permit non-equilibrium enhanced activation (superactivation). Further, transferred layer or layers may have regions of STI or other transistor elements within it or on it when transferred. Rather, the scope of the invention includes both combinations and sub-combinations of the various features described hereinabove as well as modifications and variations which would occur to such skilled persons upon reading the foregoing description. Thus the invention is to be limited only by the appended claims.

We claim:

1. A method for processing a 3D semiconductor device, the method comprising:
    processing a first layer comprising first transistors,
    forming a first power distribution grid to provide power to said first transistors,
    processing a second layer overlying said first transistors and comprising second transistors,
        wherein said second layer has a thickness greater than 5 nm and less than 2 microns,
    forming a second power distribution grid overlaying said second transistors,
        wherein said first power distribution grid comprises first power conductors and said second power distribution grid comprises second power conductors, and
        wherein said second power conductors are substantially wider or thicker than said first power conductors, and
        wherein said device comprises a plurality of vias to connect said second power distribution grid to said first power distribution grid.

2. The method according to claim 1, further comprising: forming a thermal connection path from said second layer to a top or bottom surface of said device,
    wherein said thermal connection path has a thermal conductivity greater than 10 W/m-K.

3. The method according to claim 1, further comprising: forming a heat-spreader layer between said first layer and said second layer, wherein
    said heat-spreader layer comprises a thermal conductivity greater than 10 W/m-K.

4. The method according to claim 1, further comprising: forming a power distribution network to provide power to said second transistors,
    wherein said power distribution network provides a heat removal path to at least one of said second transistors.

5. The method according to claim 1, further comprising: forming at least one thermally conductive and electrically non-conducting contact to at least one of said second transistors.

6. The method according to claim 1,
    wherein said through layer via is part of a heat removal structure of said device.

7. The method according to claim 1, further comprising: forming a power distribution network to provide power to said second transistors,
    wherein said device comprises a heat removal path between said power distribution network and a top or bottom surface of said device.

8. A method for processing a 3D semiconductor device, the method comprising:
    processing a first layer comprising first transistors,
    processing a second layer overlying said first transistors and comprising second transistors,
        wherein said second layer has a thickness greater than 5 nm and less than 2 microns,
        wherein said first layer comprises at least one first circuit comprising said first transistors, said at least one first circuit is circumscribed by a first guard ring,
        wherein said second layer comprises at least one second circuit comprising said second transistors, said at least one second circuit is circumscribed by a second guard ring, and
        wherein said second guard ring overlays said first guard ring wherein said second dice lane is overlaying and aligned to said first dice lane, and wherein said aligned is misaligned less than 200 nm,
        wherein said second dice lane is overlaying and aligned to said first dice lane, and
        wherein said aligned is misaligned less than 40 nm.

9. The method according to claim 8, further comprising: forming a thermal connection path from said second layer to a top or bottom surface of said device,
    wherein said thermal connection path has a thermal conductivity greater than 10 W/m-K.

10. The method according to claim 8, further comprising: forming a heat-spreader layer between said first layer and said second layer, wherein
    said heat-spreader layer comprises a thermal conductivity greater than 10 W/m-K.

11. The method according to claim 8, further comprising: forming a power distribution network to provide power to said second transistors,
    wherein said power distribution network provides a heat removal path to at least one of said second transistors.

12. The method according to claim 8, further comprising: forming at least one thermally conductive and electrically non-conducting contact to at least one of said second transistors.

13. The method according to claim 8,
    wherein said through layer via is part of a heat removal structure of said device.

14. The method according to claim 8, further comprising: forming a power distribution network to provide power to said second transistors,
    wherein said device comprises a heat removal path between said power distribution network and a top or bottom surface of said device.

15. A method for processing a 3D semiconductor device, the method comprising:
   processing a first layer comprising first transistors,
   processing a second layer overlying said first transistors and comprising second transistors,
      wherein said second layer has a thickness greater than 5 nm and less than 2 microns,
      wherein a portion of said first transistors is circumscribed by a first dice lane of at least 10 microns width, and there are no conductive connections to said portion of said first transistors that cross said first dice lane;
      wherein a portion of said second transistors is circumscribed by a second dice lane of at least 10 microns width, and there are no conductive connections to said portion of second transistors that cross said second dice lane,
      wherein said second dice lane is overlaying and aligned to said first dice lane, and
      wherein said aligned is misaligned less than 200 nm.

16. The method according to claim 15, further comprising:
   forming a thermal connection path from said second layer to a top or bottom surface of said device,
      wherein said thermal connection path has a thermal conductivity greater than 10 W/m-K.

17. The method according to claim 15, further comprising:
   forming a heat-spreader layer between said first layer and said second layer, wherein
      said heat-spreader layer comprises a thermal conductivity greater than 10 W/m-K.

18. The method according to claim 15, further comprising:
   forming a power distribution network to provide power to said second transistors,
      wherein said power distribution network provides a heat removal path to at least one of said second transistors.

19. The method according to claim 15, further comprising:
   forming at least one thermally conductive and electrically non-conducting contact to at least one of said second transistors.

20. The method according to claim 15,
   wherein said through layer via is part of a heat removal structure of said device.

* * * * *